(12) United States Patent
Sugahara et al.

(10) Patent No.: US 12,183,392 B2
(45) Date of Patent: Dec. 31, 2024

(54) BISTABLE CIRCUIT AND ELECTRONIC CIRCUIT

(71) Applicant: JAPAN SCIENCE AND TECHNOLOGY AGENCY, Kawaguchi (JP)

(72) Inventors: Satoshi Sugahara, Tokyo (JP); Yusaku Shiotsu, Tokyo (JP)

(73) Assignee: JAPAN SCIENCE AND TECHNOLOGY AGENCY, Kawaguchi (JP)

( * ) Notice: Subject to any disclaimer, the term of this patent is extended or adjusted under 35 U.S.C. 154(b) by 151 days.

(21) Appl. No.: 17/877,452

(22) Filed: Jul. 29, 2022

(65) Prior Publication Data

US 2022/0406370 A1    Dec. 22, 2022

Related U.S. Application Data

(63) Continuation of application No. PCT/JP2021/003224, filed on Jan. 29, 2021.

(30) Foreign Application Priority Data

Feb. 10, 2020 (JP) ................................. 2020-020954
Oct. 23, 2020 (JP) ................................. 2020-178364

(51) Int. Cl.
*G11C 11/00* (2006.01)
*G11C 11/412* (2006.01)
(Continued)

(52) U.S. Cl.
CPC .......... *G11C 11/412* (2013.01); *G11C 11/419* (2013.01); *H03K 3/3565* (2013.01); *H10B 10/12* (2023.02); *H10B 10/18* (2023.02)

(58) Field of Classification Search
CPC .......................... G11C 11/412; G11C 11/419
See application file for complete search history.

(56) References Cited

U.S. PATENT DOCUMENTS

2002/0032670 A1    3/2002   Watanabe et al.
2002/0159287 A1    10/2002  Miwa et al.
(Continued)

FOREIGN PATENT DOCUMENTS

JP    H03-250244 A    11/1991
JP    2002-109875 A    4/2002
(Continued)

OTHER PUBLICATIONS

Extended (Supplementary)European Search Report dated May 24, 2023, issued in counterpart EP Application No. 21753980.8. (9 pages).
(Continued)

*Primary Examiner* — Pho M Luu
(74) *Attorney, Agent, or Firm* — WHDA, LLP

(57) ABSTRACT

A bistable circuit includes a pair of inverter circuits each including a first FET being connected between a power supply line and an intermediate node and having a gate coupled to an input node and a first conductivity type channel, a second FET being connected between the intermediate node and an output node and having a gate coupled to the input node and the first conductivity type channel, a third FET being connected between the intermediate node and a bias node, a fourth FET being connected between the output node and a control line and having a gate coupled to a word line and a second conductivity type channel, wherein the pair of inverter circuits are connected in a loop shape, and gates of the third FETs of the pair of inverter circuits are coupled to one of the input and output nodes of the pair of inverter circuits.

13 Claims, 63 Drawing Sheets

(51) Int. Cl.
*G11C 11/419* (2006.01)
*H03K 3/3565* (2006.01)
*H10B 10/00* (2023.01)

(56) References Cited

U.S. PATENT DOCUMENTS

| | | | |
|---|---|---|---|
| 2006/0023503 A1* | 2/2006 | Lee | G11C 14/00 |
| | | | 365/185.05 |
| 2007/0036018 A1 | 2/2007 | Iwata | |
| 2011/0205787 A1* | 8/2011 | Salters | G11C 11/412 |
| | | | 365/154 |
| 2011/0261609 A1 | 10/2011 | Seshadri | |
| 2011/0273925 A1 | 11/2011 | Yamamoto et al. | |
| 2013/0051131 A1* | 2/2013 | Abouzeid | G11C 11/413 |
| | | | 365/156 |
| 2014/0191338 A1 | 7/2014 | Nii et al. | |
| 2015/0070974 A1 | 3/2015 | Shuto et al. | |
| 2017/0229179 A1 | 8/2017 | Sugahara et al. | |
| 2018/0069534 A1 | 3/2018 | Sugahara et al. | |

FOREIGN PATENT DOCUMENTS

| | | |
|---|---|---|
| JP | 2007-059043 A | 3/2007 |
| JP | 2013-525936 A | 6/2013 |
| WO | 2009/028298 A1 | 3/2009 |
| WO | 2013/172066 A1 | 11/2013 |
| WO | 2016/024527 A1 | 2/2016 |
| WO | 2016/158691 A1 | 10/2016 |

OTHER PUBLICATIONS

Ando, Kota et a l., "BRein Memory: A Single-Chip Binary/Ternary Reconfigurable in-Memory Deep Neural Network Accelerator Achieving 1.4 TOPS at 0.6 W", IEEE Journal of Solid-State Circuits, vol. 53, No. 4, pp. 983-994, 2018; Cited in the Specification. (12 pages).
International Search Report dated Apr. 13, 2021, issued in counterpart Application No. PCT/JP2021/003224, with English Translation. (12 pages).

* cited by examiner

READ OPERATION

WRITE OPERATION

HOLD STATE

H-STORE OPERATION

L-STORE OPERATION

SHUTDOWN STATE

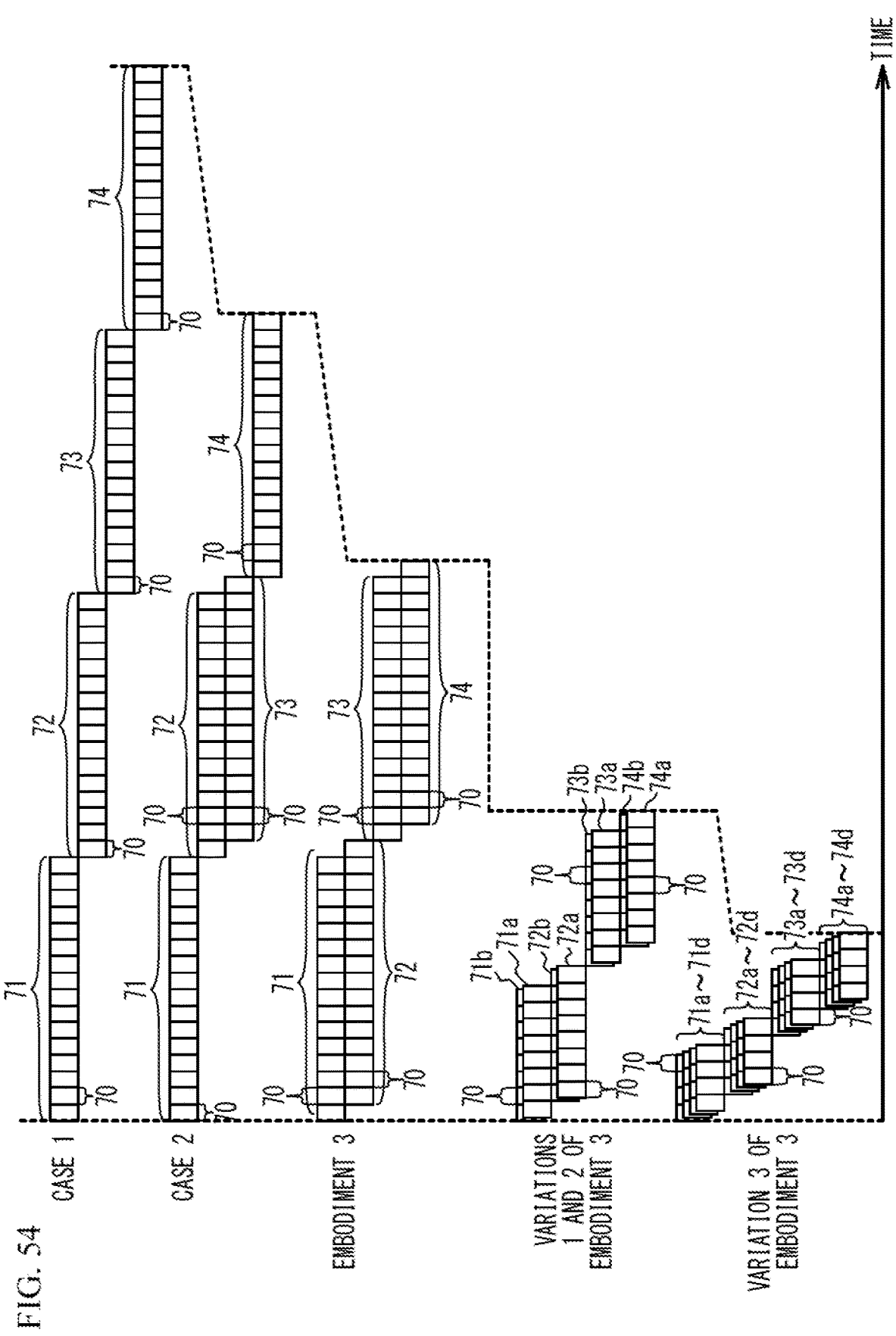

BISTABLE CIRCUIT AND ELECTRONIC CIRCUIT

CROSS-REFERENCE TO RELATED APPLICATION

This application is based upon and claims the benefit of priority of the prior International Patent Application No. PCT/JP2021/003224, filed on Jan. 29, 2021, which claims the benefits of priorities of Japanese Patent Application No. 2020-020954 filed on Feb. 10, 2020, and Japanese Patent Application No. 2020-178364 filed on Oct. 23, 2020, the entire contents of which are incorporated herein by reference.

FIELD

A certain aspect of embodiments described herein relates to bistable circuit and an electronic circuit.

BACKGROUND

Virtually nonvolatile retention SRAMs (VNR-SRAMs) or ultra-low voltage (ULV) retention SRAMs (Static Random Access Memories) (ULVR-SRAMs) composed of a CMOS (Complementary Metal Oxide Semiconductor) without using a non-volatile memory element are known as disclosed in, for example, International Publication No. 2016/158691 (Patent Document 1). Used in the VNR-SRAM is a dual mode inverter capable of switching between a Schmitt trigger (ST) mode, which allows ULV retention, and a boosted inverter (BI) mode, which can achieve circuit performance equivalent to that of the SRAM at a normal voltage. This ULV retention SRAM can be used for so-called power gating (PG).

Further, a memory circuit using a memory cell (NV-SRAM), which has a bistable circuit and a non-volatile memory element, is known as disclosed in, for example, International Publication No. 2009/028298 (Patent Document 2). In the NV-SRAM, data in the bistable circuit is stored in the non-volatile memory element to reduce the power consumption, and the data in the non-volatile memory element is restored to the bistable circuit when necessary to put the data into a usable state.

Furthermore, it is being studied to perform processing of a neural network at high speed by combining an SRAM for storing coefficients such as weight coefficients of the neural network with arithmetic circuits for a product-sum and an evaluation function as disclosed in, for example, Non-Patent Document 1: IEEE JOURNAL OF SOLID-STATE CIRCUITS, VOL. 53, pp, 983-994, 2018 (Non-patent Document 1).

SUMMARY

A first objective of the present disclosure is to provide a bistable circuit and an electronic circuit that can be miniaturized or can reduce the number of transistors.

A second objective of the present disclosure is to provide a memory circuit that can be miniaturized or can reduce the number of transistors.

Further, a third objective of the present disclosure is to provide a processing device capable of speeding up the processing of the neural network.

Further, a fourth objective of the present disclosure is to reduce the power consumption for the processing of the neural network.

According to a first aspect of the embodiments, there is provided a bistable circuit including: a first inverter circuit and a second inverter circuit each including: a first FET having a channel of a first conductivity type, wherein a source of the first FET is coupled to a power supply line, a drain of the first FET is coupled to an intermediate node, and a gate of the first FET is coupled to an input node, a second FET having a channel of the first conductivity type, wherein a source of the second FET is coupled to the intermediate node, a drain of the second FET is coupled to an output node, and a gate of the second FET is coupled to the input node, a third FET, wherein one of a source and a drain of the third FET is coupled to the intermediate node, and the other of the source and the drain of the third FET is coupled to a bias node, and a fourth FET having a channel of a second conductivity type opposite to the first conductivity type, wherein one of a source and a drain of the fourth FET is coupled to the output node, and the other of the source and the drain of the fourth FET is coupled to a control line; a first memory node to which an input node of the first inverter circuit and an output node of the second inverter circuit are coupled; and a second memory node to which an output node of the first inverter circuit and an input node of the second inverter circuit are coupled, wherein gates of the fourth FETs of the first inverter circuit and the second inverter circuit are coupled to a word line, wherein a gate of the third FET of the first inverter circuit is coupled to one of the following nodes: the input node and the output node of the first inverter circuit and the input node and the output node of the second inverter circuit, and wherein a gate of the third FET of the second inverter circuit is coupled to one of the following nodes: the input node and the output node of the second inverter circuit and the input node and the output node of the first inverter circuit.

In the above configuration, it is possible to employ the configuration in which the third FET has a channel of the second conductivity type, the gate of the third FET of the first inverter circuit is coupled to the input node of the first inverter circuit or the output node of the second inverter circuit, and the gate of the third FET of the second inverter circuit is coupled to the input node of the second inverter circuit or the output node of the first inverter circuit.

In the above configuration, it is possible to employ the configuration in which the third FET has a channel of the first conductivity type, the gate of the third FET of the first inverter circuit is coupled to the output node of the first inverter circuit or the input node of the second inverter circuit, and the gate of the third FET of the second inverter circuit is coupled to the output node of the second inverter circuit or the input node of the first inverter circuit.

According to a second aspect of the embodiments, there is provided an electronic circuit including: the above bistable circuit; and a control circuit configured to, in a first state in which the bistable circuit retains data, set a first voltage between the power supply line and the control line lower than a second voltage between the first memory node and the second memory node in a second state in which data is read from the bistable circuit or data is written in the bistable circuit.

In the above configuration, it is possible to employ the configuration in which the control circuit sets the control line as a bit line for reading data from the bistable circuit or writing data in the bistable circuit, in the second state.

In the above configuration, it is possible to employ the configuration in which in the second state, the control circuit sets a voltage of the word line higher than a voltage of the power supply line in the case that the first conductivity type is an N type, and sets the voltage of the word line lower than the voltage of the power supply line in the case that the first conductivity type is a P type.

In the above configuration, it is possible to employ the configuration in which in the first state, the control circuit sets a voltage between the word line and the power supply line to the first voltage or lower than the first voltage.

In the above configuration, it is possible to employ the configuration in which in a third state in which a voltage between the power supply line and the control line is set to the second voltage, the control circuit sets a voltage between the word line and the power supply line smaller than the second voltage.

In the above configuration, it is possible to employ the configuration in which a fixed bias is supplied to the bias node in both the first state and the second state.

In the above configuration, it is possible to employ the configuration in which the fixed bias is a voltage between a voltage of the first memory node and a voltage of the second memory node in the second state.

In the above configuration, it is possible to employ the configuration in which in the second inverter circuit, the other of the source and the drain of the fourth FET is coupled to a first control line, and a gate of the fourth FET is coupled to a first word line, in the first inverter circuit, the other of the source and the drain of the fourth FET is coupled to a second control line, and a gate of the fourth FET is coupled to a second word line, the first inverter circuit includes a fifth FET having a channel of the second conductivity type, one of the source and the drain of the fifth FET is coupled to the first memory node, the other of the source and the drain of the fifth FET is coupled to a third control line, and a gate of the fifth FET is coupled to a third word line, and the control circuit uses the first word line to turn on the fourth FET of the second inverter circuit, uses the first control line to write data in the bistable circuit, uses the second word line to turn on the fourth FET of the first inverter circuit, uses the second control line to read data from the bistable circuit, uses the third word line to turn on the fifth FET of the first inverter circuit, and uses the third control line to read data from the bistable circuit.

In the above configuration, it is possible to employ the configuration in which in the case that the first conductivity type is an N type, the control circuit sets a voltage of the first word line when data is read from the bistable circuit higher than a voltage of the first word line when data is written in the bistable circuit, and lower than the higher of voltages of the second word line and the third word line when data is read from the bistable circuit, and in the case that the first conductivity type is a P type, the control circuit sets a voltage of the first word line when data is read from the bistable circuit lower than a voltage of the first word line when data is written in the bistable circuit, and higher than the lower of voltages of the second word line and the third word line when data is read from the bistable circuit.

In the above configuration, it is possible to employ the configuration in which in the first inverter circuit, the other of the source and the drain of the fourth FET is coupled to a first control line, and a gate of the fourth FET is coupled to the first word line, in the second inverter circuit, the other of the source and the drain of the fourth FET is coupled to a second control line, and a gate of the fourth FET is coupled to the first word line, the first inverter circuit includes a fifth FET having a channel of the second conductivity type, one of a source and a drain of the fifth FET is coupled to the first memory node, the other of the source and the drain of the fifth FET is coupled to a third control line, and a gate of the fifth FET is coupled to a second word line, the second inverter circuit includes a sixth FET having a channel of the second conductivity type, one of a source and a drain of the sixth FET is coupled to the second memory node, the other of the source and the drain of the sixth FET is coupled to a fourth control line, and a gate of the sixth FET is coupled to the second word line, and the control circuit uses the first word line to turn on the fourth FETs of the first inverter circuit and the second inverter circuit, uses the first control line and the second control line to write data in the bistable circuit and read data from the bistable circuit, uses the second word line to turn on the fifth FET and the sixth FET, and uses the third control line and the fourth control line to write data in the bistable circuit and read data from the bistable circuit.

BRIEF DESCRIPTION OF THE DRAWINGS

FIG. 54 illustrates processes with respect to time in the variations of the embodiment 3;

DETAILED DESCRIPTION

Figure 1:
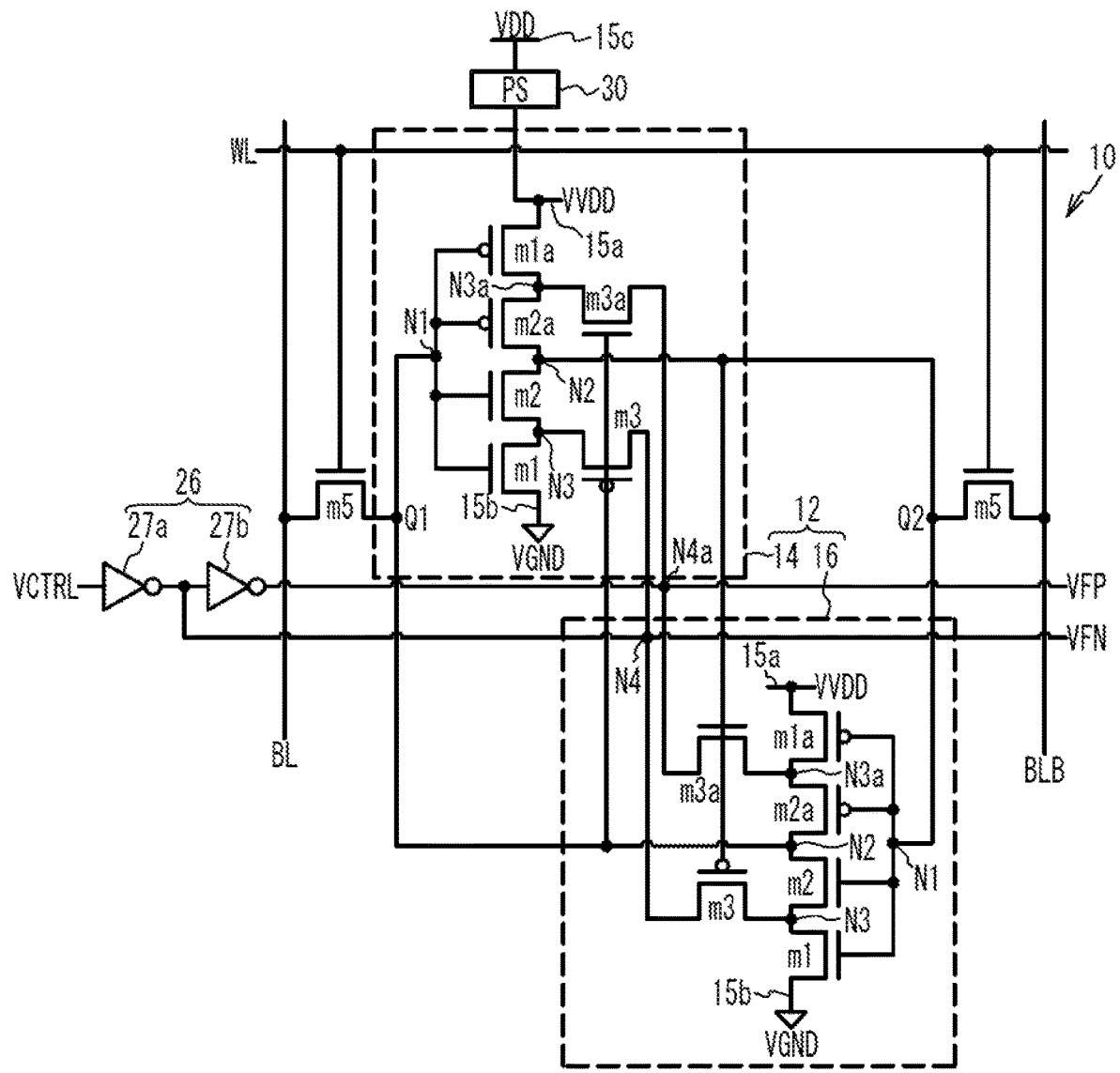
FIG. 1 is a circuit diagram of a memory cell in loop view in a comparative example 1.
Figure 2:
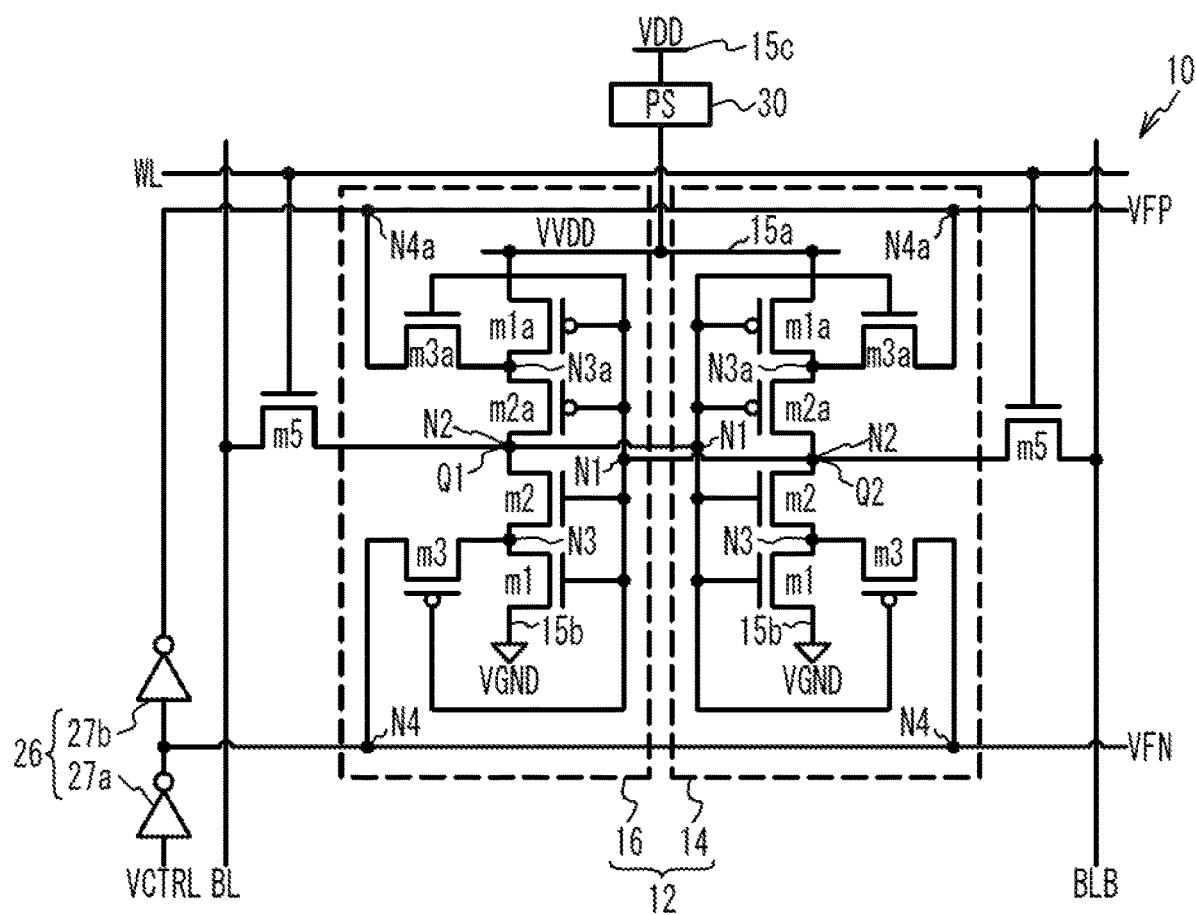
FIG. 2 is a circuit diagram of the memory cell in cross-coupled view in the comparative example 1.

FIG. 1 to FIG. 2: Comparative example 1
FIG. 3 to FIG. 4: Comparative example 2
FIG. 5 to FIG. 7C: Embodiment 1
FIG. 8A to FIG. 10C: Simulation 1, Comparative examples 2 and 3, Embodiment 1
FIG. 11 to FIG. 15: Simulation 2, Comparative examples 2 and 3, Embodiment 1
FIG. 16 to FIG. 17: Variation 1 of the embodiment 1
FIG. 18 to FIG. 20: Variation 2 of the embodiment 1
FIG. 21: Embodiment 1 and variations thereof
FIG. 22 to FIG. 29: Embodiment 2
FIG. 30 to FIG. 35B: Simulation 3, Embodiment 2
FIG. 36: Variation 1 of the embodiment 2
FIG. 37 to FIG. 44: Embodiment 3
FIG. 45 to FIG. 46: Variation 1 of the embodiment 3
FIG. 47 to FIG. 53: Variation 2 of the embodiment 3
FIG. 54 to FIG. 55C: Embodiment 3, Simulations of variations 1 to 3 thereof
FIG. 56 to FIG. 58: Variation 4 of the embodiment 3
FIG. 59A to FIG. 61B: Variation 5 of the embodiment 3

In the VNR-SRAM of Patent Document 1, by ULV retention, the standby power can be reduced without losing the memory contents of the cell. However, in the VNR-SRAM, 14 or 10 transistors are used in one memory cell (hereinafter, referred to as a 14T cell and a 10T cell, respectively). Therefore, there is a first problem that the memory cell becomes large or the cell area increases.

Further, when the number of transistors is reduced as in a 10T cell, the stability (noise margin) of the ULV retention is lowered.

Further, in the NV-SRAM of Patent Document 2, by using the non-volatile memory element in the memory cell, the power supply of the memory cell can be cut off during standby, and therefore, the standby power can be reduced. However, in addition to the non-volatile memory, 8 transistors are used in one memory cell. Therefore, there is a second problem that miniaturization of the memory cell is difficult or the cell area increases.

Apart from the first and second problems, there is a third problem that there is room for further speeding up although the method of Non-Patent Document 1 has a high effect of speeding up the processing of the neural network.

Apart from the first to third problems, there is a fourth problem that the power consumption of the SRAM becomes large and thereby, the power consumption for the processing of the neural network becomes large because in the method of Non-Patent Document 1, as the processing of the neural network becomes larger, the SRAM having a larger capacity for storing coefficients such as weight coefficients of the network is required.

Prior to a description of embodiments, comparative examples will be described.

Comparative Example 1

A comparative example 1 differs from Patent Document 1 in the conductivity type of the feedback transistor and the connection destination of the gate. FIG. 1 and FIG. 2 are circuit diagrams of a memory cell 10 in the comparative example 1. FIG. 1 is a circuit diagram in loop view, and FIG. 2 is a circuit diagram in cross-coupled view. Although the circuits illustrated in FIGS. 1 and 2 are the same circuit, the description of the operation is easy to understand using the loop view of FIG. 1, and the description of the circuit area and the like is easy to understand using the cross-couple view of FIG. 2.

As illustrated in FIG. 1 and FIG. 2, each of inverter circuits 14 and 16 includes FETs m1 to m3 and m1a to m3a. The FETs m1, m2, and m3a are N-channel MOSFETs, and the FETs m1a, m2a, and m3 are P-channel MOSFETs.

The FETs m1, m2, m1a, and m2a are connected in series between a ground line 15b and a power supply line 15a (a virtual power supply line). The gates of the FETs m1, m2, m1a, and m2a are coupled to an input node N1. An output node N2 is located between the FETs m2 and m2a. The FETs m1 and m2 are the drivers of the inverter circuits 14 and 16, and the FETs m1a and m2a are the loads.

The FET m3 is connected between an intermediate node N3, which is between the FETs m1 and m2, and a bias node N4, and the FET m3a is connected between an intermediate node N3a, which is between the FETs m1a and m2a, and a bias node N4a. The gates of the FETs m3 and m3a are coupled to the input node N1. The FETs m3 and m3a are feedback transistors FBTr.

Memory nodes Q1 and Q2 are coupled to bit lines BL and BLB via FETs m5, respectively. The gates of the FETs m5 are coupled to a word line WL. The FETs m5 are N-channel FETs and are pass transistors.

A driver 26 includes inverters 27a and 27b. The inverter 27a outputs a signal VFN, which is obtained by inverting a control signal VCTRL, to the bias node N4, and the inverter 27b outputs a signal VFP, which is obtained by inverting the signal VFN, to the bias node N4a. A power switch (PS) 30 converts the voltage VDD of a power supply 15c to a virtual power supply voltage VVDD and supplies it to the power supply line 15a. The power switch 30 switches the virtual power supply voltage VVDD according to a control signal from a control circuit (not illustrated).

In the memory cell according to the comparative example 1, the modes of the inverter circuits 14 and 16 can be switched between the ST mode and the BI mode by the control signal VCTRL. When the control signal VCTRL is at a high level (VVDDH, e.g., 1.2 V), the inverter circuits 14 and 16 enter the BI mode. When the control signal VCTRL is at a low level (VGND, e.g., 0 V), the inverter circuits 14 and 16 enter the ST mode.

The ST mode is a mode in which the transmission characteristics of the inverter circuits 14 and 16 have hysteresis, and the BI mode is a mode in which the transmission characteristics of the inverter circuits 14 and 16 have substantially no hysteresis. In the ST mode, when the virtual power supply voltage VVDD−VGND applied to the inverter circuits 14 and 16 is set to a normal voltage (e.g., 1.2 V), the leakage current becomes large. In the BI mode, the leakage current is smaller than that in the ST mode even when the voltage VVDD−VGND is set to a normal voltage. Note that having substantially no hysteresis means that intentional hysteresis such as that in the ST mode is not present, and the presence of unintended hysteresis is acceptable.

In the BI mode, the memory cell 10 functions as a normal SRAM cell. In the ST mode, a bistable circuit 12 retains data even if the voltage (VVDD−VGND) is set to an ultralow voltage (ULV) such as, for example, 0.2 V.

Table 1 is a table presenting the states in the comparative example 1.

TABLE 1

| State | VCTRL | Mode | VVDD | VVDD − VGND | VWL |
|---|---|---|---|---|---|
| Read/write | VVDDH (1.2 V) | BI | VVDDH (1.2 V) | VH (1.2 V) | H (1.2 V) |
| VDD retention | VVDDH (1.2 V) | BI | VVDDH (1.2 V) | VH (1.2 V) | L (0 V) |
| ULV retention | VGND (0 V) | ST | VVDDL (0.2 V) | VL (0.2 V) | L (0 V) |

The state in which data is read from and written in the memory cell 10 is a read/write state. During the read/write state, the control signal VCTRL is at a high level H. This causes the inverter circuits 14 and 16 to enter the BI mode. The power switch 30 sets the virtual power supply voltage VVDD to the VVDDH (e.g., 1.2 V). The voltage (VVDD−VGND) becomes VH (e.g., 1.2 V). By setting the voltage VWL of the word line WL of the memory cell 10 subject to read or write to a high level (e.g., 1.2 V), the FET m5 is turned on and reading of data from or writing of data in the bistable circuit 12 becomes possible.

During the normal operation, the state in which data is retained is a VDD retention state. In the VDD retention state, the control signal VCTRL is at the high level H, and the inverter circuits 14 and 16 are in the BI mode. The virtual power supply voltage VVDD is the VVDDH (e.g., 1.2 V), and the voltage (VVDD−VGND) is the VH (e.g., 1.2 V). Since neither read nor write is performed, the voltage VWL of the word line WL is a low level (e.g., 0 V) and the FET m5 is OFF.

The state in which the data in the memory cell 10 is retained at an ultralow voltage is a ULV retention state. In the ULV retention state, the control signal VCTRL is at a low level L, and the inverter circuits 14 and 16 are in the ST mode. The power switch 30 sets the virtual power supply voltage VVDD to VVDDL (e.g., 0.2 V). The voltage (VVDD−VGND) becomes VL (e.g., 0.2 V) lower than the VH. The voltage VWL is a low level (e.g., 0 V), and the FET m5 is OFF.

Comparative Example 2

Figure 3:
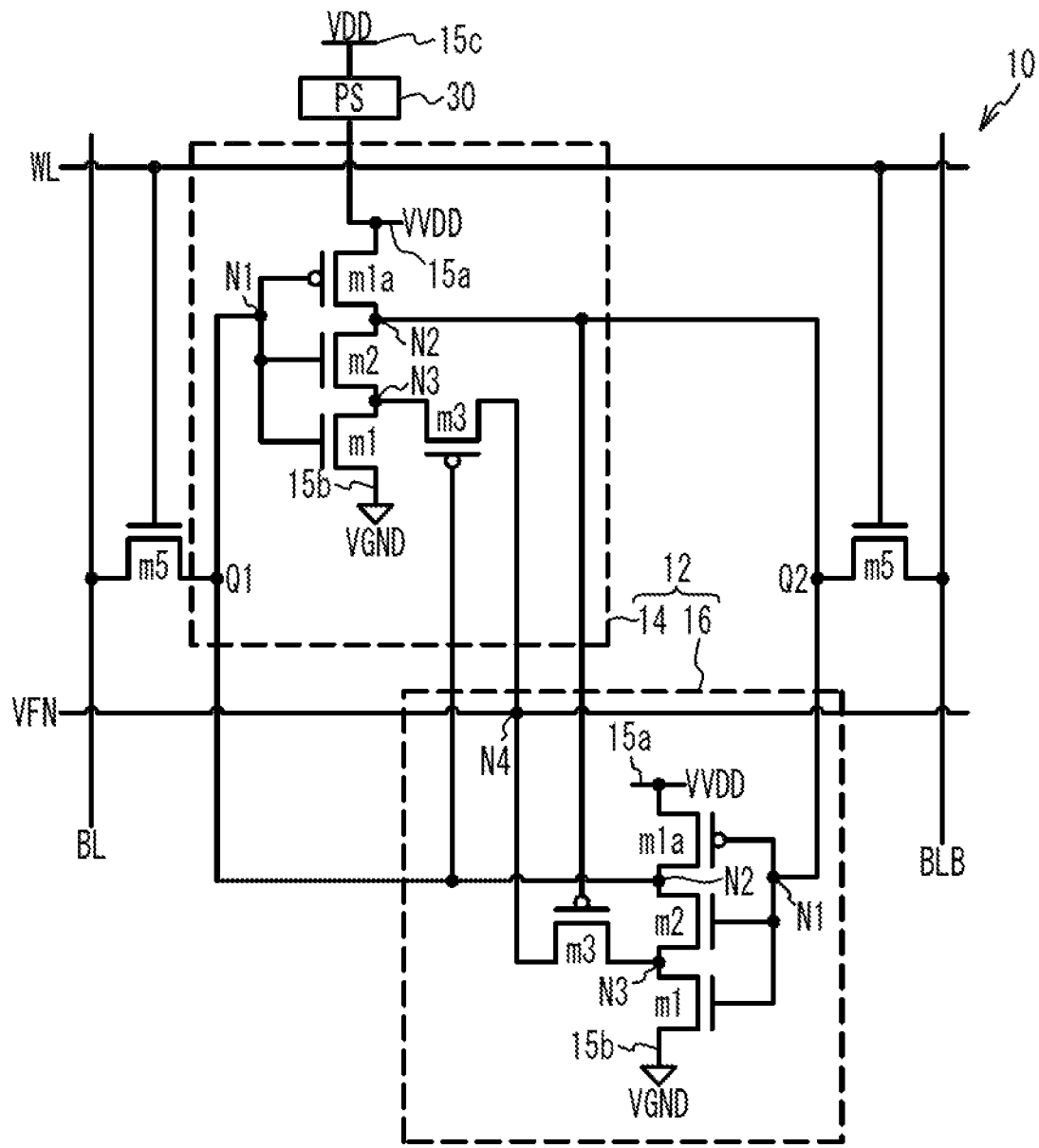
FIG. 3 is a circuit diagram of a memory cell in loop view in a comparative example 2.
Figure 4:
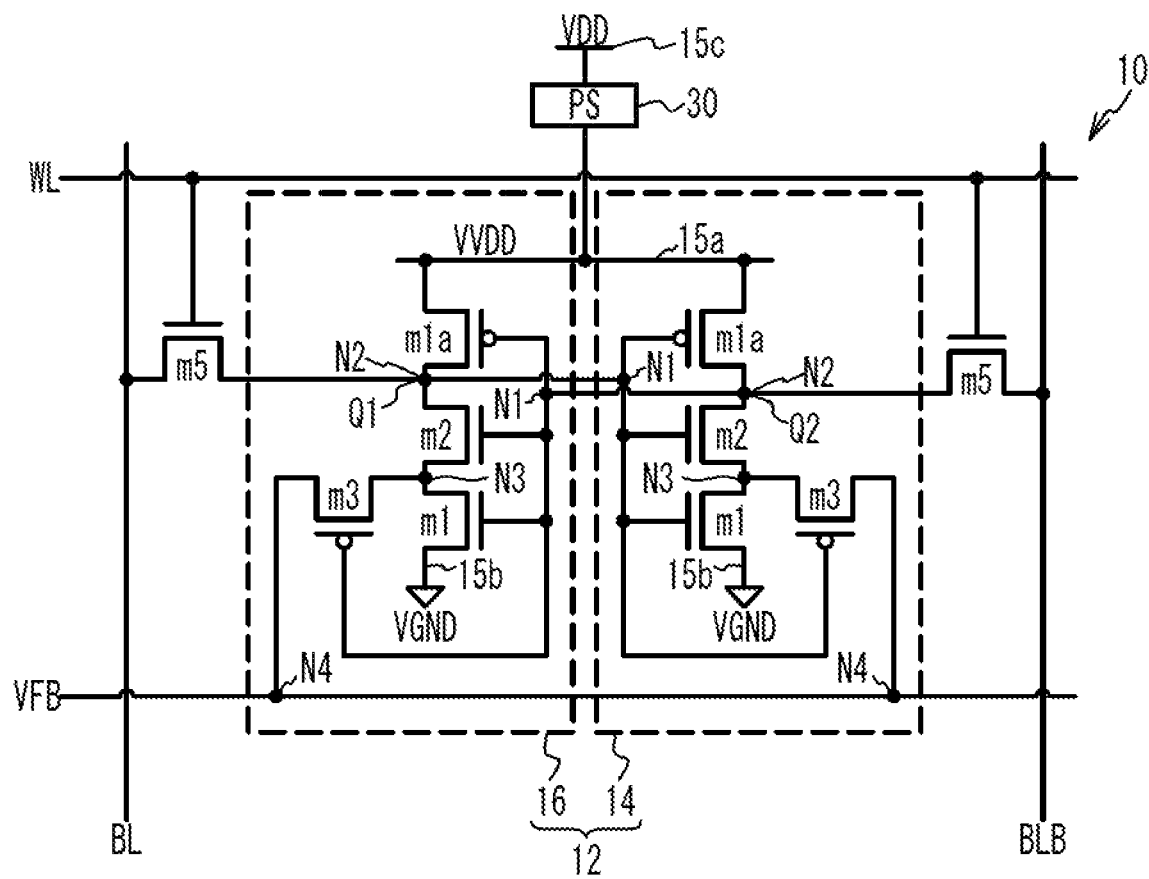
FIG. 4 is a circuit diagram of the memory cell in cross-coupled view in the comparative example 2.

FIG. 3 and FIG. 4 are circuit diagrams of the memory cell 10 in a comparative example 2. FIG. 3 is a circuit diagram in loop view, and FIG. 4 is a circuit diagram in cross-coupled view.

As illustrated in FIG. 3 and FIG. 4, in the comparative example 2, the FETs m2a and m3a and the driver 26 are not provided. Other configurations are the same as those in the comparative example 1.

Table 2 is a table presenting the states in the comparative example 2.

TABLE 2

| State | VCTRL | Mode | VVDD | VVDD − VGND | VWL |
|---|---|---|---|---|---|
| Read/write | VFN (0.2 V) | BI | VVDDH (1.2 V) | VH (1.2 V) | H (1.2 V) |
| VDD retention | VFN (0.2 V) | BI | VVDDH (1.2 V) | VH (1.2 V) | L (0 V) |
| ULV retention | VFN (0.2 V) | ST | VVDDL (0.2 V) | VL (0.2 V) | L (0 V) |

As presented in Table 2, the voltage of the bias node N4 is constant at VFN (e.g., 0.2 V) regardless of the mode. In the read/write state, the power switch 30 sets the virtual power supply voltage VVDD to the VVDDH (e.g., 1.2 V) according to a control signal from the control circuit (not illustrated). The virtual power supply voltage (VVDD−VGND) applied to the bistable circuit 12 becomes the VH (e.g., 1.2 V). At this time, the inverter circuits 14 and 16 enter the BI mode. The voltage VWL of the word line WL is a high level (e.g., 1.2 V). In the VDD retention state, the virtual power supply voltage VVDD is the VVDDH (e.g., 1.2 V), the voltage (VVDD−VGND) is the VH (e.g., 1.2 V), and the inverter circuits 14 and 16 are in the BI mode. The voltage VWL of the word line WL is a low level (0 V).

In the ULV retention state, the power switch 30 sets the virtual power supply voltage VVDD to the VVDDL (e.g., 0.2 V). The voltage (VVDD−VGND) becomes the VL (e.g., 0.2 V), which is lower than the VH. At this time, the inverter circuits 14 and 16 enter the ST mode. The voltage VWL is a low level (e.g., 0 V). As in the comparative example 1, the power consumption can be reduced in the ULV retention state.

The type in which the FET m3 is provided, as the feedback transistor FBTr, between the N-type channel FETs m1 and m2 is referred to as a pull-down type feedback PDFB. The type in which the FET m3a is provided, as the feedback transistor FBTr, between the P-type channel FETs m1a and m2a is referred to as a pull-up type feedback PUFB. The type in which both the FET m3 and m3a are provided is referred to as a pull-up pull-down type feedback PUPDFB. The comparative example 1 is of the PUPDFB, and the comparative example 2 is of the PDFB.

In the case that the conductivity type of the channel of the FBTr is different from the conductivity type of the channel of the FET to which the FBTr is connected, the FBTr is referred to as a different conductivity type channel FBTr. In the comparative example 2, which is of the PDFB, the FET m3, which is an FBTr, has a P-type channel, and the FETs m1 and m2 to which the FET m3 is connected have N-type channels. Therefore, in the case that the FBTr has a P-type channel in the PDFB, the FBTr is a different conductivity type channel FBTr. In the case that the FBTr has an N-type channel in the PUFB, the FBTr is a different conductivity type channel FBTr. In the case that the conductivity type of the channel of the FBTr and the conductivity type of the channel of the FET to which the FBTr is connected are the same, the FBTr is referred to as an identical conductivity type channel FBTr. In the case that the FBTr has an N-type channel in the PDFB, and in the case that the FBTr has a P-type channel in the PUFB, the FBTr is the identical conductivity type channel FBTr.

In the different conductivity type channel FBTr, the gate is coupled to the input node of the same inverter circuit or the output node of the other inverter circuit. In the identical conductivity type channel FBTr, the gate is coupled to the output node of the same inverter circuit or the input node of the other inverter circuit. The comparative examples 1 and 2 are the identical conductivity type channel FBTrs. Patent document 1 discloses the identical conductivity type channel FBTr.

The system in which the power switch 30 is provided between the power supply line 15a and the power supply 15c, and the power switch 30 sets the virtual power supply voltage VVDD, and sets the voltage VVDD−VGND as the power supply voltage of the memory cell 10 is referred to as a header PS. The system in which the power switch 30 is provided between the ground line 15b and a ground, and the power switch 30 sets the virtual ground voltage VVGND, and sets VDD−VVGND as the power supply voltage of the memory cell 10 is referred to as a footer PS. The system in which the power switch 30 is provided both between the power supply line 15a and the power supply 15c and between the ground line 15 and a ground, and the power switch 30 sets the virtual power supply voltage VVDD and the virtual ground voltage VVGND, and sets VVDD−VVGND as the power supply voltage of the memory cell 10 is referred to as a dual PS. The comparative examples 1 and 2 are of the header PS.

The system in which the driver 26 is provided, and the ST mode and the BI mode are switched by applying a high level and a low level to the bias nodes N4 and N4a by the control signal VCTRL is referred to as Type 2. The system in which the driver 26 is not provided and the bias node N4 is set at a constant voltage (fixed bias) is referred to as Type 1. The comparative example 1 is of Type 2, and the comparative example 2 is of Type 1.

In summary, the comparative example 1 is of the PUPDFB, the different conductivity type channel FBTr, the header PS, Type 2. The comparative example 2 is of the PDFB, the different conductivity type channel FBTr, the header PS, Type 1.

It will be described that the operational stability (e.g., noise margin) of the bistable circuit 12 in the ULV retention state is higher in the different conductivity type channel FBTr than in the identical conductivity type channel FBTr.

For example, in the comparative example 2, in the case that the FET m3 has an N-type channel (i.e., the identical conductivity type channel), the gates of the FETs m3 of the inverter circuits 14 and 16 are coupled to the output nodes N2 of the inverter circuits 14 and 16, respectively. In the ULV retention state, for example, when the memory nodes Q1 and Q2 are at a low level and a high level, respectively, the FET m3 of the inverter circuit 14 is turned on and the intermediate node N3 is charged from the bias node N4 having a voltage of VFN. However, since the FET m3 has an N-type channel and the threshold voltage Vth of the FET m3 is positive, the charge potential from the bias node N4 is insufficient. This may cause the feedback effect of the FET m3, which is FBTr, to deteriorate, and the operational stability of the bistable circuit in the ULV retention state may decrease.

On the other hand, in the case that the FET m3 has a P-type channel (i.e., the different conductivity type channel) as in the comparative example 2, for example, when the memory nodes Q1 and Q2 are at a low level and a high level, respectively, the FET m3 of the inverter circuit 14 is turned on. The intermediate node N3 is charged from the bias node N4 having a voltage of VFN. Since the FET m3 has a P-type channel and a sufficiently low voltage relative to those applied to the source and the drain is applied to the gate of the FET m3, the intermediate node N3 can be pulled up to the VFN. This allows the feedback effect of the FET m3 to be produced sufficiently. Thus, the operational stability of the bistable circuit in the ULV retention state can be improved.

Next, it will be described that the comparative example 2 is of Type 1. In the comparative example 2, the VFN is set to a fixed bias of about VVDDL. When the VVDDH is applied to the power supply line 15a, the inverter circuits 14 and 16 enter the BI mode because the VFN is sufficiently low relative to the VVDDH. When the VVDDL is applied to the power supply line 15a, the inverter circuits 14 and 16 enter the ST mode because the VFN is high relative to the VGND and is equal to the VVDDL or close to the VVDDL. Thus, in the PDFB•header PS, the driver 26 is not required. Similarly, in the PUFB•footer PS, the driver 26 is not required.

In the comparative example 1, the number of transistors in the memory cell 10 is 14, and the driver 26 is provided. This increases the area of the circuit, as illustrated in FIG. 2. Because the feedback is applied by both the FBTrs (the FETs m3 and m3a) at the pull-up sides of the inverter circuits 14 and 16 and the pull-down sides of the inverter circuits 14 and 16, the noise margin in the ULV retention state is increased. This allows the VVDDL to be set to 0.15 V, for example, which may reduce the power consumption.

In the comparative example 2, the number of transistors in the memory cell 10 is 10 and the driver 26 is not required. This reduces the area of the circuit as illustrated in FIG. 4. However, because the feedback is applied only by the FBTr (the FET m3) at the pull-down side, the noise margin in the ULV retention state is smaller than that of the comparative example 1. As a result, the VVDDL becomes 0.2 V, for example. Thus, the power consumption is higher than that of the comparative example 1.

Embodiment 1

An embodiment 1 is an example of the PDFB, the different conductivity type channel FBTr, the header PS, Type 1. In the embodiment 1, the FET m1a, which is the load of the comparative example 2, and the FET m5, which is a pass transistor, are implemented by a single FET m4. This further reduces the number of transistors in the memory cell 10 to 8, which is even less than in the comparative example 2. Furthermore, the noise margin in the ULV retention can be increased.

[Description of the Memory Cell]

Figure 5:
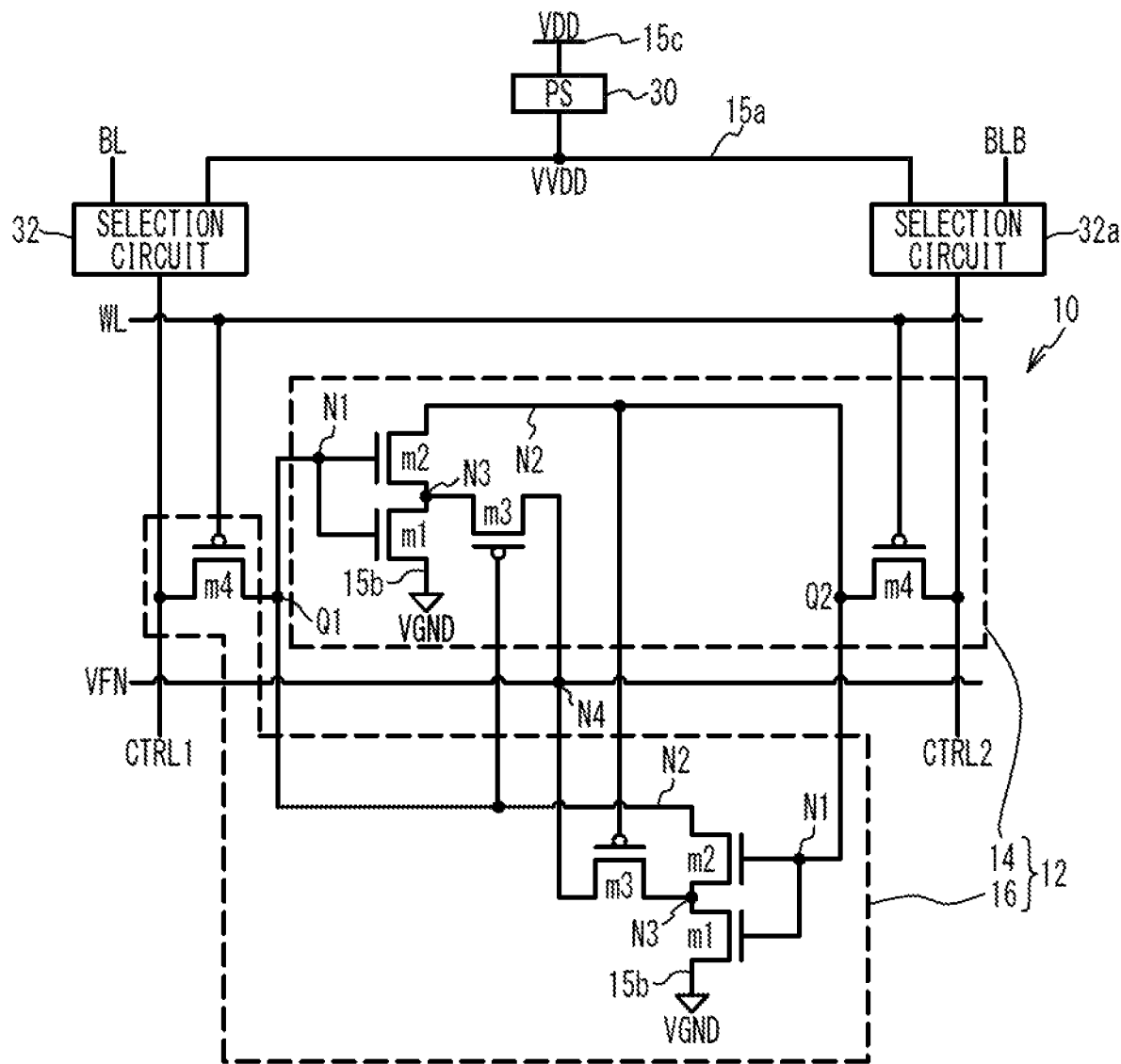
FIG. 5 is a circuit diagram of a memory cell in loop view in an embodiment 1.
Figure 6:
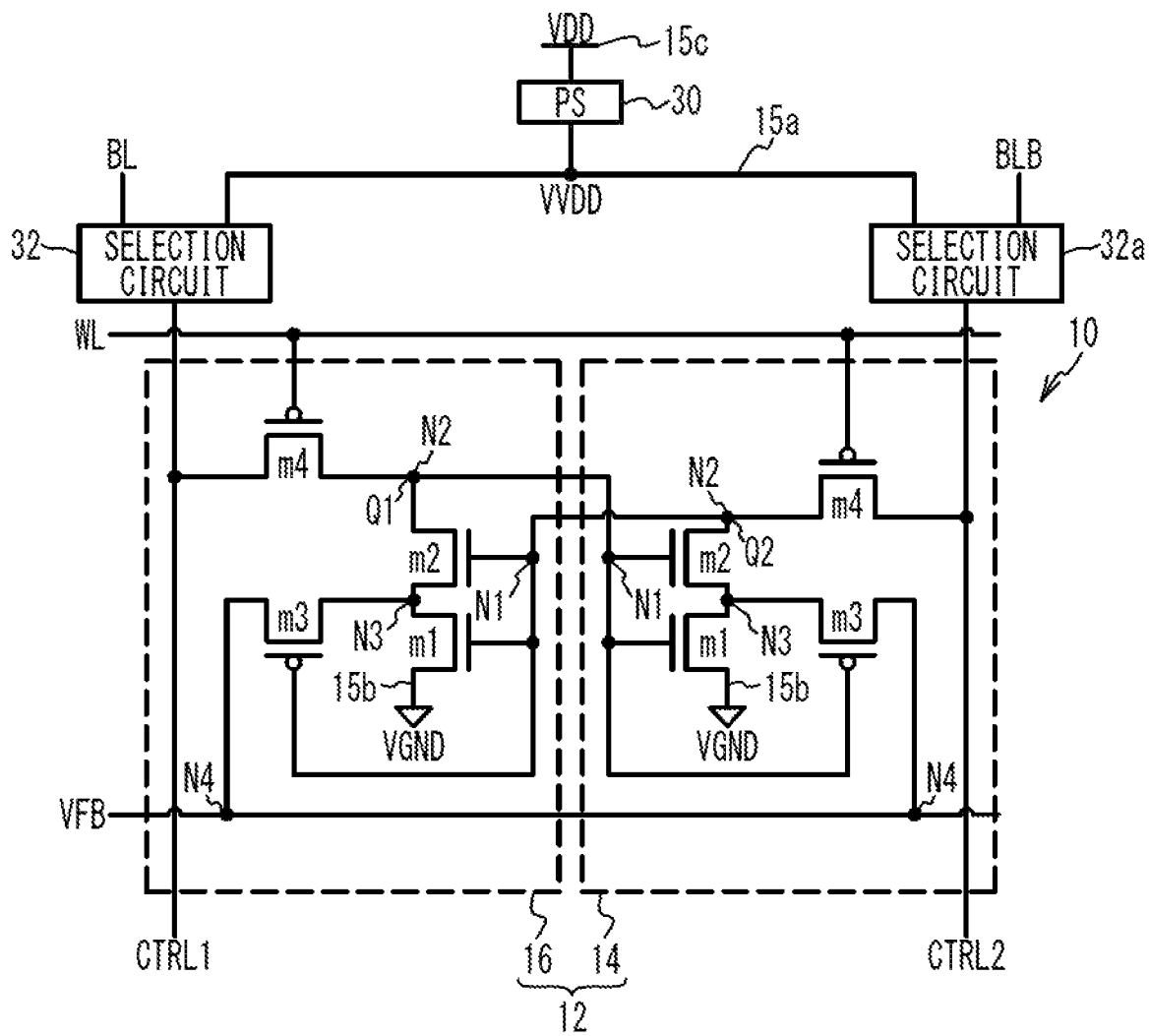
FIG. 6 is a circuit diagram of the memory cell in cross-coupled view in the embodiment 1.

FIG. 5 and FIG. 6 are circuit diagrams of a memory cell in the embodiment 1. FIG. 5 is a circuit diagram in loop view, and FIG. 6 is a circuit diagram in cross-coupled view.

As illustrated in FIG. 5 and FIG. 6, the memory cell 10 includes mainly the inverter circuits 14 and 16. The inverter circuits 14 and 16 are connected in a loop shape to form the bistable circuit 12. Each of the inverter circuits 14 and 16 includes FETs m1 to m4. The FETs m1 and m2 are N-channel MOSFETs, and the FETs m3 and m4 are P-channel MOSFETs. The FETs m1 to m4 are normally-off type transistors, for example.

In the FET m1, the source is coupled to the ground line 15b to which the ground voltage VGND is applied, the drain is coupled to the intermediate node N3, and the gate is coupled to input node N1. In the FET m2, the source is coupled to the intermediate node N3, the drain is coupled to the output node N2, and the gate is coupled to the input node N1. The FETs m1 and m2 are drivers.

In the FET m3, one of the source and the drain is coupled to the intermediate node N3, the other of the source and the drain is coupled to the bias node N4, and the gate is coupled to the input node N1. The FET m3 is a feedback transistor FBTr.

In the FET m4, one of the source and the drain is coupled to the output node N2, the other of the source and the drain is coupled to the control line CTRL1 or CTRL2, and the gate is coupled to the word line WL. The FET m4 functions as a pass transistor in the read/write state, and functions as a load in the VDD retention state and the ULV retention state.

The input node N1 of the inverter circuit 14 and the output node N2 of the inverter circuit 16 are coupled to the memory node Q1, and the input node N1 of the inverter circuit 16 and the output node N2 of the inverter circuit 14 are coupled to the memory node Q2. The memory nodes Q1 and Q2 are nodes complementary to each other. The memory node Q1 is coupled to the control line CTRL1 via the FET m4 of the inverter circuit 16, and the memory node Q2 is coupled to the control line CTRL2 via the FET m4 of the inverter circuit 14.

A selection circuit 32 connects the control line CTRL1 to either the bit line BL or the power supply line 15a (the virtual power supply line). A selection circuit 32a connects the control line CTRL2 to either the bit line BLB or the power supply line 15a. The power switch (PS) 30 converts the voltage VDD of the power supply 15c to the virtual power supply voltage VVDD and supplies it to the power supply line 15a.

[Description of the Memory Array]

Figure 7A:
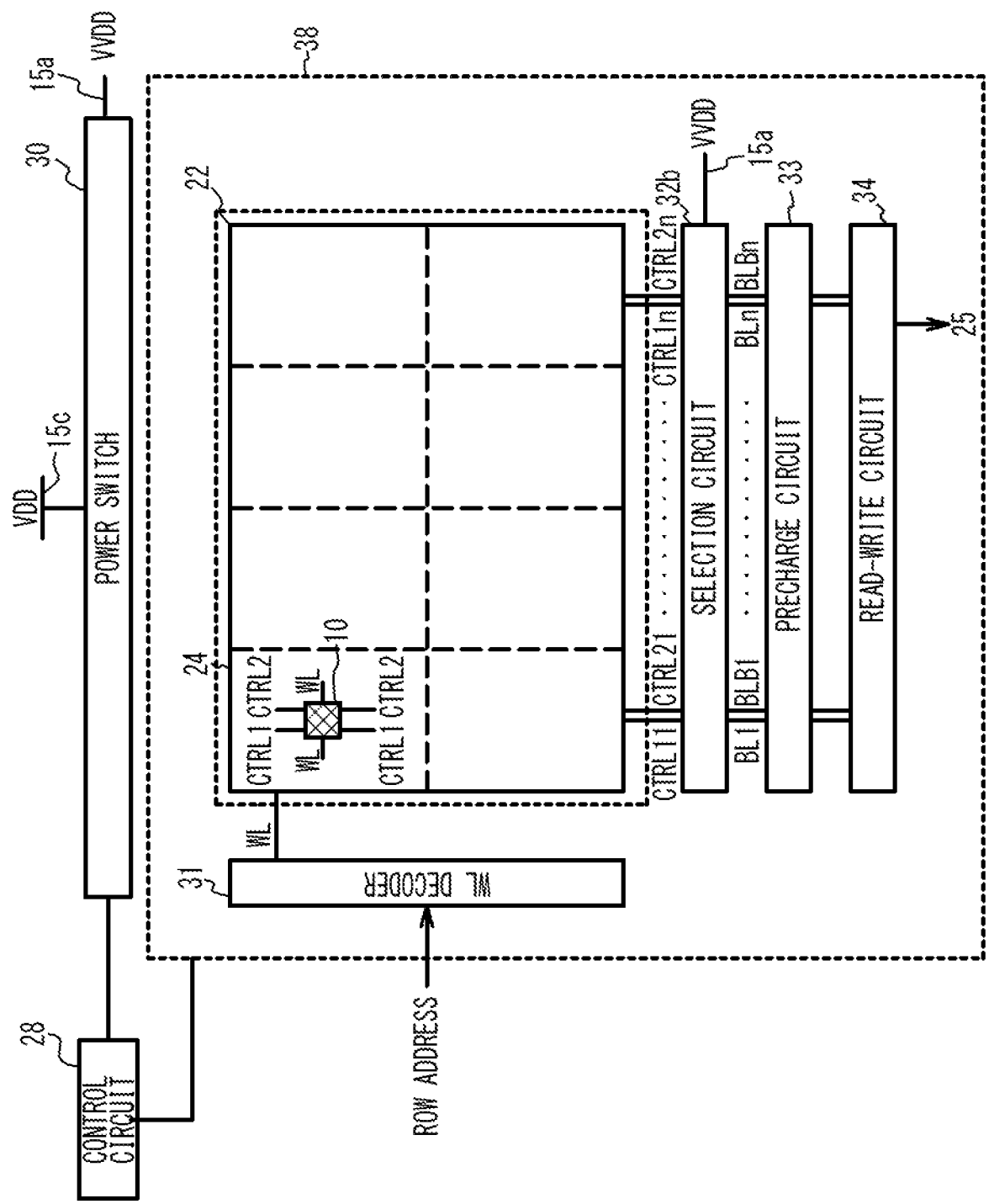
FIG. 7A is a block diagram of a memory array in the embodiment 1.

FIG. 7A is a block diagram of a memory array in the embodiment 1. As illustrated in FIG. 7A, a memory array 22 is divided into a plurality of blocks 24 each having the memory cell 10. The number of the blocks 24 can be designed as appropriate. A plurality of the memory cells 10 are arranged in a matrix form of n columns in the memory array 22. Within the memory array 22, the word line WL extends in the row direction and the control lines CTRL1 and CTRL2 extend in the column direction. The word line WL and the control lines CTRL1 and CTRL2 are coupled to each memory cell 10. In FIG. 7A, the control lines CTRL1 and CTRL2 of the first column to the n-th column are represented by control lines CTRL11 and CTRL21 to CTRL1n and CTRL2n, respectively.

A control circuit 28, the power switch 30, and a peripheral circuit 38 are provided so as to correspond to the memory array 22. The control circuit 28 controls the power switch 30 and the peripheral circuit 38.

The power switch 30 outputs, according to the control signal from the control circuit 28, the virtual power supply voltage VVDD obtained from the voltage VDD of the power supply 15c using a voltage-dividing circuit, for example. The voltage VVDD–VGND is the voltage applied to the bistable circuit 12. The peripheral circuit 38 includes a WL decoder 31, a selection circuit 32b, a precharge circuit 33, and a read-write circuit 34. In FIG. 7A, the selection circuits 32 and 32a in FIG. 5 and FIG. 6 will be described as the selection circuit 32b. The same applies to the following similar figures.

When the memory cell 10 retains data, the selection circuit 32b switches so that the control lines CTRL11 and CTRL21 to CTRL1n and CTRL2n are connected to the power supply line 15a. When data is read from or written in the memory cell 10, the selection circuit 32b switches so that the bit lines BL1 and BLB1 to BLn and BLBn are connected to the control lines CTRL11 and CTRL21 to CTRL1n and CTRL2n, respectively. The WL decoder 31 selects the word line WL on the basis of the row address. The column address is input to the read-write circuit 34. The read-write circuit 34 selects, from among the bit lines BL1 and BLB1 to BLn and BLBn, the bit lines BL and BLB corresponding to the column selected on the basis of the column address. The precharge circuit 33 precharges the bit lines BL and BLB. The read-write circuit 34 writes data in the bistable circuit 12 of the selected memory cell 10 or reads data from the bistable circuit 12 and outputs the read data to a bus 25.

Figure 7B:
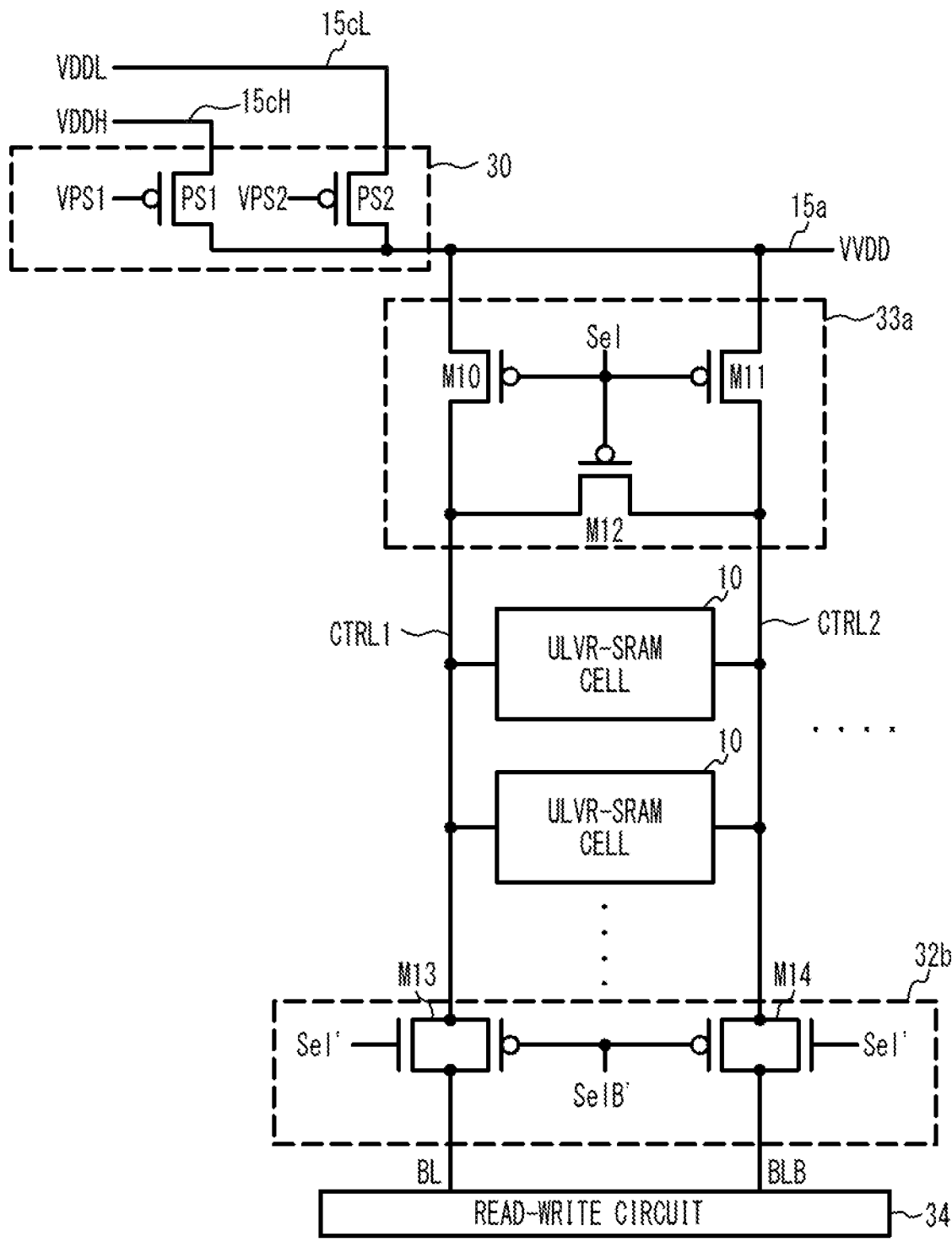
FIG. 7B illustrates a power switch and a selection circuit in the embodiment 1.

Another example of the peripheral circuit will be described with reference to FIG. 7B and FIG. 7C. FIG. 7B illustrates the power switch and the selection circuit in the embodiment 1. As illustrated in FIG. 7B, the power switch 30 includes FETs PS1 and PS2. The FETs PS1 and PS2 are P-channel FETs. The FET PS1 is connected between a power supply 15cH and the power supply line 15a, and the FET PS2 is connected between a power supply 15cL and the power supply line 15a. The power supply voltages VDDH and VDDL are supplied to the power supply 15cH and the power supply 15cL, respectively.

Signals VPS1 and VPS2 are input to the gates of the FETs PS1 and PS2, respectively. When the signals VPS1 and VPS2 are at a low level and a high level, respectively, the FETs PS1 and PS2 are turned on and turned off, respectively, and the virtual power supply voltage VVDD becomes the VDDH. The virtual power supply voltage VVDD becomes the VDDH in the read/write state and the VDD retention state, and the voltage VVDD−VGND is, for example, 1.2 V. When the signals VPS1 and VPS2 are at a high level and a low level, respectively, the FETs PS1 and PS2 are turned off and turned on, respectively, and the virtual power supply voltage VVDD becomes VDDL. The virtual power supply voltage VVDD becomes the VDDL in the ULV retention state, and the voltage VVDD−VGND is, for example, 0.2 V. When both the signals VPS1 and VPS2 are at a high level, both the FETs PS1 and PS2 are turned off and the virtual power supply voltage VVDD is cut off. The virtual power supply voltage VVDD is cut off in the shutdown state.

A precharge/selection circuit 33a is provided between the power supply line 15a and the control lines CTRL1 and CTRL2. The precharge/selection circuit 33a includes FETs M10 to M12. The FET M10 is connected between the power supply line 15a and the control line CTRL1. The FET M11 is connected between the power supply line 15a and the control line CTRL2. The FET M12 is connected between the control lines CTRL1 and CTRL2. The FETs M10 to M12 are P-channel FETs. A selection signal Sel is input to the gates of the FETs M10 to M12. The selection circuit 32b is provided between the control lines CTRL1 and CTRL2 and the bit lines BL and BLB coupled to the read-write circuit 34. The selection circuit 32b includes transfer gates M13 and M14. The transfer gate M13 is connected between the bit line BL and the control line CTRL1. The transfer gate M14 is connected between the bit line BLB and the control line CTRL2. A selection signals Sel' and a complementary signal SelB' of the selection signals Sel' are input to the transfer gates M13 and M14.

Figure 7C:
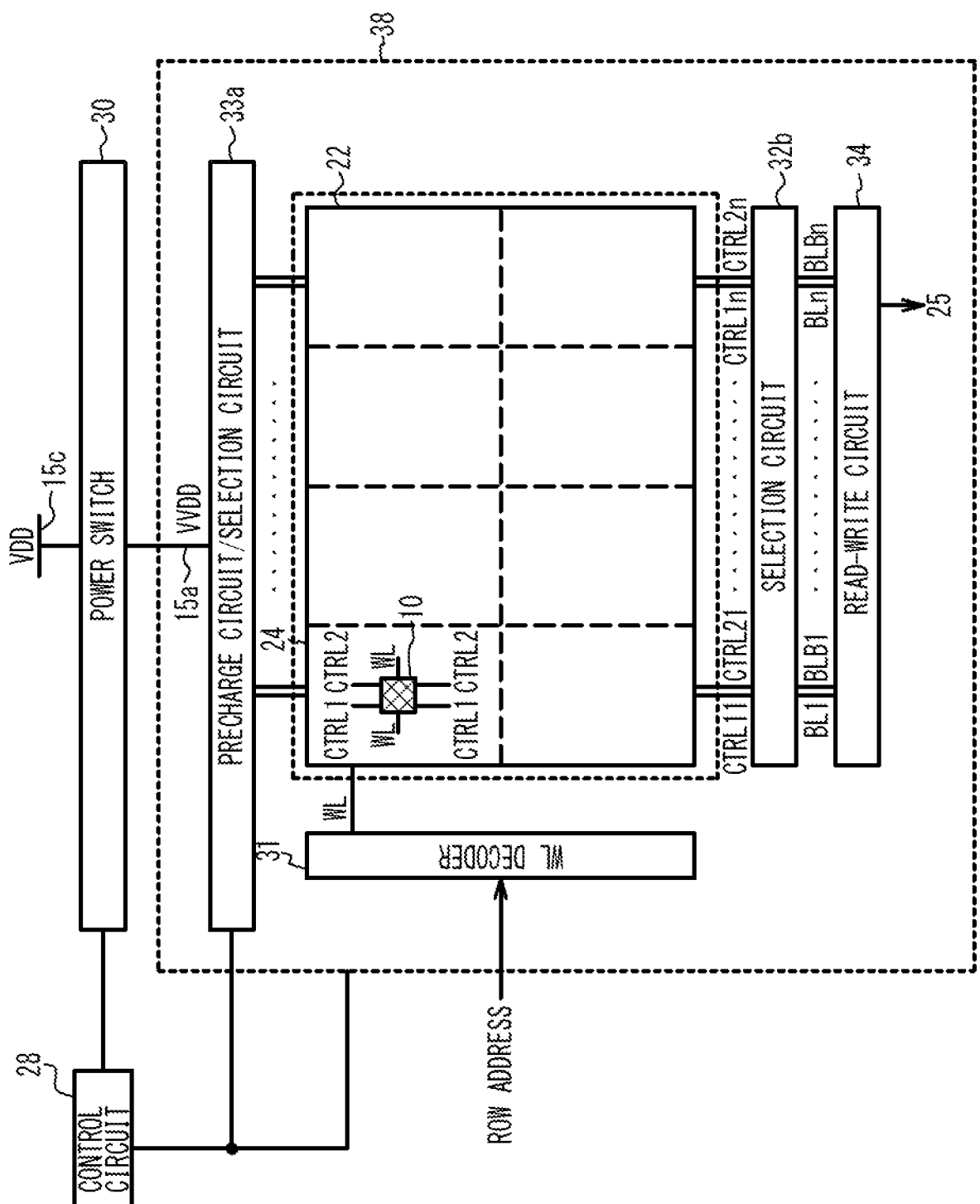
FIG. 7C is a block diagram illustrating another example of the memory array in the embodiment 1.

FIG. 7C is a block diagram illustrating another example of the memory array in the embodiment 1. As illustrated in FIG. 7C, the precharge/selection circuit 33a is provided between the power switch 30 and the memory array 22. The precharge/selection circuit 33a includes the FETs M10 to M12 of FIG. 7B, and the selection circuit 32b includes the transfer gates M13 and M14 of FIG. 7B.

When the selection signal Sel is at a low level, the FETs M10 to M12 are turned on, and the virtual power supply voltage VVDD is supplied to the control lines CTRL1 and CTRL2. When the selection signal Sel is at a high level, the FETs M10 to M12 are turned off. When the FETs M10 to M12 are OFF, and the selection signal Sel' is at a high level, the transfer gates M13 and M14 are turned on and the control lines CTRL1 and CTRL2 function as the bit lines BL and BLB. When the FETs M10 to M12 are ON and the selection signal Sel' is at a low level, the transfer gates M13 and M14 are turned off and the control lines CTRL1 and CTRL2 are disconnected from the bit lines BL and BLB. As described above, the precharge/selection circuit 33a may be connected to the ends of the control lines CTRL1 and CTRL2, and the selection circuit 32b may be connected to the other ends of the control lines CTRL1 and CTRL2.

The control circuits 28 of the electronic circuits of FIG. 7A and FIG. 7C control the power switch 30, and set, in the ULV retention state in which the bistable circuit 12 retains data, the voltage VL (0.2 V) of the voltage VVDD−VGND in Table 3 of the embodiment 1 lower than the voltage VH (1.2 V) in the read/write state (a second state). This can reduce the power consumption in the ULV retention state.

Table 3 is a table presenting the states in the embodiment 1.

TABLE 3

| State | VCTRL | Mode | VVDD | VVDD − VGND | Selection | VWL |
|---|---|---|---|---|---|---|
| Read/write | VFN (0.2 V) | BI | VVDDH (1.2 V) | VH (1.2 V) | BL | V1 (0.25 V) |
| VDD retention | VFN (0.2 V) | BI | VVDDH (1.2 V) | VH (1.2 V) | VVDD | V2 (1.1 V) |
| ULV retention | VFN (0.2 V) | ST | VVDDL (0.2 V) | VL (0.2 V) | VVDD | V3 (0.2 V) |

The bias node N4 is a constant voltage VFN (e.g., 0.2 V). In the read/write state, the selection circuit 32b connects the bit line BL (the bit lines BL and BLB in FIG. 5 and FIG. 6) to the control line CTRL (the control lines CTRL1 and CTRL2 in FIG. 5 and FIG. 6). The power switch 30 sets the virtual power supply voltage VVDD to the VVDDH (e.g., 1.2 V). The voltage VVDD−VGND becomes the VH (e.g., 1.2 V). In the read state, the bit lines BL and BLB become about the VVDDH. In the write state, one of the bit lines BL and BLB becomes about the VVDDH, and the other becomes about the VGND. The high levels of the memory nodes Q1 and Q2 become about the VVDDH, and the low levels become about the VGND. The inverter circuits 14 and 16 enter the BI mode.

The voltage VWL of the word line WL of the memory cell 10 subject to read or write is set to the voltage V1 (e.g., 0.25 V). The voltage V1 is set to a voltage at which the FET m4 is turned on regardless of whether the memory nodes Q1 and Q2 are at a high level or a low level. This makes it possible to read and write data from and in the memory cell 10.

In the VDD retention state, the selection circuit 32b connects the power supply line 15a to the control line CTRL (the control lines CTRL1 and CTRL2 in FIGS. 5 and 6). The power switch 30 sets the virtual power supply voltage VVDD to the VVDDH (e.g., 1.2 V). The voltage VVDD−VGND becomes the VH (e.g., 1.2 V). The inverter circuits 14 and 16 enter the BI mode.

The voltage VWL of the word line WL is set to the voltage V2 (e.g., 1.1 V). Since the voltage V2 is slightly lower than the VVDDH, the FET m4 is slightly turned on regardless of whether the memory nodes Q1 and Q2 are at a high level or a low level. As a result, the FET m4 functions as the loads of the inverter circuits 14 and 16. In the VDD retention state, the data in the bistable circuit 12 is retained.

In the ULV retention state, the selection circuit 32b connects the power supply line 15a to the control line CTRL (the control lines CTRL1 and CTRL2 in FIGS. 5 and 6). The power switch 30 sets the virtual power supply voltage VVDD to the VVDDL (e.g., 0.2 V). The voltage VVDD−VGND becomes the VL (e.g., 0.2 V). The inverter circuits 14 and 16 enter the ST mode.

The voltage VWL of the word line WL is set to the voltage V3 (e.g., 0.2 V). When the voltage V3 is applied to the gate, the FETm4 is turned off regardless of whether the memory nodes Q1 and Q2 are at a high level or a low level, but the leakage current of the FET m4 causes the FET m4 to function as the loads of the inverter circuits 14 and 16. In the ULV retention state, the data in the bistable circuit 12 is retained at an ultra-low voltage. This can reduce the power consumption due to leakage current.

[Simulation 1]

Simulation 1 is a simulation of the SNM (Static Noise Margin) and the standby power in the VDD retention state and at the time of read in the read/write state.

The simulation was performed for the embodiment 1, the comparative example 2, and a comparative example 3 that is an SRAM cell (6T) using 6 transistors. The simulation conditions are as follows.

The channel width W/the length L of each FET in the embodiment 1 are as follows.
 FETs m1 and m2 (drivers): 100 nm/60 nm
 FET m3 (feedback transistor): WFB/60 nm
 FET m4 (pass transistor/load): WLP/60 nm
Each voltage in the embodiment 1 is as follows.
 VVDDH=1.2 V
 VGND=0 V
 VFN=0.2 V
 VWL=1.1 V or 0.25 V
The channel width W/the length L of each FET in the comparative example 2 are as follows.
 FETs m1 and m2 (drivers): 165 nm/60 nm
 FET m1a (load): 100 nm/60 nm
 FET m3 (feedback transistor): 120 nm/60 nm
 FET m5 (pass transistor): 100 nm/60 nm
Each voltage in the comparative example 2 is as follows.
 VVDDH=1.2 V
 VGND=0 V
 VFN=0.2 V
The channel width W/the length L of each FET in the comparative example 3 are as follows.
 Driver: 150 nm/60 nm
 Load: 100 nm/60 nm
 Pass transistor: 100 nm/60 nm
Each voltage in the comparative example 3 is as follows.
 VVDD =1.2 V
 VGND=0 V In the embodiment 1, the virtual power supply voltage VVDD is supplied to the memory cell 10 from the control lines CTRL1 and CTRL2. Therefore, the noise margin and the standby power are determined by the size of the FET m4 and the voltage VWL of the word line WL in the VDD retention state. Further, since the VFN is set to a fixed bias, feedback is applied by the FETm3 even in the BI mode, although it is weaker than in the ST mode. Therefore, the noise margin can be designed using the size of the FET m3.

The SNM (Static Noise Margin) and the standby power in the VDD retention state were simulated for different sizes (the channel width WLP) of the FET m4 and different sizes (the channel width WFB) of the FET m3. The standby power corresponds to the sum of the leakage current of each FET in the state in which data is retained. In addition, the SNM and standby power in the VDD retention state were simulated for different voltages VWL of the word line WL. The SNM is a noise margin, and when the SNM is small, the data in the bistable circuit 12 is likely to be inverted by noise or the like, and when the SNM is large, the data in the bistable circuit 12 is less likely to be inverted by noise or the like. As a measure of the SNM, an SNM of 80 mV or greater was targeted.

Figure 8A:
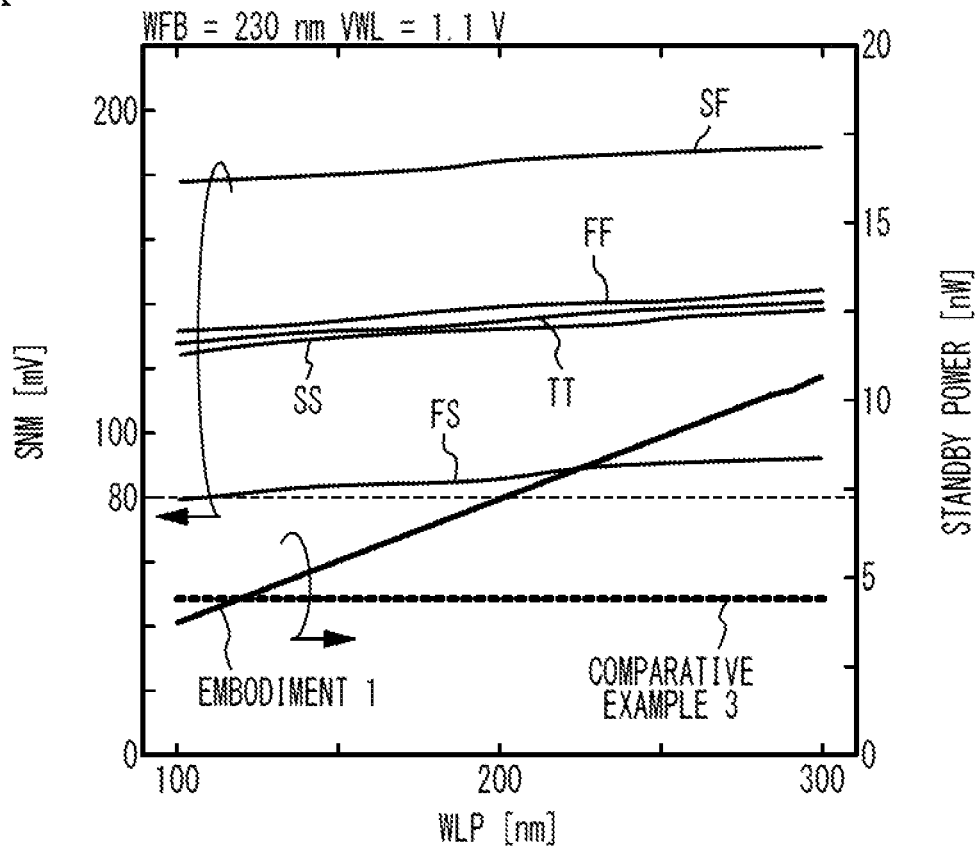
FIG. 8A and FIG. 8B present the SNM and the standby power of the embodiment 1 with respect to WLP and WFB in a VDD retention state.
Figure 8B:
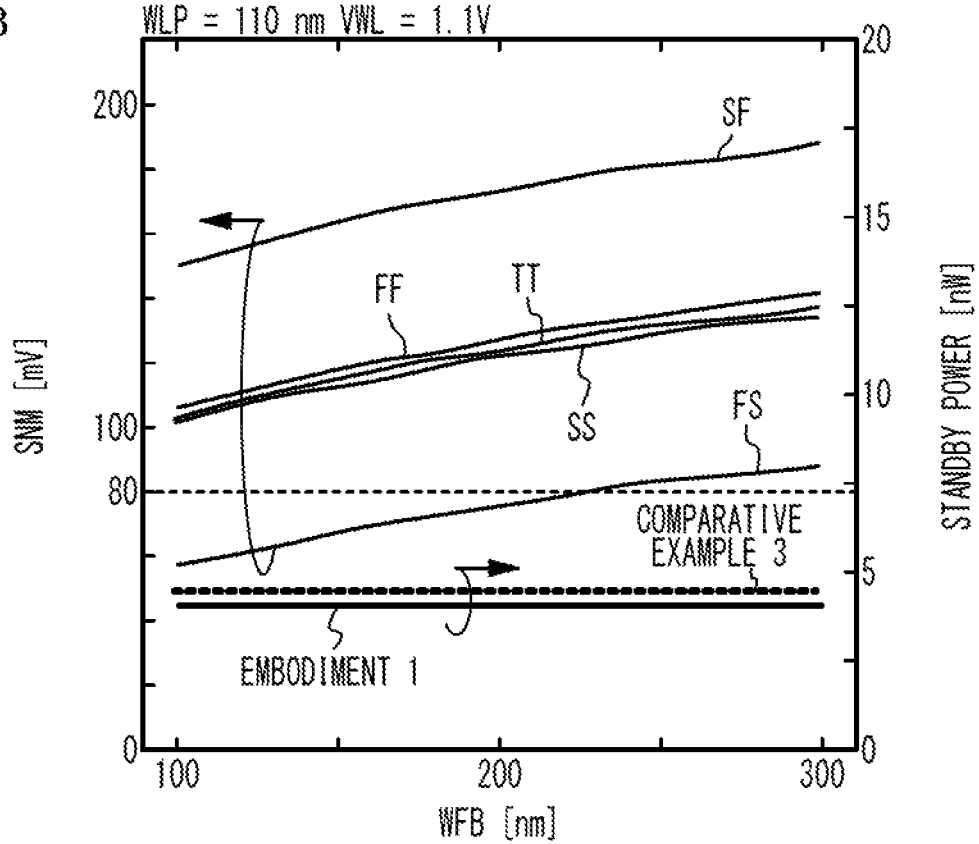

FIG. 8A and FIG. 8B present the SNM and the standby power of the embodiment 1 with respect to the WLP and the WFB in the VDD retention state. The TT of the SNM is the SNM when the threshold voltages of the PFET and the NFET are Typical. The FF of the SNM is the SNM when both the threshold voltages of the PFET and the NFET are shifted by 3σ from the Typical value to the Fast (F) side (the lower side) because of the process fluctuation. The SS of the SNM is the SNM when both the threshold voltages of the PFET and the NFET are shifted by 3σ from the Typical value to the Slow (S) side (the higher side) because of the process fluctuation. The FS and the SF of the SNM are the SNMs when one of the threshold voltages of the PFET and the NFET is shifted by 3σ from the Typical value to the F side, and the other is shifted by 3σ from the Typical value to the S side. If the SNMs of the TT, the FF, the SS, the FS, and the SF are secured, the SNMs can be secured even if the threshold voltages of the PFETs and the NFETs vary within a range of ±3σ. In the comparative example 3, the channel width W of the pass transistor is constant.

As presented in FIG. 8A, the WLP is varied from 100 nm to 300 nm when the WFB is 230 nm and the VWL is 1.1 V. As the WLP increases, the SNM increases. At a WLP of 100 nm or greater, all SNMs are 80 mV or greater. As the SNM increases, the standby power increases. The standby power of the embodiment 1 becomes smaller than that of the comparative example 3 (6T) when the WLP is 110 nm or less. Therefore, the WLP is set to 110 nm.

As presented in FIG. 8B, the WFB is varied from 100 nm to 300 nm when the WLP is 110 nm and the VWL is 1.1 V. As the WFB increases, the SNM increases. At a WFB of 230 nm or greater, all SNMs are 80 mV or greater. The standby power of the embodiment 1 does not depend on the WFB and is smaller than that of the comparative example 3 in any WFB. Because of the above, the WFB is set to 230 nm.

Figure 9A:
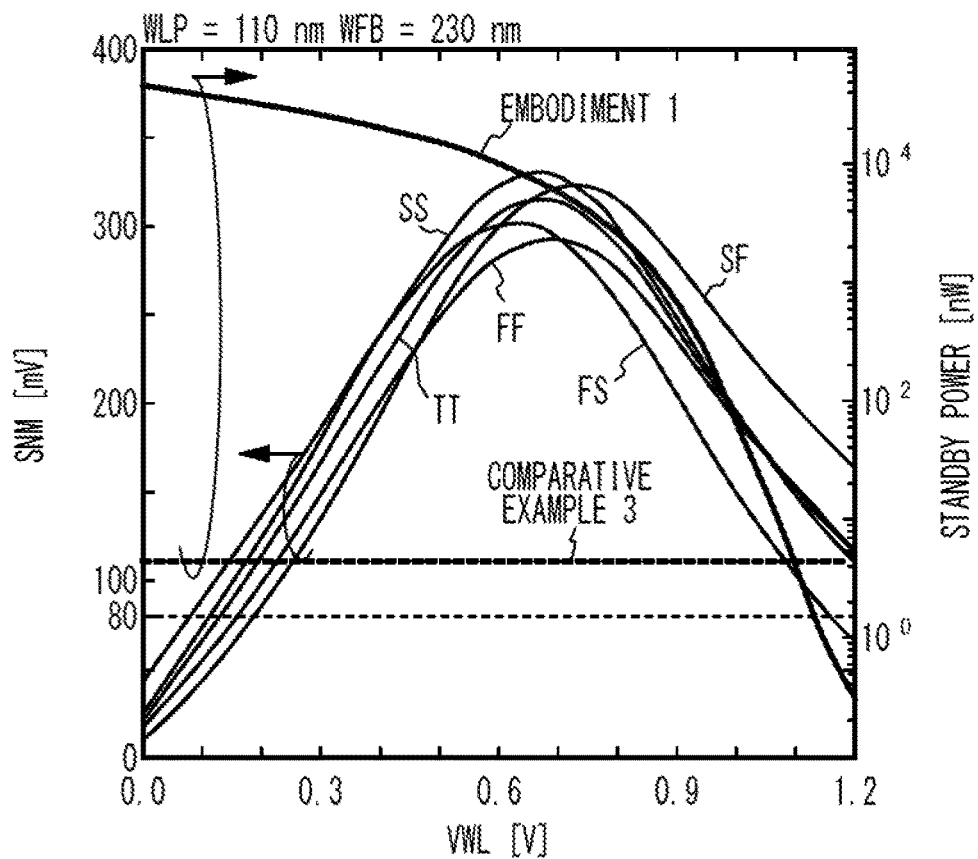
FIG. 9A and FIG. 9B present the SNMs and the standby power of the embodiment 1 and a comparative example 3 with respect to VWL in the VDD retention state and in a read of a read/write state.
Figure 9B:
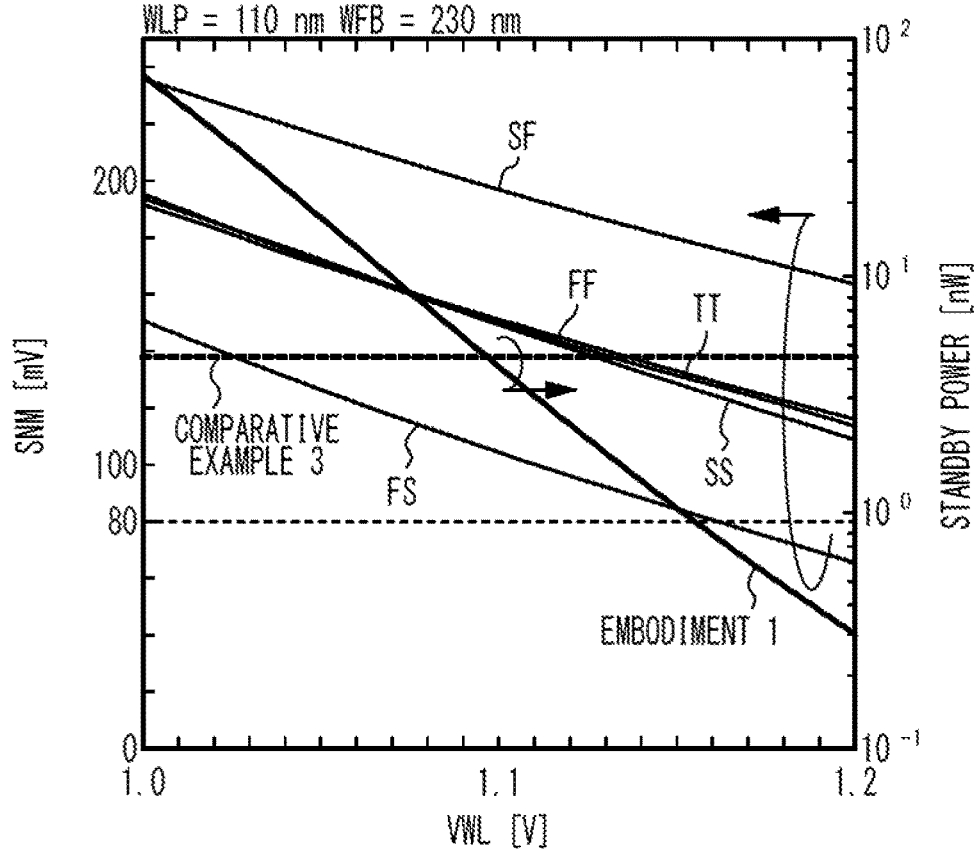

FIG. 9A and FIG. 9B present the SNMs and the standby power of the embodiment 1 and the comparative example 3 with respect to the VWL in the VDD retention state and the read/write state. FIG. 9B is an enlarged view of FIG. 9A around a VWL of 1.1 V. An SNM of 80 mV or greater was targeted. An SNM of 80 mV is indicated by a broken line.

As presented in FIG. 9A, the VWL is varied from 0 V to 1.2 V when WLP is 110 nm and the WFB is 230 nm. The SNM has a peak around a VWL of 0.7 V, the SNM becomes smaller when the VWL becomes smaller than 0.7 V, and the SNM becomes smaller when the VWL becomes larger than 0.7 V. As the VWL decreases, the standby power increases.

As presented in FIG. 9B, at a VWL of 1.1 V or greater, the standby power of the embodiment 1 is smaller than that of the comparative example 3. At a VWL of 1.15 V or less, all SNMs are 80 mV or greater. Therefore, the VWL in the VDD retention state was set to 1.1 V.

In the read/write state, the VWL is lowered to turn on the FET m4. However, it is preferable that the SNM is large. As presented in FIG. 9A, at a VWL of 0.25 V or greater, all SNMs are 80 mV or greater. Therefore, the VWL was set to 0.25 V.

For the embodiment 1 and the comparative examples 2 and 3, the SNMs in the read/write state and the VDD retention state were simulated. In the embodiment 1, the WLP was set to 110 nm, the WFP was set to 230 nm, the VWL in the VDD retention state was set to 1.1 V, and the VWL in the read/write state was set to 0.25 V.

Figure 10A:
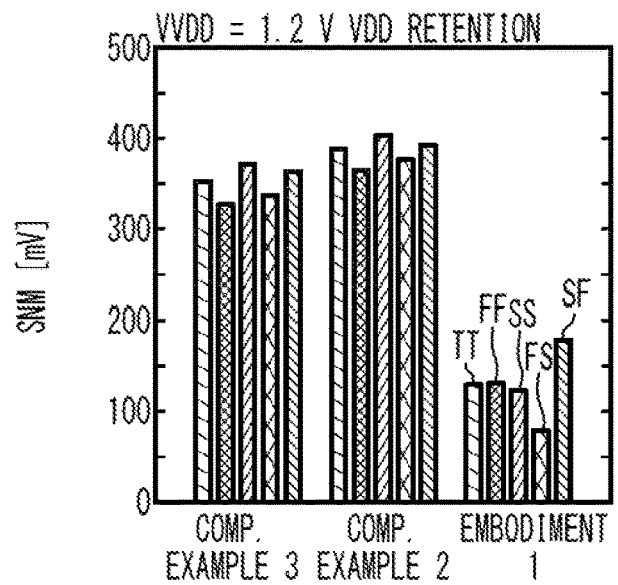
FIG. 10A to FIG. 10C present the SNMs of the embodiment 1 and the comparative examples 2 and 3 in the VDD retention state and the read/write state.
Figure 10B:
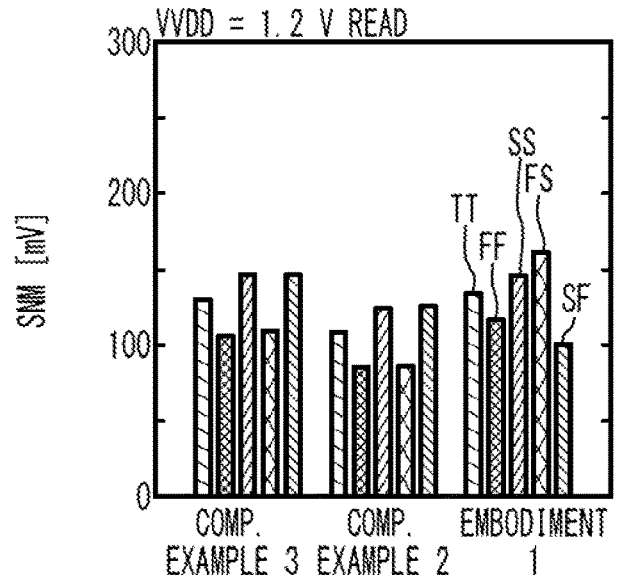
Figure 10C:
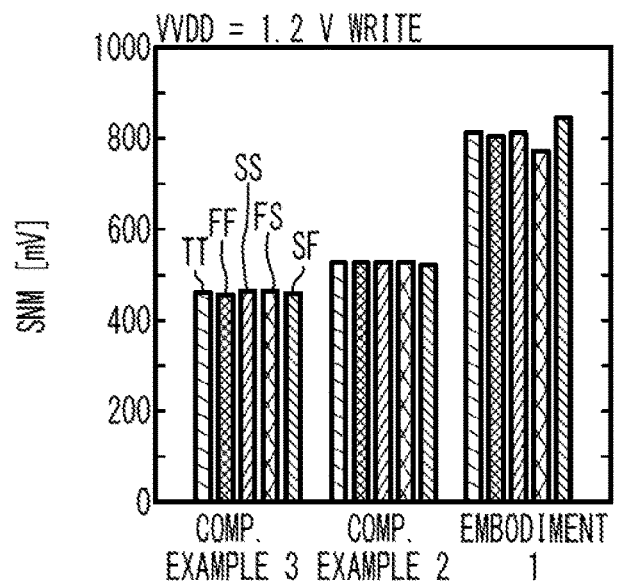

FIG. 10A to FIG. 10C present the SNMs of the embodiment 1 and the comparative examples 2 and 3 in the VDD retention state and the read/write state. FIG. 10A presents the SNMs in the VDD retention state, FIG. 10B presents the SNMs at the time of reading in the read/write state, and FIG. 10C presents the SNMs at the time of writing in the read/write state.

As presented in FIG. 10A, in the VDD retention state, the SNM of the embodiment 1 is smaller than those of the comparative examples 2 and 3, but is greater than 80 mV in all SNMs. As presented in FIG. 10B, in the read, the SNM of the embodiment 1 is almost the same as those of the comparative examples 2 and 3, and is greater than 80 mV in all SNMs. As presented in FIG. 10C, in the write, the SNM of the embodiment 1 is greater than those of the comparative examples 2 and 3, and is greater than 80 mV in all SNMs. As seen from the above, in the embodiment 1, all SNMs are greater than 80 mV. In addition, the SNM of the TT is greater than 100 mV. As seen from the above, in the embodiment 1, a sufficient noise margin can be secured in the read/write state and the VDD retention state. The optimization of the VWL in FIG. 9A and FIG. 9B is performed in the VDD retention state and in the read of the read/write state, but as presented in FIG. 10A to 10C, the SNM can also be increased in the write of the read/write state.

[Simulation 2]

Simulation 2 is a simulation of the transfer characteristics of the inverter circuits 14 and 16 in the ULV retention state, the butterfly curve of the bistable circuit 12, the SNM, and the standby power.

The channel width W/the length L of each FET and each voltage not specifically described are the same as those in simulation 1. In the embodiment 1, the WLP was set to 110 nm and the WFP was set to 230 nm. In the comparative example 3, the VVDD is 0.2 V.

For the embodiment 1, the transfer characteristics of the inverter circuits 14 and 16 in the ULV retention state were simulated for different voltages VWL of the word line WL.

Figure 11:
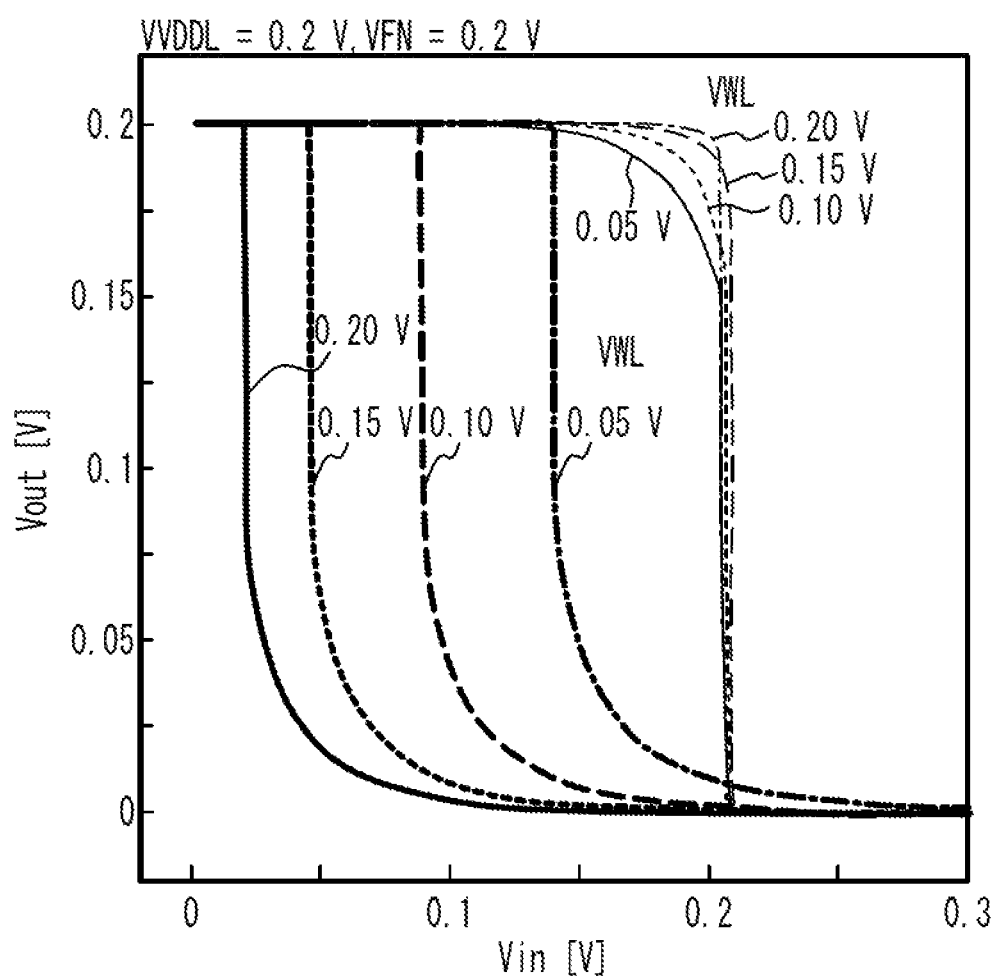
FIG. 11 presents the transfer characteristics of an inverter circuit of the embodiment 1 in a ULV retention state.

FIG. 11 presents the transfer characteristics of the inverter circuit of the embodiment 1 in the ULV retention state, and presents the output voltages Vout (the output node N2) with respect to the input voltages Vin (the voltages of the input nodes N1) of the inverter circuits 14 and 16.

As presented in FIG. 11, in the forward sweep in which the Vin is increased, as the VWL is increased, the threshold voltage at which the output voltage Vout shifts from a high level to a low level shifts to a higher Vin. In the backward sweep in which the Vin is lowered, as the VWL is increased, the threshold voltage at which the output voltage Vout shifts from a low level to a high level shifts to a lower Vin. In the backward sweep, as the VWL is increased, the threshold voltage shifts to a further lower Vin.

Figure 12A:
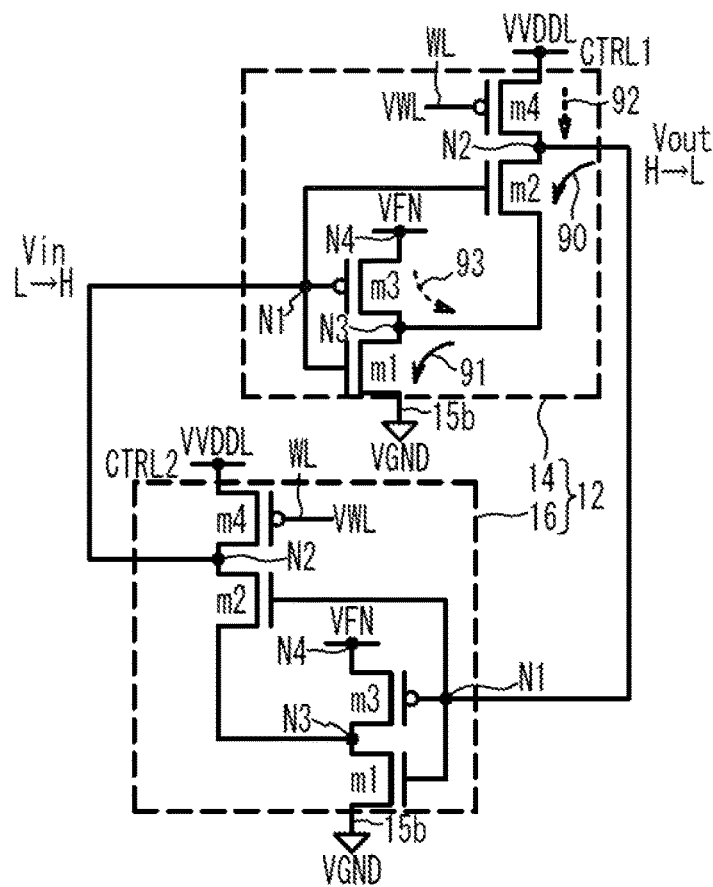
FIG. 12A and FIG. 12B are circuit diagrams of a bistable circuit in the embodiment 1.
Figure 12B:
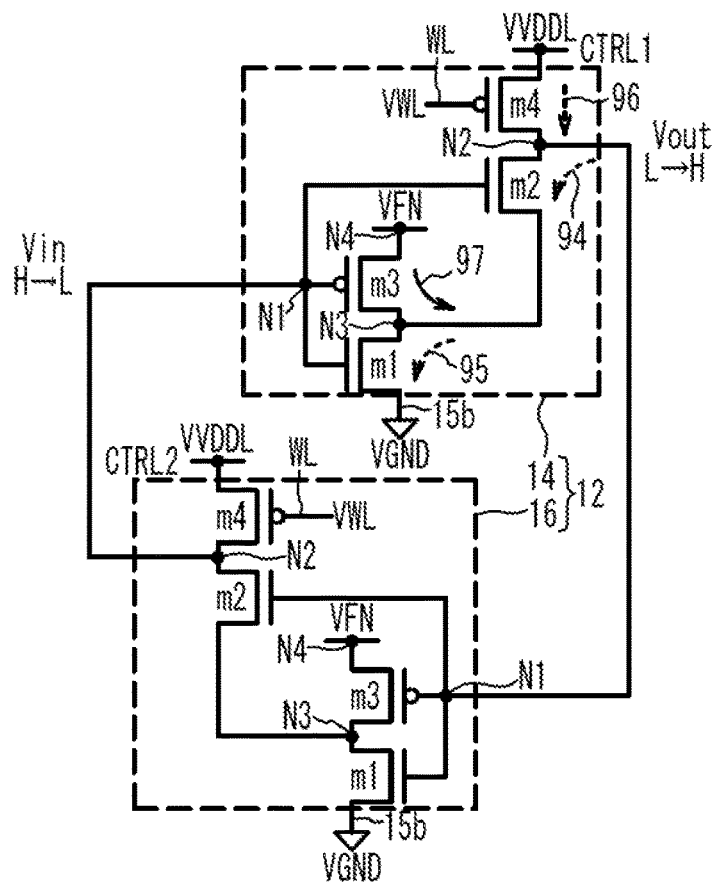

FIG. 12A and FIG. 12B are circuit diagrams of the bistable circuit in the embodiment 1. The circuit of the bistable circuit 12 is a circuit diagram in the ULV retention state in FIG. 5 and FIG. 6, and is displayed so that the principle can be easily understood. In FIG. 12A and FIG. 12B, the input voltage Vin and the output voltage Vout of the inverter circuit 14 will be described.

The forward sweep will be described with reference to FIG. 12A. In the initial state, the input voltage Vin is a low level (e.g., 0 V) and the output voltage Vout is a high level (e.g., 0.2 V). In this state, in the inverter circuit 14, the FETs m1 and m2 are OFF, and the FET m3 is ON. The FET m4 is OFF at a VWL of 0.2 V, but a leakage current flows. When the VWL is lower than 0.2 V, the FET m4 is turned on. Therefore, the output node N2 is charged from the VVDDL of the control line CTRL1 by the leakage current or the on-current of the FET m4 as indicated by a dotted arrow 92, and the intermediate node N3 is charged by the VFN of the bias node N4 as indicated by a dotted arrow 93.

To cause the output voltage Vout to be a low level when the input voltage Vin becomes high, discharge from the output node N2 to the intermediate node N3 is performed as indicated by a solid line arrow 90. However, unless discharge from the intermediate node N3 to the ground line 15b indicated by a solid line arrow 91 is performed, discharge from the output node N2 to the intermediate node N3 is impossible. Therefore, the output node N2 is discharged after the intermediate node N3 is discharged, and thereby, the threshold voltage at which the output voltage Vout becomes a low level shifts to a higher Vin.

The backward sweep will be described with reference to FIG. 12B. In the initial state, the input voltage Vin is a high level (e.g., 0.2 V) and the output voltage Vout is a low level (e.g., 0 V). In this state, in the inverter circuit 14, the FETs m1 and m2 are ON, and the FETs m3 and m4 are OFF. Therefore, the intermediate node N3 is discharged to the ground line 15b as indicated by a dotted arrow 95. The FET m4 is OFF at a VWL of 0.2 V, but a leakage current flows. When the VWL is lower than 0.2 V, the FET m4 is turned on weakly. Since the discharge via the FET m2 indicated by a dotted arrow 94 is faster than the charge via the FET m4 indicated by a dotted arrow 96, the output node N2 is discharged to the intermediate node N3.

When the input voltage Vin becomes low, the FET m1 is turned off and the FET m3 is turned on, and therefore, the intermediate node N3 is charged by the VFN of the bias node N4 as indicated by a solid arrow 97. When the FET m2 is OFF and the FET m4 is OFF or is weakly turned on, the output node N2 is charged from the VVDDL of the control line CTRL1 as indicated by the dotted arrow 96. However, since the output node N2 is charged with a current close to the off-current of the FET m4, charging depends on the VWL. Thus, the threshold voltage at which the output voltage Vout becomes a high level shifts to a lower Vin as the VWL is increased. In particular, the VWL is applied to the gate of the FET m4. Therefore, the magnitude of the current of the dotted arrow 96 depends on the VWL. When the VWL is high, the current of the FET m4 is small, and therefore, the threshold voltage further shifts to a lower Vin.

The butterfly curves in the bistable circuits 12 of the embodiment 1, the comparative examples 2 and 3 were simulated. In the embodiment 1, the VWL was set to 0.2 V.

Figure 13A:
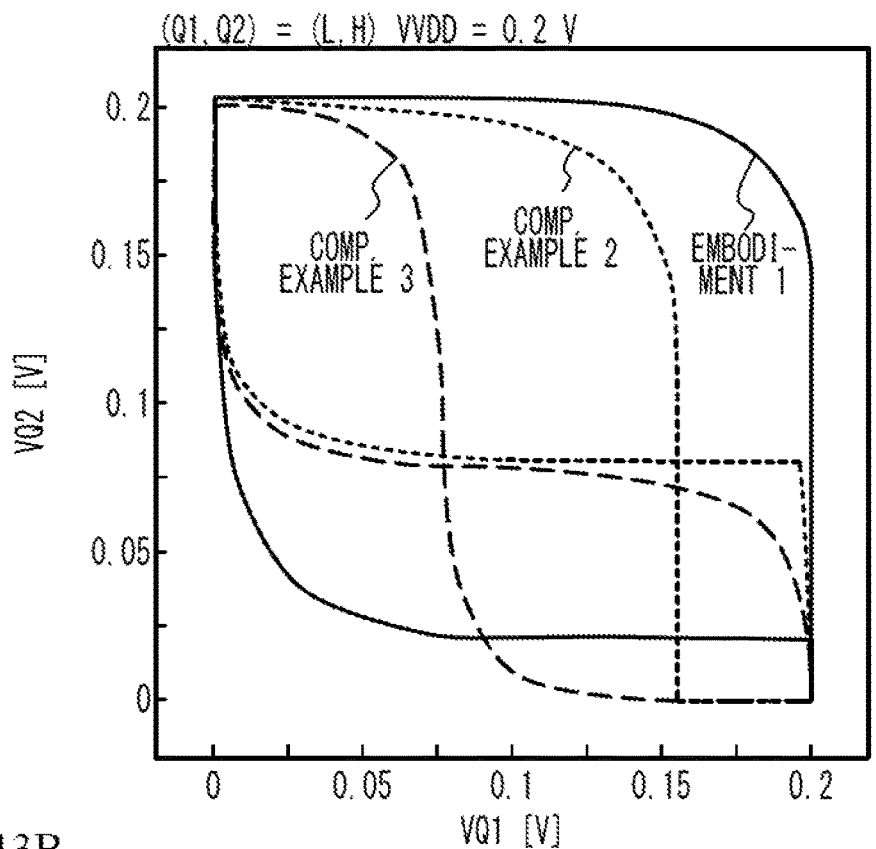
FIG. 13A and FIG. 13B present the butterfly curves of the bistable circuits of the embodiment 1 and the comparative examples 2 and 3 in the ULV retention state.
Figure 13B:
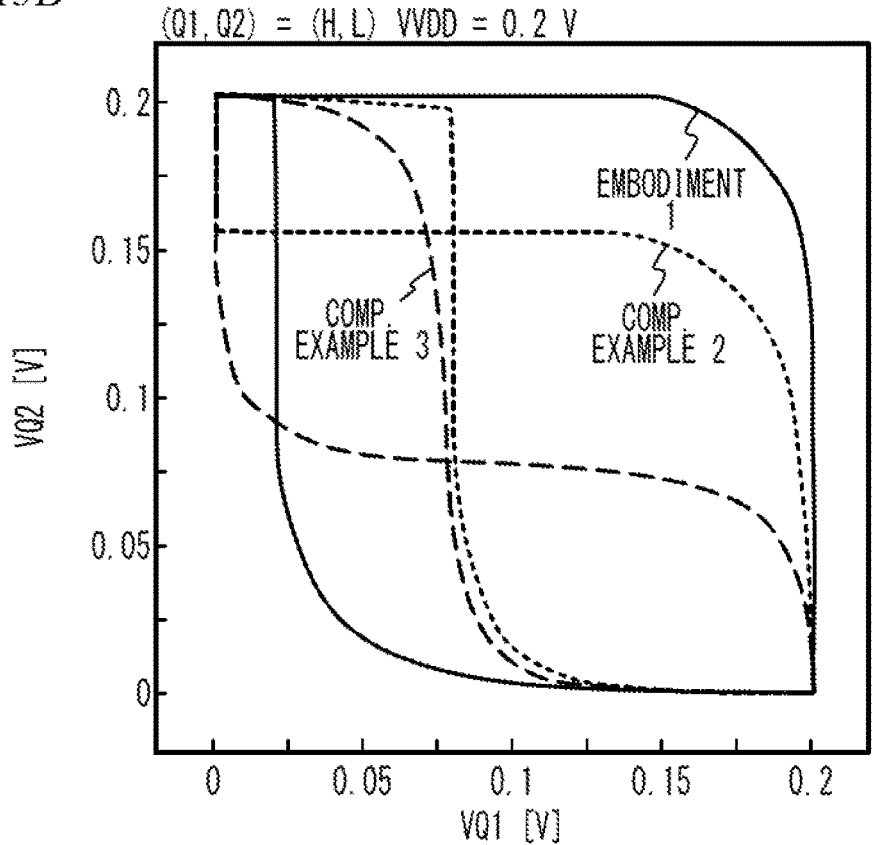

FIG. 13A and FIG. 13B present the butterfly curves of the bistable circuits of the embodiment 1 and the comparative examples 2 and 3 in the ULV retention state. In FIG. 13A, the operating point is when the Q1 is at a low level and the Q2 is at a high level, and in FIG. 13B, the operating point is when the Q1 is at a high level and the Q2 is at a low level.

As presented in FIG. 13A and FIG. 13B, in the 6T-RAM of the comparative example 3, the opening (lobe) of the butterfly curve is narrow and the noise margin is small. In the comparative example 2, the opening at the operating point side is wider and the noise margin is larger. In the embodiment 1, the opening at the operating point side is wider than that of the comparative example 2, and the noise margin is larger than that of the comparative example 2.

The SNMs of the embodiment 1 and the comparative examples 2 and 3 in the ULV retention state were simulated.

Figure 14A:
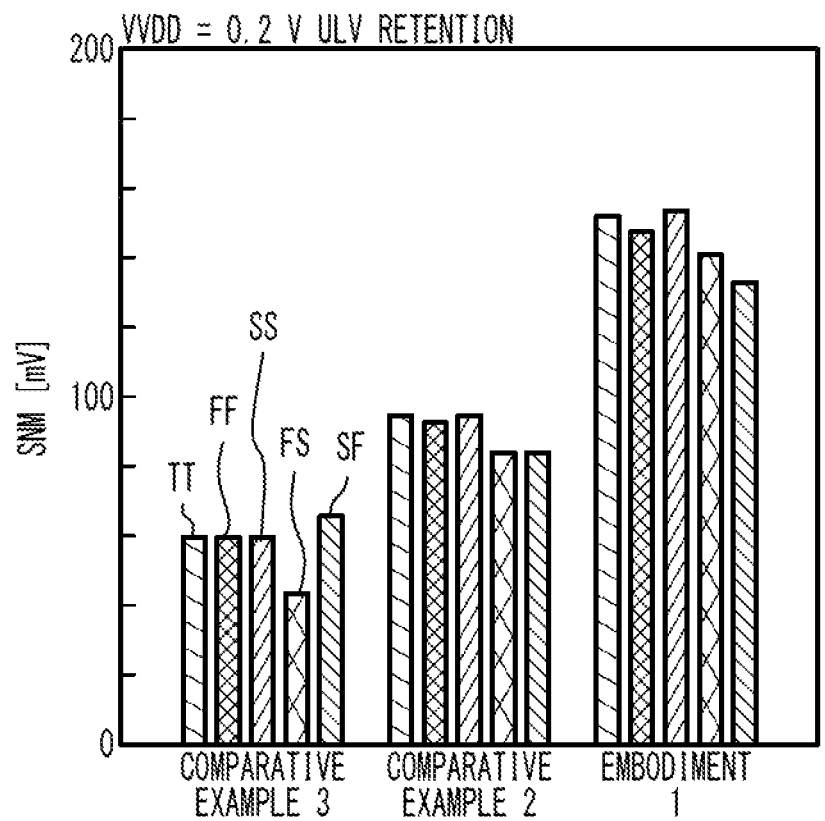
FIG. 14A presents the SNMs of the embodiment 1 and the comparative examples 2 and 3 in the ULV retention state.

FIG. 14A presents the SNMs of the embodiment 1 and the comparative examples 2 and 3 in the ULV retention state. As presented in FIG. 14A, in the comparative example 3, each SNM is smaller than 80 mV and the noise margin is small. In the comparative example 2, each SNM is 80 mV or greater, and the noise margin is large. In the embodiment 1, each SNM is 130 mV or greater, and the noise margin is larger than that of the comparative example 2. When it is assumed that the practical SNM is 80 mV, in the embodiment 1, the VVDD can be set lower than 0.2 V. When the VVDD is 0.2 V, the SNM is 130 mV or greater, and the bistable circuit 12 is more stable than when the VVDD is lower than 0.2 V.

In the ULV retention state of the embodiment 1, the SNM and standby power were simulated for different VVDDs.

Figure 14B:
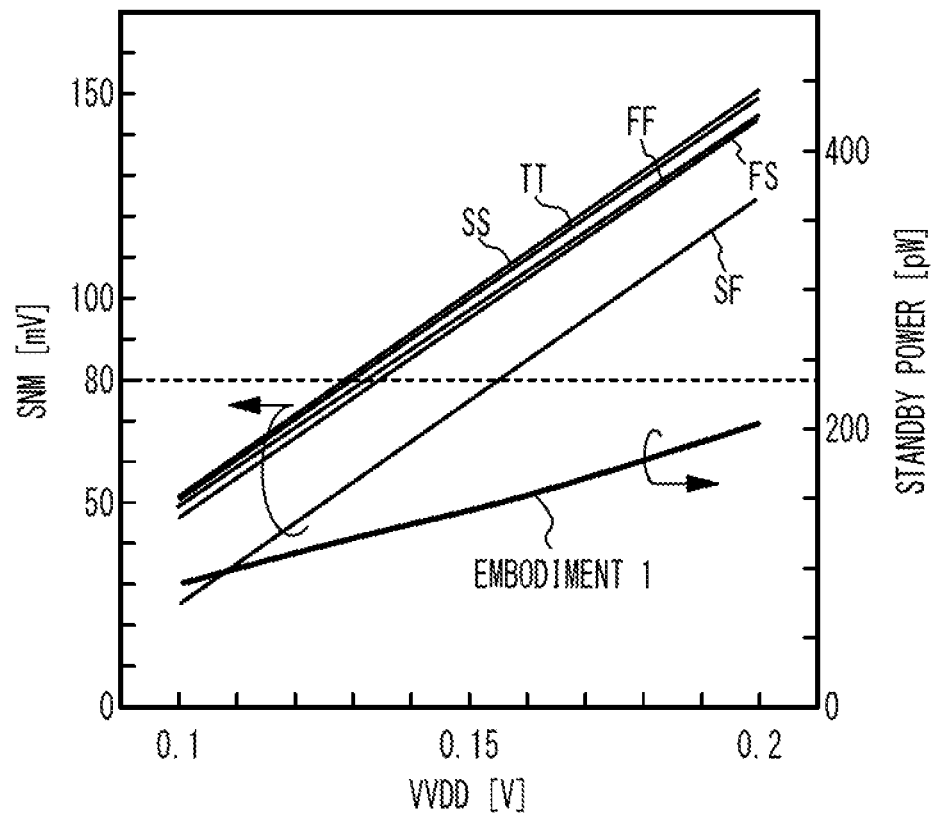
FIG. 14B presents the SNM and the standby power of the embodiment 1 with respect to VVDD in the ULV retention state.

FIG. 14B presents the SNM and the standby power of the embodiment 1 with respect to the VVDD in the ULV retention state. As presented in FIG. 14B, in the embodiment 1, the VVDD is varied from 0.1 to 0.2 V. As the VVDD becomes higher, the SNM increases and the standby power increases. At a VVDD of 0.15 V or greater, all SNMs are 80 mV or greater. Therefore, the VVDD (i.e., the VVDDL) in the ULV retention state can be set to 0.15 V.

For the embodiment 1 and the comparative example 3, the standby power for each VVDD was simulated.

Figure 15:
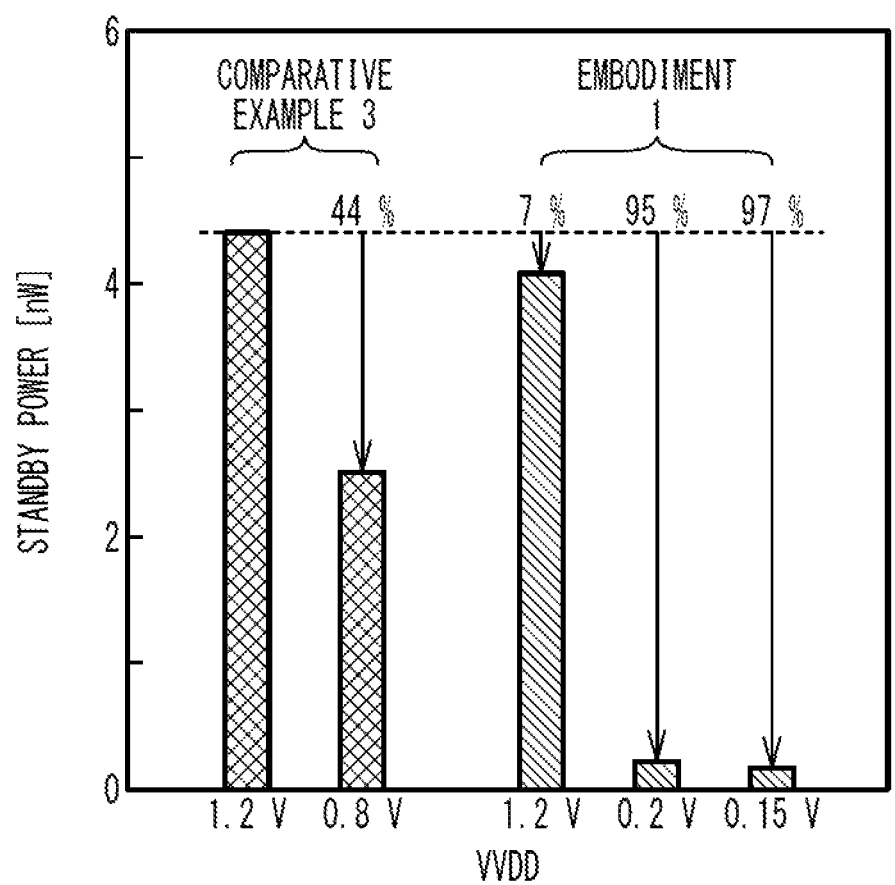
FIG. 15 presents the standby power in the embodiment 1 and the comparative example 3.

FIG. 15 presents the standby power in the embodiment 1 and the comparative example 3. The numbers indicate the reduction rate of the standby power with respect to the standby power when the VVDD is 1.2 V in the comparative example 3.

As presented in FIG. 15, in the comparative example 3, the VVDD is 1.2 V in a normal state in which read/write is performed. Under this condition, the standby power is approximately 4.4 nW. In the comparative example 3, the VVDD is 0.8 V in the sleep state in which read and write are not performed and data is retained. Under this condition, the reduction rate of the standby power is 44%.

In the embodiment 1, the VVDD is 1.2 V in the VDD retention state. The reduction rate of the standby power at this time is 7%. In the ULV retention state, when the VVDD is set to 0.2 V, the reduction rate of the standby power is 95%. Further, when the VVDD is set to 0.15 V, the reduction rate of the standby power is 97%.

In the comparative example 2, the number of transistors in the memory cell 10 is 10, while in the embodiment 1, the number of transistors in the memory cell 10 can be reduced to 8. As a result, the circuit area can be reduced as is clear from the comparison between FIG. 4 and FIG. 6. Further, as presented in FIG. 14A, the noise margin in the ULV retention state can be made to be larger than that in the comparative example 2. This can further reduce the standby power.

Variation 1 of the Embodiment 1

Figure 16:
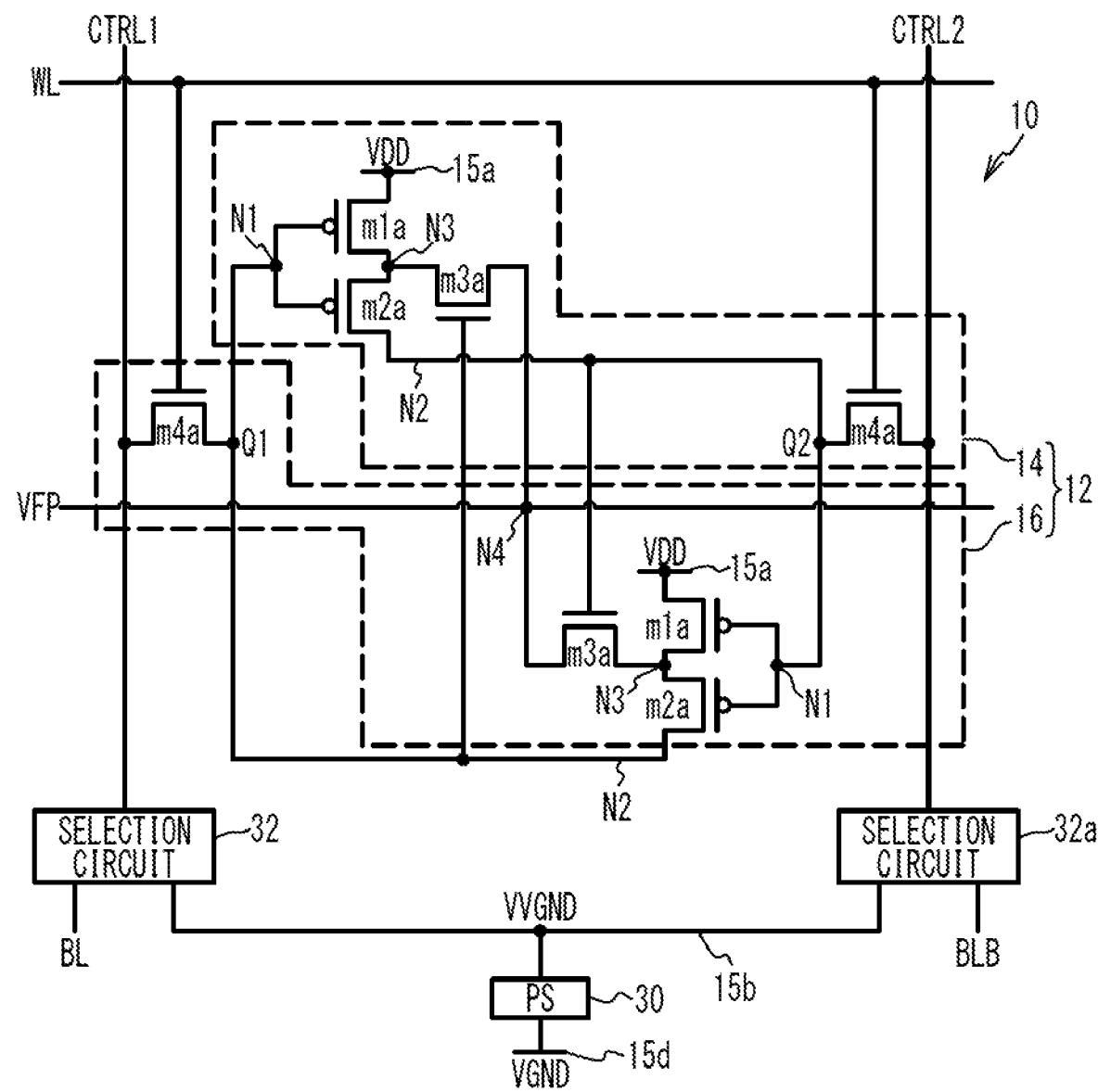
FIG. 16 is a circuit diagram of a memory cell in loop view in a variation 1 of the embodiment 1.
Figure 17:
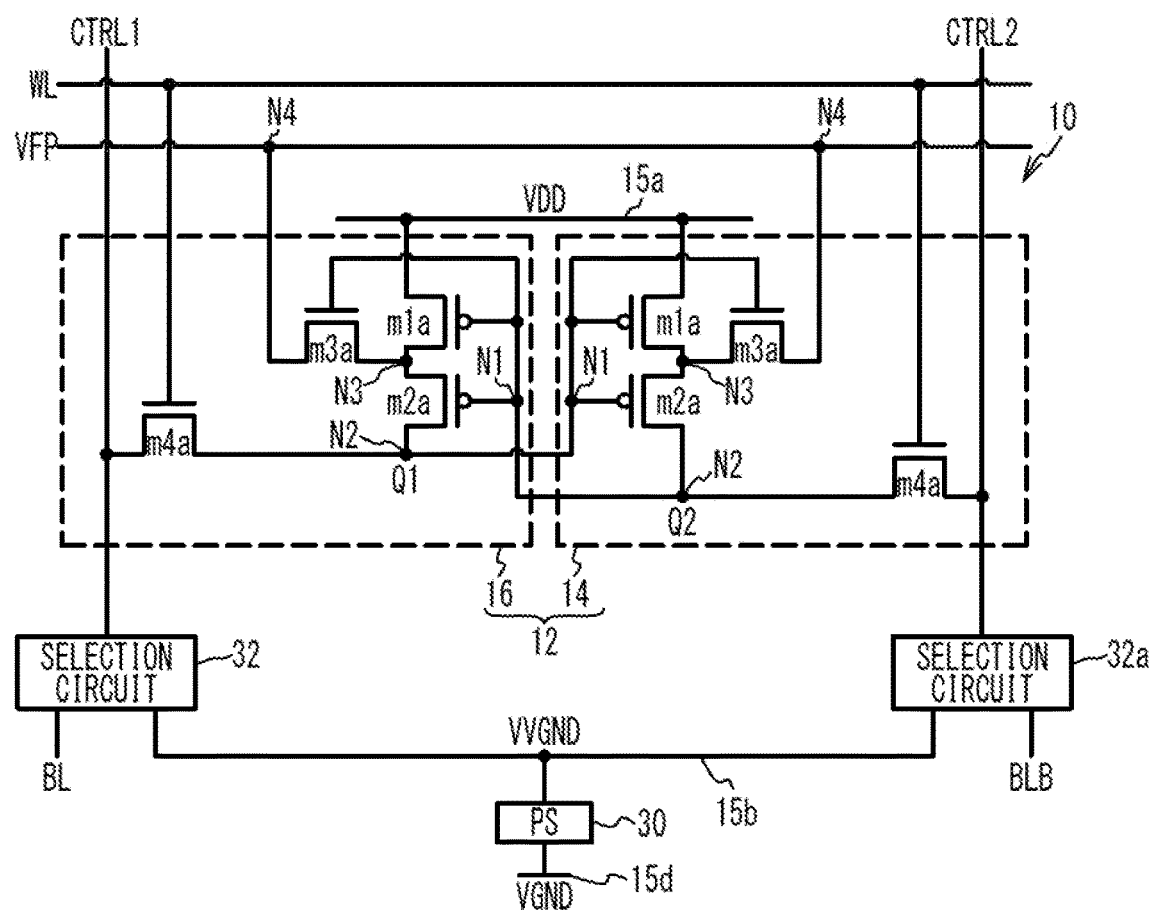
FIG. 17 is a circuit diagram of the memory cell in cross-coupled view in the variation 1 of the embodiment 1.

A variation 1 of the embodiment 1 is an example of the PUFB, the different conductivity type channel FBTr, the footer PS, Type 1. FIG. 16 and FIG. 17 are circuit diagrams of the memory cell 10 in the variation 1 of the embodiment 1. FIG. 16 is a circuit diagram in loop view, and FIG. 17 is a circuit diagram in cross-coupled view. In the PUFB•footer PS, the VDD retention state is precisely the VSS retention state, but here, the VSS retention state is referred to as the VDD retention state to match with the embodiment 1.

As illustrated in FIG. 16 and FIG. 17, each of the inverter circuits 14 and 16 includes the FETs m1a to m4a. The FETs m1a and m2a are P-channel MOSFETs, and the FETs m3a and m4a are N-channel MOSFETs.

In the FET m1a, the source is coupled to the power supply line 15a to which the power supply voltage VDD is applied. The selection circuit 32 connects the control line CTRL1 to either the bit line BL or the ground line 15b (a virtual ground line). The selection circuit 32a connects the control line CTRL2 to either the bit line BLB or the ground line 15b. The power switch (PS) 30 converts the voltage VGND of a ground 15d to the virtual ground voltage VVGND and supplies it to the ground line 15b. A fixed bias VFP is applied to the bias node N4. Other circuit configurations are the same as the circuit in which the FETs m1 to m4 in FIG. 5 and FIG. 6 of the embodiment 1 are replaced with the FETs m1a to m4a, respectively.

Table 4 is a table presenting the states in the variation 1 of the embodiment 1.

TABLE 4

| State | VCTRL | Mode | VVGND | VDD − VVGND | Selection | VWL |
|---|---|---|---|---|---|---|
| Read/write | VFP (1.0 V) | BI | VVGNDL (0 V) | VH (1.2 V) | BL | V1 (0.9 V) |
| VDD retention | VFP (1.0 V) | BI | VVGNDL (0 V) | VH (1.2 V) | VVGND | V2 (0.1 V) |
| ULV retention | VFP (1.0 V) | ST | VVGNDH (1.0 V) | VL (0.2 V) | VVGND | V3 (1.0 V) |

The bias node N4 has a constant voltage VFP (e.g., 1.0 V). In the read/write state, the selection circuits 32 and 32a connect the bit lines BL and BLB to the control lines CTRL1 and CTRL2, respectively. The power switch 30 sets the virtual ground voltage VVGND to the VVGNDL (e.g., 0 V). The virtual power supply voltage VDD−VVGND applied to the bistable circuit 12 is the VH (e.g., 1.2 V). In the read state, the bit lines BL and BLB can be made to be at about the VVGNDL. In the write state, one of the bit lines BL and BLB can be made to be at about the VVGNDL, and the other can be made to be at about the VDD. The high levels of the memory nodes Q1 and Q2 become about the VDD, and the low levels become about the VVGNDL. The inverter circuits 14 and 16 enter the BI mode. The voltage VWL of the word line WL of the memory cell 10 subject to read or write is set to the voltage V1 (e.g., 0.9 V).

In the VDD retention state, the selection circuits 32 and 32a connect the ground line 15b to the control lines CTRL1 and CTRL2. The power switch 30 sets the virtual ground voltage VVGND to the VVGNDL (e.g., 0 V). The voltage VDD−VVGND becomes the VH (e.g., 1.2 V). The inverter circuits 14 and 16 enter the BI mode. The voltage VWL of the word line WL is set to the voltage V2 (e.g., 0.1 V).

In the ULV retention state, the selection circuits 32 and 32a connect the ground line 15b to the control lines CTRL1 and CTRL2. The power switch 30 sets the virtual ground voltage VVGND to the VVGNDH (e.g., 1.0 V). The voltage VDD−VVGND becomes the VL (e.g., 0.2 V). The inverter circuits 14 and 16 enter the ST mode. The voltage VWL of the word line WL is set to the voltage V3 (e.g., 1.0 V). In the ULV retention state, the data in the bistable circuit 12 is retained at an ultra-low voltage. This reduces the power consumption due to leakage current.

Variation 2 of the Embodiment 1

Figure 18:
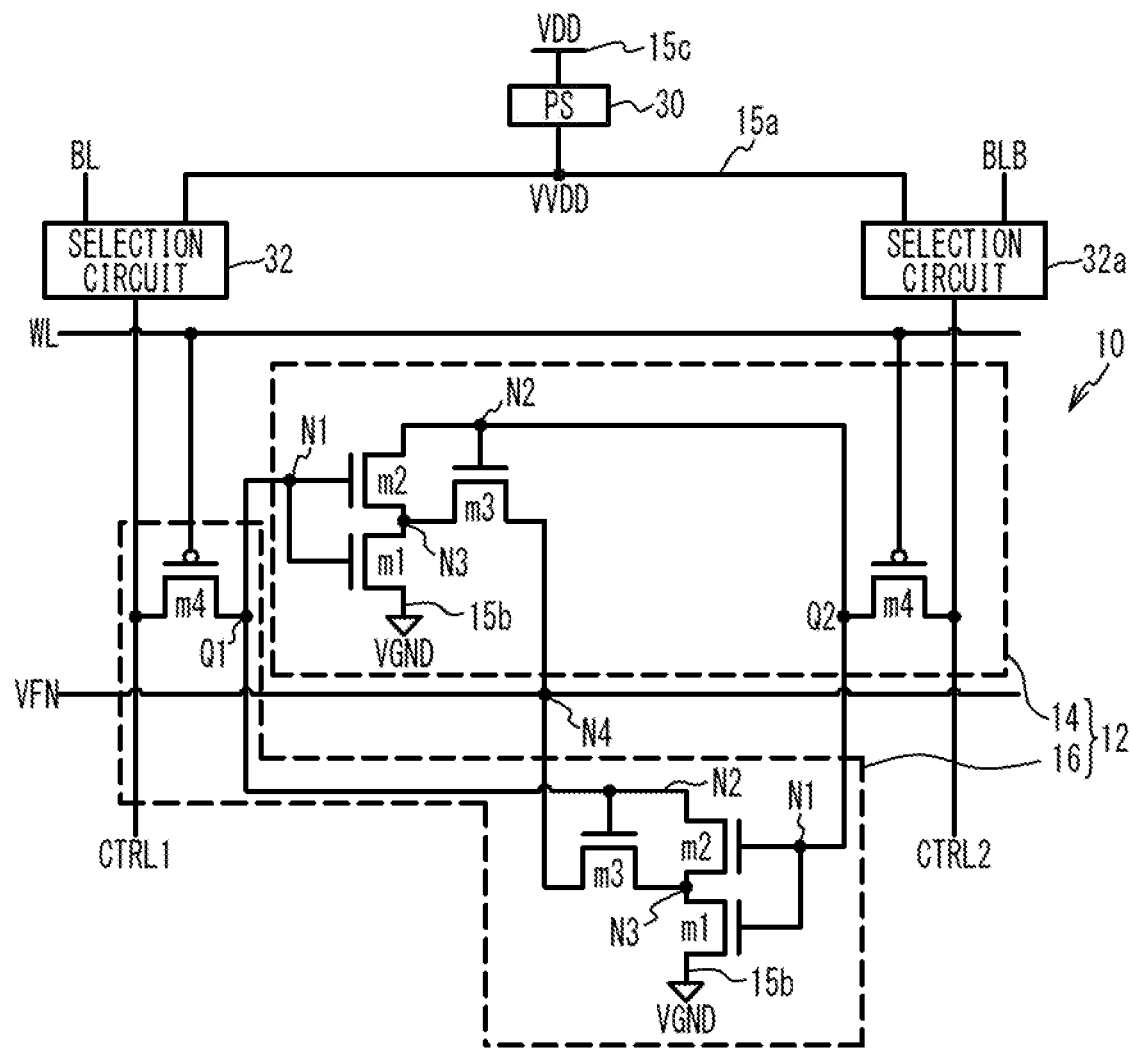
FIG. 18 is a circuit diagram of a memory cell in loop view in a variation 2 of the embodiment 1.
Figure 19:
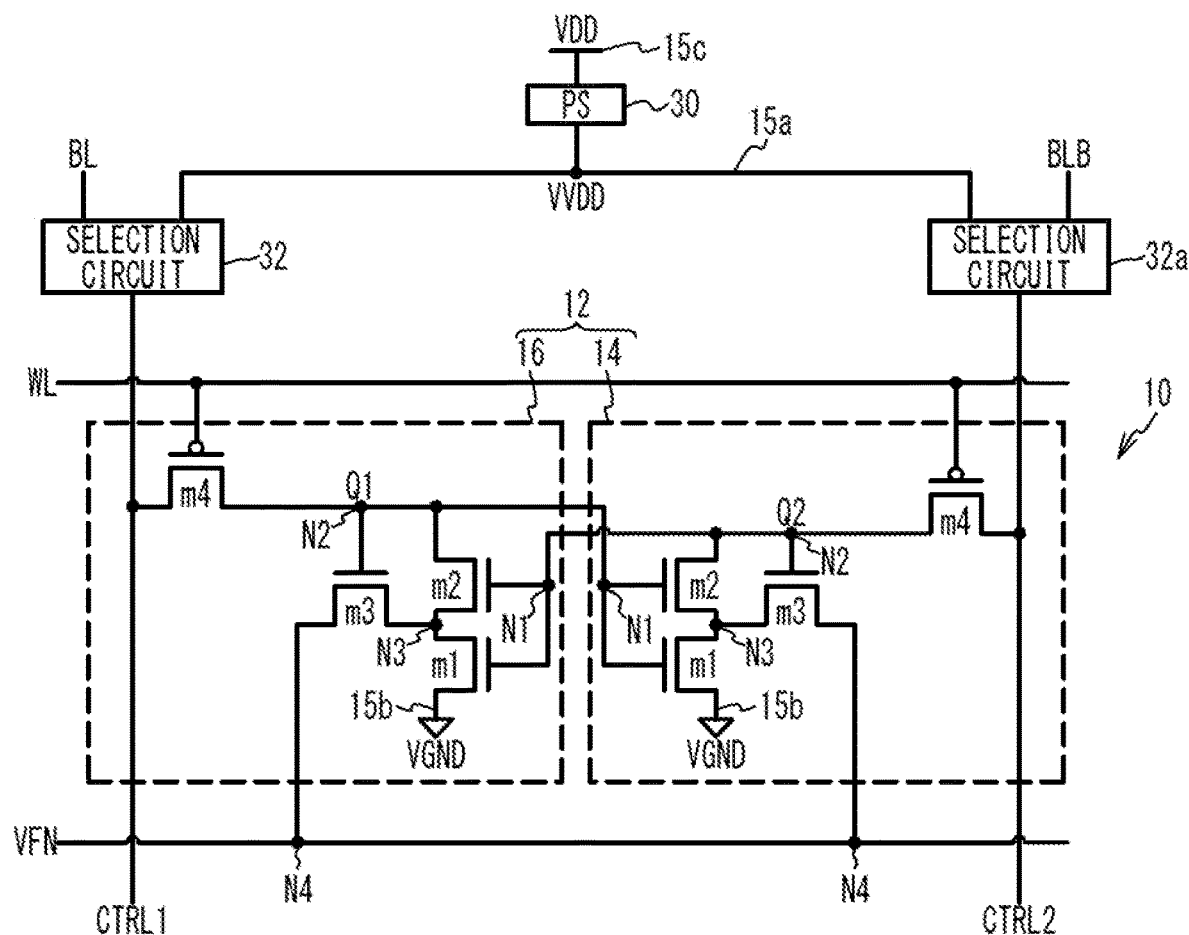
FIG. 19 is a circuit diagram of the memory cell in cross-coupled view in the variation 2 of the embodiment 1.

A variation 2 of the embodiment 1 is an example of the PDFB, the identical conductivity type channel FBTr, the header PS, and Type 1. FIG. 18 and FIG. 19 are circuit diagrams of the memory cell 10 in the variation 2 of the embodiment 1. FIG. 18 is a circuit diagram in loop view, and FIG. 19 is a circuit diagram in cross-coupled view.

As illustrated in FIG. 18 and FIG. 19, the FETs m3 are N-channel FETs in the inverter circuits 14 and 16. The gate of the FET m3 of the inverter circuit 14 is coupled to the output node N2 of the inverter circuit 14 or the input node N1 of the inverter circuit 16, and the gate of the FET m3 of the inverter circuit 16 is coupled to the output node N2 of the inverter circuit 16 or the input node N1 of the inverter circuit 14. Other circuit configurations are the same as those in the embodiment 1 illustrated in FIG. 5 and FIG. 6. As in FIG. 7B, part of the selection circuits 32 and 32a may be the precharge/selection circuit 33a provided between the power switch 30 and the control lines CTRL1 and CTRL2, and another part of the selection circuits 32 and 32a may be the selection circuit 32b provided between the read-write circuit 34 and the control lines CTRL1 and CTRL2.

The butterfly curve of the variation 2 of the embodiment 1 in the ULV retention state was simulated. The simulation conditions are almost the same as those of simulation 2 of the embodiment 1. The VVDD was set to 0.2 V. In the variation 2 of the embodiment 1, the noise margin is the largest when the VWL is 0.1 V, and therefore the VWL was set to 0.1 V.

Figure 20:
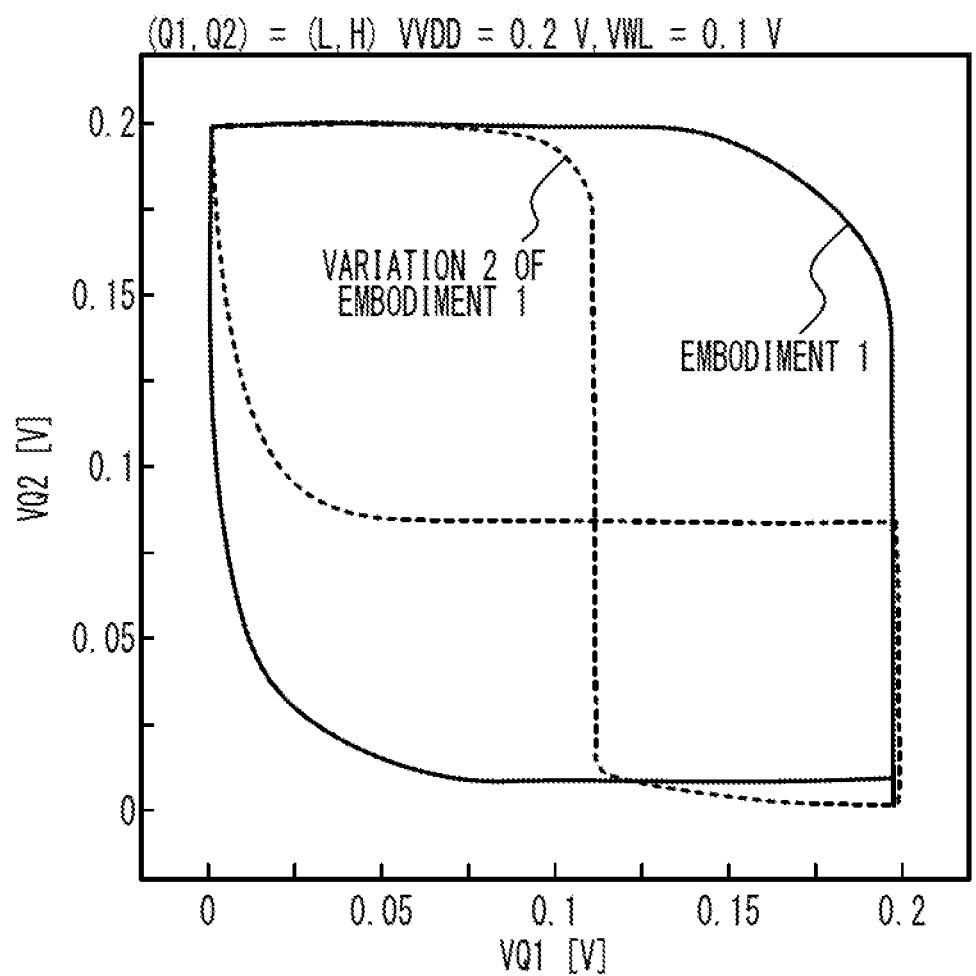
FIG. 20 presents the butterfly curves of the bistable circuits of the embodiment 1 and the variation 2 thereof in the ULV retention state.

FIG. 20 presents the butterfly curves of the bistable circuits of the embodiment 1 and its variation 2 in the ULV retention state. In FIG. 20, the operating point is when the Q1 is at a low level and the Q2 is at a high level. The butterfly curve of the embodiment 1 is the same as that of FIG. 13A.

As presented in FIG. 20, in the variation 2 of the embodiment 1, the opening at the operating point side is smaller than the opening at the operating point side of the embodiment 1. As described above, in the case that the feedback transistor (the FET m3) has the same conductivity type channel as the FETs m1 and m3, the noise margin is smaller than that in the case of the different conductivity type channel. The opening at the operating point side is wider than that of the comparative example 3 in FIG. 13A. Therefore, the power consumption can be reduced by the ULV retention compared with that in the comparative example 3. Further, the circuit area can be reduced compared with that of the comparative example 2.

In the embodiment 1 and its variations, in the inverter circuit 14 (a first inverter circuit) and the inverter circuit 16 (a second inverter circuit), in the FET m1 (a first FET) (or the FET m1a), the source is coupled to the ground line 15b (or the power supply line 15a), the drain is coupled to the intermediate node N3, and the gate is coupled to the input node N1. In the PDFB such as the embodiment 1 and the variation 2 thereof, the ground line 15b corresponds to the power supply line, and in the PUFB such as the variation 1 of the embodiment 1, the power supply line 15a corresponds to the power supply line.

In the FET m2 (a second FET) (or the FET m2a), the source is coupled to the intermediate node N3 and the drain is coupled to the output node N2. In the FET m3 (a third FET) (or the FET m3a), one of the source and the drain is coupled to the intermediate node N3, and the other of the source and the drain is coupled to the bias node N4. In the FET m4 (a fourth FET) (or the FET m4a), one of the source and the drain is coupled to the output node N2, and the other of the source and the drain is coupled to the control line CTRL1 or CTRL2. The conductivity type (a second conductivity type) of the FET m4 (or m4a) is opposite to the conductivity types (a first conductivity type) of the FETs m1 and m2 (or the FETs m1a and m2a).

In the memory node Q1 (a first memory node), the input node N1 of the inverter circuit 14 and the output node N2 of the inverter circuit 16 are connected, and in the memory node Q2 (a second memory node), the output node N2 of the inverter circuit 14 and the input node N1 of the inverter circuit 16 are connected. This forms the bistable circuit 12.

The gates of the FETs m4 (or the FETs m4a) of the inverter circuits 14 and 16 are coupled to the word line WL. The gate of the FET m3 (or the FET m3a) of the inverter circuit 14 is coupled to one of the following nodes: the input node N1 and the output node N2 of the inverter circuit 14 and the input node N1 and the output node N2 of the inverter circuit 16. The gate of the FET m3 (or the FET m3a) of the inverter circuit 16 is coupled to one of the following nodes: the input node N1 and the output node N2 of the inverter circuit 16 and the input node N1 and the output node N2 of the inverter circuit 14.

The circuit configuration described above allows the FETs m4 (or the FETs m4a) to serve as both the loads of the inverter circuits 14 and 16 and the pass transistors. Therefore, the circuit area can be reduced as compared with that of the comparative example 2. Further, the FET m3 (or the FET m3a), which is the FBTr, makes the noise margin in the ULV retention state wider than that in the comparative example 3. Therefore, the power consumption can be reduced.

In the embodiment 1 and its variation 1, the FET m3 (or the FET m3a) has a channel of a second conductivity type opposite to the first conductivity type of the channels of the FETs m1 and m2 (or the FETs m1a and m2a). That is, the FBTr is the different conductivity type FBTr. In this case, the gate of the FET m3 (or the FET m3a) of the inverter circuit 14 is coupled to the input node N1 of the inverter circuit 14 or the output node N2 of the inverter circuit 16, and the gate of the FET m3 (or the FET m3a) of the inverter circuit 16 is coupled to the input node N1 of the inverter circuit 16 or the output node N2 of the inverter circuit 14.

Thereby, as in simulation 2 of the embodiment 1, the noise margin in the ULV retention state can be made to be larger than that of the comparative example 2. Further, by lowering the VVDDL, the power consumption can be reduced.

As in the variation 2 of the embodiment 1, the FET m3 has a channel of the first conductivity type that is the same as those of the FETs m1 and m2. That is, the FBTr is the identical conductivity type channel FBTr. In this case, the gate of the FET m3 of the inverter circuit 14 is coupled to the output node N2 of the inverter circuit 14 or the input node N1 of the inverter circuit 16, and the gate of the FET m3 of the inverter circuit 16 is coupled to the output node N2 of the inverter circuit 16 or the input node N1 of the inverter circuit 14.

This can make the noise margin in the ULV retention state larger than that in the comparative example 3. Further, by lowering the VVDDL, the power consumption can be reduced.

The control circuits 28 of the electronic circuits of FIG. 7A and FIG. 7C control the power switch 30 (a power supply circuit), and in the ULV retention state (a first state) in which the bistable circuit 12 retains data, set the voltage VVDD–VGND in Table 3 of the embodiment 1 and the voltage VL (a first voltage) of the VDD–VVGND in Table 4 of the variation 1 of the embodiment 1 lower than the voltage VH (a second voltage) in the read/write state (second state). This can reduce the power consumption in the ULV retention state.

The voltage VL corresponds to the voltage VVDD–VGND between the ground line 15b and the control lines CTRL1 and CTRL2 in the ULV retention state in the embodiment 1, and corresponds to the voltage VDD–VVGND between the power supply line 15a with the voltage VDD and the control lines CTRL1 and CTRL2 in the ULV retention state in the variation 1 of the embodiment 1. The voltage VH corresponds to the voltage between the memory nodes Q1 and Q2 in the read/write state.

The voltage VL is only required to be smaller than the voltage VH, but the voltage VL is preferably equal to or less than ½ of, more preferably equal to or less than ¼ of, further preferably equal to or less than ⅕ of, yet further preferably equal to or less than ⅙ of the voltage VH to secure the SNM and reduce the power consumption in the ULV retention state. In particular, the voltage VL is preferably approximately ¹⁄₁₀ of the voltage VH to reduce the power consumption. The voltage VL is greater than 0 V.

The control circuit 28 controls the selection circuit 32b and connects the bit lines BL and BLB for reading or writing data from or in the bistable circuit 12 to the control lines CTRL1 and CTRL2 in the read/write state. That is, the control lines CTRL1 and CTRL2 are set as the bit lines BL and BLB. This allows data to be read from or written in the bistable circuit 12 via the control lines CTRL1 and CTRL2.

In the case of the PDFB (that is, in the case that the first conductivity type is an N type) as in the embodiment 1 and its variation 2, the FET m4 is of a P type. Therefore, to turn on the FET m4 in the read/write state, it is typical to set the voltage VWL of the word line WL to the voltage VGND (e.g., 0 V) of the ground line 15b. However, as illustrated in FIG. 9A, when the VWL is set to 0 V, the SNM becomes small.

Therefore, in the read/write state, the control circuit 28 sets the voltage VWL of the word line WL of the power switch 30 higher than the voltage of the ground line 15b. For example, in the embodiment 1 and its variation 2, the VWL is set to 0.25 V with respect to a VGND of 0 V. As a result, as illustrated in FIG. 9A, it is possible to prevent the SNM from becoming smaller than 80 mV, which is the target.

In the case of the PUFB as in the variation 1 of the embodiment 1 (that is, in the case that the first conductivity type is a P type), the control circuit 28 sets the voltage VWL of the word line WL lower than the voltage VDD of the power supply line 15a. For example, in the variation 1 of the embodiment 1, the VWL is set to 0.9 V with respect to a VDD of 1.2 V. This can prevent the SNM from becoming smaller, as in the case of the PDFB.

In the VDD retention and the read/write state, if the VWL is too close to the voltage of the ground line 15b (or the power supply line 15a), the SNM in the read does not become large. Therefore, the difference between the voltage of the ground line 15b (or the power supply line 15a) and the VWL is preferably equal to or greater than ¹⁄₁₀ of, more preferably equal to or greater than ⅕ of, and further preferably approximately ½ of the VH, as illustrated in FIG. 9A.

In the ULV retention state, when the VWL becomes high, the FET m4 is not turned on and the operating speed decreases. Therefore, the difference between the voltage of the ground line 15b (or the power supply line 15a) and the VWL is preferably equal to or less than ½ of, more preferably equal to or less than ¼ of, and further preferably equal to or less than ⅕ of the voltage VH. In the embodiment 1, the difference between the voltage of the ground line 15b and the VWL is set to approximately ⅙ of the voltage VH in order to give priority to the speed performance.

In the ULV retention state, in FIG. 12A and FIG. 12B, it is preferable that the FETm4 is turned off when the output node N2 is at a low level (e.g., VGND=0 V), and the FET m4 is turned on when the output node N2 is at a high level (e.g., VVDDL=0.2 V). Therefore, it is preferable that the VWL is equal to or greater than the VGND and equal to or less than the VVDDL. That is, it is preferable that the control circuit 28 sets the voltage between the word line WL and the ground line 15b (or the power supply line 15a) to the voltage VL or lower than the voltage VL. For example, in the embodiment 1, VWL–VGND is 0.2 V with respect to a VL of 0.2 V. In the variation 1 of the embodiment 1, VDD–VWL is 0.2 V with respect to a VL of 0.2 V. In the variation 2 of the embodiment 1, VWL–VGND is 0.1 V with respect to a VL of 0.2 V.

As illustrated in FIG. 11, in the embodiment 1, if the VWL is too close to the VGND, the noise margin becomes small. Therefore, the voltage between the word line WL and the ground line 15b (or the power supply line 15a) is preferably equal to or greater than ¼ of, more preferably equal to or greater than ½ of the voltage VL. In FIG. 11, the voltage between the word line WL and the ground line 15b (or the power supply line 15a) may be the voltage VL so that the noise margin is maximized at a VWL of 0.2 V.

In the case of the PDFB (that is, in the case that the first conductivity type is an N type) as in the embodiment 1 and its variation 2, the FET m4 is of a P type. Therefore, to turn off the FET m4 in the VDD retention state in which the voltage VVDD–VGND between the ground line 15b and the control lines CTRL1 and CTRL2 is set to the VH (e.g., 1.2 V), it is typical to set the voltage VWL of the word line WL to the VDD (e.g., 1.2 V). However, as illustrated in FIG. 9B, when the VWL is set to 1.2 V, the SNM becomes small.

Therefore, in the VDD retention state (a third state), the control circuit 28 sets the voltage between the word line WL and the ground line 15b smaller than the VH. For example, in the embodiment 1 and its variation 2, VWL–VGND is set to 1.1 V with respect to a VH of 1.2 V. This can prevent the SNM from becoming smaller as illustrated in FIG. 9B.

In the case of the PUFB as in the variation 1 of the embodiment 1 (that is, in the case that the first conductivity type is a P type), the control circuit 28 sets the voltage between the word line WL and the power supply line 15a smaller than the VH. For example, in the variation 1 of the embodiment 1, VDD–VWL is set to 1.1 V with respect to a VH of 1.2 V. This can prevent the SNM from becoming small.

If the VWL is too close to the voltage of the ground line 15b (or the power supply line 15a), the SNM does not become large. Therefore, the difference between the voltage of the ground line 15b (or the power supply line 15a) and the VWL is preferably equal to or less than ⁴⁹/₅₀ of, more preferably equal to or less than ¹⁹/₂₀ of, further preferably equal to or less than ⁹/₁₀ of the VH.

As illustrated in FIG. 9B, the standby power increases as the VWL decreases. Therefore, the difference between the voltage of the ground line 15b (or the power supply line 15a) and the VWL is preferably equal to or greater than ½ of, more preferably equal to or greater than ¾ of, further preferably equal to or greater than ⅘ of the voltage VH.

In any of the ULV retention state, the VDD retention state, and the read/write state, the bias node N4 is supplied with the VFN or the VFP, which is a fixed bias. This eliminates the need for the driver 26 and can reduce the circuit area. A preferred range of the voltages VFN and VFP supplied to the bias node N4 will be discussed.

Figure 21A:
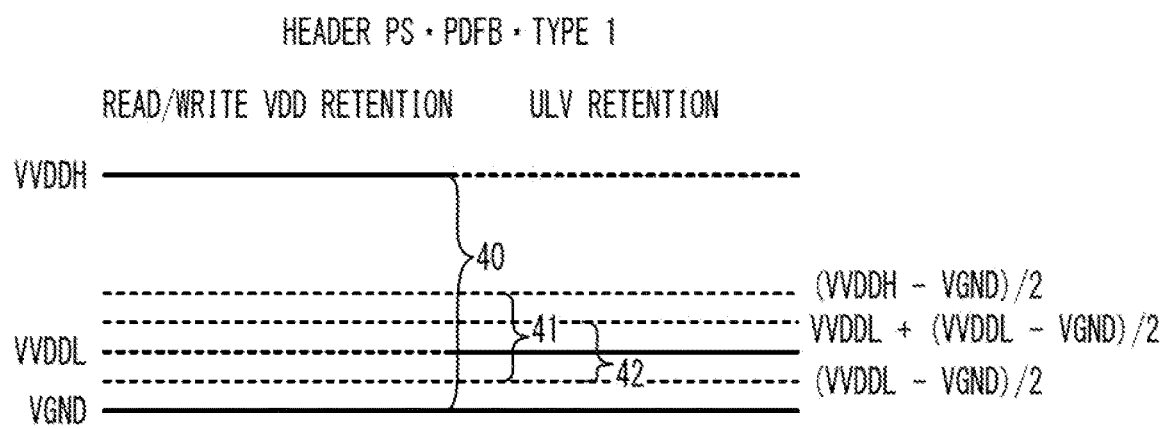
FIG. 21A and FIG. 21B illustrate voltages of a header PS•PDFB•Type 1 type and a footer PS•PUFB•Type 1 type, respectively.
Figure 21B:
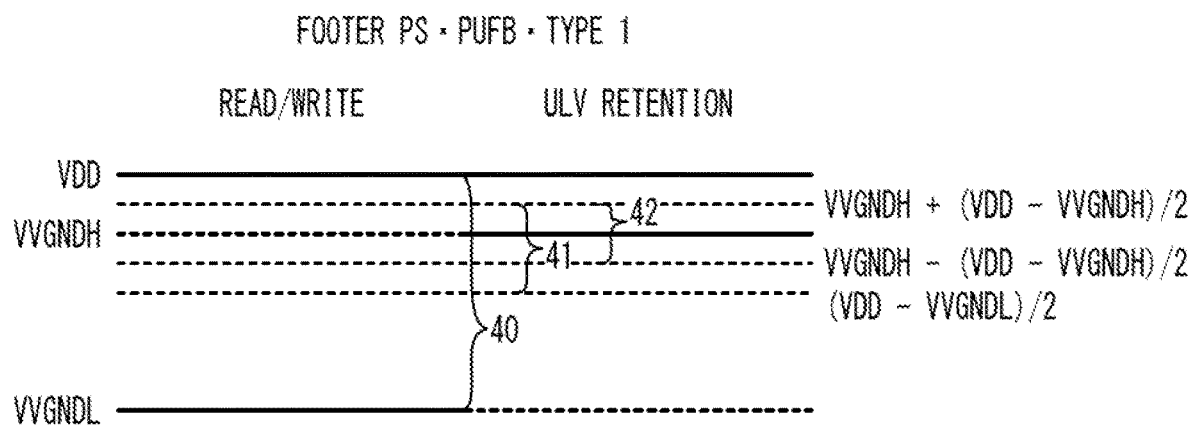

FIG. 21A and FIG. 21B present the voltages of the header PS PDFB Type 1 type and the footer PS•PUFB•Type 1 type, respectively. In FIG. 21A, the VVDDH and the VVDDL with respect to the VGND are presented in the vertical direction, and in FIG. 21B, the VVGNDL and the VVGNDH with respect to the VDD are presented in the vertical direction.

As presented in FIG. 21A, in the header PS, the VVDDH is supplied to the power supply line 15a and the VGND is supplied to the ground line 15b in the read/write state and the VDD retention state. In this case, when the VFN is set to a fixed bias of about the VVDDL, the inverter circuits 14 and 16 enter the BI mode because the VFN is sufficiently low relative to the VVDDH. In the ULV retention state, the VVDDL is supplied to the power supply line 15a and the VGND is supplied to the ground line 15b. In this case, when the VFN is set to about the VVDDL, the inverter circuits 14 and 16 enter the ST mode because the VFN is higher than the VGND.

The constant voltage VFN is only required to be smaller than the VVDDH and larger than the VGND. That is, the VFN is only required to be between the voltage of the memory node Q1 and the voltage of the memory node Q2 (a range 40 in FIG. 21A) in the read/write state. If the constant voltage VFN is too close to the VVDDH, the inverter circuits 14 and 16 are less likely to enter the BI mode when the virtual power supply voltage VVDD is set to the VVDDH. If the constant voltage VFN is too close to the VGND, the inverter circuits 14 and 16 are less likely to enter the ST mode when the virtual power supply voltage VVDD is set to the VVDDL. Therefore, to automatically switch the mode of the bistable circuit 12 by the virtual power supply voltage VVDD, the constant voltage VFN is preferably equal to or less than the voltage at the midpoint between the VVDDH and the VGND (i.e., (VVDDH−VGND)/2 or less), more preferably equal to or less than the voltage obtained by adding ½ of the difference between the VVDDL and the VGND to the VVDDL (i.e., VVDDL+(VVDDL−VGND)/2 or less), and further preferably between (VVDDH−VGND)/2 and about the voltage at the midpoint between the VVDDL and the VGND (that is, about (VVDDL−VGND)/2) (a range 41 in FIG. 21A), preferably between VVDDL+(VVDDL−VGND)/2 and about (VVDDL−VGND)/2 (a range 42 in FIG. 21A). Further, the constant voltage VFN is preferably about the VVDDL.

As illustrated in FIG. 21B, in the footer PS, the VVGNDL is supplied to the ground line 15b and the VDD is supplied to the power supply line 15a in the read/write state and the VDD retention state. In this case, when the VFP is set at a fixed bias of about the VVGNDH, the inverter circuits 14 and 16 enter the BI mode because the VFP is sufficiently high relative to the VVGNDL. In the ULV retention state, the VVGNDH is supplied to the ground line 15b and the VDD is supplied to the power supply line 15a. In this case, when the VFP is set to about the VVGNDH, the inverter circuits 14 and 16 enter the ST mode because the VFP is lower than the VDD.

The constant voltage VFP is only required to be larger than the VVGNDL and smaller than the VDD. That is, the VFP is only required to be between the voltage of the memory node Q1 and the voltage of the memory node Q2 in the read/write state (the range 40 in FIG. 21B). If the constant voltage VFP is too close to the VVGNDL, the inverter circuits 14 and 16 are less likely to enter the BI mode when the virtual ground voltage VVGND is set to the VVGNDL. If the constant voltage VFP is too close to the VDD, the inverter circuits 14 and 16 are less likely to enter the ST mode when the virtual ground voltage VVGND is set to the VVGNDH. Therefore, to automatically switch the mode of the bistable circuit 12 by the virtual ground voltage VVGND, the constant voltage VFP is preferably equal to or greater than the voltage at the midpoint between the VDD and the VVGNDL (i.e., (VDD−VVGNDL)/2 or greater), more preferably equal to or greater than the voltage obtained by subtracting ½ of the voltage difference between the VDD and the VVGNDH from the VVGNDH (i.e., VVGNDH−(VDD−VVGNDH)/2 or greater), further preferably between (VDD−VVGNDL)/2 and about the voltage at the midpoint between the VDD and the VVGNDH (i.e., about VVGNDH+(VDD−VVGNDH)/2) (the range 41 in FIG. 21B), preferably between VVGNDH−(VDD−VVGNDH)/2 and about VVGNDH+(VDD−VVGNDH)/2 (the range 42 in FIG. 21B). Further, the constant voltage VFP is preferably about the VVGNDH.

In the embodiment 1 and its variations, Type 1 in which the driver 26 is not provided has been described as an example, but Type 2 in which the driver 26 is provided may also be used. The combinations of the PDFB and the PUFB, the different conductivity type channel and the identical conductivity type channel, and the header PS, the footer PS and the dual PS can be desirably set.

Further, although the SRAM cell has been described as an example, the bistable circuit of the embodiment 1 and its variations may be used for the flip-flop circuit such as a master-slave type flip-flop circuit. In the master-slave type flip-flop circuit, a switch such as a pass gate that is turned on and off in synchronization with the clock signal may be provided in the loop of the bistable circuit 12.

Embodiment 2

An embodiment 2 is an example in which the memory cell has a non-volatile memory element.

[Description of the Memory Cell of the Virtual Power Supply System]

Figure 22:
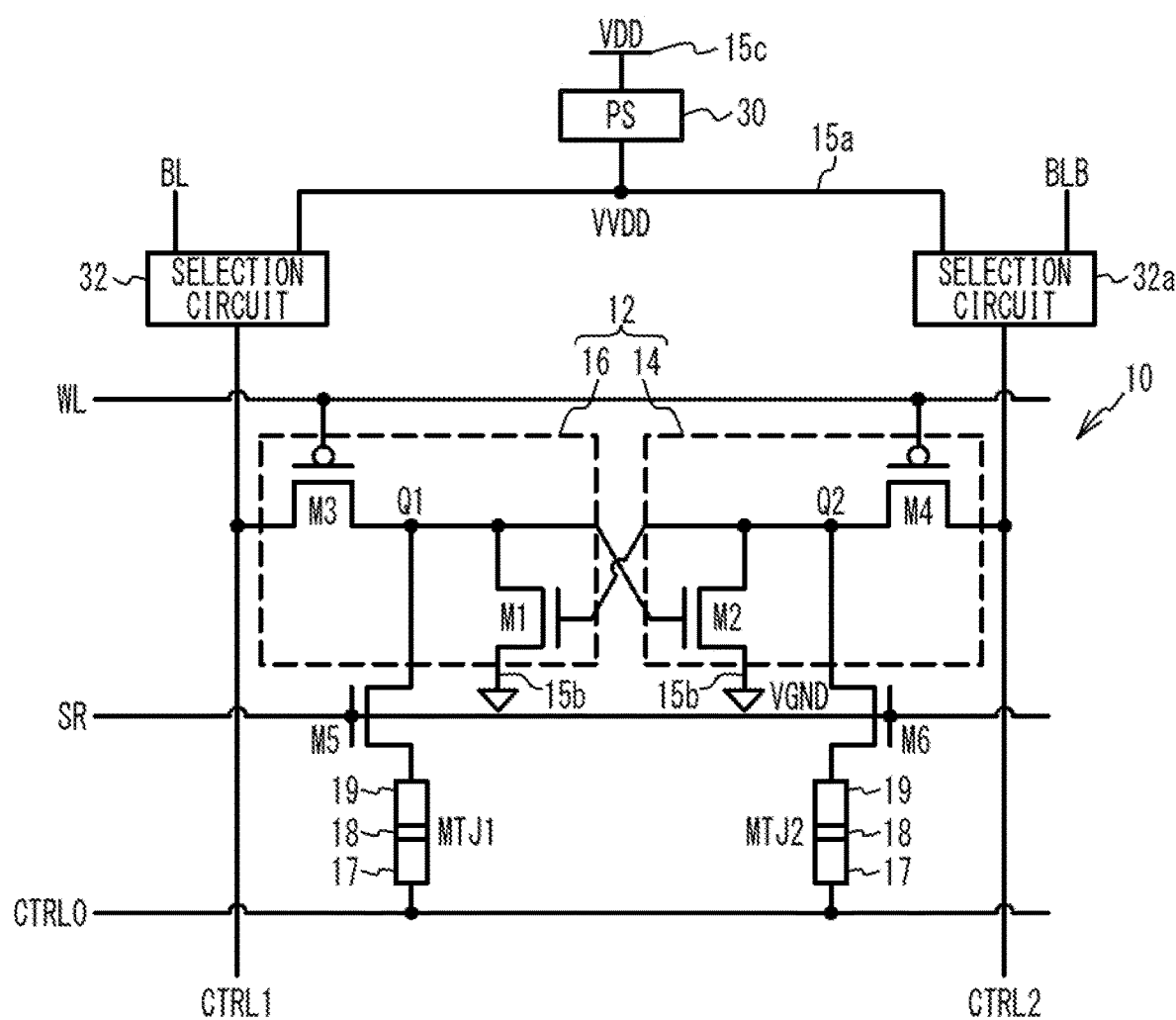
FIG. 22 is a circuit diagram of a memory cell of a virtual power supply system in an embodiment 2.

FIG. 22 is a circuit diagram of a memory cell of a virtual power supply system using the virtual power supply voltage VVDD in the embodiment 2. As illustrated in FIG. 22, in the virtual power supply system, the power switch 30 is provided between the power supply line 15a (the virtual power supply line) and the power supply 15c. The memory cell 10 mainly includes the inverter circuits 14 and 16, FETs M5 and M6, and spin transfer torque magnetic tunnel junction elements (STT-MTJ: hereinafter simply referred to as ferromagnetic tunnel junction elements) MTJ1 and MTJ2 as non-volatile memory elements.

The inverter circuits 14 and 16 are connected in a loop shape to form the bistable circuit 12. The inverter circuit 14 includes FETs M2 and M4. The inverter circuit 16 includes FETs M1 and M3. The FETs M1, M2, M5, and M6 are N-channel MOSFETs, and the FETs M3 and M4 are P-channel MOSFETs.

In the FETs M1 (a first FET) and M2 (a second FET), the sources are coupled to the ground line 15b to which the ground voltage VGND is applied, the drains are coupled to the memory nodes Q1 (a first memory node) and Q2 (a second memory node), respectively, and the gates are coupled to the memory nodes Q2 and Q1, respectively. The memory nodes Q1 and Q2 are nodes complementary to each other. The FETs M1 and M2 are drivers.

In each of the FETs M3 (a third FET) and M4 (a fourth FET), one of the source and the drain is coupled to the corresponding one of the memory nodes Q1 and Q2, the other of the source and the drain is coupled to the corresponding one of the control lines CTRL1 (a first control line) and CTRL2 (a second control line), and the gate is coupled to the word line WL. The FETs M3 and M4 function as pass transistors during the read and write operations and functions as loads during the hold state, the store operation, and the restore operation.

The FET M5 and the ferromagnetic tunnel junction element MTJ1 are connected between the memory node Q1 and a control line CTRL0, and the FET M6 and the ferromagnetic tunnel junction element MTJ2 are connected between the memory node Q2 and the control line CTRL0. In each of the FETs M5 (a first switch) and M6 (a second switch), one of the source and the drain is coupled to the corresponding one of the memory nodes Q1 and Q2, and the other of the source and the drain is coupled to the corresponding one of the ferromagnetic tunnel junction elements MTJ1 and MTJ2. The gate is coupled to the switch line SR.

Each of the ferromagnetic tunnel junction elements MTJ1 (a first non-volatile memory element) and MTJ2 (a second non-volatile memory element) has a free layer 17, a tunnel insulating film 18, and a pin layer 19. The free layers 17 are coupled to the control line CTRL0 and the pin layers 19 are coupled to the FETs M5 and M6. The free layer 17 and the pin layer 19 are made of a ferromagnet. In a state in which the magnetization directions of the free layer 17 and the pin layer 19 are parallel (a parallel state), the resistance values of the MTJ1 and the MTJ2 are low. In a state in which the magnetization directions of the free layer 17 and the pin layer 19 are antiparallel (an antiparallel state), the resistance values of the MTJ1 and the MTJ2 are higher than those in the parallel state. The MTJ1 and the MTJ2 store data on the basis of the magnetization states (i.e., the resistance values) of the MTJ1 and the MTJ2. The MTJ will be described as an example of the non-volatile memory element, but the non-volatile memory element may be a giant magnetic resistance (GMR) element, a variable resistance element such as that used for a ReRAM (Resistance Random Access Memory), or a phase change element used for a PRAM (Phase change RAM).

The selection circuit 32 connects the control line CTRL1 to either the bit line BL or the power supply line 15a. The selection circuit 32a connects the control line CTRL2 to either the bit line BLB or the power supply line 15a. The power switch (PS) 30 converts the voltage VDD of the power supply 15c to the virtual power supply voltage VVDD and supplies it to the power supply line 15a.

Figure 23:
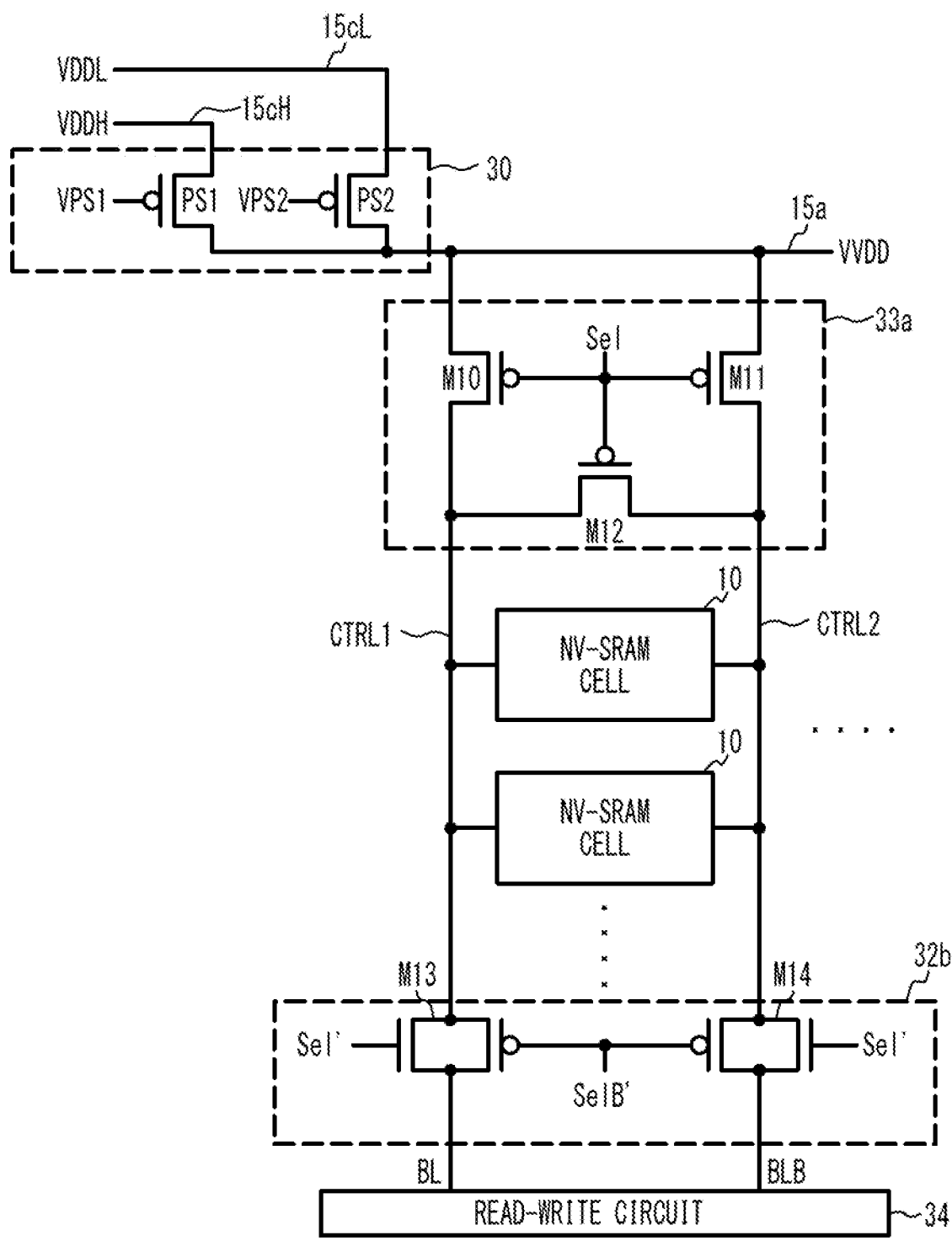
FIG. 23 illustrates a power switch and a selection circuit in the virtual power supply system of the embodiment 2.

FIG. 23 illustrates the power switch and the selection circuit in the virtual power supply system using the virtual power supply voltage of the embodiment 2. As illustrated in FIG. 23, the memory cell 10 is an NV-SRAM cell. Other circuit configurations are the same as those in FIG. 7B. In the embodiment 2, the virtual power supply voltage VVDD becomes the VDDH during the store operation and the restore operation, and the voltage VVDD−VGND is, for example, 1.2 V. The virtual power supply voltage VVDD becomes the VDDL in the hold state, and the voltage VVDD−VGND is, for example, 1.0 V. The FETs M10 to M12 are turned off during the read operation and the write operation.

[Description of the Memory Cell of the Virtual Ground System]

Figure 24:
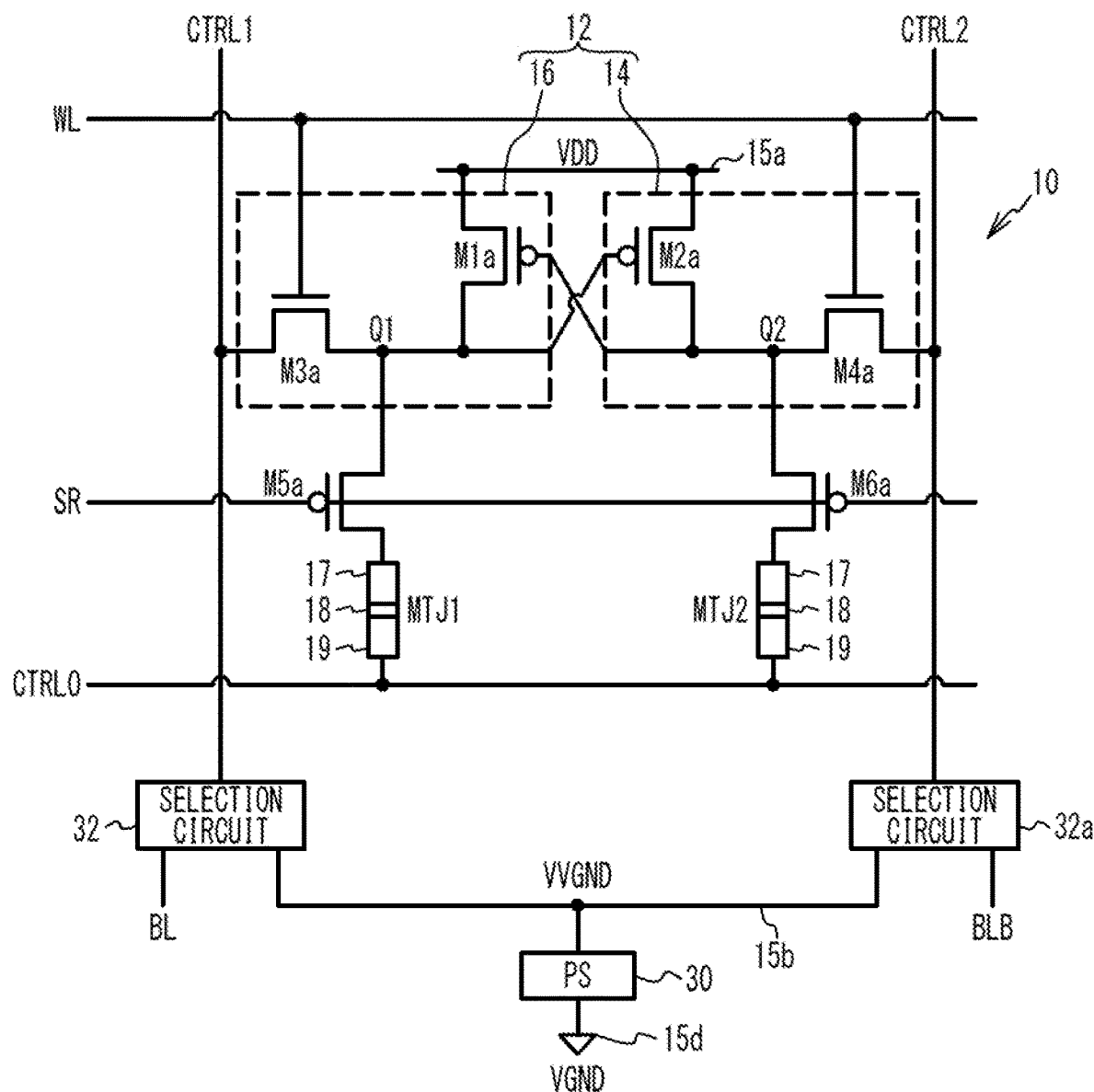
FIG. 24 is a circuit diagram of a memory cell of a virtual ground system in the embodiment 2.

FIG. 24 is a circuit diagram of the memory cell 10 of the virtual ground system in the embodiment 2. As illustrated in FIG. 24, in the virtual ground system, the power switch 30 is provided between the ground line 15b (a virtual ground line) and the ground 15d. FETs M1a to M6a are provided instead of the FETs M1 to M6. The FETs M1a, M2a, M5a, and M6a are P-channel FETs, and the FETs M3a and M4a are N-channel FETs.

The sources of the FETs M1a and M2a are coupled to the power supply line 15a. The pin layers 19 of the MTJ1 and the MTJ2 are coupled to the control line CTRL0, and the free layers 17 are coupled to the FETs M5 and M6. The selection circuit 32 connects the control line CTRL1 to either the bit line BL or the ground line 15b. The selection circuit 32a connects the control line CTRL2 to either the bit line BLB or the ground line 15b. The power switch (PS) 30 converts the voltage VGND of the ground 15d to the virtual ground voltage VVGND and supplies it to the ground line 15b. Other configurations are the same as those in FIG. 22 of the virtual power supply system, and the description thereof will be omitted.

Figure 25:
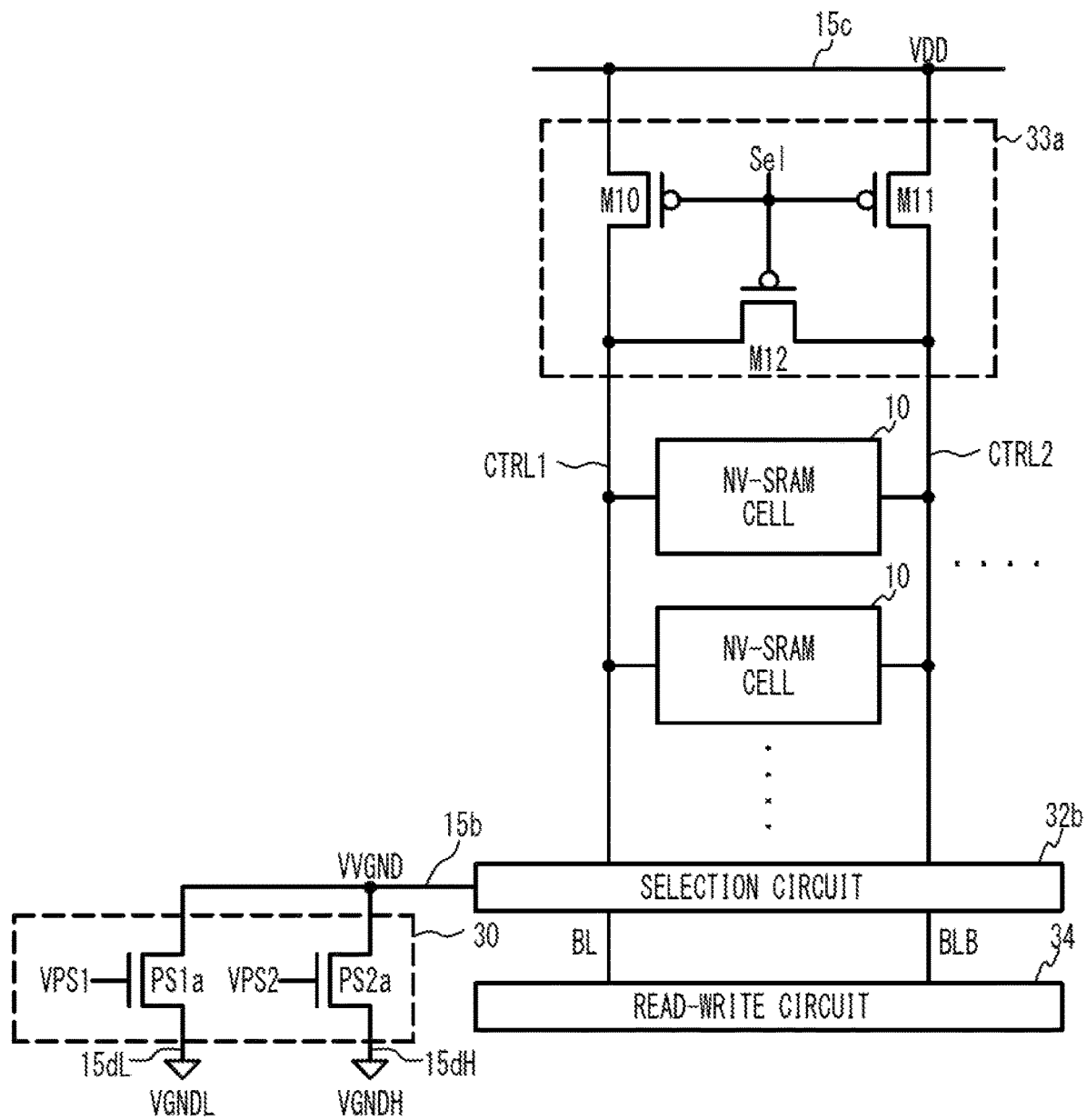
FIG. 25 illustrates a power switch and a selection circuit in the virtual ground system of the embodiment 2.

FIG. 25 illustrates the power switch and the selection circuit in the virtual ground system of the embodiment 2. As illustrated in FIG. 25, the selection circuit 32b connects either the bit lines BL and BLB, which are coupled to the read-write circuit 34, or the ground line 15b to the control lines CTRL1 and CTRL2. The power switch 30 includes FETs PS1a and PS2a. The FET PS1a and PS2a are N-channel FETs. The FET PS1a is connected between a ground 15dL and the ground line 15b, and the FET PS2a is connected between a ground 15dH and the ground line 15b. The ground voltage VGNDL and the voltage VGNDH are supplied to the grounds 15dL and 15dH, respectively.

Signals VPS1 and VPS2 are input to the gates of the FETs PS1a and PS2a, respectively. When the signals VPS1 and VPS2 are at a high level and a low level, respectively, the FETs PS1a and PS2a are turned on and turned off, respectively, and the virtual ground voltage VVGND becomes the VGNDL. The virtual ground voltage VVGND becomes the VGNDL during the store operation and the restore operation, and VDD−VVGND is, for example, 1.2 V. When the signals VPS1 and VPS2 are at a low level and a high level, respectively, the FETs PS1a and PS2a are turned off and turned on, respectively, and the virtual ground voltage VVGND becomes the VGNDH. The virtual ground voltage VVGND becomes the VGNDH in the hold state, and VDD−VVGND is, for example, 1.0 V. When both the signals VPS1a and VPS2a are at a low level, both the FETs PS1a and PS2a are turned off and the virtual ground voltage VVGND is cut off. The virtual ground voltage VVGND is cut off in the shutdown state.

The precharge/selection circuit 33a includes the FETs M10 to M12. The FET M10 is connected between the power supply 15c and the control line CTRL1. The FET M11 is connected between the power supply 15c and the control line CTRL2. The FET M12 is connected between the control lines CTRL1 and CTRL2. The selection signal Sel is input to the gates of the FETs M10 to M12. When the selection signal Sel is at a low level, the FETs M10 to M12 are turned on, and the power supply voltage VDD is applied to the control lines CTRL1 and CTRL2. The FETs M10 to M12 are turned on during the precharging of the read operation. When the selection signal Sel is at a high level, the FETs M10 to M12 are turned off and the selection circuit 32b connects the control lines CTRL1 and CTRL2 to the bit lines BL and BLB or the ground line 15b.

Hereinafter, the memory array and the operation of the embodiment 2 will be described using the virtual power supply system as an example.

[Description of the Memory Array]

Figure 26:
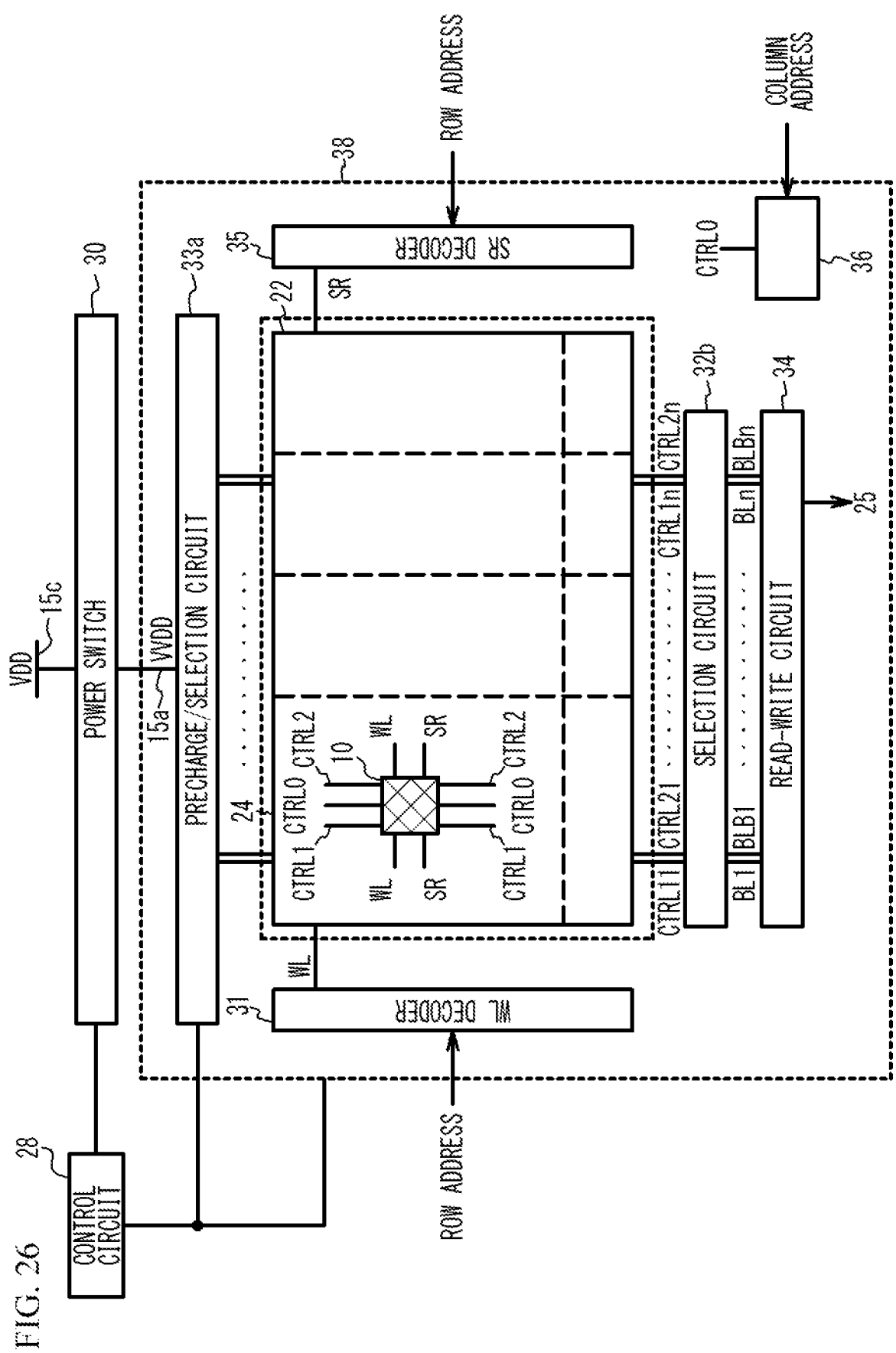
FIG. 26 is a block diagram of a memory array in the embodiment 2.

FIG. 26 is a block diagram of the memory array in the embodiment 2. As illustrated in FIG. 26, the memory array 22 is divided into a plurality of blocks 24 each having the memory cell 10. The number of the blocks 24 can be designed as appropriate. A plurality of the memory cells 10 are arranged in a matrix form in the memory array 22. In the memory array 22, the word line WL and the switch line SR extend in the row direction, and the control lines CTRL0 to CTRL2 extend in the column direction. The word line WL, the switch line SR, and the control lines CTRL0 to CTRL2 are coupled to each memory cell 10. In FIG. 26, the control lines CTRL1 and CTRL2 of the 1st column to the n-th column are represented by control lines CTRL11 and CTRL21 to CTRL1n and CTRL2n, respectively.

The control circuit 28, the power switch 30, and the peripheral circuit 38 are provided so as to correspond to the memory array 22. The control circuit 28 controls the power switch 30 and the peripheral circuit 38. The peripheral circuit 38 includes the WL decoder 31, the selection circuit 32b, the precharge/selection circuit 33a, the read-write circuit 34, an SR decoder 35, and a column decoder 36.

In the read operation and the write operation, the selection circuit 32b connects the bit lines BL1 and BLB1 to BLn and BLBn to the control lines CTRL11 and CTRL21 to CTRL1n and CTRL2n, respectively. The WL decoder 31 selects the word line WL on the basis of the row address. The read-write circuit 34 selects, from among the bit lines BL1 and BLB1 to BLn and BLBn, the bit lines BL and BLB corresponding to the column selected on the basis of the column address. The precharge/selection circuit 33a precharges the bit lines BL and BLB. The read-write circuit 34 writes data in the bistable circuit 12 of the selected memory cell 10 or reads data from the bistable circuit 12 and outputs the read data to the bus 25.

In the store operation and the restore operation, the selection circuit 32b connects the power supply line 15a to the control lines CTRL11 and CTRL21 to the CTRL1n and CTRL2n. In the store operation, the SR decoder 35 selects the switch line SR on the basis of the row address. The column decoder 36 selects the control line CTRL0 on the basis of the column address. In the memory cell 10 selected by the WL decoder 31 and the column decoder 36, the data in the bistable circuit 12 is stored in the ferromagnetic tunnel junction elements MTJ1 and MTJ2 in a non-volatile manner.

[Description of the Operation]

FIG. 27A to FIG. 29 illustrate the operations of the memory cell in the embodiment 2. H indicates a high level, L indicates a low level, and the number in parentheses indicates an example of voltage.

Figure 27A:
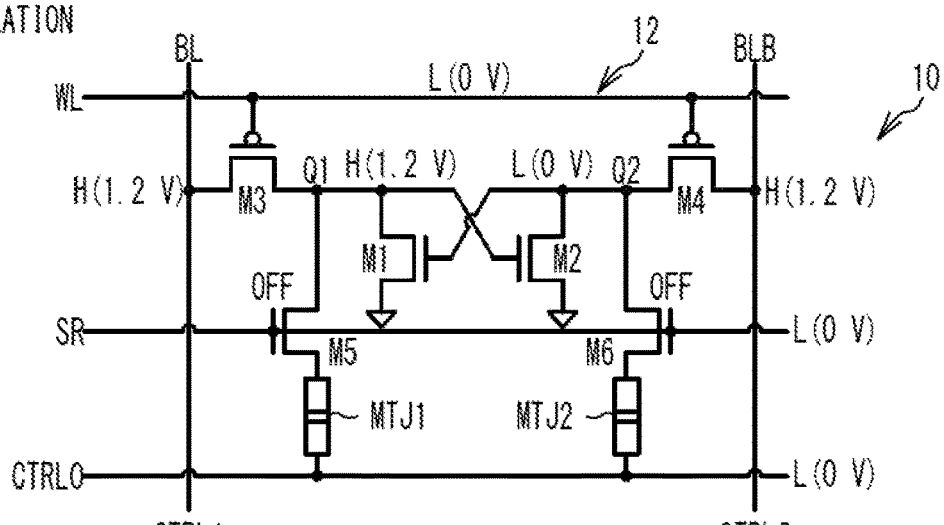
FIG. 27A to FIG. 27C illustrate the operations of the memory cell in the embodiment 2.

A description will be given of the case that the voltages of the memory nodes Q1 and Q2 are set to H (e.g., 1.2 V) and L (e.g., 0 V), respectively, in the bistable circuit 12 as illustrated in FIG. 27A. During the read operation in which the data in the bistable circuit 12 is read, the control circuit 28 causes the selection circuit 32b to make the control lines CTRL1 and CTRL2 function as the bit lines BL and BLB. For example, the control circuit 28 turns off the FETs M10 to M12 in FIG. 23 and turns on the transfer gates M13 and M14. The control circuit 28 sets the word line WL to L (e.g., 0 V), turns off the FETs M5 and M6 (for example, sets the switch line SR to L (e.g., 0 V)), and sets the control line CTRL0 to L (e.g., 0 V). The read-write circuit 34 sets the control lines CTRL1 and CTRL2 to H (e.g., 1.2 V), and reads the data in the bistable circuit.

Figure 27B:
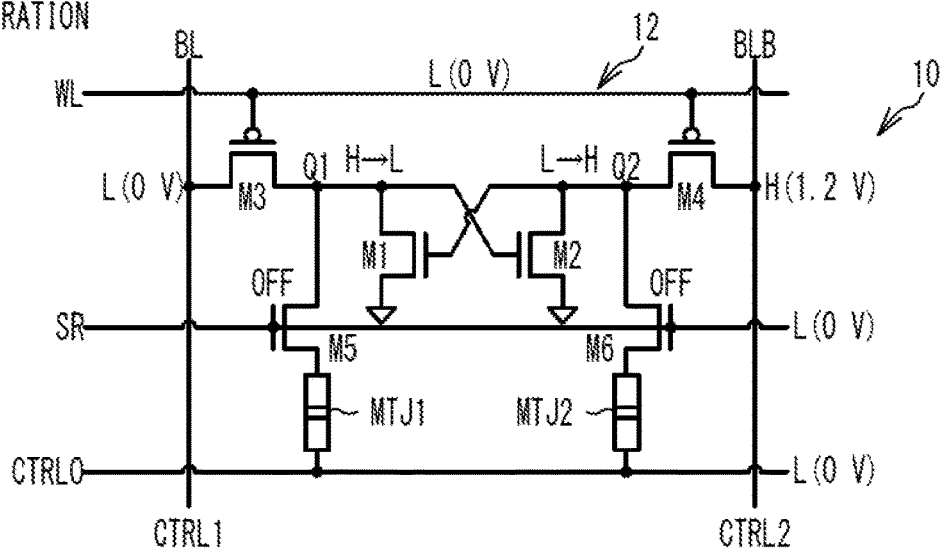

As illustrated in FIG. 27B, the write operation for writing data to the bistable circuit 12 will be described by taking as an example a case in which the voltage of the memory node Q1 is rewritten from H to L and the voltage of the memory node Q2 is rewritten from L to H. The control circuit 28 causes the selection circuit 32b to make the control lines CTRL1 and CTRL2 function as the bit lines BL and BLB. The control circuit 28 sets the word line WL to L, turns off the FETs M5 and M6, and sets the control line CTRL0 to L. The read-write circuit 34 sets the bit lines BL and BLB to L (e.g., 0 V) and H (e.g., 1.2 V), respectively. This causes L and H to be written to the memory nodes Q1 and Q2, respectively.

Figure 27C:
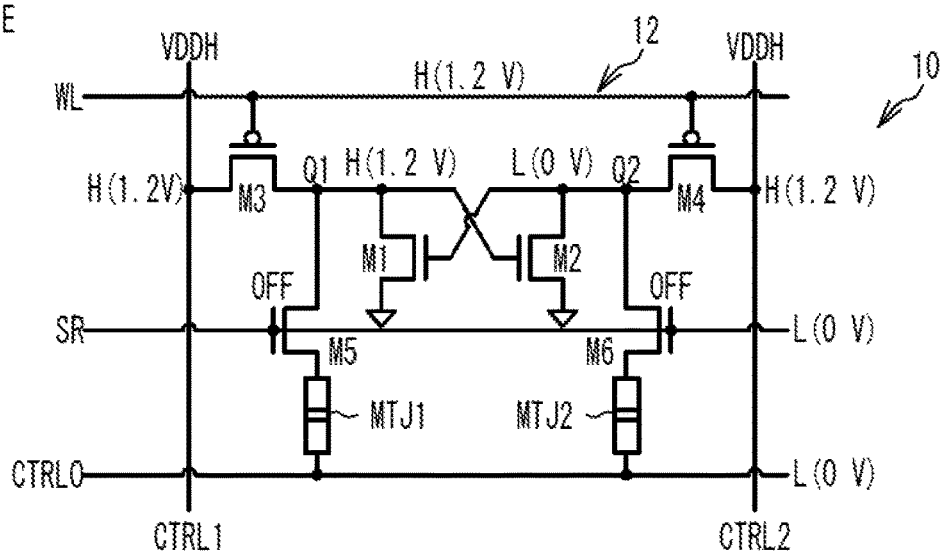

As illustrated in FIG. 27C, in the hold state in which the bistable circuit 12 retains data in a volatile manner, the control circuit 28 causes the power switch 30 and the selection circuit 32b to apply the voltage VDDH (e.g., 1.2 V) as H to the control lines CTRL1 and CTRL2. For example, the control circuit 28 turns on the FETs M10 to M12 in FIG. 23, turns off the transfer gates M13 and M14, and turns on the FET PS1 and turns off the FET PS2. The control circuit 28 sets the word line WL to H (e.g., 1.2 V), turns off the FETs M5 and M6, and sets the control line CTRL0 to L. As a result, the memory nodes Q1 and Q2 are maintained at H and L, respectively. As described above, in the read operation, the write operation, and the hold state, since the FETs M5 and M6 are turned off, the influence of the MTJ1 and the MTJ2 does not reach the bistable circuit 12.

The operation of storing the data in the bistable circuit 12 in the MTJ1 and the MTJ2 in a non-volatile manner will be described. In the store operation, an H-store operation (a first store operation) in which one of the MTJ1 and the MTJ2 is set to high resistance and an L-store operation (a second store operation) in which the other of the MTJ1 and the MTJ2 is set to low resistance are performed. Either the H-store operation or the L-store operation may be performed first. The hold state may be set between the H-store operation and the L-store operation.

Figure 28A:
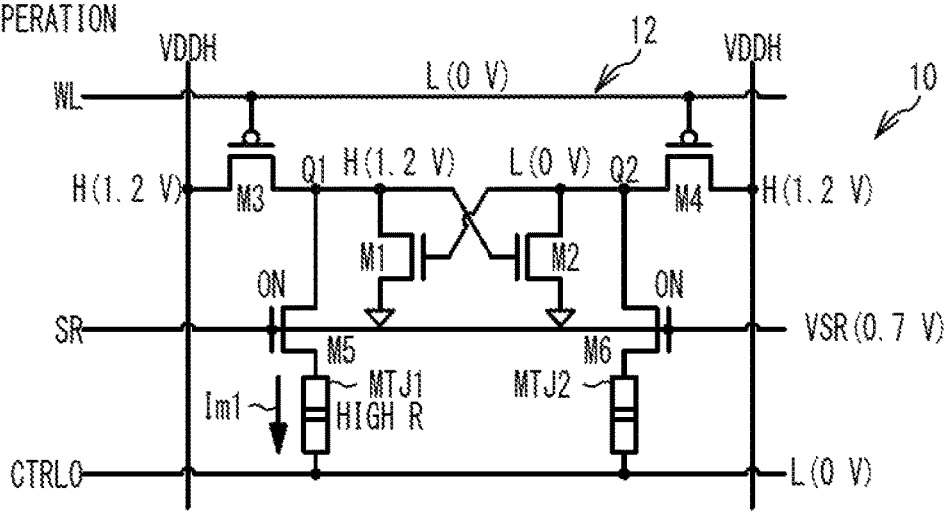
FIG. 28A to FIG. 28C illustrate the operations of the memory cell in the embodiment 2.

A description will be given in the case that the memory nodes Q1 and Q2 are at H and L, respectively as illustrated in FIG. 28A, as an example. During the H-store operation, the control circuit 28 causes the power switch 30 and the selection circuit 32b to apply the voltage VDDH as H to the control lines CTRL1 and CTRL2. The control circuit 28 sets the word line WL to L, turns on the FETs M5 and M6 (for example, sets the voltage VSR to 0.7 V), and sets the control line CTRL0 to L. As a result, the current Im1 flows from the memory node Q1 to the control line CTRL0 via the MTJ1. Therefore, the MTJ1 is put into the antiparallel state and has high resistance.

Figure 28B:
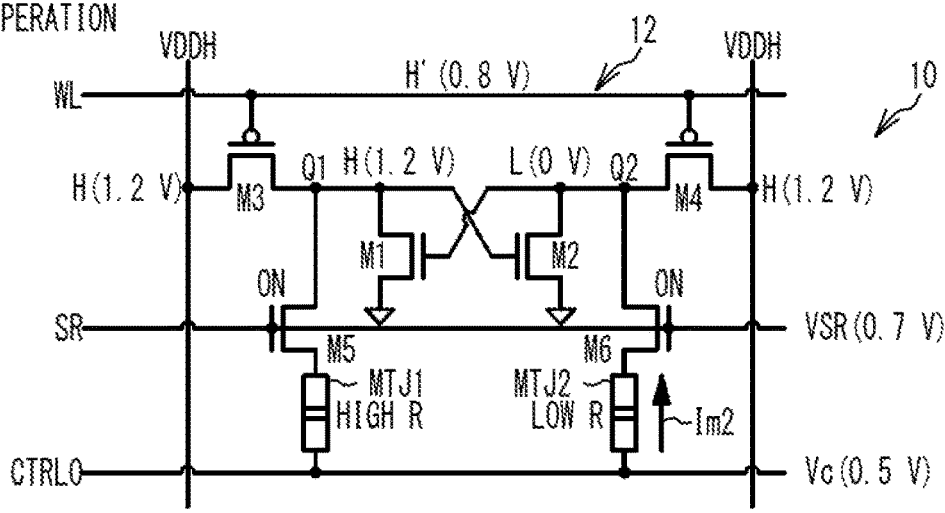

As illustrated in FIG. 28B, during the L-store operation, the control circuit 28 causes the power switch 30 and the selection circuit 32b to apply the voltage VDDH as H to the control lines CTRL1 and CTRL2. The control circuit 28 sets the word line WL to H' (e.g., 0.8 V), turns on the FETs M5 and M6 (for example, sets the voltage VSR to 0.7 V), and sets the control line CTRL0 to Vc (e.g., 0.5 V). As a result, a current Im2 flows from the control line CTRL0 to the memory node Q2 via the MTJ2. Therefore, the MTJ2 is put into the parallel state and has low resistance.

As illustrated in FIG. 28A and FIG. 28B, in the case that the FETs M1 and M2 have N-type channels, the voltage VWL (a first voltage) of the word line WL in the H-store operation (a first store operation) is lower than the voltage VWL (a fourth voltage) in the L-store operation (a second store operation), and the voltage Vc (a third voltage) of the control line CTRL0 in the H-store operation is lower than the voltage Vc (a sixth voltage) in the L-store operation. The voltages (a second voltage and a fifth voltage) of the control lines CTRL1 and CTRL2 in the H-store operation and the L-store operation are higher than the voltage VGND of the ground line 15b. This allows the data in the bistable circuit 12 to be stored in the MTJ1 and the MTJ2. As illustrated in FIG. 24, in the case that the FETs M1a and M2a have P-type channels, the first voltage is higher than the fourth voltage, and the third voltage is higher than the sixth voltage. The second voltage and the fifth voltage are lower than the voltage VDD of the power supply line 15a.

Figure 28C:
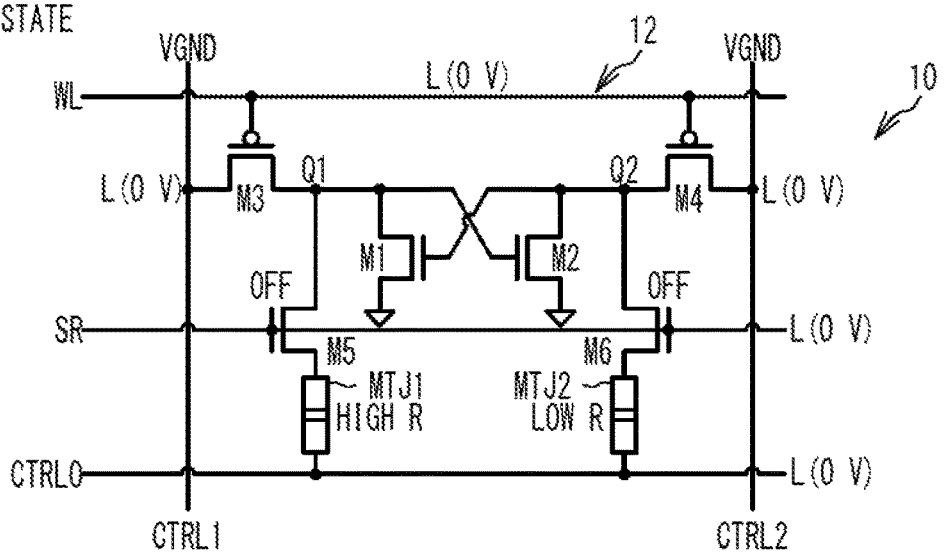

As illustrated in FIG. 28C, the state is put into a shutdown state in which the power supply is shut down (the voltage VVDD−VGND is set to 0 V) after the store operation. In the shutdown state, the control circuit 28 causes the power switch 30 and the selection circuit 32b to apply the voltage VGND (e.g., 0 V) as L to the control lines CTRL1 and CTRL2. The control circuit 28 sets the word line WL to L, turns off the FETs M5 and M6, and sets the control line CTRL0 to L. As described above, the control circuit 28 shuts down the power supply of the memory cell 10. In the shutdown state, the MTJ1 and the MTJ2 are maintained at high resistance and low resistance, respectively. The power supplies of the control circuit 28 and the peripheral circuit 38 may or may not be shut down.

Figure 29:
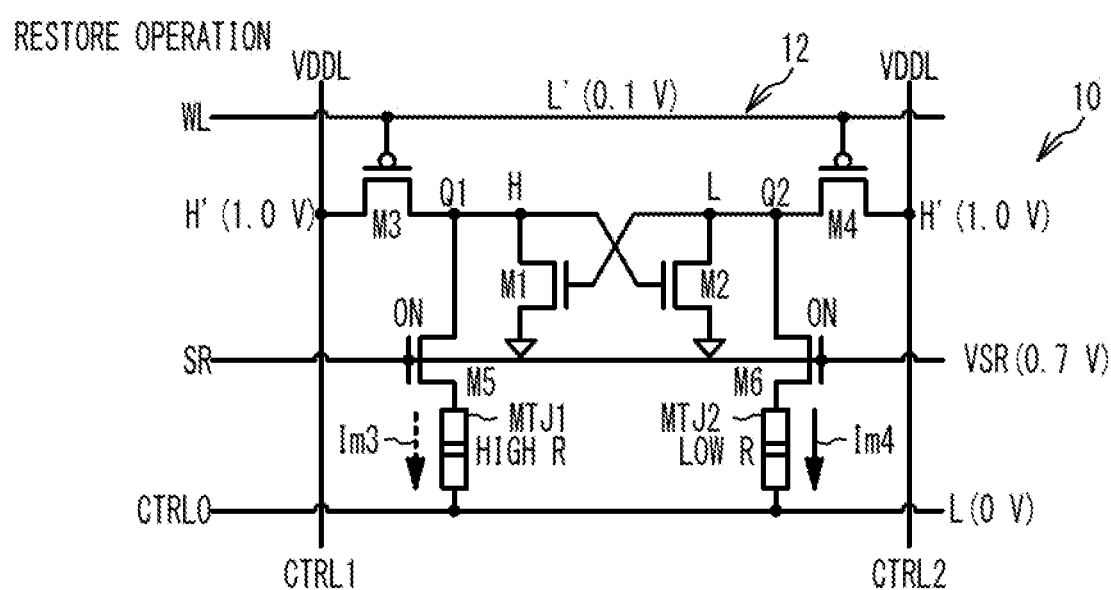
FIG. 29 illustrates the operations of the memory cell in the embodiment 2.

A description will be given of the case that the MTJ1 and the MTJ2 have high resistance and low resistance, respectively as illustrated in FIG. 29, as an example. During the restore operation for restoring the data in the MTJ1 and the MTJ2 to the bistable circuit 12, the control circuit 28 causes the power switch 30 and the selection circuit 32b to raise the control lines CTRL1 and CTRL2 from L to H' (e.g., 1.0 V). The control circuit 28 sets the word line WL to L' (e.g., 0.1 V), turns on the FETs M5 and M6 (for example, sets the voltage VSR to 0.7 V), and sets the control line CTRL0 to L. A current Im3 flows from the control line CTRL1 to the MTJ1 via the FETs M3 and M5. Similarly, a current Im4 flows from the control line CTRL2 to the MTJ2 via the FETs M4 and M6. Since the MTJ1 and the MTJ2 have high resistance and low resistance, respectively, the current Im4 is larger than Im3. This causes the voltage of the memory node Q2 to become low faster than the voltage of the memory node Q1. Therefore, the memory nodes Q1 and Q2 are stabilized to H and L, respectively. This completes the restore operation. The bistable circuit 12 retains the data in a volatile manner by putting the state into the hold state after the restore operation. In addition, the read operation and the write operation are performed.

As illustrated in FIG. 27A and FIG. 27B, the control circuit 28 turns off the FETs M5 and M6 during the write operation for writing data in the bistable circuit 12 in a volatile manner and the read operation for reading data from the bistable circuit 12. As illustrated in FIG. 28A, FIG. 28B, and FIG. 29, during the store operation for storing data from the bistable circuit 12 to the MTJ1 and the MTJ2 in a non-volatile manner, and the restore operation for restoring data from the MTJ1 and the MTJ2 to the bistable circuit 12, the FETs M5 and M6 are turned on. Thereby, it is possible to reduce the influence of the MTJ1 and the MTJ2 on the bistable circuit 12 during the write operation and the read operation.

[Simulation 3]

Appropriate channel widths and voltages in the embodiment 2 were simulated. In simulation 3, the following steps S1 to S5 were performed to determine each channel width and voltage. First, by analogy with the comparative example 3 (6T-SRAM), the channel width of each FET was set as follows. The channel length of each FET is 60 nm.

FETs M1 and M2: WDRV=150 nm
FETs M3 and M4: WLP=100 nm
FETs M5 and M6: WSR=100 nm

[Step S1]

Figure 30:
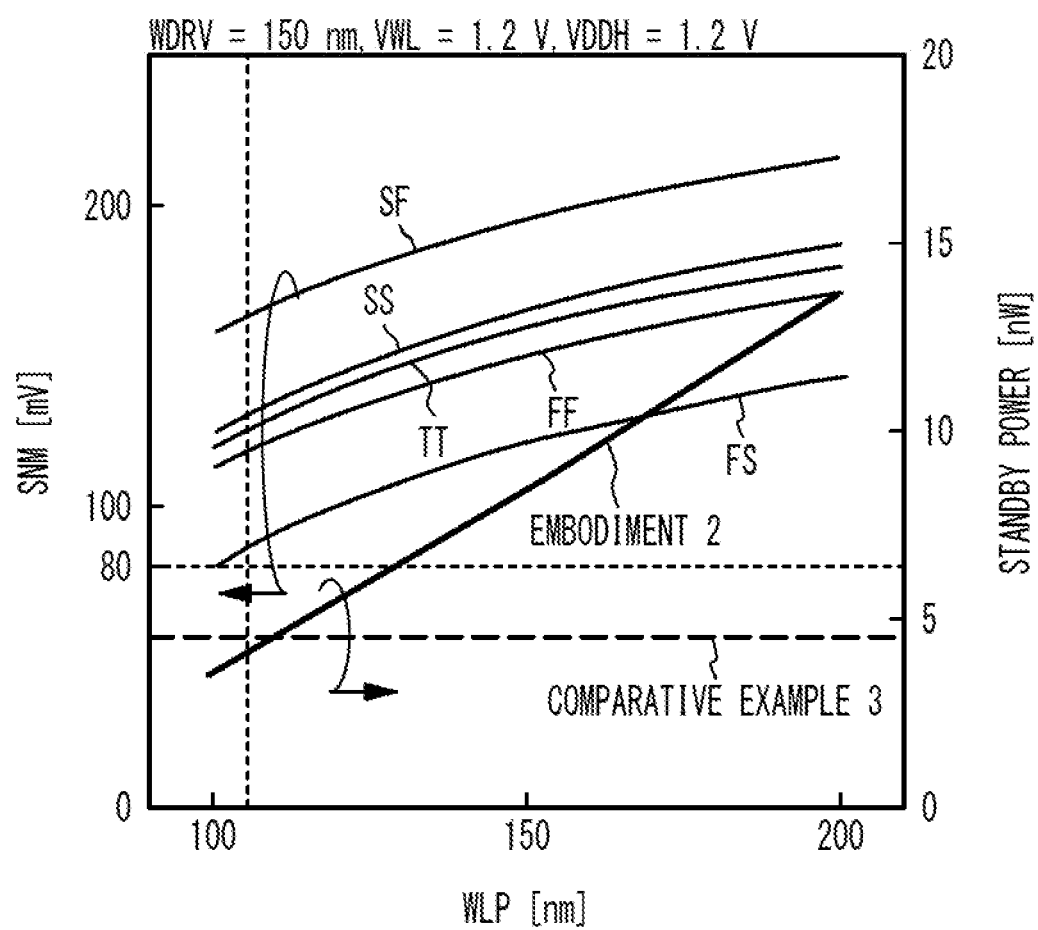
FIG. 30 presents the SNM and the standby power with respect to WLP in the hold state in simulation 3.

In step S1, the channel widths WLP of the FETs M3 and M4 were determined from the SNM in the hold state of the 4T cell (the FETs M1 to M4) of the bistable circuit 12 of the embodiment 2. FIG. 30 presents the SNM and the standby power with respect to the WLP in the hold state in simulation 3. The channel widths WDRV of the FETs M1 and M2 are 150 nm, the voltage VWL of the word line WL is 1.2 V, and the voltages VDDH of the control lines CTRL1 and CTRL2 are 1.2 V. The SNM is presented for the TT, the SS, the SF, the FS, and the FF. For the standby power, the simulation result of the embodiment 2 (a 4T cell) is indicated by a solid line, and the simulation result of the comparative example 3 (a 6T cell) is indicated by a broken line.

As illustrated in FIG. 30, as the WLP increases, the SNM becomes larger, but the standby power also becomes larger. At a WLP of 105 nm or greater, all SNMs are 80 mV or greater. At a WLP of 110 nm or greater, the standby power exceeds that of the comparative example 3. From these facts, the WLP was determined to be 105 nm.

[Step S2]

Figure 31:
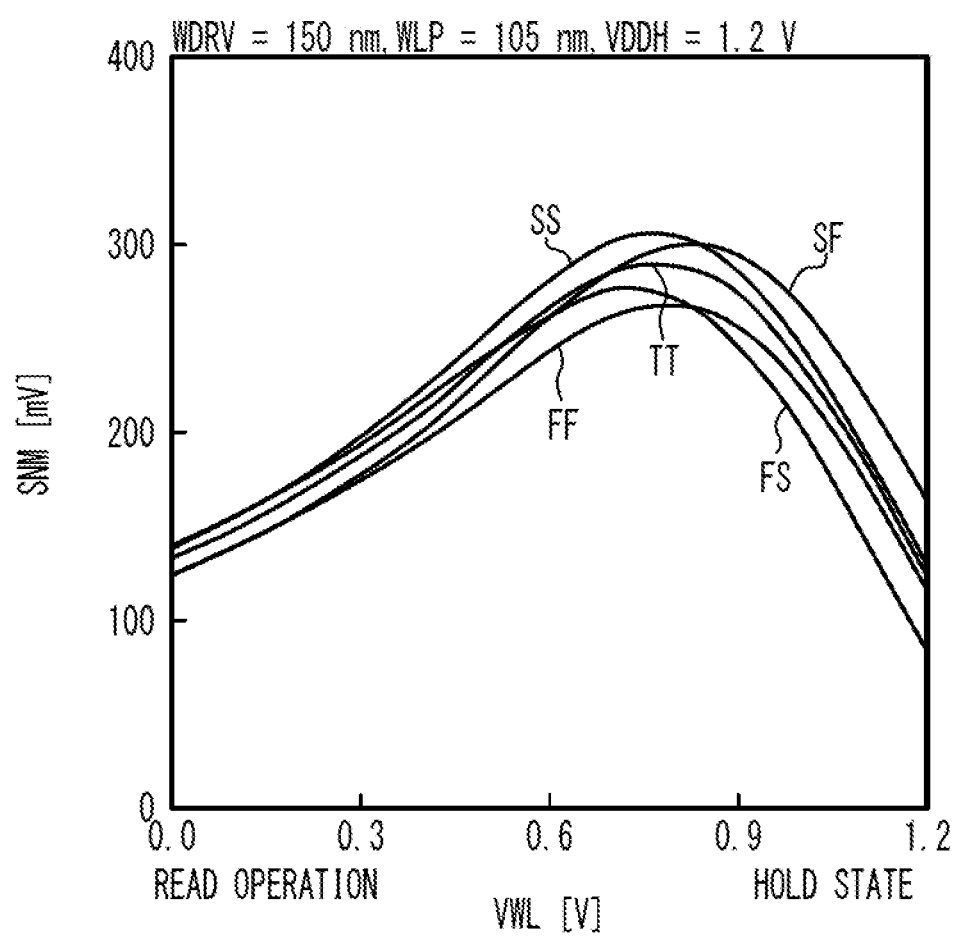
FIG. 31 presents the SNM with respect to VWL in a read operation and the hold state in simulation 3.

In step S2, the voltages VWL of the word line WL in the read operation, the write operation, and the hold state were determined from the SNM in the read operation and the hold state of the 4T cell. FIG. 31 presents the SNM with respect to the VWL in the read operation and the hold state in simulation 3. The channel widths WDRV of the FETs M1 and M2 are 150 nm, the channel widths WLP of the FETs M3 and M4 are 105 nm, and the voltages VDDH of the control lines CTRL1 and CTRL2 are 1.2 V. The SNM is illustrated for the TT, the SS, the SF, the FS, and the FF. The VWL around 0 V corresponds to the read operation and the write operation in which the FETs M3 and M4 are turned on, and the VWL around 1.2 V corresponds to the hold state in which the FETs M3 and M4 are turned off.

As illustrated in FIG. 31, the SNM depends on the VWL. When the VWL becomes higher than 0 V, the SNM increases, and when the VWL becomes lower than 1.2 V, the SNM increases. The SNM is the largest when the VWL is 0.7 V to 0.8 V. Since the SNM is 80 mV or greater at a VWL of 0 V and 1.2 V, the VWL for the read operation and the write operation was determined to be 0 V, and the VWL in the hold state was determined to be 1.2 V.

[Step S3]

In step S3, the current Im1 (see FIG. 28A) in the H-store operation was designed. The target current Im1 was 1.2 times the threshold current Ic at which the MTJ1 and the MTJ2 switch from the parallel state to the antiparallel state. In the store operation, the control lines CTRL1 and CTRL2 are at H (1.2 V) to retain the data in the bistable circuit 12. To cause the current Im1 to flow from the memory node Q1 with H to the MTJ1, the voltage Vc of the control line CTRL0 is set to 0 V. The FETs M5 and M6 are turned on.

The FET M3 is turned on so that the memory node Q1 does not become L. Therefore, the voltage VWL of the word line WL is set to 0 V.

Figure 32A:
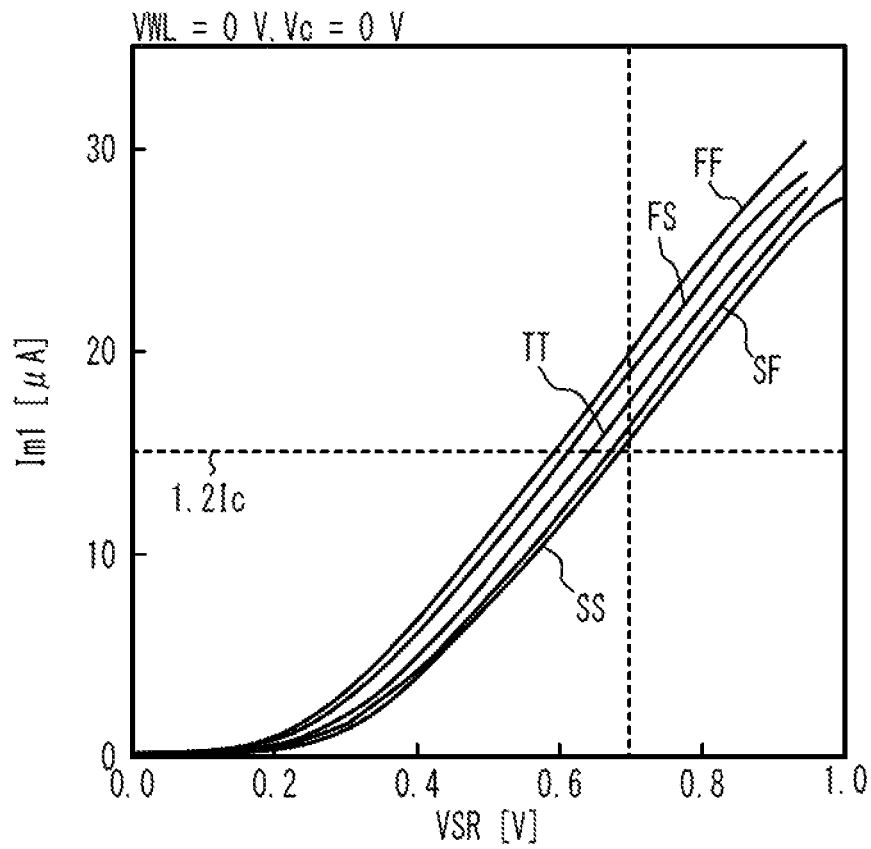
FIG. 32A and FIG. 32B present current Im1 and the SNM with respect to voltage VSR in an H-store operation in simulation 3, respectively.
Figure 32B:
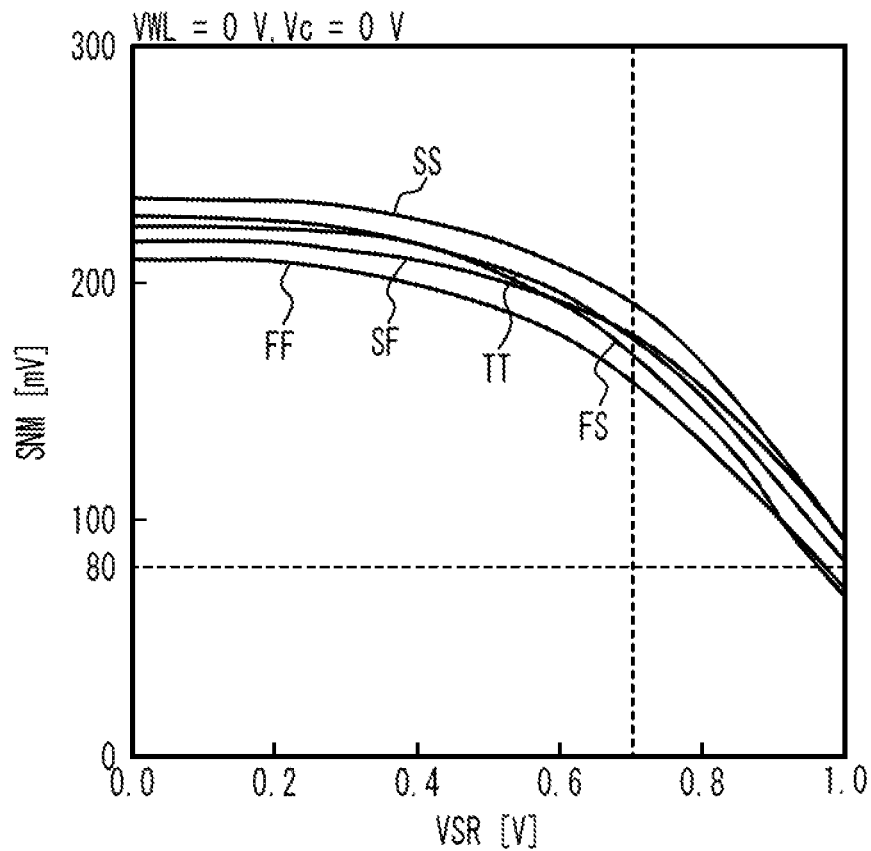

FIG. 32A and FIG. 32B present the current Im1 and the SNM with respect to the voltage VSR for the H-store operation in simulation 3, respectively. As presented in FIG. 32A, the current Im1 increases as the voltage VSR increases. At a voltage VSR of 0.7 V or greater, the current Im1 is 1.2 Ic or greater. As presented in FIG. 32B, as the voltage VSR becomes higher, the SNM decreases. When the voltage VSR is 0.95 V or greater, the SNM falls below 80 mV. The voltage VSR was determined to be 0.7 V so that the SNM was 80 mV or greater and the current Im1 was around 1.2 Ic.

[Step S4]

In step S4, the current Im2 (see FIG. 28B) in the L-store operation was designed. The target current Im2 was equal to or greater than 1.2 times the threshold current Ic at which the MTJ1 and the MTJ2 switch from the antiparallel state to the parallel state. To retain the data in the bistable circuit 12, the control lines CTRL1 and CTRL2 are at H (1.2 V). To cause the current Im2 to flow from the control line CTRL0 to the memory node Q2 with L via the MTJ2, the voltage Vc of the control line CTRL0 is set higher than L. To turn on the FETs M5 and M6, the voltage VSR is set to 0.7 V, which is the same as that in the H-store operation. The voltage VWL of the word line WL and the voltage Vc of the control line CTRL0 were varied.

Figure 33A:
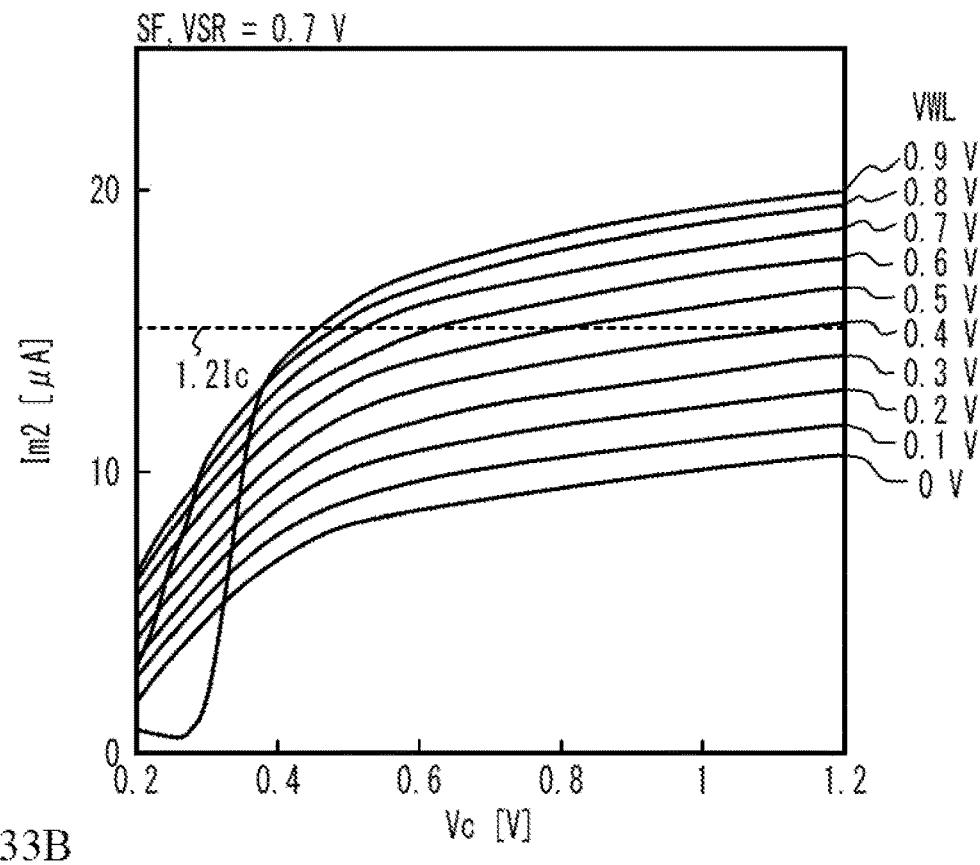
FIG. 33A and FIG. 33B present current Im2 and the SNM with respect to voltage Vc in an L-store operation in simulation 3.
Figure 33B:
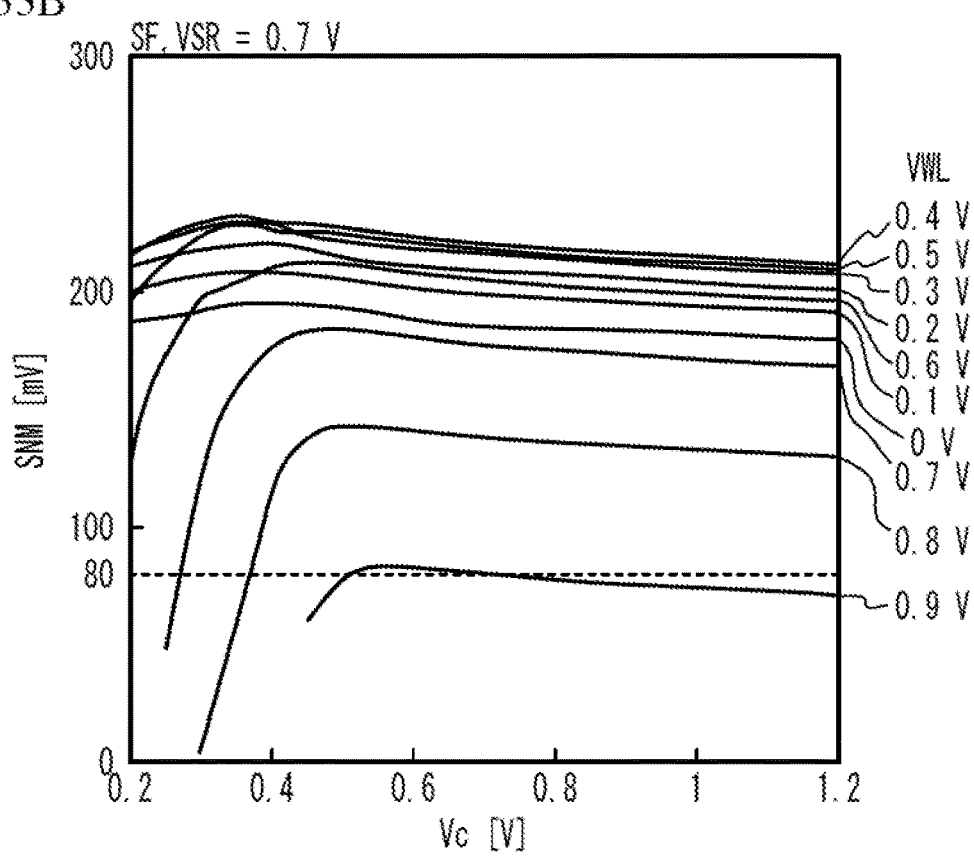

FIG. 33A and FIG. 33B present the current Im2 and the SNM with respect to the voltage Vc in the L-store operation in simulation 3, respectively. Since the SNM at the time of the SF is the smallest among the SNMs in the L-store operation, the current Im2 and the SNM at the time of the SF are presented. As presented in FIG. 33A, the current Im2 increases as the voltage Vc of the control line CTRL0 increases, and the current Im2 increases as the voltage VWL of the word line WL increases. The reason why the current Im2 decreases as the voltage VWL decreases is because the FET M4 is completely turned on when the voltage VWL is around 0 V, and the voltage of the memory node Q2 becomes high.

As presented in FIG. 33B, when the voltage VWL is increased to above 0 V, the SNM becomes larger, but when the VWL becomes 0.4 V or greater, the SNM becomes smaller. When the VWL is 0.9 V, the SNM is smaller than 80 mV. This is because when the voltage VWL becomes high, the FET M4 is turned off and the data cannot be maintained. When the voltage VWL is set to 0.5 V to 0.8 V, the current Im2 of 1.2 Ic and the SNM of 100 mV or greater can be achieved by appropriately selecting the voltage Vc. The voltage VWL was determined to be 0.8 V and the voltage Vc was determined to be 0.5 V. As seen from the above, by making the voltage VWL for the L-store operation higher than the voltage VWL for the H-store operation, it is possible to reduce a decrease in SNM in the L-store operation.

Further, the voltage VWL during the L-store operation is preferably such that the FETs M3 and M4 are slightly turned on. Therefore, when the FETs M1 and M2 have N-type channels, it is preferable that the voltage VWL in the L-store operation is lower than the voltages of the control lines CTRL1 and CTRL2. Further, when the FETs M1$a$ and M2$a$ have P-type channels, it is preferable that the voltage VWL in the second store operation is higher than the voltages of the control lines CTRL1 and CTRL2. This makes it possible to increase the SNM. The voltage VWL during the second store operation is preferably equal to or greater than VGND+(VDD−VGND)/4 and equal to or less than VDD−(VDD−VGND)/4.

[Step S5]

In step S5, the voltage VSR of the switch line SR and the voltage VWL of the word line WL in the restore operation were determined. In the restore operation, the voltage Vc of the control line CTRL0 is set to 0 V, and the voltages of the control lines CTRL1 and CTRL2 are increased. The data is restored to the bistable circuit 12 without raising the voltages of the control lines CTRL1 and CTRL2 to the voltage VDDH (1.2 V). Therefore, the restore operation ends when the voltages of the control lines CTRL1 and CTRL2 are raised to 1.0 V. When the hold state is set after the restore operation, for example, the voltages of the control lines CTRL1 and CTRL2 are raised to the VDDH (1.2 V). As a result, when the voltages of the control lines CTRL1 and CTRL2 are 1.0 V or greater, the voltage VSR can be set to 0 V and the voltage VWL can be set to 1.0 V or greater, and thereby, the power consumption can be reduced.

Figure 34A:
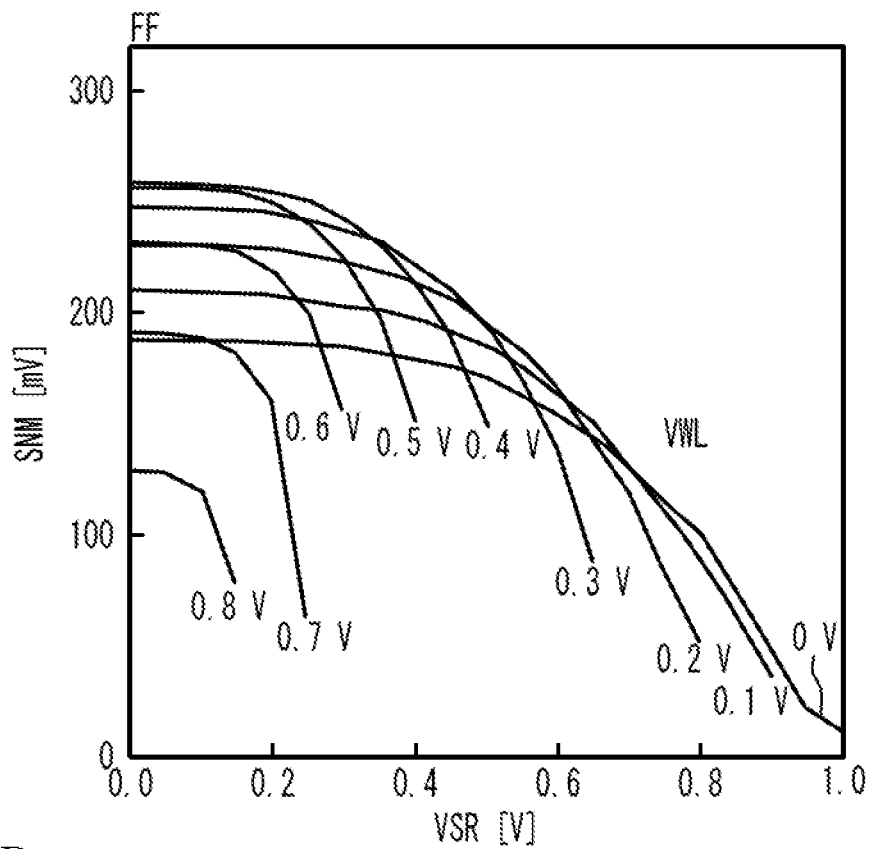
FIG. 34A and FIG. 34B presents the SNMs of FF and FS with respect to voltage VSR in a restore operation in simulation 3, respectively.
Figure 34B:
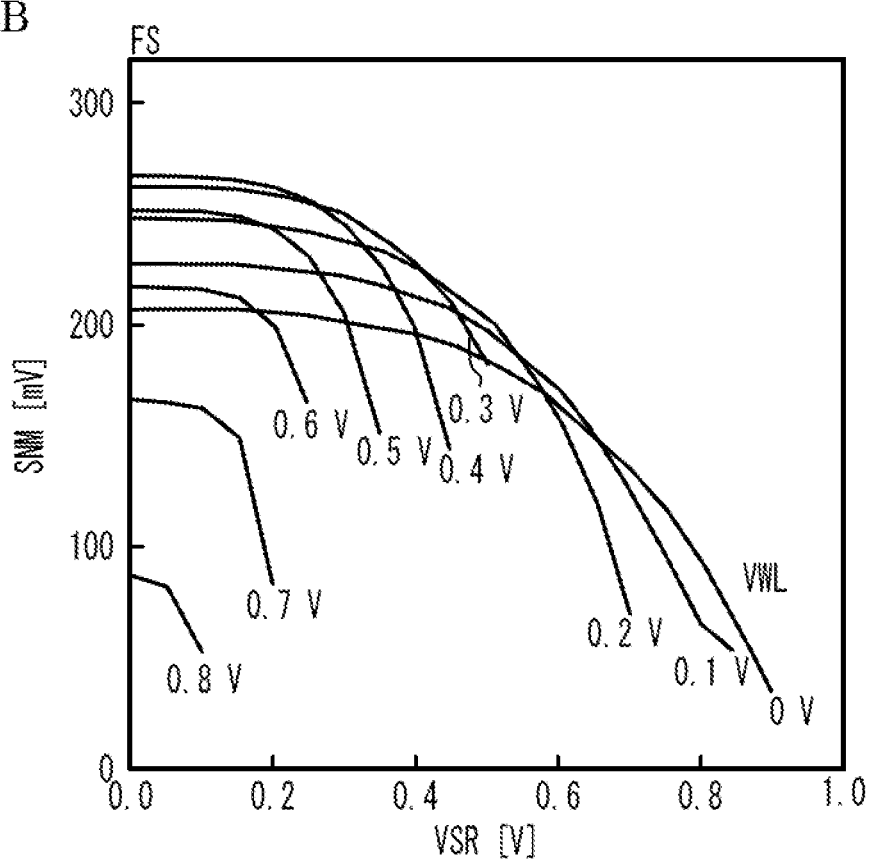

FIG. 34A and FIG. 34B present the SNMs of the FF and the FS with respect to the voltage VSR in the restore operation in simulation 3, respectively. The SNM is the SNM when the voltages of the control lines CTRL1 and CTRL2 are 1.0 V. As illustrated in FIG. 34A and FIG. 34B, when the voltage VSR of the switch line SR is increased while the FETs M3 and M4 are OFF (for example, VWL=0.8 V), the voltage of the memory node Q1 with H decreases, and the SNM becomes smaller. By lowering the voltage VWL of the word line WL to turn on the FETs M3 and M4, a current flows from the control line CTRL1 to the memory node Q1 with H, the H of the memory node Q1 can be maintained, and the SNM becomes larger. If the voltage VWL is set too low, the voltage of the memory node Q2 with L increases and the SNM decreases. In consideration of these facts, the voltage VSR was determined to be 0.7 V, which is the same as that in the store operation, and the voltage VWL was determined to be 0.1 V.

When the restore operation is performed, the voltage VWL of the word line WL is higher than the lower (e.g., 0 V) of the voltages VDD of the memory nodes Q1 and Q2 during the write operation, and is lower than the higher (e.g., 1.2 V) of the voltages VGND of the memory nodes Q1 and Q2. As a result, the SNM can be increased as illustrated in FIG. 34A and FIG. 34B. The voltage VWL during the restore operation is preferably lower than VGND+(VDD−VGND)/4 when the FETs M1 and M2 have N-type channels, and is preferably higher than VDD−(VDD−VGND)/4 when the FETs M1$a$ and M2$a$ have P-type channels.

Table 5 lists the channel width of each FET and voltages determined on the basis of the above steps S1 to S5.

TABLE 5

| Channel width | | |
| --- | --- | --- |
| WDRV | WLP | WSR |
| 150 nm | 105 nm | 100 nm |
| VWL | CTRL1, 2 | VSR | Vc |
| Hold state | | | |
| 1.2 V | 1.2 V | −0.2 V | 0 V |
| Read operation | | | |
| 0 V | 1.2 V | −0.2 V | 0 V |

TABLE 5-continued

| | Write operation | | |
|---|---|---|---|
| 0 V | 1.2/0 V | −0.2 V | 0 V |
| | H-store operation | | |
| 0 V | 1.2 V | 0.7 V | 0 V |
| | L-store operation | | |
| 0.8 V | 1.2 V | 0.7 V | 0.5 V |
| | Restore operation | | |
| 0.1 V | 0 −> 1 V | 0.7 V | 0 V |

In Table 5, the voltages VWL of the word line WL in the read operation, the write operation, the H-store operation, and the L-store operation are the voltage VWL in the memory cell 10 to be accessed. The voltage VWL of the memory cell 10 not to be accessed is 1.2 V (high level) at which the FETs M3 and M4 are turned off In Table 5, −0.2 V, which is lower than L, is applied as the voltage VSR of the switch line SR during the hold state, the read operation, and the write operation. This is to reduce the leakage current of the FETs M5 and M6. The voltage VSR may be any voltage as long as the FETs M5 and M6 are turned off. To reduce the leakage currents of the FETs M5 and M6 during the hold state, the read operation, and the write operation, the voltage Vc of the control line CTRL0 may be set higher than L. For example, the voltage Vc may be set to 0.05 V. The voltage VSR may be set lower than L and the voltage Vc may be set higher than L.

The voltage VSR in the H-store operation, the L-store operation, and the restore operation is only required to be such that the FETs M5 and M6 are turned on. The voltage VWL of the word line WL in the hold state is only required to be a voltage such that the FETs M3 and M4 are turned off, and the voltage VWL in the read operation, the write operation, the H-store operation, and the restore operation is only required to be such that the FETs M3 and M4 are turned on. The channel widths and the voltages are not limited to the examples in Table 5, and can be appropriately set.

Figure 35A:
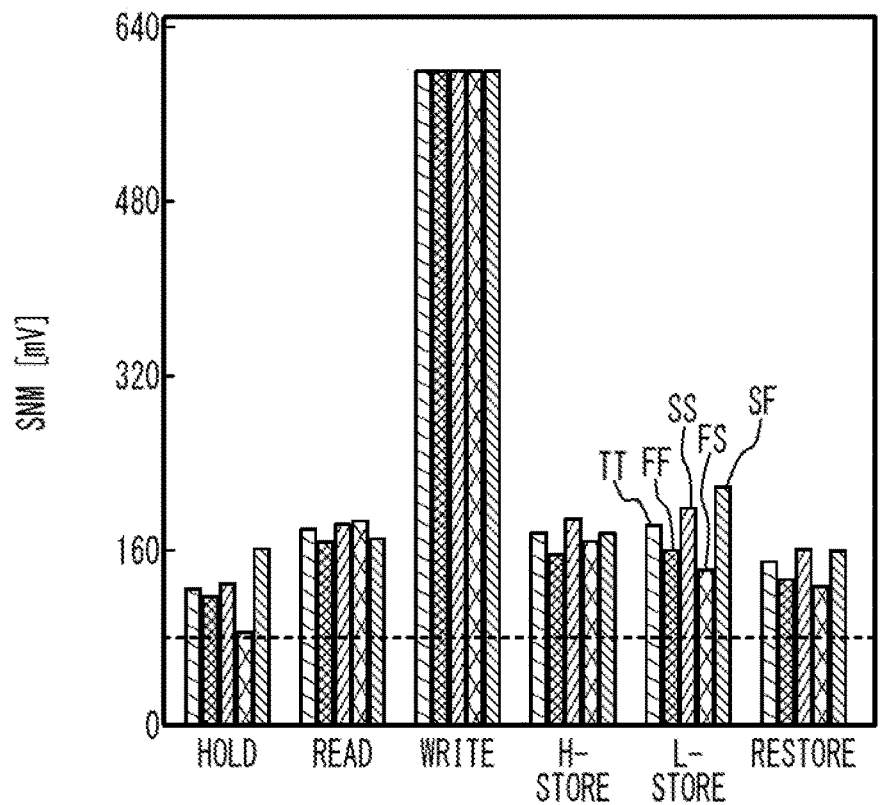
FIG. 35A presents the SNMs in the embodiment 2.

The SNM in each state and operation was simulated using the values in Table 5. FIG. 35A presents the SNM in the embodiment 2. As presented in FIG. 35A, the SNM of the FS in the hold state is the smallest. The SNM is 80 mV or greater in all corners of all states and operations. In the TT, the SNM is 100 mV or greater in all states and operations.

Figure 35B:
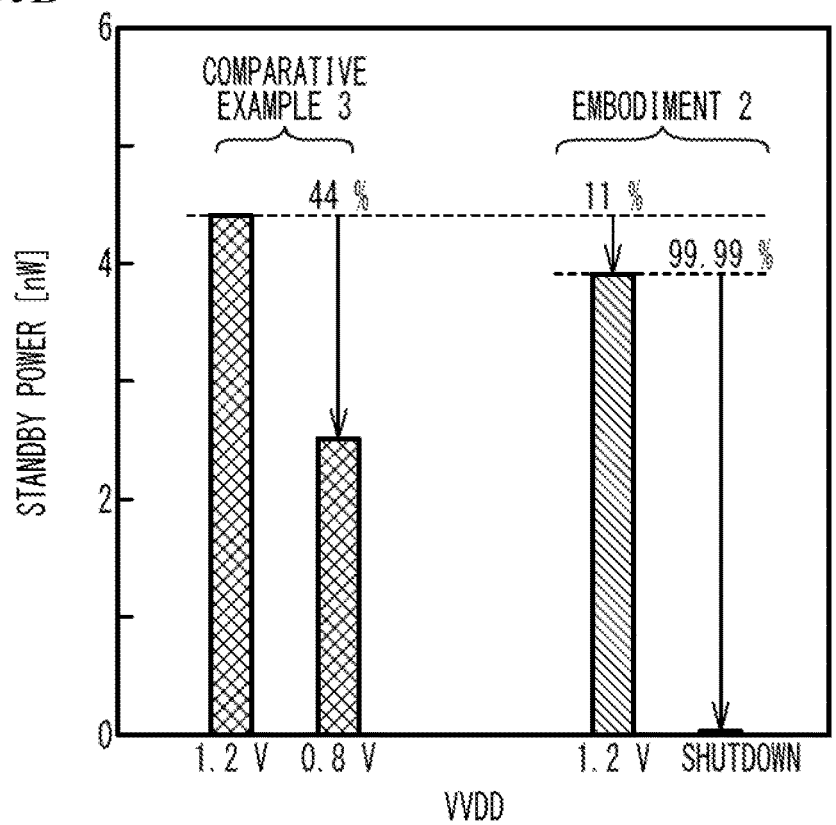
FIG. 35B presents the standby power in the embodiment 2 and the comparative example 3.

The standby power in the embodiment 2 was simulated and compared with that in the comparative example 3 (a 6T cell) described in FIG. 15. FIG. 35B presents the standby power of the embodiment 2 and the comparative example 3.

As presented in FIG. 35B, in the comparative example 3, the reduction rate of the standby power in the sleep state, in which the VVDD is 0.8 V, to the standby power in the normal operation, in which the VVDD is 1.2 V, is 44%. The reduction rate of the standby power when the VVDD is 1.2 V of the embodiment 2 to the standby power when the VVDD is 1.2 V of the comparative example 3 is 11%. Further, the reduction rate of the standby power in the shutdown state to the standby power when the VVDD is 1.2 V in the embodiment 2 is 99.99%.

As described above, in the embodiment 2, the FETs M1 and M2 are the FETs having the first conductivity type channel, the FETs M3 and M4 are the FETs having the channel of the second conductivity type opposite to the first conductivity type, and the FETs M3 and M4 are used as a pass transistor and a load. As a result, the standby power can be reduced and the number of transistors can be reduced to 6, so that the size can be reduced.

Variation 1 of the Embodiment 2

Figure 36:
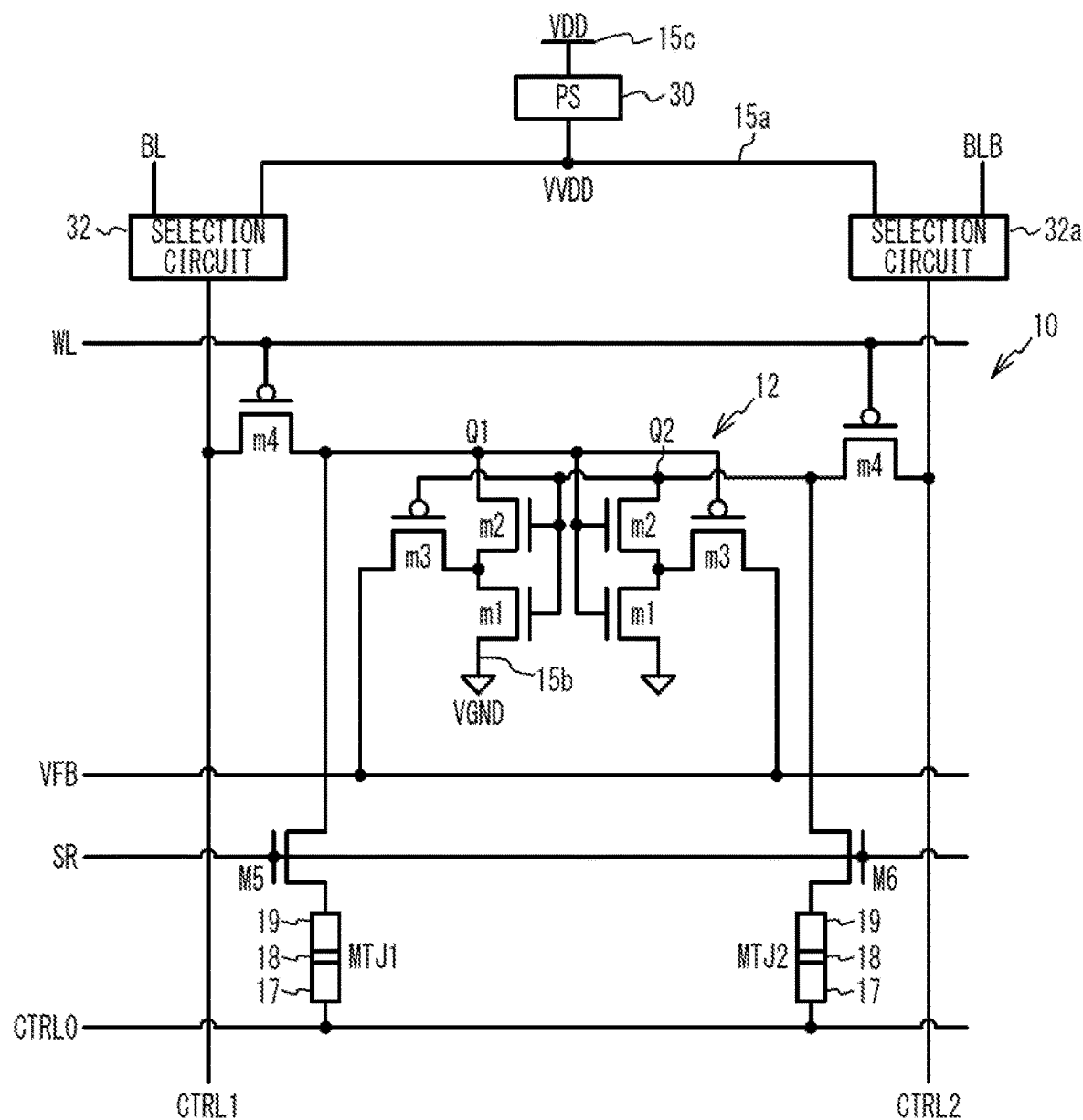
FIG. 36 is a circuit diagram of a memory cell in accordance with a variation 1 of the embodiment 2.

FIG. 36 is a circuit diagram of a memory cell in accordance with a variation 1 of the embodiment 2. As illustrated in FIG. 36, in the variation 1 of the embodiment 2, the FET M5 and the MTJ1 are connected between the memory node Q1 and the control line CTRL0 in FIG. 6 of the embodiment 1, and the FET M6 and the MTJ2 are connected between the memory node Q2 and the control line CTRL0. As in this case, the bistable circuit 12 may be the bistable circuit of any one of the embodiment 1 and its variations. As in FIG. 7B and FIG. 23, the precharge/selection circuit 33a may be coupled to the ends of the control lines CTRL1 and CTRL2, and the selection circuit 32b may be coupled to the other ends of the control lines CTRL1 and CTRL2.

When the access interval to the memory cell 10 is short, the ULV retention of the data in the bistable circuit 12 is performed, and when the access interval is long, the data is stored in the MTJ1 and the MTJ2, and shutdown is performed. This can further reduce the power consumption.

Embodiment 3

An embodiment 3 is an application example to a binary neural network (BNN: Binary Neural Network) such as BinaryNET or XNOR-NET. The BNN can be realized with low power consumption and a small amount of memory without significantly deteriorating the inference accuracy, and is expected to be applied to edge computing. In edge computing, learning and inference are not always performed, but it is required to retain data such as weights stored in the BNN device in the memory. Therefore, reducing the standby power of the memory becomes an issue. By using the ULVR-SRAM or the NV-SRAM for the memory portion of the BNN device (a BNN accelerator), it is possible to reduce the standby power of the memory.

Figure 37:
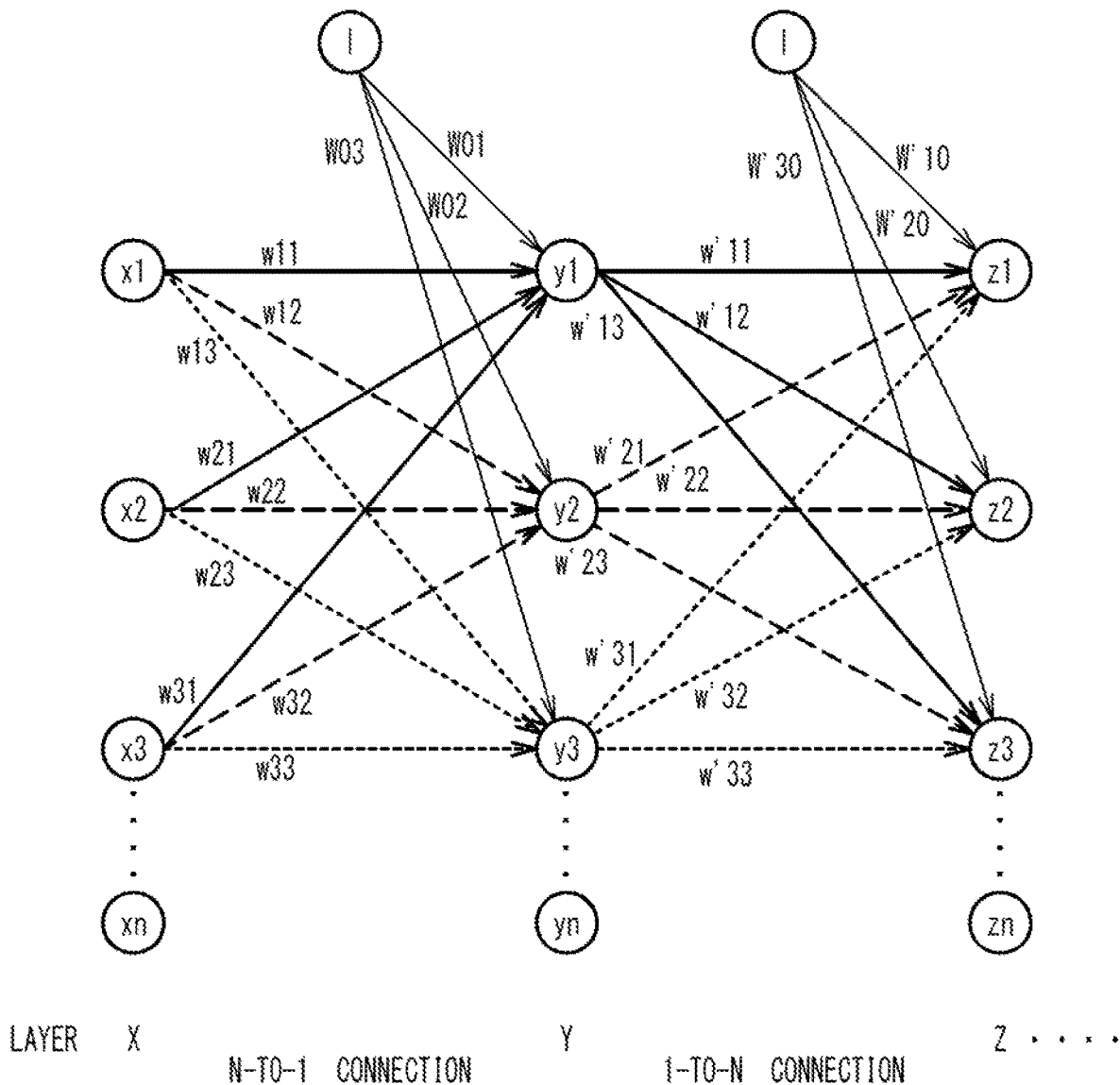
FIG. 37 illustrates a BNN model in an embodiment 3.

FIG. 37 illustrates the BNN model in the embodiment 3. Hereinafter, discussed is the BNN model using Batch Normalization Free Technique (Y. Yonekawa and H. Nakahara, "On-chip Memory Based Binarized Convolutional Deep Neural Network Applying Batch Normalization Free Technique on an FPGA", 2017 IEEE International Parallel and Distributed Processing Symposium Workshops, pp. 98-105, 2017).

As illustrated in FIG. 37, three layers: an X layer, a Y layer, and a Z layer, will be described as an example. The number of layers may be 4 or more. The X layer has nodes x1 to xn, the Y layer has nodes y1 to yn, and the Z layer has nodes z1 to zn. Each of the nodes x1 to xn, y1 to yn, and z1 to zn is 1 bit. The outputs of the nodes x1 to xn in the X layer are multiplied by the weights w1$i$ to wn$i$ of 1 bit ($i$ is an integer of 1 to n), respectively, and input to the node y$i$. Further, an integer bias W0$i$ is input to the node y$i$ from the node 1. The output of the node y$i$ is obtained by applying the evaluation function to the sum of these. The data of all the nodes y$i$ are obtained by performing the above operation for all $i$ (integers from 1 to n). The output of the node y$j$ of the Y layer is multiplied by 1-bit weights w'j1 to w'jn ($j$ is an integer of 1 to n) and input to respective nodes zk ($k$ is an integer of 1 to n). An integer bias W'j0 is input to the node zj from the node 1. The above operation is performed for all $j$ (integers from 1 to n), and in each node zj, the inputs to each node zj are added up. After the operation is completed, the output of each node zk (k=1 to n) is obtained by applying the evaluation function to these sums. Each data of the weight matrix w11 to wnn and w'11 to w'nn is 1 bit, and each data of the integer bias columns W01 to W0$n$ and W'10 to W'n0 is an integer (multi-bit). The same applies to the case that there are layers after the Z layer.

In the embodiment 3, the operation for calculating the Y layer from the X layer performs operations corresponding to solid lines from the nodes x1 to xn to the node y1, and then performs operations corresponding to broken lines from the nodes x1 to xn to the node y2, and then performs operations corresponding to dotted lines from the nodes x1 to xn to the node y3. Thereafter, the operations are sequentially performed for the nodes y4 to yn. This is called an n-to-1 connection. The operation for calculating the Z layer from the Y layer performs operations indicated by solid lines from the node y1 to the nodes z1 to zn, then performs operations indicated by dashed lines from the node y2 to the nodes z1 to zn, and then performs operations indicated by dotted lines from the node y3 to the nodes z1 to zn. This is called a 1-to-n connection. The operations of the solid lines and the broken lines of the 1-to-n connection can be performed in parallel to the operations of the broken lines and the dotted lines of the n-to-1 connection, respectively.

Figure 38:
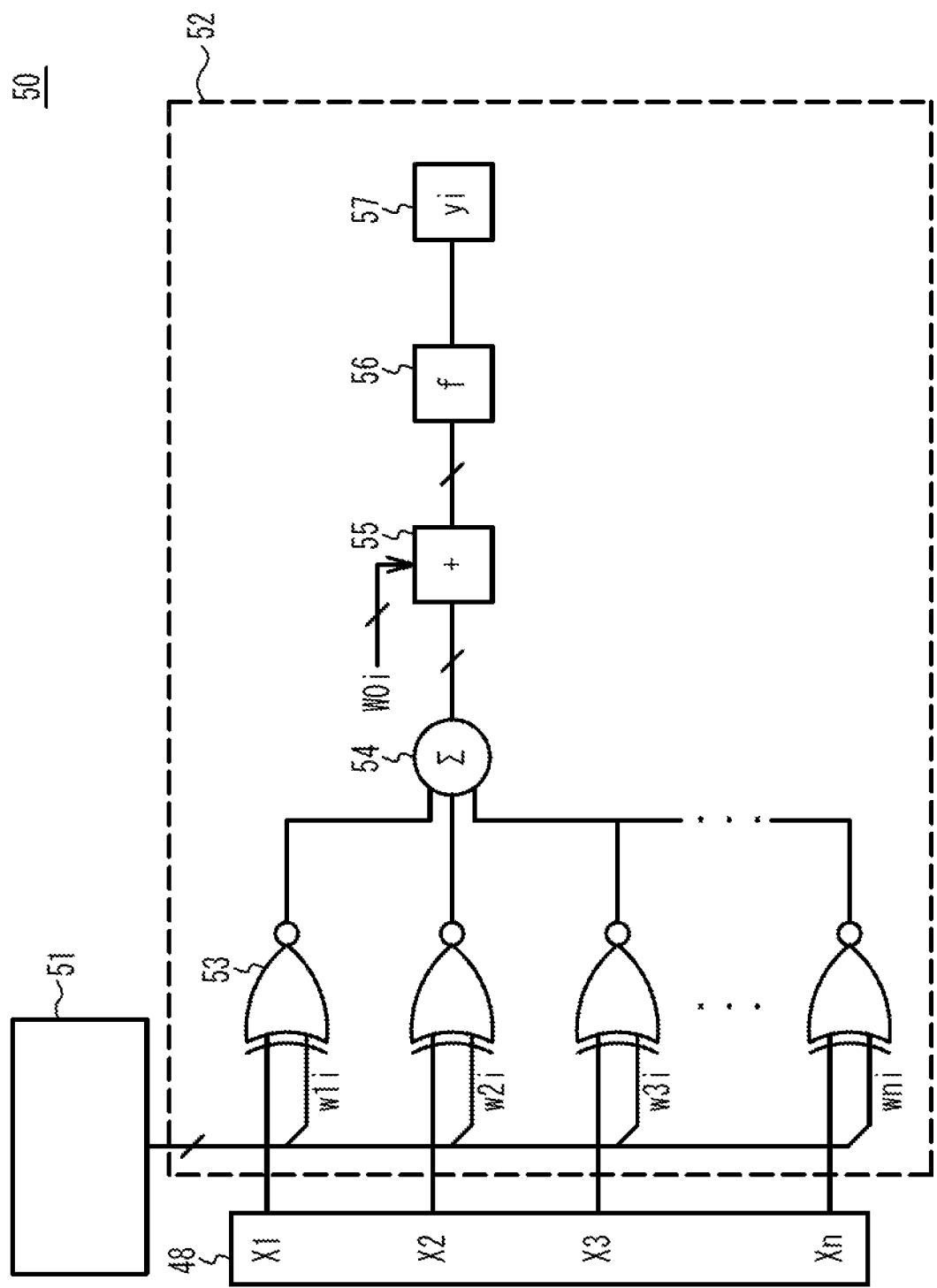
FIG. 38 is a block diagram of an arithmetic circuit that performs an n-to-1 connection operation in the embodiment 3.

FIG. 38 is a block diagram of an arithmetic circuit that performs an operation of the n-to-1 connection in the embodiment 3. As illustrated in FIG. 38, an arithmetic circuit 50 includes a memory 51 and a processing unit 52. The processing unit 52 includes XNOR circuits 53, a counter 54, an adder 55, an evaluation unit 56, and an output unit 57. An input unit 48 is an n-bit latch circuit and retains data of the nodes x1 to xn. The XNOR circuits 53 acquire the data of the nodes x1 to xn from the input unit 48, acquires the weight column w1$i$ to wni from the memory 51, and perform XNOR operations between the data of the nodes x1 to xn and the weight column w1$i$ to wni, respectively. The counter 54 bit-counts the outputs of the XNOR circuits 53 and calculates the sum. That is, the number of "1" of the output bits of n XNOR circuits 53 is calculated. The adder 55 acquires the integer bias W0$i$ from the memory 51 and adds it to the output of the counter 54. The evaluation unit 56 compares the output of the adder 55 with the evaluation function f, and outputs the 1-bit result to the output unit 57 as the data of the node yi. The output unit 57 is a 1-bit latch circuit and retains the data of the node yi.

Figures 39A, 39B:
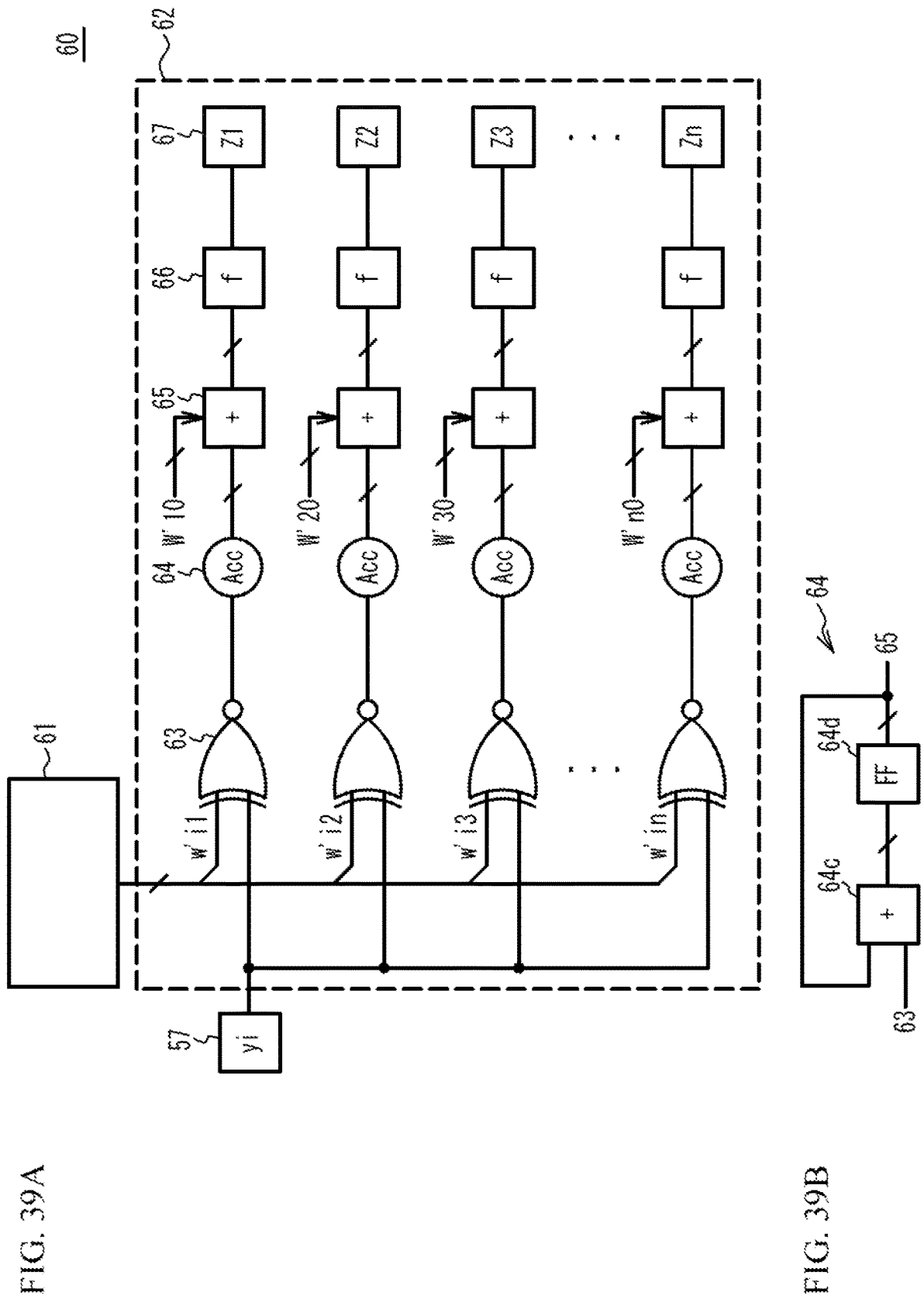
FIG. 39A is a block diagram of an arithmetic circuit that performs a 1-to-n connection operation in the embodiment 3.
FIG. 39B is a block diagram of an accumulator.

FIG. 39A is a block diagram of an arithmetic circuit that performs an operation of the 1-to-n connection in the embodiment 3. As illustrated in FIG. 39A, an arithmetic circuit 60 includes a memory 61 and a processing unit 62. The processing unit 62 includes XNOR circuits 63, accumulators 64, adders 65, evaluation units 66, and output units 67. The XNOR circuits 63 acquire the data of the node yi from the output unit 57, acquire the weight column w'i1 to w'in from the memory 61, and performs XNOR operations between the data of the node yi and the weight column w'i1 to w'in, respectively.

FIG. 39B is a block diagram of the accumulator. As illustrated in FIG. 39B, the accumulator 64 includes an adder 64$c$ and a latch circuit 64$d$. The adder 64$c$ adds the output of the latch circuit 64$d$ and the output of the XNOR circuit 63. The latch circuit 64$d$ holds the output of the adder 64$c$. The latch circuit 64$d$ is reset in advance, and when i varies from 1 to n, the output of the XNOR circuit 63 in each i is sequentially added. Then, when i becomes n, the numerical value of the operation result is output to the adder 65. In this way, each of the accumulators 64 accumulates the outputs for i=1 to n of the corresponding one of the n XNOR circuits 63.

Referring back to FIG. 39A, the adders 65 acquire the integer bias column W'10 to W'n0 from the memory 61 and add them to the output column of the accumulators 64, respectively. The evaluation units 66 compare the output column of the adders 65 with the evaluation function f to output 1-bit results to the output units 67 as the data of the nodes z1 to zn. The output units 67 are n-bit latch circuits and hold the data of the nodes z1 to zn, respectively.

Figure 40:
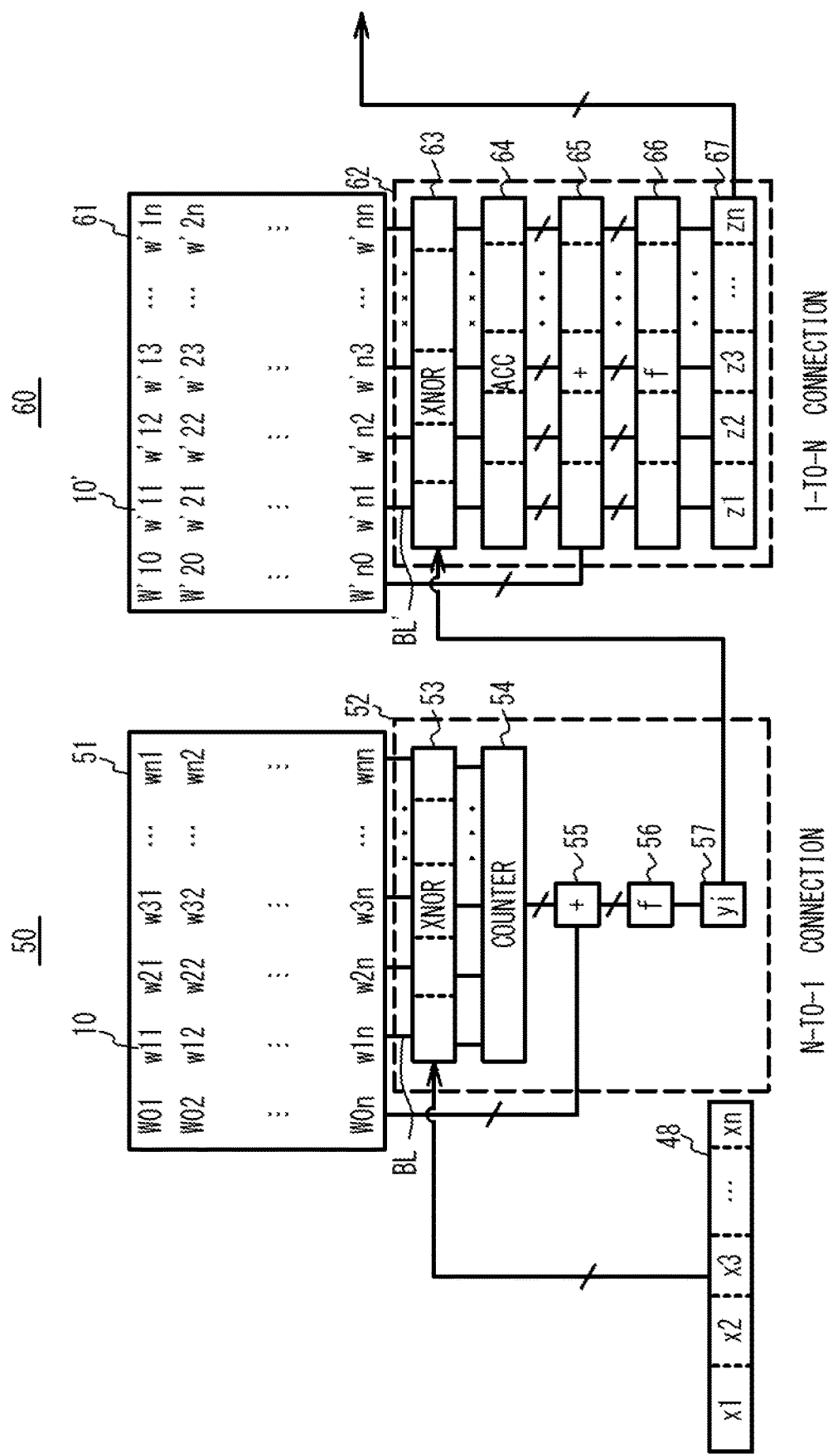
FIG. 40 is a block diagram of a BNN device in the embodiment 3.

FIG. 40 is a block diagram of the BNN device in the embodiment 3. As illustrated in FIG. 40, memories 51 (a first memory) and 61 (a second memory) are in a matrix form. The memory 51 stores the integer bias column W01 to W0$n$ and the weight matrix w11 to wnn. Each of the weights w11 to wnn is stored in the memory cell 10 (a first memory cell). In the memory 51, a plurality of weights w1$i$ to wni corresponding to one node yi are stored in the same row, and pluralities of weights corresponding to different nodes yi (for example, w11 to wn1 and w12 to wn2) are stored in different rows. A plurality of the memory cells 10 in the same row are connected to respective bit lines BL (first bit lines) extending in the column direction, and a plurality of the memory cells 10 in the same column are connected to the same bit line of the bit lines BL. Each integer bias (W01 to W0$n$) is multi-bit and is stored in the memory cell 10.

The memory 61 stores the integer bias columns W'10 to W'n0 and the weight matrix w' 11 to w'nn. Each of the weights w' 11 to w'nn is stored in a memory cell 10' (a second memory cell). In the memory 61, a plurality of weights w'i1 to w'in corresponding to one second node yi are stored in the same row, and pluralities of weights corresponding to different second nodes yi (for example, w'11 to w'1$n$ and w'21 to w'2$n$) are stored in different rows. A plurality of the memory cells 10' in the same row are connected to respective second bit lines BL' extending in the column direction. Each integer bias (W'10 to W'n0) is multi-bit and is stored in the memory cell 10'.

By storing the weight matrices in the memories 51 and 61 as described above, the processing unit 52 can acquire a plurality of first weights w1$i$ to wni from the memory 51 via a plurality of the bit lines BL when processing the node yi. Further, the processing unit 62 can acquire a plurality of weights w'i1 to w'in from the memory 61 via the second bit line BL' when processing the node yi. As a result, the processing units 52 and 62 can efficiently perform processing. The memory cells 10 and 10' may be 6T-RAM cells, but may be the memory cells 10 of the embodiments 1 and 2 and the variations thereof. At least part of the processing units 52 and 62 may be implemented as a dedicated circuit. At least part of the processing units 52 and 62 may be implemented by the cooperation between the processor and the software. In this case, at least part of the processing units 52 and 62 is a processor.

In the arithmetic circuit 50, the XNOR circuits 53 are provided so as to correspond to the column of the weight matrix w11 to wnn, and perform the XNOR operations between the output data of the nodes x1 to xn of the input unit 48 and the weight column w1$i$ to wni. The counter 54 counts the output bits of the XNOR circuits 53. The adder 55, the evaluation unit 56, and the output unit 57 are the same as those described in FIG. 38.

In the arithmetic circuit 60, the XNOR circuits 63 to the output units 67 are provided so as to correspond to the column of the weight matrix w'11 to w'nn. The XNOR circuits 63 perform XNOR operations between the output data of the node yi of the output unit 57 and the weight column w'i1 to w'in, respectively. The accumulators 64 to the output units 67 perform operations for each column.

Other operations are the same as those described in FIG. 39A. In the case that there are four or more layers, the nodes z1 to zn of the output units 67 form an input data column for the n-to-1 connection process of the next layer.

Figure 41:
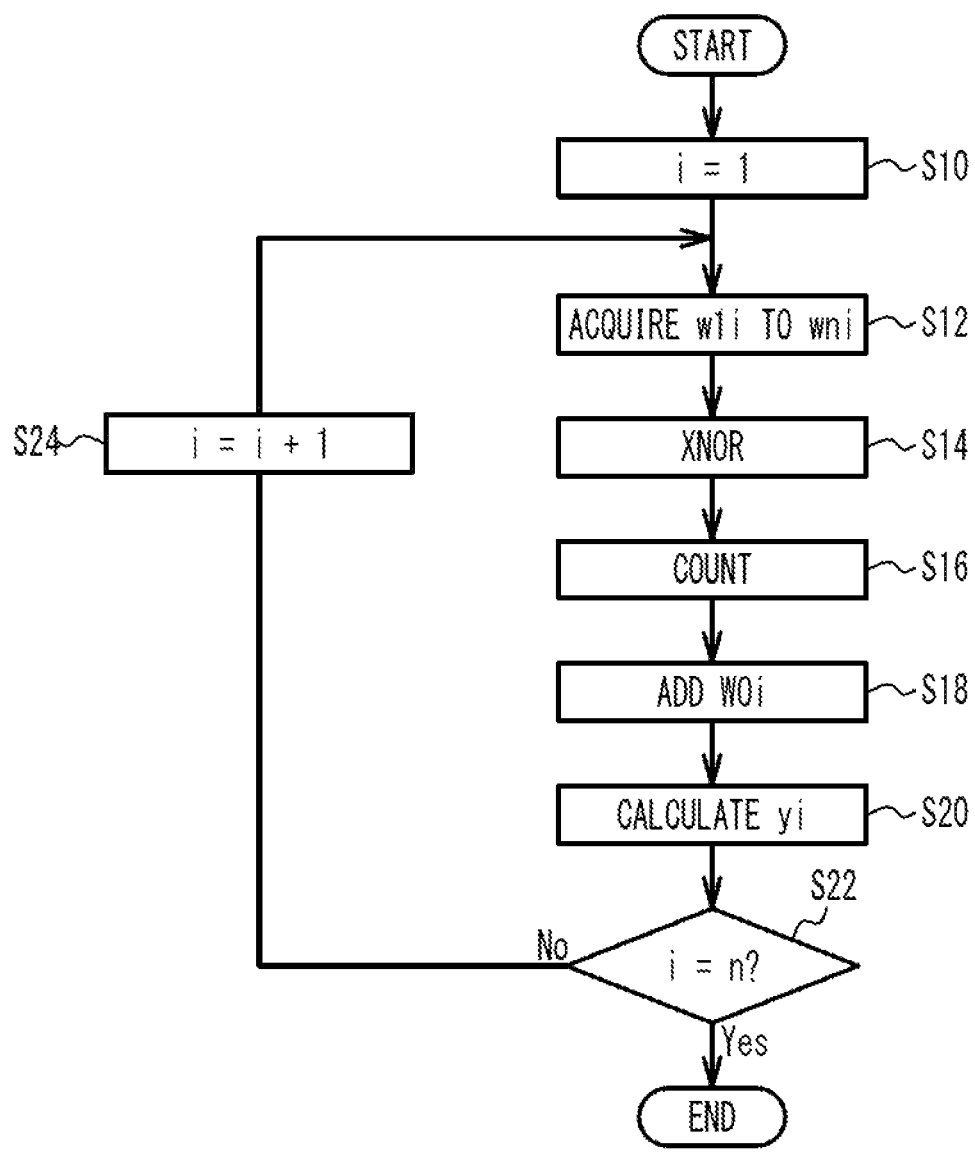
FIG. 41 is a flowchart of an n-to-1 connection process executed by a processing unit 52 in the embodiment 3.

FIG. 41 is a flowchart illustrating a process of the n-to-1 connection performed by the processing unit 52 in the embodiment 3. As illustrated in FIG. 41, the processing unit 52 sets i to 1 (step S10). The processing unit 52 acquires the weight column w1$i$ to wni from the memory 51 (step S12). The processing unit 52 calculates the XNORs between the data of the nodes x1 to xn and the weight columns w1$i$ to wni (step S14). The processing unit 52 bit-counts the calculation result of each XNOR and calculates the sum (step S16). The processing unit 52 acquires the weight W0$i$ from the memory 51 and adds it to the sum obtained in steps S16 (step S18). The processing unit 52 calculates and holds the data of the 1-bit node yi by comparing the result of step S18 with the evaluation function f (step S20). The processing unit 52 determines whether i is equal to n (step S22). In the case of No, the processing unit 52 sets i to i+1 and proceeds to step S12 (step S24). In the case of Yes, the n-to-1 connection process is terminated. The processing unit 52 may include a control circuit that controls the operation of each circuit, and the control circuit may execute steps S10 to S24.

Figure 42:
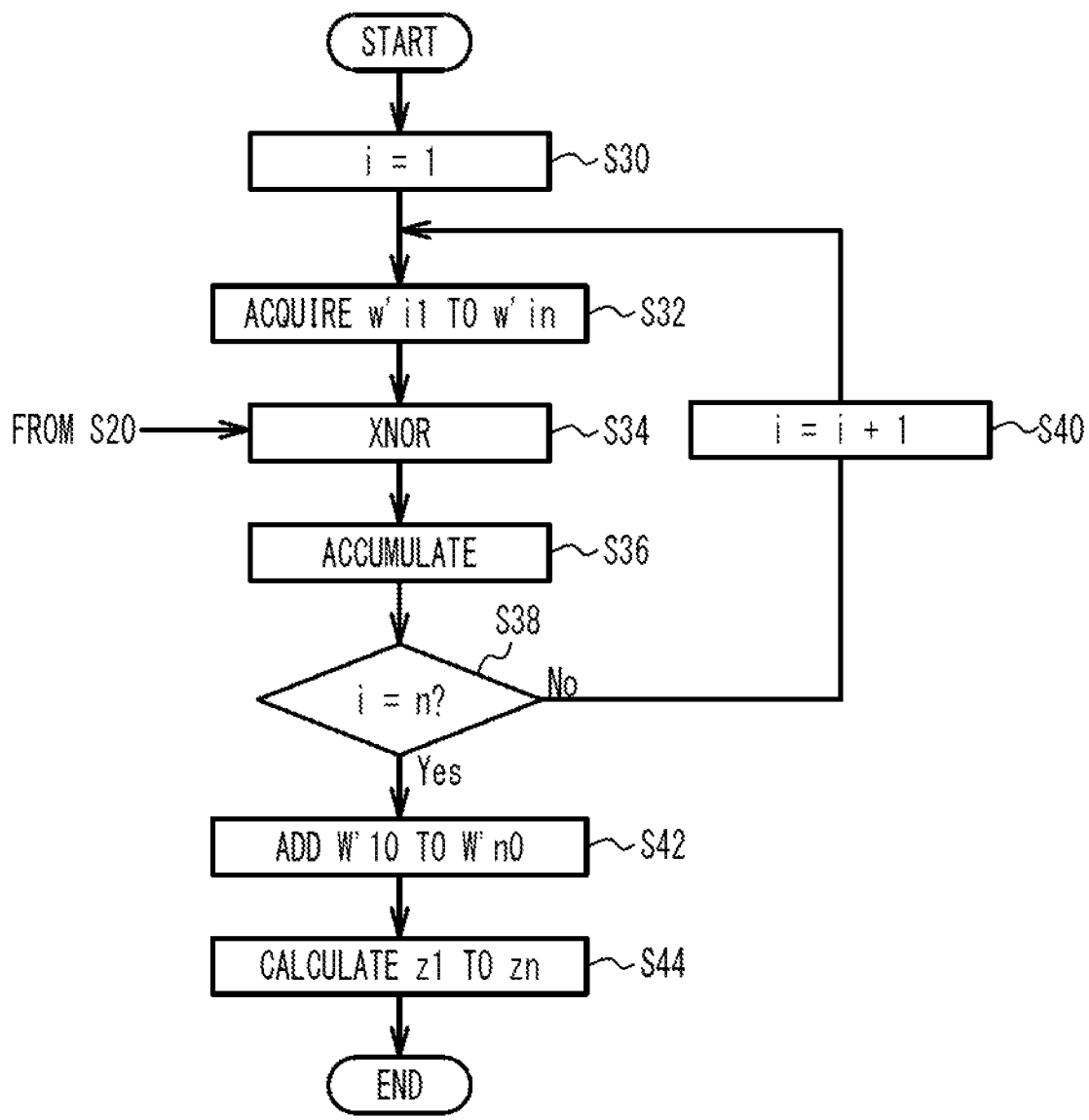
FIG. 42 is a flowchart of a 1-to-n connection process executed by a processing unit 62 in the embodiment 3.

FIG. 42 is a flowchart illustrating a process of the 1-to-n connection performed by the processing unit 62 in the embodiment 3. As illustrated in FIG. 42, the processing unit 62 sets i to 1 (step S30). The processing unit 62 acquires the weight column w'i1 to w'in from the memory 61 (step S32). The processing unit 62 acquires the data of the node yi from step S20 of FIG. 41, and calculates the XNORs between the data of the node yi and the weight column w'i1 to w'in (step S34). The processing unit 62 accumulates the calculation results of n XNORs (step S36). The processing unit 62 determines whether i is equal to n (step S38). In the case of No, the processing unit 62 sets i to i+1, and returns to step S32 (step S40). In the case of Yes in step S38, the processing unit 62 acquires the weights W'10 to W'n0 from the memory 61 and adds them to the n results of step S36, respectively (step S42). The processing unit 62 calculates and holds the data of each of the 1-bit nodes z1 to zn by comparing the n results of step S42 with the evaluation function f (step S44). After that, the 1-to-n connection process is terminated. The data of the nodes z1 to zn become an input data column when the n-to-1 connection of the next layer is performed. The processing unit 62 may include a control circuit that controls the operation of each circuit, and the control circuit may execute steps S30 to S44.

Figure 43:
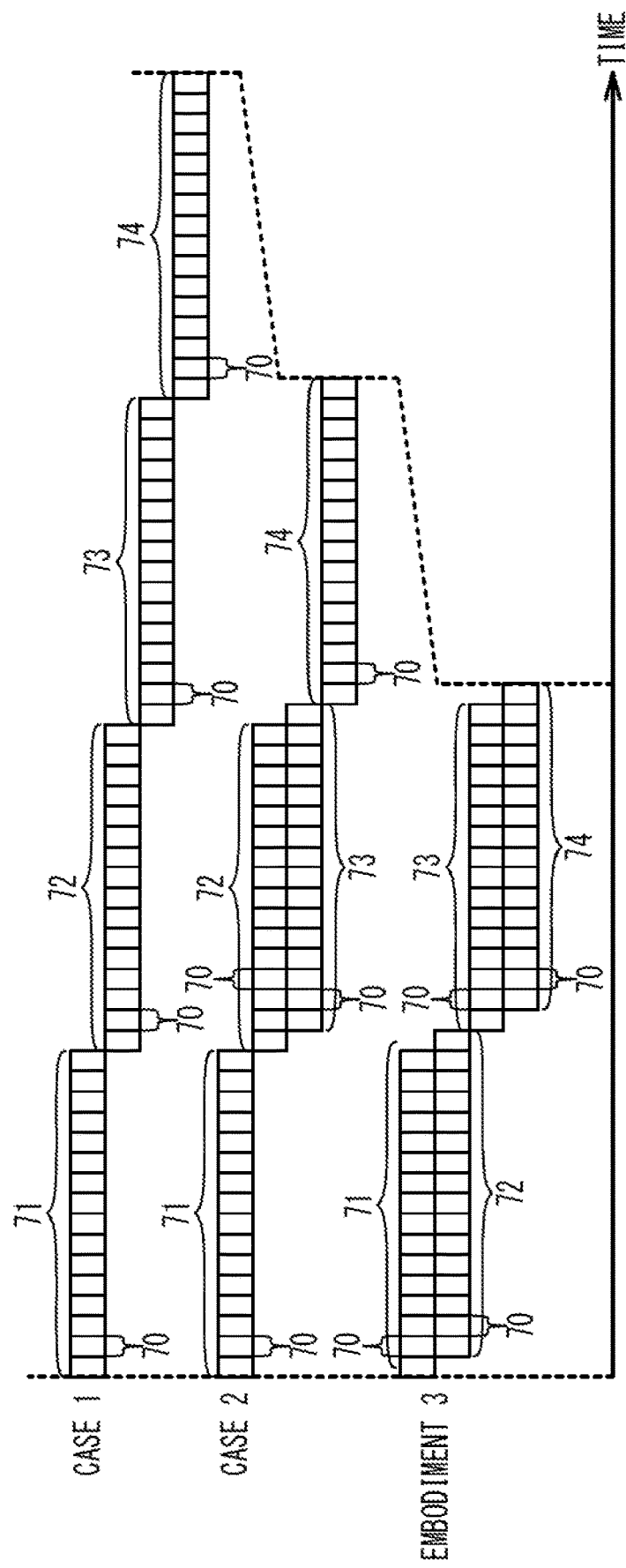
FIG. 43 illustrates processes with respect to time in the embodiment 3.

FIG. 43 is an explanatory diagram illustrating the processing operation of the embodiment 3 along the time axis. In FIG. 43, the processing operation of the embodiment 3 is illustrated so that it can be compared with the processing operations of cases 1 and 2 described later. Processes 71 to 74 indicate operations between layers. For example, the process 71 is a process of calculating each node y1 to yn of the Y layer from each node x1 to xn of the X layer in FIG. 37, and the process 72 is a process of calculating each node z1 to Zn of the Z layer from each node y1 to yn of the Y layer. The process 73 is a process of calculating each node of the subsequent layer from each node z1 to zn of the Z layer. The process 74 is a further subsequent process. A process 70 indicates a process corresponding to one node. In the n-to-1 connection process, the process of calculating one node yi from the n nodes x1 to xn corresponds to the process 70. In the 1-to-n connection process, the process of calculating the n nodes z1 to zn from one node yi corresponds to the process 70. The processes 71 to 74 execute the n processes 70 sequentially.

In the case 1, all of the processes 71 to 74 are the n-to-1 connection processes or the 1-to-n connection processes. In this case, the processes 71 to 74 cannot be processed in parallel. In the case 2, the processes 71 and 73 are the 1-to-n connection processes, and the processes 72 and 74 are the n-to-1 connection processes. In this case, the processes 71 and 72 cannot be processed in parallel. The process 72 and the process 73 can be processed in parallel.

In the embodiment 3, the processes 71 and 73 are the n-to-1 connection processes, and the processes 72 and 74 are the 1-to-n connection processes. In this case, the (i+1)-th process 70 of the process 71 and the i-th process of the process 72 can be processed in parallel. Therefore, the process 70 and the process 71 can be processed in the time of n+1 processes 70. After the end of the process 72, the process 73 is started. The (i+1)-th process 70 of the process 73 and the i-th process of the process 74 can be processed in parallel.

As described above, in the case 2, the processing time can be shortened as compared with that in the case 1, but in the embodiment 3, the processing time can be further shortened as compared with that in the case 2.

The memory array 22 illustrated in FIG. 7A in the embodiment 1 or the memory array 22 illustrated in FIG. 26 in the embodiment 2 can be used for the memories 51 and 61 of the embodiment 3. This can reduce the power consumption.

Figure 44:
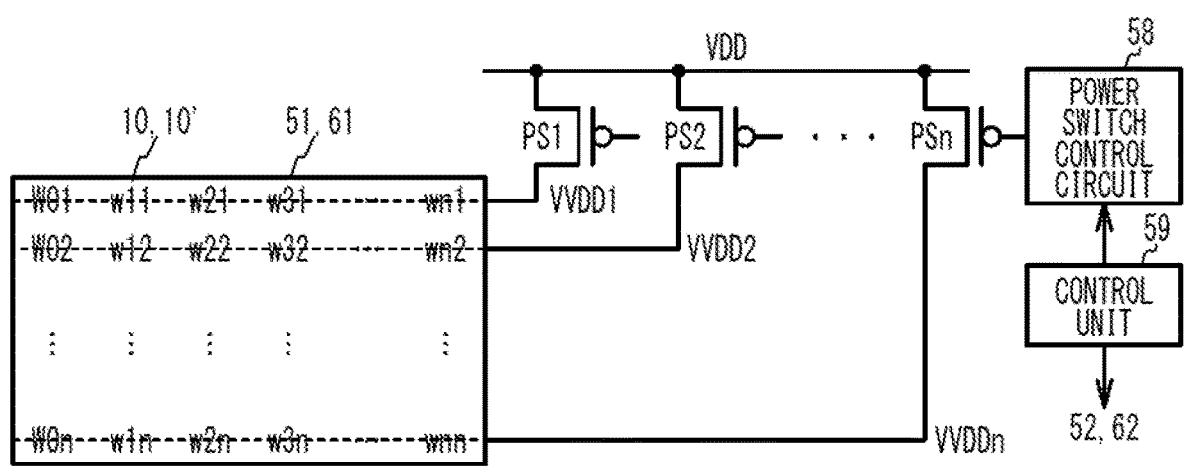
FIG. 44 is a block diagram illustrating an example of a memory in the embodiment 3.

FIG. 44 is a block diagram illustrating an example of the memory in the embodiment 3. As illustrated in FIG. 44, power switches PS1 to PSn are provided for respective rows of the memories 51 and 61. Further, a power switch control circuit 58 for independently controlling the power switches PS1 to PSn in different states is provided. This makes it possible to set the virtual power supply voltages VVDD1 to VVDDn for respective rows. During the n-to-1 connection process and the 1-to-n connection process, the power switch control circuit 58 supplies the first power supply voltage so that the row in which the data to be processed is stored is put into a state in which the data can be read. The power switch control circuit 58 puts the other rows in the ULV retention state in the case that the memory array of the embodiment 1 is used for the memories 51 and 61, and puts the other rows in the shutdown state in the case that the memory array of the embodiment 2 is used. A control unit 59 controls the processing units 52 and 56 and the power switch control circuit 58.

For example, when the processing unit 52 performs the i-th process in FIG. 41, or when the processing unit 62 performs the i-th process in FIG. 42, the power switch control circuit 58 sets the virtual power supply voltage VVDDi supplied to the i-th row of the memory 51 or 61 to the first power supply voltage at which data can be read from the memory cell 10 or 10', and sets the virtual power supply voltage VVDD supplied to rows other than the i-th row to the second power supply voltage, which is lower than the first power supply voltage and allows the memory cell 10 or 10' to retain data, or shuts down the power supply voltage. In the case that the memory array of the embodiment 1 is used for the memory 51 or 61, the second power supply voltage is a voltage at which the state becomes the ULV retention state. In the case that the memory array of the embodiment 2 is used for the memory 51 or 61, the power supply voltage is shut down. The power switch control circuit 58 is only required to supply the second power supply voltage to at least one or some of the rows other than the i-th row or shut down the power supply voltage.

This control by the power switch control circuit 58 can reduce the power consumption of the memories 51 and 61. As a result, the power consumption of the entire neural network can be reduced. The control of the power switches PS1 to PSn is not limited to the control described above, and the power may be supplied so that the rows near the row for which the n-to-1 connection process and the 1-to-n connection process are performed are put into the state in which the data can be read, in consideration of the recovery time until the data can be read from the ULV retention state of the memories 51 and 61 and the recovery time until the data can be read from the shutdown state in the memory array of the embodiment 2. Each virtual power supply voltage VVDD1 to VVDDn may have a plurality of stages. In this case, power switches corresponding to the number of virtual power supply voltages are provided. In FIG. 44, a power switch is provided for each row, but a power switch may be provided for each set of a plurality of rows. Although the virtual power supply system has been described as an example, the virtual ground system may also be used.

In FIG. 44, an example in which the power consumption is reduced by performing the control of the power switches PS1 to PSn described above in both the n-to-1 connection process and the 1-to-n connection process of the neural network process has been described. In either or both of the n-to-1 connection process and the 1-to-n connection, the power consumption may be reduced by performing the control of the power switches PS1 to PSn as described above. Further, in a processing device having an inference device learned by deep learning, in which the n-to-1 connection process and the 1-to-n connection process are repeated in multiple layers, the power consumption can be reduced by performing the control of the power switches PS1 to PSn described above for at least one layer of one of the n-to-1 connection process and the 1-to-n connection process.

The power consumption of the BNN device was simulated for the cases in which the 6T cell of the comparative example 3 and the ULVR-SRAM cell of the embodiment 1 were used for the memory cells 10 and 10' in the memories 51 and 61. In the case that the memory cells 10 and 10' are the 6T cells, the power consumption of the memory can be reduced by 50% to 60% when the state is put into the sleep state in which the power supply voltage is 70% of that in the normal state. In the case that the memory cells 10 and 10' are the ULVR-SRAM cells of the embodiment 1, the power consumption of the memory can be reduced by 90% to 95% compared with that in the normal state of the 6T cell. As described above, the power consumption of the BNN device can be reduced by using the ULVR-SRAM cell of the embodiment 1 or the NV-SRAM cell of the embodiment 2 for the memory cells 10 and 10'. Further, the ULVR-SRAM cell described in Patent Document 1 or the NV-SRAM cell described in Patent Document 2 may be used for the memory cells 10 and 10'. This can reduce the standby power.

In the embodiment 3, the processing unit 52 (a first processing unit) calculates the data of one second node yi of a plurality of pieces of second data corresponding to the second nodes y1 to yn of the Y layer (a second layer) as in steps S16, S18, and S20 by weighting a plurality of pieces of first data corresponding to a plurality of first nodes x1 to xn of the X layer (a first layer) by a plurality of first weights w1i to wni, respectively, as in step S14 of FIG. 41, and then adding up a plurality of pieces of weighted first data as in step S18. The processing unit 52 performs the above process for each of the plurality of second nodes y1 to yn to calculate the plurality of pieces of second data. As in step S32 of FIG. 42, the processing unit 62 (a second processing unit) performs a process of calculating respective parts of a plurality of pieces of third data corresponding to third nodes z1 to zn of the Z layer (a third layer) by weighting the data of one second node yi of the plurality of second nodes y1 to yn by a plurality of second weights w'i1 to w'in, for each of the plurality of second nodes y1 to yn. As in steps S36 and S44, the processing unit 62 calculates the third data of each of the plurality of third nodes z1 to zn by adding up the corresponding parts of the third data originating from the plurality of second nodes y1 to yn to obtain the data of each of the plurality of third nodes z1 to zn. Then, the processing unit 52 performs a process for another second node yi+1 of the plurality of pieces of second data in parallel with the process for one second node yi of the plurality of pieces of second data performed by the processing unit 62. This can shorten the processing time of the processing device, as illustrated in FIG. 43.

The data of the nodes x1 to xn, y1 to yn, and z1 to zn, the weights w11 to wnn and the weights w'11 to w'nn are 1 bit each. Therefore, the BNN can be processed. In the BNN, the processing unit 52 performs weighting by performing the XNOR operations between the data of the plurality of first nodes x1 to xn and the plurality of first weights w1i to wni, and the processing unit 62 performs weighting by performing XNOR operations between the data of the second node yi and a plurality of second weights w'i1 to w'in. Therefore, weighting can be performed in the BNN.

Variation 1 of the Embodiment 3

Figure 45:
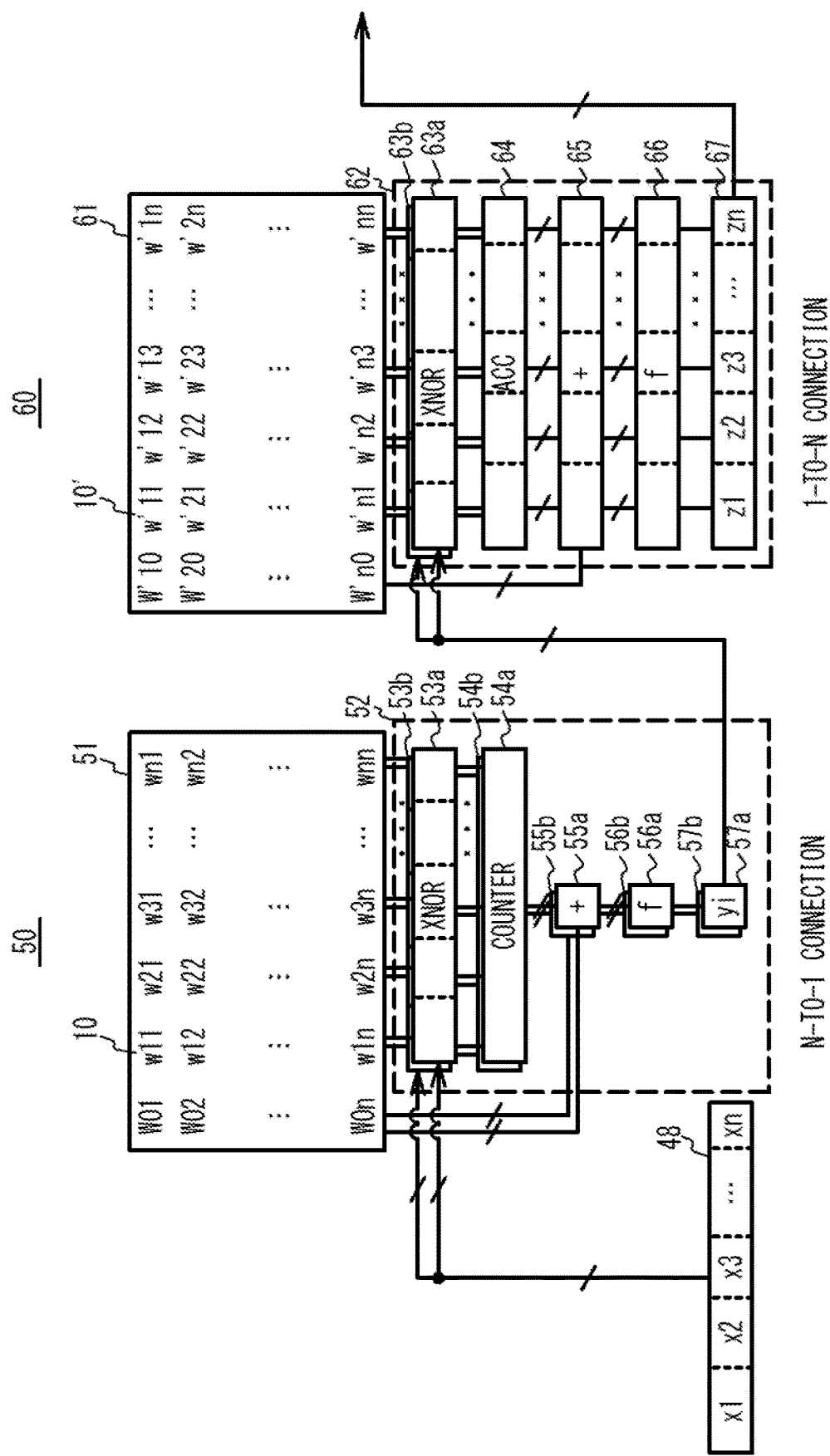
FIG. 45 is a block diagram of the BNN device in a variation 1 of the embodiment 3.

FIG. 45 is a block diagram of the BNN device in a variation 1 of the embodiment 3. As illustrated in FIG. 45, in the variation 1 of the embodiment 3, in the processing unit 52, each of XNOR circuits 53a and 53b, each of counters 54a and 54b, each of adders 55a and 55b, each of evaluation units 56a and 56b, and each of output units 57a and 57b are provided so as to correspond to multiple rows of the memory 51. The processing unit 52 performs the processes corresponding to multiple rows of the memory 51 in parallel. In the processing unit 62, each of XNOR circuits 63a and 63b is provided so as to correspond to multiple rows of the memory 61. The processing unit 62 performs the processes corresponding to multiple rows of the memory 61 in parallel.

Figure 46:
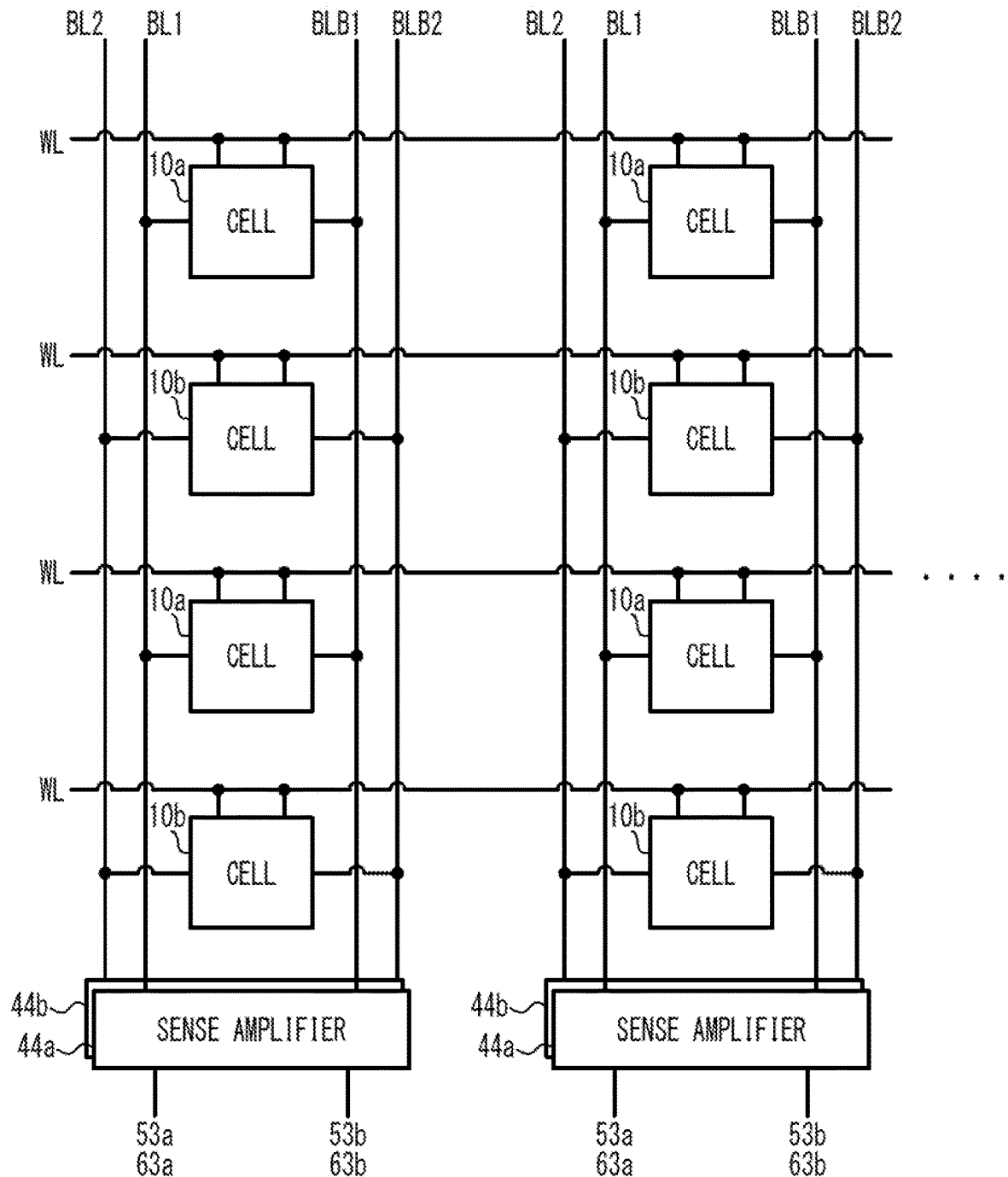
FIG. 46 illustrates an example of a memory in the variation 1 of the embodiment 3.

FIG. 46 illustrates an example of a memory in the variation 1 of the embodiment 3. In FIG. 46, the illustration of peripheral circuits other than sense amplifiers 44a and 44b is omitted. As illustrated in FIG. 46, memory cells 10a and 10b are arranged in a matrix form in the memories 51 and 61. The bit lines BL1 and BLB1 and the bit lines BL2 and BLB2 extend in the column direction. The memory nodes Q1 and Q2 (see FIG. 1 and FIG. 22) of the memory cell 10a of the memory cells 10a and 10b in the same column are coupled to the bit lines BL1 and BLB1, respectively, but are not coupled to the bit line BL2 or BLB2. The memory nodes Q1 and Q2 of the memory cell 10b are coupled to the bit lines BL2 and BLB2, respectively, and are not coupled to the bit line BL1 or BLB1.

A plurality of sense amplifiers 44a and 44b are provided in one column. The bit lines BL1 and BLB1 are coupled to the sense amplifier 44a, and the bit lines BL2 and BLB2 are coupled to the sense amplifier 44b. The sense amplifiers 44a and 44b read the data in the memory cells 10a and 10b selected by the word line WL, respectively. The sense amplifiers 44a and 44b output the read data to the XNOR circuit 53a (or 63a) and the XNOR circuit 53b (or 63b), respectively. That is, the processing units 52 and 62 acquire weights from the memories 51 and 61 via the BL1 and the BLB1 when performing one process of the processes performed in parallel, and acquires weights from the memories 51 and 61 via the bit lines BL2 and BLB2 when performing another process of the processes performed in parallel. This allows the weight columns of multiple rows to be output to the XNOR circuits 53a and 53b (or 63a and 63b) from the memory 51 or 61 in parallel without using a multiport cell described later in a variation 2 of the embodiment 3. The memory cell 10 may be the 6T cell of the comparative example 3, or may be the memory cells 10 of the embodiments 1 and 2 and the variations thereof.

Variation 2 of the Embodiment 3

The variation 2 of the embodiment 3 is an example in which the multiport cells are used for the memories 51 and 61. A description will be given of a 2R1W-type having one write-port and two read-ports and a 2RW-type having two write-ports and two read-ports as the multiport cell.

Figure 47:
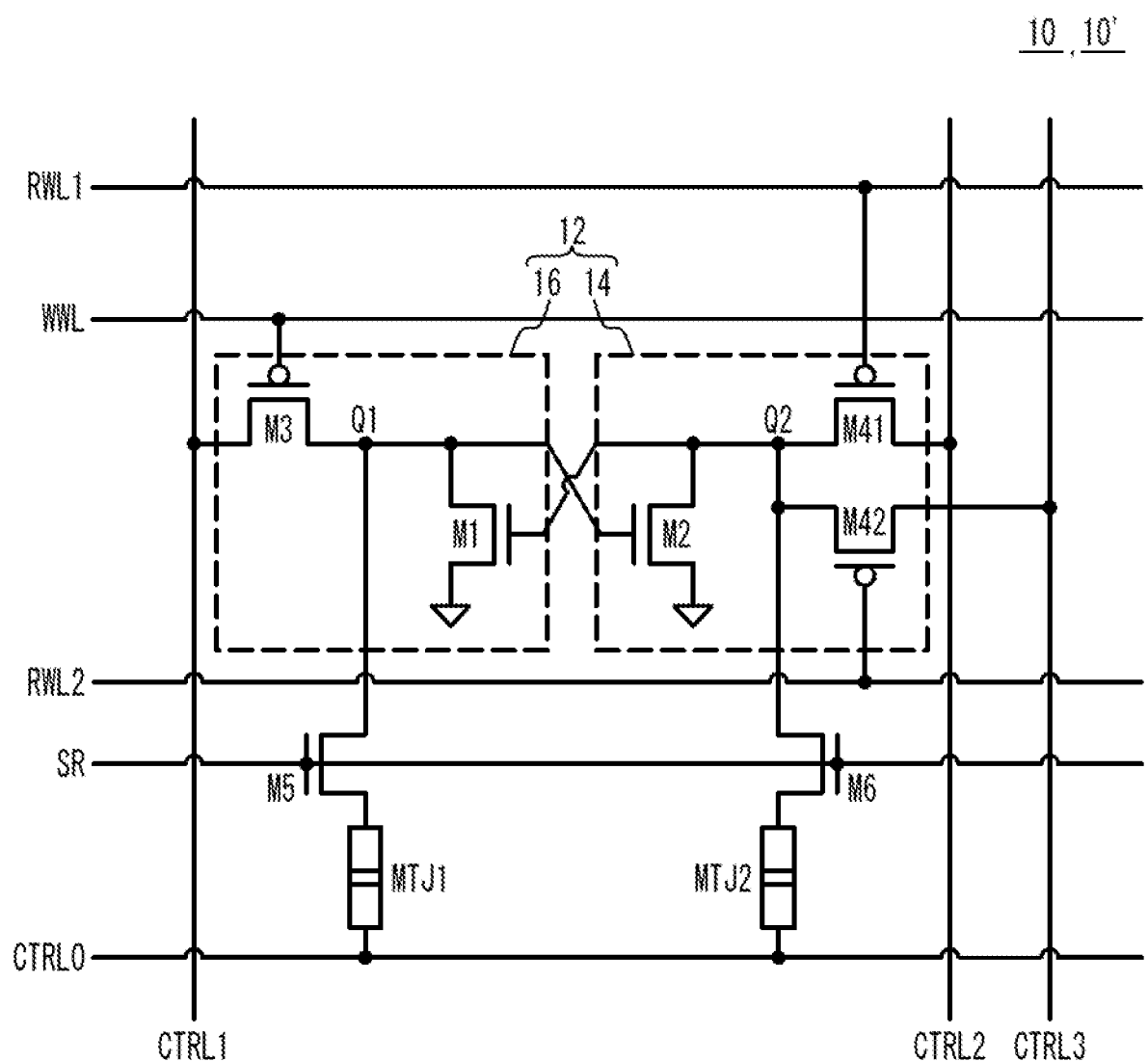
FIG. 47 is a circuit diagram illustrating an example of a 2R1W-type NV-SRAM memory cell in a variation 2 of the embodiment 3.

FIG. 47 is a circuit diagram of a 2R1W-type NV-SRAM memory cell in the variation 2 of the embodiment 3. As illustrated in FIG. 47, a WWL, an RWL1, and an RWL2 are provided as the word line. The WWL is a write word line, the RWL1 and the RWL2 are read word lines. Control lines CTRL1 to CTRL3 are provided.

The gate of the FET M3 is coupled to the WWL, one of the source and the drain is coupled to the memory node Q1, and the other of the source and the drain is coupled to the control line CTRL1. The gate of an FET M41 is coupled to the RWL1, one of the source and the drain is coupled to the memory node Q2, and the other of the source and the drain is coupled to the control line CTRL2. The gate of an FET M42 is coupled to the RWL2, one of the source and the drain is coupled to the memory node Q2, and the other of the source and the drain is coupled to the control line CTRL3. Other configurations are the same as those in the embodiment 2, and the description thereof is thus omitted.

Table 6 is a table presenting the voltage of each line in each state and operation.

TABLE 6

| | WWL | RWL1 | RWL2 | CTRL1 | CTRL2 | CTRL3 |
|---|---|---|---|---|---|---|
| Hold State | 1.2 V | 1.2 V | 1.2 V | 1.2 V | 1.2 V | 1.2 V |
| Write operation | 0 V | 1.2 V | 1.2 V | 1.2/ 0 V | 1.2 V | 1.2 V |
| Read operation 1 | 0.7 V | 0 V | 1.2 V | 1.2 V | 1.2 V -> FL | 1.2 V |
| Read operation 2 | 0.7 V | 1.2 V | 0 V | 1.2 V | 1.2 V | 1.2 V -> FL |

In Table 6, the voltages of the word lines WWL, RWL1, and RWL2 in the write operation, the read operation 1, and the read operation 2 are the voltages in the memory cell 10 to be accessed. The voltages of the word lines WWL, RWL1, and RWL2 in the memory cell 10 not to be accessed are 1.2 V.

As presented in Table 6, in the hold state, the voltages of the WWL, the RWL1, the RWL2, and the CTRL1 to the CTRL3 are 1.2 V (high level), and the FETs M3, M41, and M42 are OFF. During the write operation, the voltage of the WWL of the cell 10 subject to write is set to 0 V (low level). This turns on the FET M3 of the cell subject to write. The voltages of the word lines RWL1 and RWL2 are 1.2 V, and the FETs M41 and M42 are OFF. The memory node Q1 becomes H or L by setting the voltage of the control line CTRL1 to 1.2 V or 0 V. This causes data to be written in the cell 10.

During the read operation 1, the voltage of the RWL1 of the cell 10 subject to read is set to 0 V. This turns on the FET M41 of the cell 10 subject to read. The voltage of the RWL2 is 1.2 V, and the FET M42 is OFF. The voltage of the WWL is 0.7 V, which slightly turns on the FET M3. By changing the voltage of the control line CTRL2 from 1.2 V to floating (FL), the data in the memory node Q2 is read from the control line CTRL2. The voltages during the read operation 2 are the same as those during the read operation 1. Other operations are the same as those in the embodiment 2.

Figure 48:
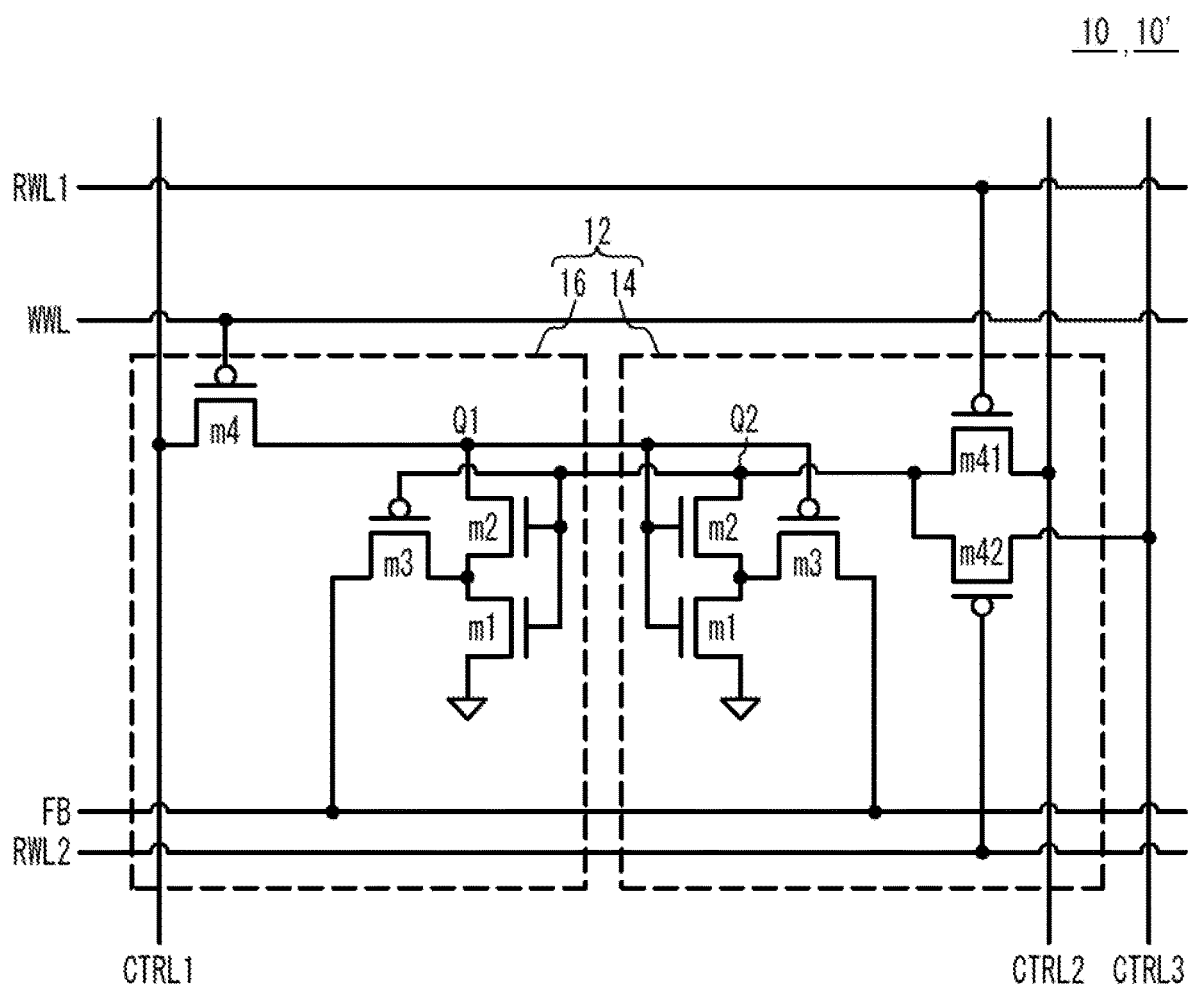
FIG. 48 is a circuit diagram illustrating an example of a 2R1W-type ULVR-SRAM memory cell in the variation 2 of the embodiment 3.

FIG. 48 is a circuit diagram illustrating an example of the 2R1W-type ULVR-SRAM memory cell in the variation 2 of the embodiment 3. As illustrated in FIG. 48, the WWL, the RWL1, and the RWL2 are provided as the word line. The control lines CTRL1 to CTRL3 are provided.

The gate of the FET m4 is coupled to the WWL, one of the source and the drain is coupled to the memory node Q1, and the other of the source and the drain is coupled to the control line CTRL1. The gate of an FET m41 is coupled to the RWL1, one of the source and the drain is coupled to the memory node Q2, and the other of the source and the drain is coupled to the control line CTRL2. The gate of an FET m42 is coupled to the RWL2, one of the source and the drain is coupled to the memory node Q2, and the other of the source and the drain is coupled to the control line CTRL3. Other configurations are the same as those in the embodiment 1, and the description thereof is thus omitted.

Table 7 is a table presenting the voltage of each line in each state and operation.

TABLE 7

| | WWL | RWL1 | RWL2 | CTRL1 | CTRL2 | CTRL3 |
|---|---|---|---|---|---|---|
| Hold State | 1.1 V | 1.1 V | 1.1 V | 1.2 V | 1.2 V | 1.2 V |
| Write operation | 0.3 V | 1.1 V | 1.1 V | 1.2/ 0 V | 1.2 V | 1.2 V |
| Read operation 1 | 0.6 V | 0.3 V | 1.1 V | 1.2 V | 1.2 V -> FL | 1.2 V |
| Read operation 2 | 0.6 V | 1.1 V | 0.3 V | 1.2 V | 1.2 V | 1.2 V -> FL |

As presented in Table 7, in the hold state, the voltages of the word lines WWL, RWL1, and RWL2 are 1.1 V, the voltages of the CTRL1 to the CTRL3 are 1.2 V, and the FETs m4, m41, and m42 are OFF. During the write operation, the voltage of the WWL of the memory cell 10 subject to write is set to 0.3 V. This turns on the FET m3 of the memory cell 10 subject to write. The voltages of the word lines RWL1 and RWL2 are 1.1 V, and the FETs m41 and m42 are OFF. By setting the voltage of the control line CTRL1 to 1.2 V or 0 V, the memory node Q1 becomes H or L. This causes data to be written in the memory cell 10.

During the read operation 1, the voltage of the RWL1 of the memory cell 10 subject to read is set to 0.3 V. This turns on the FET m41 of the memory cell 10 subject to read. The voltage of the RWL2 is 1.1 V, and the FET m42 is OFF. The voltage of the WWL is 0.6 V, which slightly turns on the FET m4. By changing the voltage of the control line CTRL2 from 1.2 V to floating (FL), the data in the memory node Q2 is read from the control line CTRL2. The read operation 2 is the same as the read operation 1. The voltages of the word lines WWL, RWL1, and RWL2 of the memory cell 10 not to be accessed are 1.1 V. Other operations are the same as those in the embodiment 1.

For the 2R1W-type NV-SRAM cell and the 2R1W-type ULVR-SRAM cell, the SNM with respect to the voltage VWWL of the word line WWL during the read operations 1 and 2 was simulated. In the 2R1W-type NV-SRAM memory cell, the WLP was set to 105 nm, the WDRV was set to 150 nm, and the voltage VRWL of the word lines RWL1 and RWL2 were set to 0 V. In the 2R1W-type ULVR-SRAM memory cell, the VVDD was set to 1.2 V, the BI mode was set, the WLP was set to 110 nm, and the WFB was set to 230 nm.

Figure 49A:
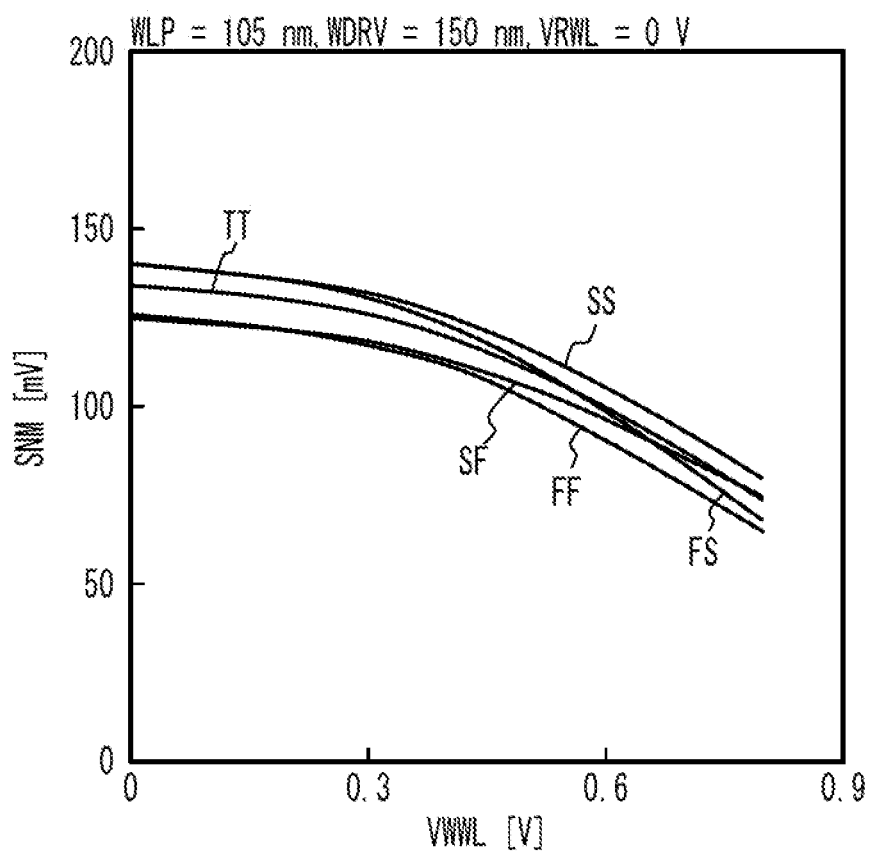
FIG. 49A presents the SNM of the 2R1W-type NV-SRAM memory cell of the variation 2 of the embodiment 3 with respect to VWWL in the read operation.
Figure 49B:
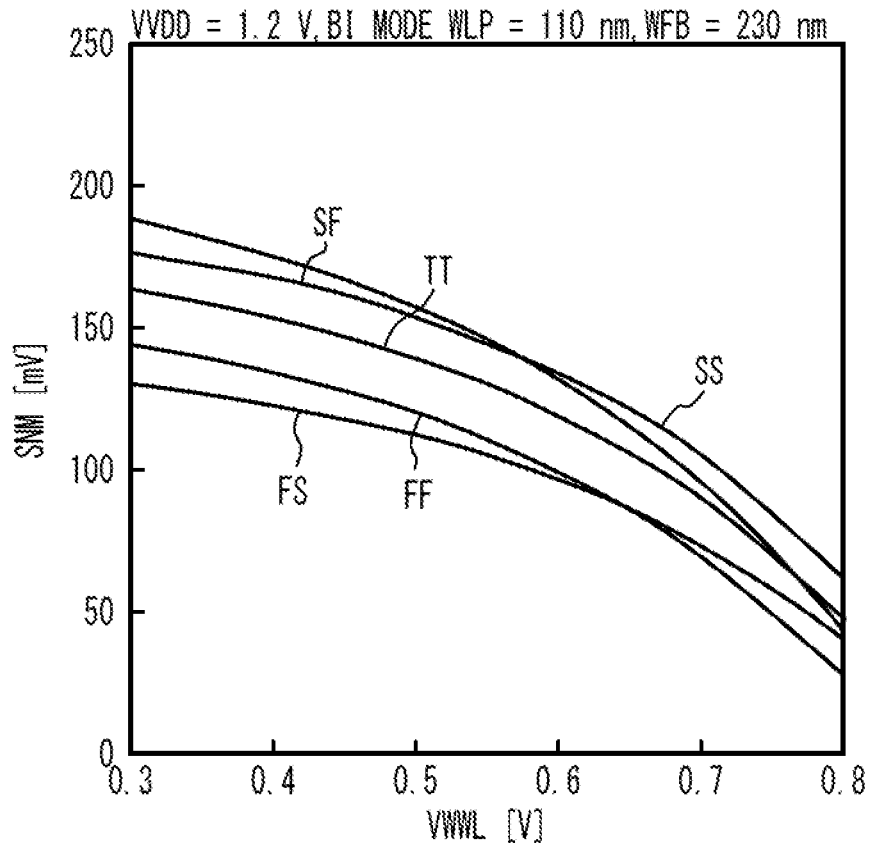
FIG. 49B presents the SNM of the 2R1W-type ULVR-SRAM memory cell with respect to VWWL in the read operation.

FIG. 49A presents the SNM of the 2R1W-type NV-SRAM memory cell of the variation 2 of the embodiment 3 with respect to the VWWL in the read operation, and FIG. 49B presents the SNM of the 2R1W-type ULVR-SRAM memory cell with respect to the VWWL in the read operation. As illustrated in FIG. 49A and FIG. 49B, as the voltage VWWL of the word line WWL becomes higher, the SNM decreases. In the read operation, the write word line WWL is not selected, and the FETs M3 and the FET m4 are set to OFF. However, when the FET M3 and the FET m4 are completely OFF, the SNM becomes small. Thus, the voltage VWWL (e.g., 0.6 V) of the write word line WWL in the read operations 1 and 2 is set higher than the voltage VWWL (e.g., 0.3 V) in the write operation. Further, the voltage VWWL (e.g., 0.6 V) in the read operation 1 is set lower than the voltage (e.g., 1.2 V) of the word line RWL1 for the read operation 2. The same applies to the read operation 2. This can increase the SNM.

Figure 50:
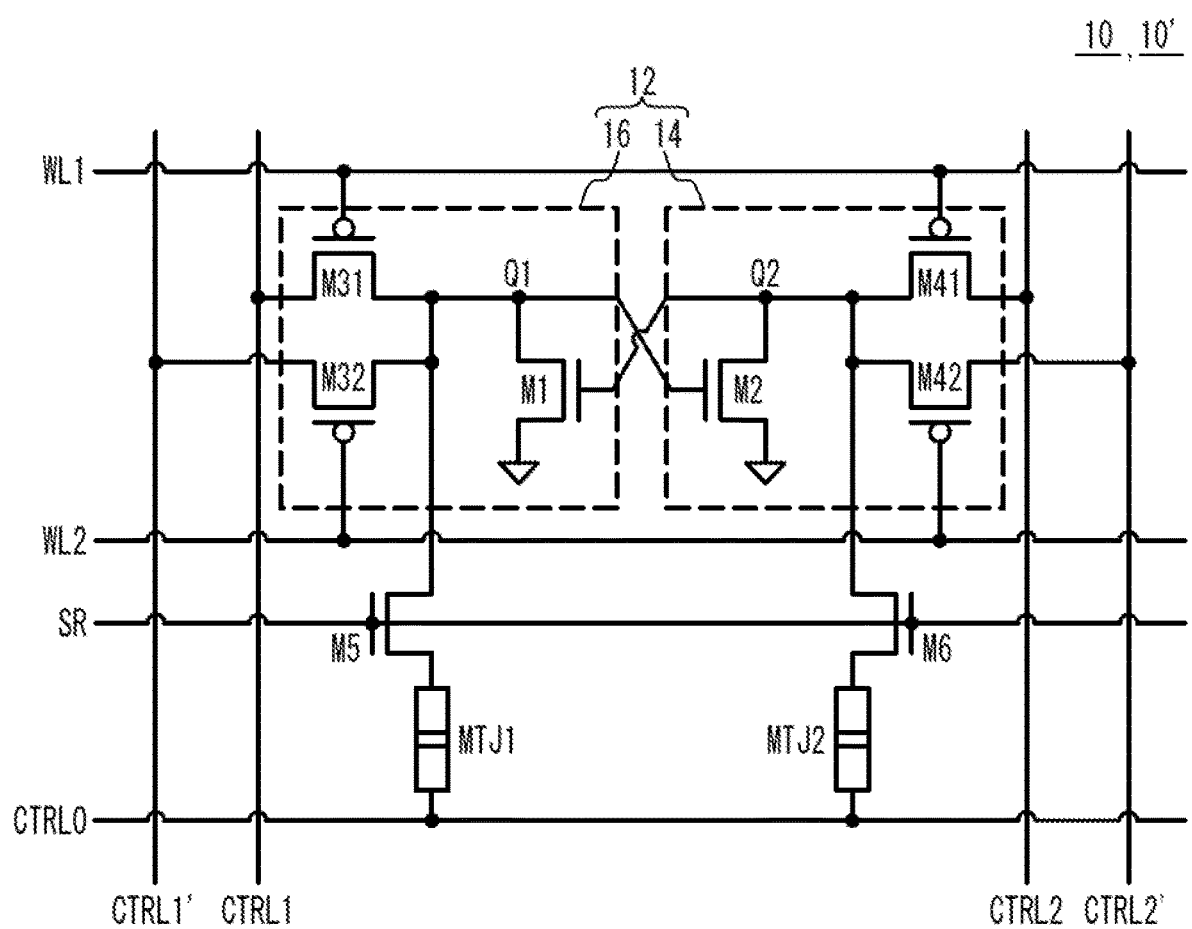
FIG. 50 is a circuit diagram illustrating an example of a 2RW-type NV-SRAM memory cell in the variation 2 of the embodiment 3.

FIG. 50 is a circuit diagram illustrating the 2RW-type NV-SRAM memory cell in the variation 2 of the embodiment 3. As illustrated in FIG. 50, a WL1 and a WL2 are provided as the word line. The CTRL1, a CTRL1', the CTRL2, and a CTRL2' are provided as the control line.

The gate of an FET M31 (a third FET) is coupled to the WL1 (a first word line), one of the source and the drain is coupled to the memory node Q1 (a first memory node), and the other of the source and the drain is coupled to the control line CTRL1 (a first control line). The gate of an FET M32 (a fifth FET) is coupled to the WL2 (a second word line), one of the source and the drain is coupled to the memory node Q1, and the other of the source and the drain is coupled to the control line CTRL1' (a fourth control line). The gate of the FET M41 (a fourth FET) is coupled to the WL1, one of the source and the drain is coupled to the memory node Q2, and the other of the source and the drain is coupled to the control line CTRL2 (a second control line). The gate of the FET M42 (a sixth FET) is coupled to the WL2, one of the source and the drain is coupled to the memory node Q2, and the other of the source and the drain is coupled to the control line CTRL2' (a fifth control line). Other configurations are the same as those of the embodiment 2, and the description thereof is thus omitted.

Table 8 is a table presenting the voltage of each line in each state and operation.

TABLE 8

|  | WL1 | WL2 | CTRL1, 2 | CTRL1', 2' |
| --- | --- | --- | --- | --- |
| Hold state | 1.2 V | 1.2 V | 1.2 V | 1.2 V |
| Write operation 1 | 0 V | 1.2 V | 1.2/0 V | 1.2 V |
| Write operation 2 | 1.2 V | 0 V | 1.2 V | 1.2/0 V |

TABLE 8-continued

|  | WL1 | WL2 | CTRL1, 2 | CTRL1', 2' |
| --- | --- | --- | --- | --- |
| Read operation 1 | 0 V | 1.2 V | 1.2 V -> FL | 1.2 V |
| Read operation 2 | 1.2 V | 0 V | 1.2 V | 1.2 V -> FL |

As presented in Table 8, in the hold state, the voltages of the word lines WL1 and WL2, and the control lines CTRL1, CTRL1', CTRL2, and CTRL2' are 1.2 V (high level), and the FETs M31, M32, M41, and M42 are OFF. During the write operation 1 and the read operation 1, data is read and written via the FETs M31 and M41 using the WL1, the CTRL1, and the CTRL2. The WL2, the CTRL1', and the CTRL2' are set to 1.2 V to turn off the FETs M32 and M42. The write operation 2 and the read operation 2 are the same as those of the write operation 1 and the read operation 1. The voltages of the word lines WL1 and WL2 of the memory cell 10 not to be accessed are 1.2 V. Other operations are the same as those in the embodiment 2.

Figure 51:
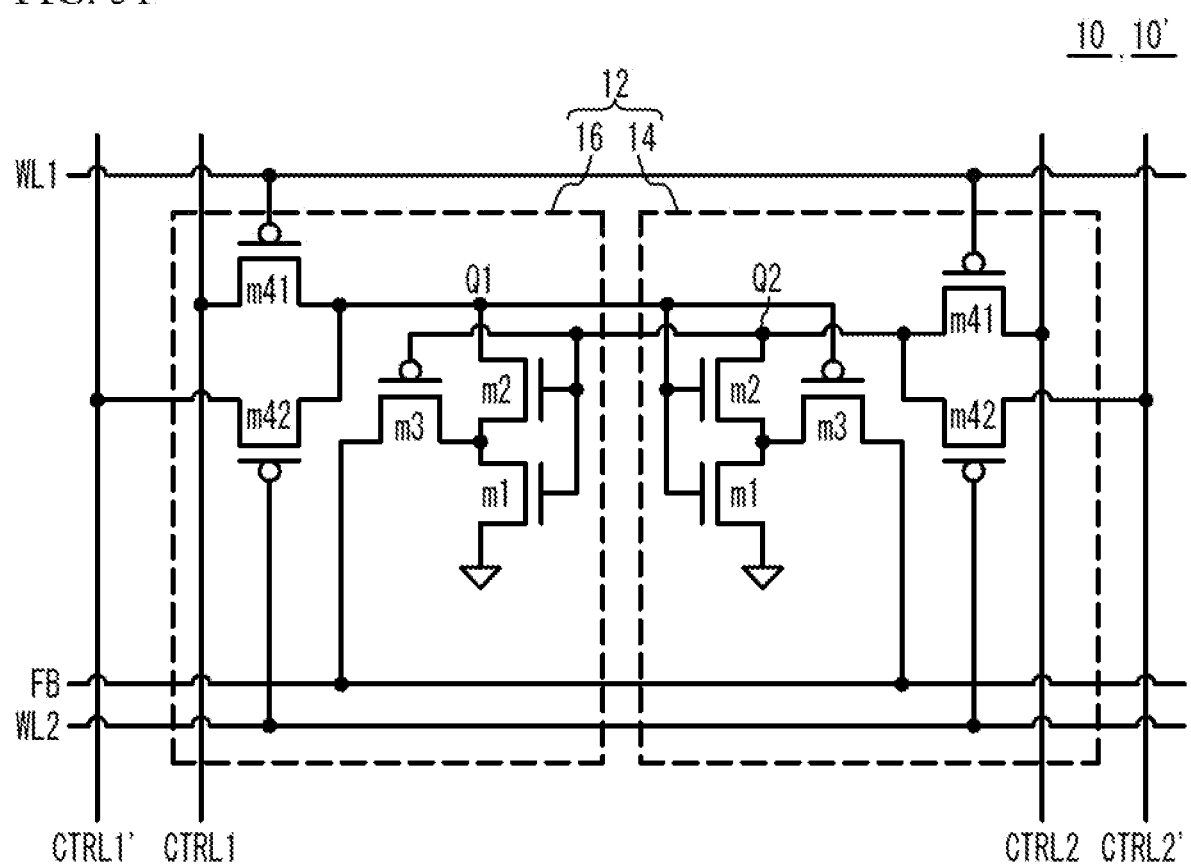
FIG. 51 is a circuit diagram illustrating an example of a 2RW-type ULVR-SRAM memory cell in the variation 2 of the embodiment 3.

FIG. 51 is a circuit diagram illustrating the 2RW-type ULVR-SRAM memory cell in the variation 2 of the embodiment 3. As illustrated in FIG. 51, the WL1 and the WL2 are provided as the word line. The CTRL1, the CTRL1', the CTRL2, and the CTRL2' are provided as the control line.

The gates of the FETs m41 (a third FET, a fourth FET) are coupled to the WL1 (a first word line), one of the source and the drain of each of the FETs m41 is coupled to the corresponding one of the memory nodes Q1 and Q2, the other of the source and the drain of each of the FETs m41 is coupled to the corresponding one of the control lines CTRL1 (a first control line) and CTRL2 (a second control line). The gates of the FETs m42 (a fifth FET, a sixth FET) are coupled to the WL2 (a second word line), one of the source and the drain of each of the FETs m42 is coupled to the corresponding one of the memory nodes Q1 and Q2, and the other of the source and the drain of each of the FETs m42 is coupled to the corresponding one of the control lines CTRL1' (a third control line) and CTRL2'(a fourth control line). Other configurations are the same as those of the embodiment 1, and the description thereof is thus omitted.

Table 9 is a table presenting the voltage of each line in each state and operation.

TABLE 9

|  | WL1 | WL2 | CTRL1, 2 | CTRL1', 2' |
| --- | --- | --- | --- | --- |
| Hold state | 1.1 V | 1.1 V | 1.2 V | 1.2 V |
| Write operation 1 | 0.25 V | 1.1 V | 1.2/0 V | 1.2 V |
| Write operation 2 | 1.1 V | 0.25 V | 1.2 V | 1.2/0 V |
| Read operation 1 | 0.25 V | 1.1 V | 1.2 V -> FL | 1.2 V |
| Read operation 2 | 1.1 V | 0.25 V | 1.2 V | 1.2 V -> FL |

As presented in Table 9, in the hold state, the voltages of the WL1 and the WL2 are 1.1 V, the voltages of the CTRL1, 2, 1', and 2' are 1.2 V, and the FETs m41 and m42 are OFF. During the write operation 1 and the read operation 1, data is written and read via the FET m41 using the WL1, the CTRL1, and the CTRL2. The voltage of the WL2 is set to 1.1 V, the voltages of the CTRL1' and the CTRL2' are set to 1.2 V, and the FET m42 is turned off. The write operation 2 and the read operation 2 are the same as the write operation 1 and the read operation 1. The voltages of the word lines WL1 and WL2 of the memory cell 10 not to be accessed are 1.1 V. Other operations are the same as those of the embodiment 2.

Figure 52:
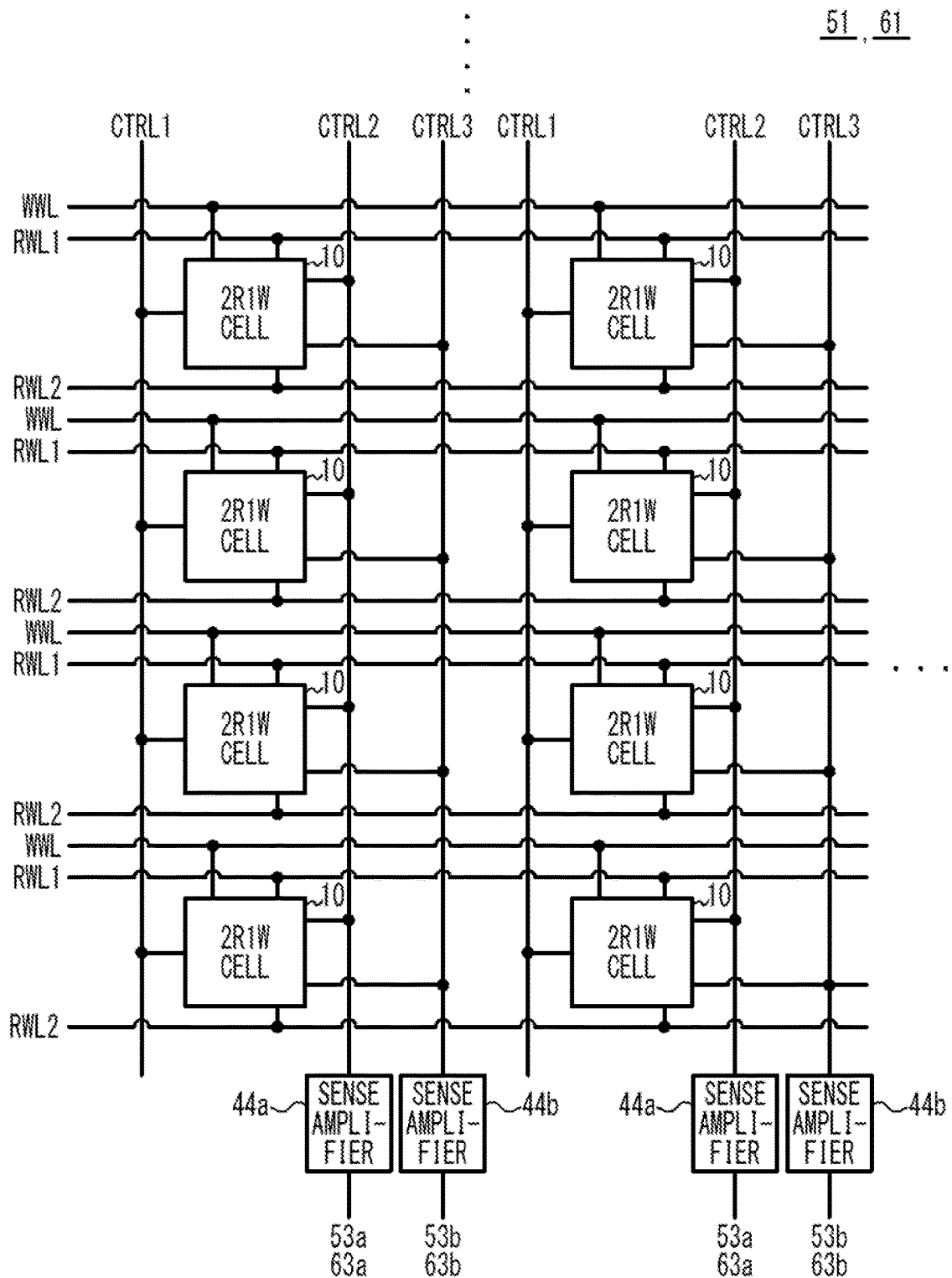
FIG. 52 illustrates an example of a 2R1W-type memory in the variation 2 of the embodiment 3.

FIG. 52 illustrates an example of the 2R1W-type memory in the variation 2 of the embodiment 3. In FIG. 52, the illustration of the peripheral circuits other than the sense amplifiers 44*a* and 44*b* is omitted. As illustrated in FIG. 52, the memory cells 10 are arranged in a matrix in the memories 51 and 61. The memory cell 10 is the 2R1W-type NV-SRAM cell or the 2R1W-type ULVR-SRAM cell. The control line CTRL2 is coupled to the sense amplifier 44*a*, and the control line CTRL3 is coupled to the sense amplifier 44*b*. The sense amplifier 44*a* reads the data in the memory cell 10 selected by the word line RWL1, and the sense amplifier 44*b* reads the data in the memory cell 10 selected by the word line RWL2. The sense amplifiers 44*a* and 44*b* output the read data to the XNOR circuit 53*a* (or 63*a*) and the XNOR circuit 53*b* (or 63*b*), respectively. This allows the weight columns of the multiple rows to be output to the XNOR circuits 53*a* and 53*b* (or 63*a* and 63*b*) from the memory 51 or 61 in parallel. The memory cell 10 may be a 6T cell.

Figure 53:
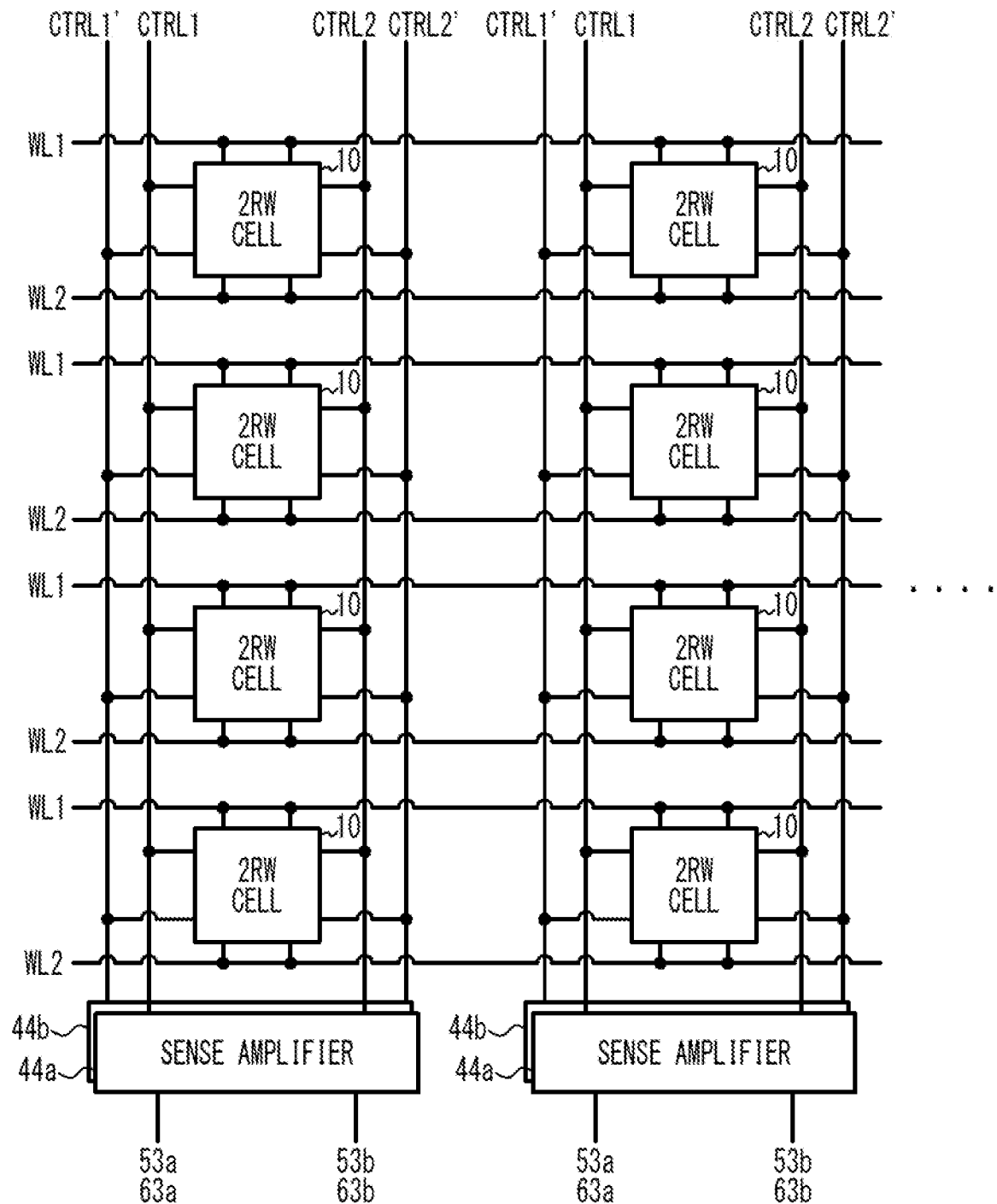
FIG. 53 illustrates an example of a 2RW-type memory in the variation 2 of the embodiment 3.

FIG. 53 illustrates an example of the 2RW-type memory in the variation 2 of the embodiment 3. In FIG. 53, the illustration of the peripheral circuits other than the sense amplifiers 44*a* and 44*b* is omitted. As illustrated in FIG. 53, the memory cell 10 is the 2RW-type NV-SRAM cell or the 2RW-type ULVR-SRAM cell. The control lines CTRL1 and CTRL2 are coupled to the sense amplifier 44*a*, and the control lines CTRL1' and CTRL2' are coupled to the sense amplifier 44*b*. The sense amplifier 44*a* reads the data in the memory cell 10 selected by the word line WL1, and the sense amplifier 44*b* reads the data in the memory cell 10 selected by the word line WL2. Other configurations are the same as those in FIG. 52. The sense amplifiers 44*a* and 44*b* output the read data to the XNOR circuit 53*a* (or 63*a*) and the XNOR circuit 53*b* (or 63*b*), respectively. This allows the weight columns of the multiple rows to be output to the XNOR circuits 53*a* and 53*b* (or 63*a* and 63*b*) from the memory 51 or 61 in parallel. The memory cell 10 may be a 6T cell.

FIG. 54 illustrates the processes with respect to time in the variations of the embodiment 3. The case 1, the case 2, and the embodiment 3 are the same as those in FIG. 43, and the description thereof is thus omitted. In the variations 1 and 2 of the embodiment 3, the processes for two rows of the memories 51 and 61 can be performed in parallel. This allows the process 71 to be performed by performing processes 71*a* and 71*b* in parallel. Similarly, processes 72*a* and 72*b* can be performed in parallel, processes 73*a* and 73*b* can be performed in parallel, and processes 74*a* and 74*b* can be performed in parallel. Thus, the processing time can be reduced as compared with that in the embodiment 3.

In a variation 3 of the embodiment 3, the processes for four rows of the memories 51 and 61 are performed in parallel. This allows the process 71 to be processed by performing processes 71*a* to 71*d* in parallel. Similarly, processes 72*a* to 72*d* can be processed in parallel, processes 73*a* to 73*d* can be processed in parallel, and processes 74*a* to 74*d* can be processed in parallel. Thus, the processing time can be further reduced as compared with those in the variations 1 and 2 of the embodiment 3.

Figure 55A:
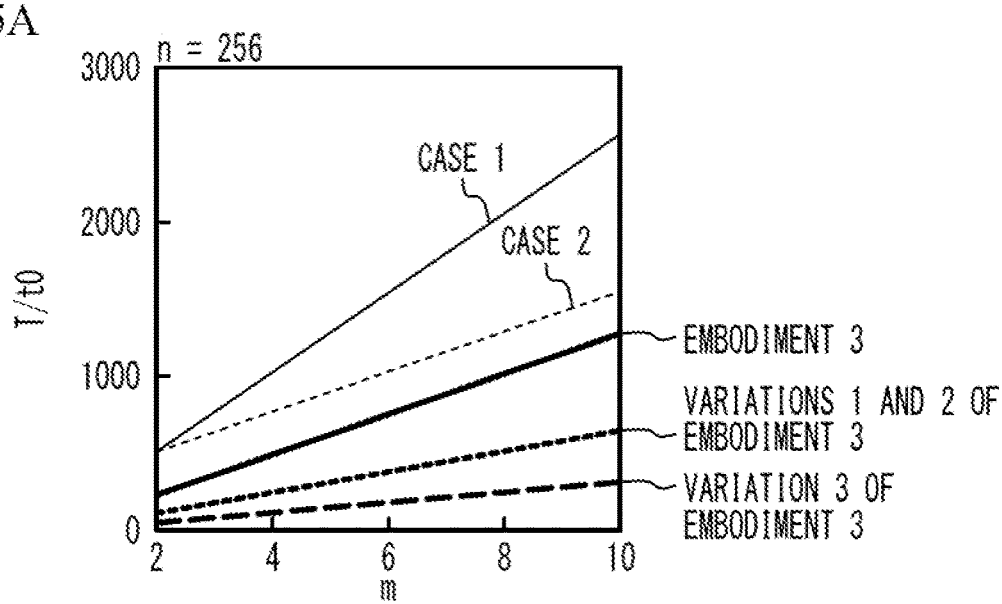
FIG. 55A to FIG. 55C illustrate normalized processing time with respect to the number m of layers.
Figure 55B:
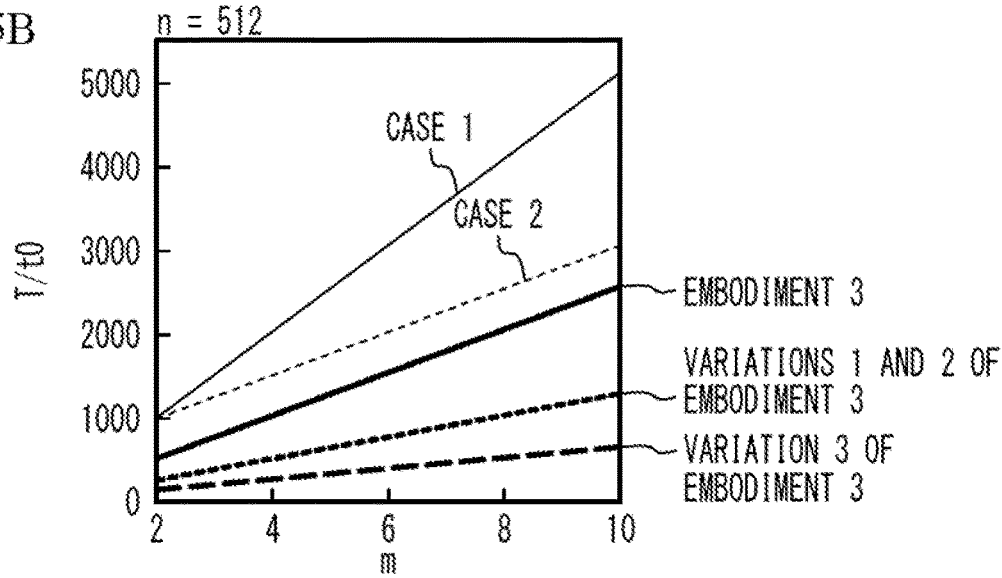
Figure 55C:
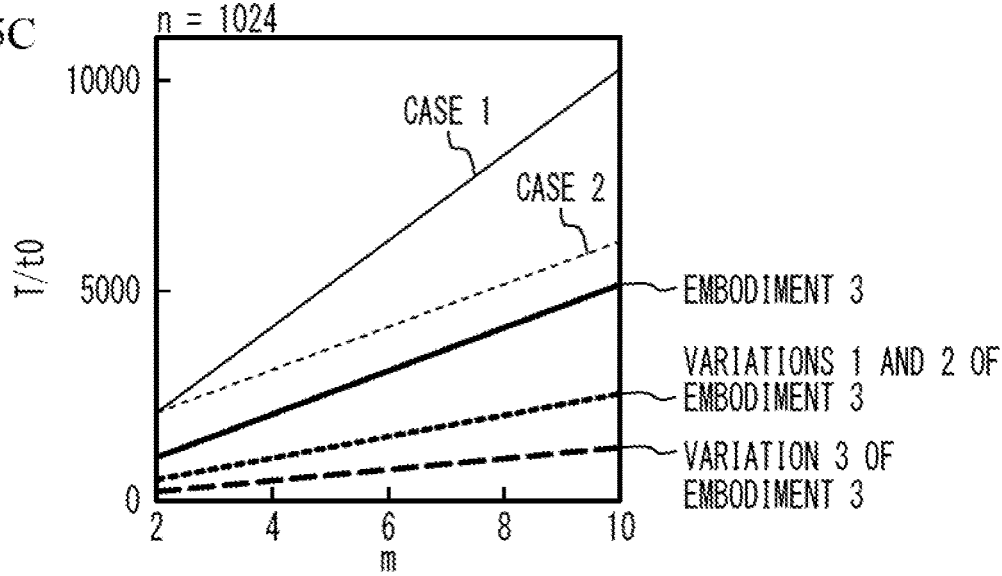

The processing time was simulated for the embodiment 3 and the variations thereof. The number of nodes of the input X layer and each of other layers was set to n, and the number of layers excluding the X layer was set to m (m is an even number). FIG. 55A to FIG. 55C present the normalized processing time T/t0 with respect to the number m of layers. The t0 is the value for normalization. FIG. 55A to FIG. 55C correspond to n=256, n=512, and n=1024, respectively. As presented in FIG. 55A to FIG. 55C, independently from n, the processing time of the embodiment 3 is shorter than those in the case 1 and the case 2. In the variations 1 and 2 of the embodiment 3, the processing time is approximately ½ of that of the embodiment 3. In the variation 3 of the embodiment 3, the processing time is approximately ¼ of that in the embodiment 3.

In the variations 1 to 3 of the embodiment 3, the processing unit 52 performs the processes of at least two second nodes of the second nodes y1 to yn in parallel, and the processing unit 62 performs the processes of at least two second nodes of the second nodes y1 to yn in parallel. This can reduce the processing time as in FIG. 54.

As in FIG. 47, FIG. 48, FIG. 50, and FIG. 51, each of the memory cells 10 has a pair of the memory nodes Q1 and Q2 complementary to each other, and at least one memory node of the pair of the memory nodes Q1 and Q2 is coupled to the control lines CTRL2 (a first bit line) and CTRL3 or CTRL2'(a second bit line) that extend in the column direction in parallel. The processing unit 52 acquires a plurality of first weights from the memory 51 via the first bit line when performing one process of the processes for second data performed in parallel and acquires a plurality of first weights from the memory 51 via the second bit line when performing another process. This allows the two processes to be performed in parallel in the processing unit 52.

As in FIG. 47, FIG. 48, FIG. 50, and FIG. 51, the processing unit 62 acquires a plurality of first weights from the memory 61 via the control line CTRL2 (a third bit line) when performing one process of the processes for second data performed in parallel, and acquires a plurality of first weights from the memory 61 via the control line CTRL3 or CTRL2' (a fourth bit line) when performing another process. This allows two processes to be performed in parallel in the processing unit 62.

As illustrated in FIG. 47, in the case that the memory cells 10 and 10' are the 2R1W-type NV-SRAM memory cells, the other of the source and the drain of the FET M3 is coupled to the first control line CTRL1, and the gate is coupled to the first word line WWL. The other of the source and the drain of the FET M41 is coupled to the second control line CTRL2, and the gate is coupled to the second word line RWL1. One of the source and the drain of the FET M42 (a fifth FET) is coupled to the memory node Q2, the other of the source and the drain is coupled to the fourth control line CTRL3, and the gate is coupled to the third word line RWL2.

In the case that the memory cells 10 and 10' are the 2R1W-type ULVR-SRAM memory cells, as illustrated in FIG. 48, in the inverter circuit 16 (a second inverter circuit), the other of the source and the drain of the FET m4 is coupled to the first control line CTRL1, and the gate is coupled to the first word line WWL. In the inverter circuit 14, the other of the source and the drain of the FET m41 is coupled to the second control line CTRL2, and the gate is coupled to the second word line RWL1. One of the source and the drain of the FET m42 is coupled to the second memory node Q2, the other of the source and the drain is coupled to the third control line CTRL3, and the gate is coupled to the third word line RWL2.

The control circuit 28 uses the word line WWL to turn on the FET M3 in FIG. 47 or the FET m4 of the inverter circuit 16 in FIG. 48, and uses the control line CTRL1 to write data in the bistable circuit 12. The control circuit 28 uses the word line RWL1 to turn on the FET M41 or the FET m41, uses the control line CTRL2 to read data from the bistable circuit 12, uses the word line RWL2 to turn on the FET M42 or the FET m42, and uses the control line CTRL3 to read data from the bistable circuit 12. This allows data to be written in the bistable circuit 12 using one control line CTRL1 in the 2R1W-type NV-SRAM cell and the 2R1W-type ULVR-SRAM cell. In addition, the control lines CTRL2 and CTRL3 through which data is read from the bistable circuit 12 can be selected using the word lines RWL1 and RWL2.

As presented in Table 6 and Table 7, in the case that the FETs M1 and M2 and the FETs m1 and m2 have N-type channels, the control circuit 28 sets the voltage of the word line WWL when data is read from the bistable circuit 12 higher than the voltage of the word line WWL when data is written in the bistable circuit 12, and lower than the higher of the voltages of the word lines RWL1 and RWL2 when data is read from the bistable circuit 12. This improves the SNM at the time of read. The voltage of the word line WWL during the read operation is preferably higher than the voltage of the word line WWL during the write operation by (VDD−VGND)/10 or greater, and is preferably lower than the higher of the voltages of the word lines RWL1 and RWL2 during the read operation by (VDD−VGND)/10 or greater.

In the case that the FETs M1a and M2a and the FETs m1a and m2a have P-type channels, the control circuit 28 sets the voltage of the word line WWL when data is read from the bistable circuit 12 lower than the voltage of the word line WWL when data is written in the bistable circuit 12, and higher than the lower of the voltages of the word lines RWL1 and RWL2 when data is read from the bistable circuit 12. This improves the SNM at the time of read. The voltage of the word line WWL during the read operation is preferably lower than the voltage of the word line WWL during the write operation by (VDD−VGND)/10 or greater, and is preferably higher than the higher of the voltages of the word lines RWL1 and RWL2 during the read operation by (VDD−VGND)/10 or greater.

Variation 4 of the Embodiment 3

Figure 56:
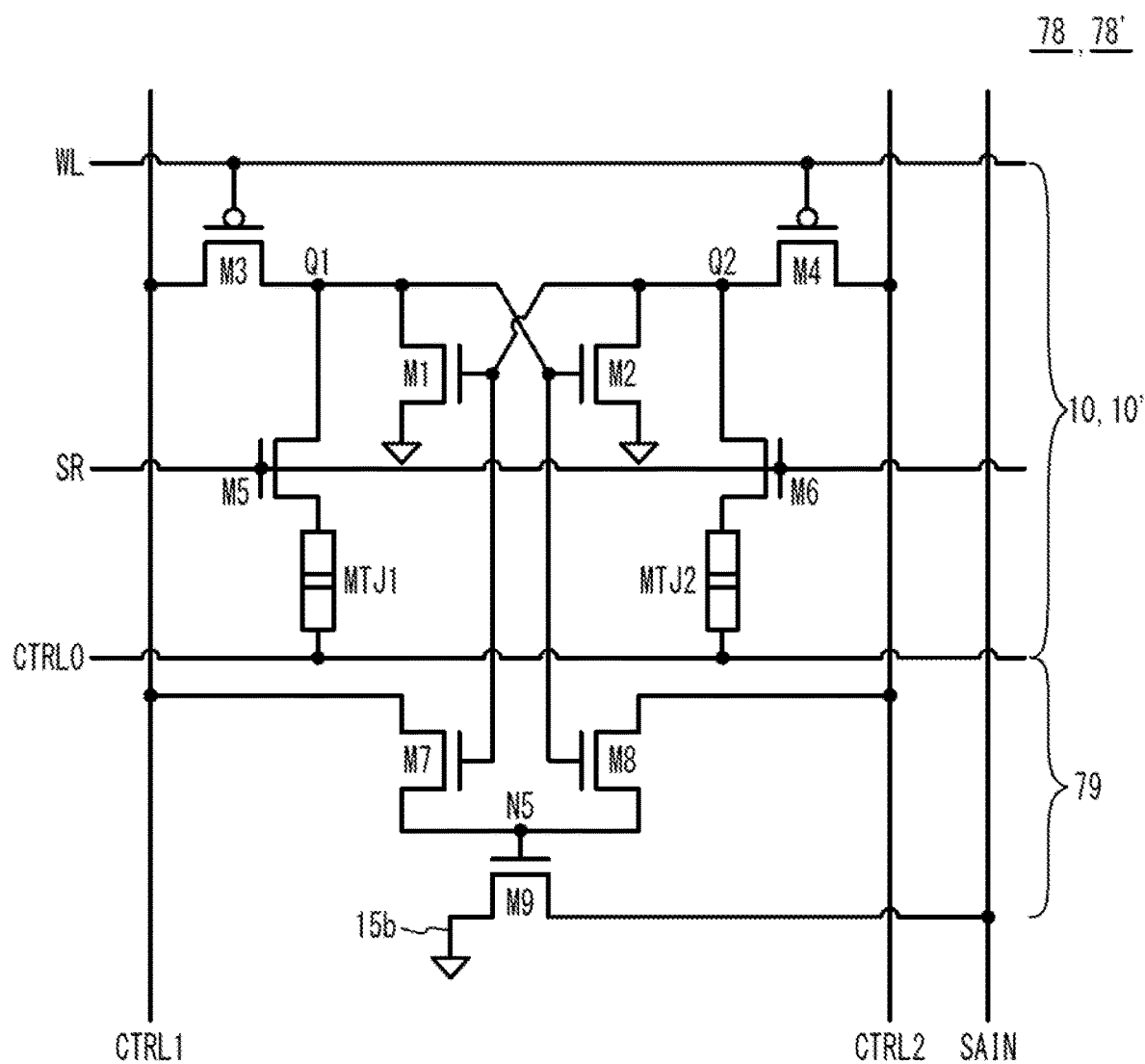
FIG. 56 is a circuit diagram of an NV-SRAM memory cell in accordance with a variation 4 of the embodiment 3.

FIG. 56 is a circuit diagram of the NV-SRAM memory cell in accordance with a variation 4 of the embodiment 3. As illustrated in FIG. 56, cells 78 and 78' include the memory cells 10 and 10' of the embodiment 2 and an XNOR circuit 79. The XNOR circuit 79 includes FETs M7 to M9. In the FET M7, one of the source and the drain is coupled to the control line CTRL1, and the other of the source and the drain is coupled to a node N5, and the gate is coupled to the memory node Q2. In the FET M8, one of the source and the drain is coupled to the control line CTRL2, and the other of the source and the drain is coupled to the node N5, and the gate is coupled to the memory node Q1. In the FET M9, one of the source and the drain is coupled to the ground line 15b, the other of the source and the drain is coupled to an output line SAIN, and the gate is coupled to the node N5.

In the hold state of the memory cell 10, the XNOR circuit 79 outputs the XNOR between the memory node Q1 and the control line CTRL1 (corresponding to the XNOR between the memory node Q2 and the control line CTRL2) to the output line SAIN. One-bit computation data (for example, H is 1.2 V, L is 0 V) is input to the control line CTRL1, and the complementary data of the computation data is input to the control line CTRL2. The XNOR between the computation data and the memory node Q1 is output to the output line SAIN.

Figure 57:
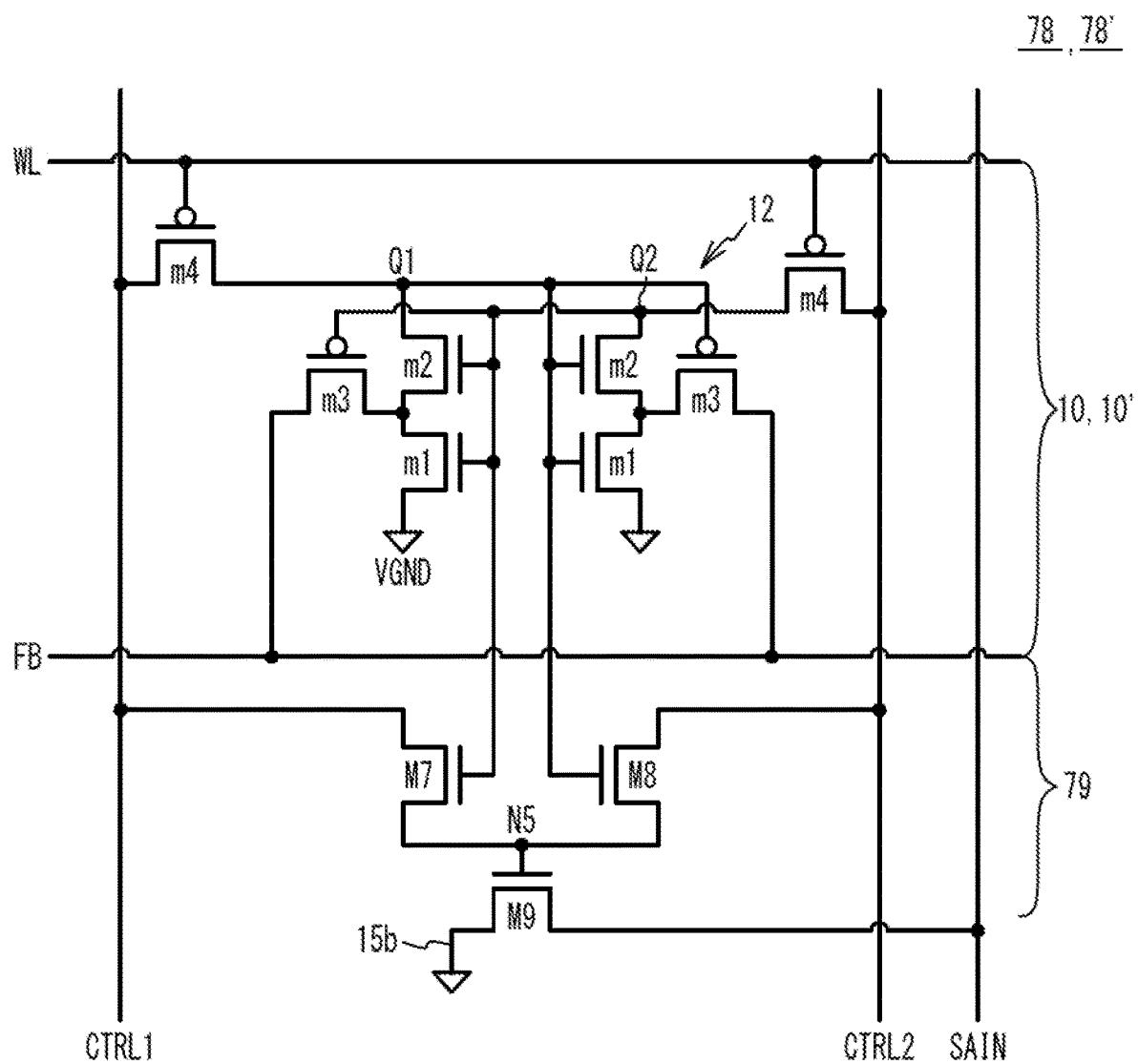
FIG. 57 is a circuit diagram of a ULVR-SRAM memory cell in the variation 4 of the embodiment 3.

FIG. 57 is a circuit diagram of a ULVR-SRAM memory cell in accordance with the variation 4 of the embodiment 3. As illustrated in FIG. 57, the cells 78 and 78' include the memory cells 10 and 10' of the embodiment 1 and the XNOR circuit 79. The circuit configuration and the functions of the XNOR circuit 79 are the same as those in FIG. 56.

Figure 58:
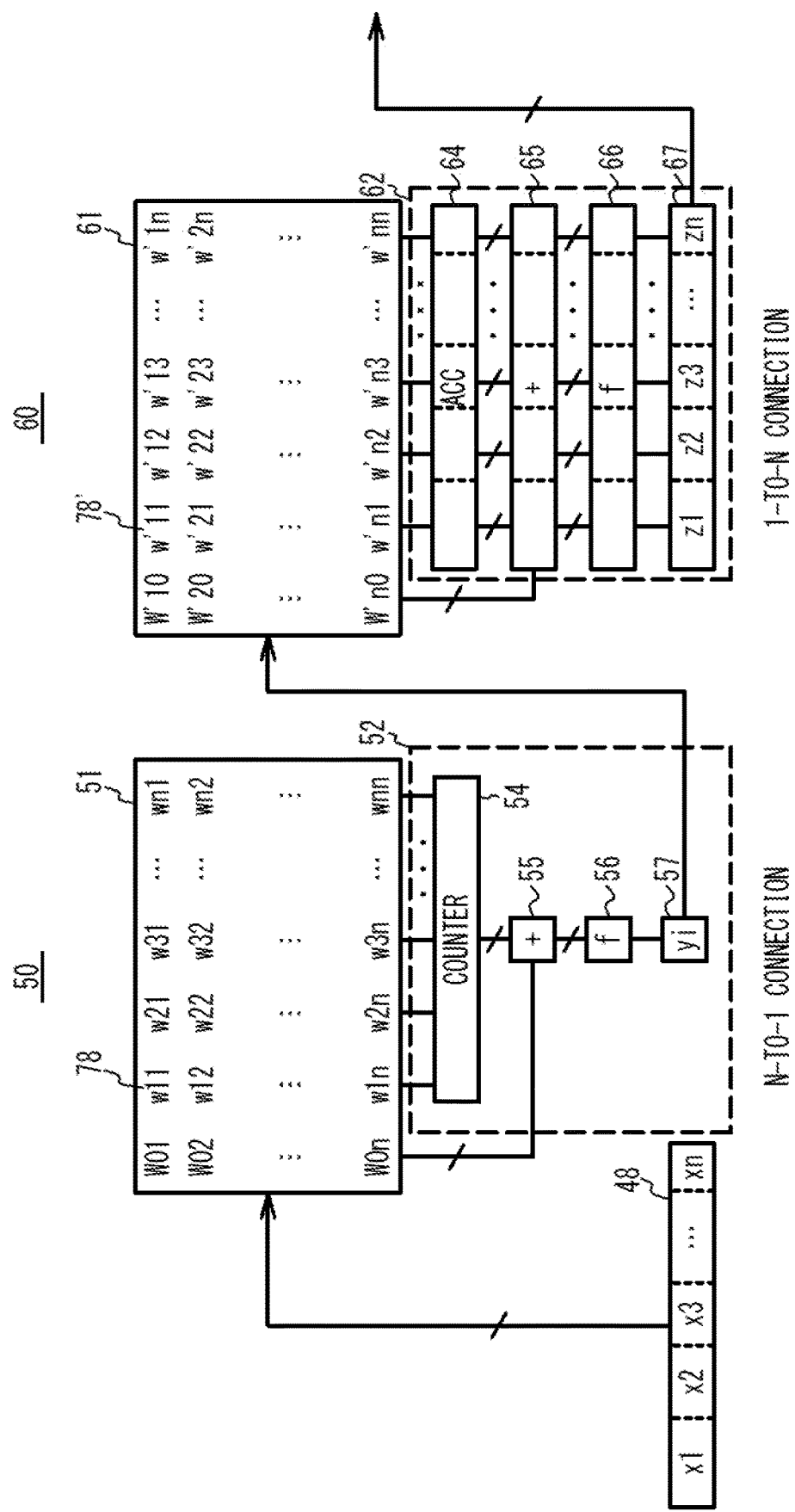
FIG. 58 is a block diagram of the BNN device in the variation 4 of the embodiment 3.

FIG. 58 is a block diagram of the BNN device in the variation 4 of the embodiment 3. As illustrated in FIG. 58, the memory cells in the memories 51 and 61 are the cells 78 and 78' in FIG. 56 or FIG. 57. The processing units 52 and 62 include no XNOR circuit. When the XNOR is output from the memory 51, the data of the nodes x1 to xn of the input unit 48 and the complementary data thereof are input to the control line CTRL1 and the control line CTRL2 of the memory 51, respectively. The sense amplifier of the memory 51 reads data from the output line SAIN of each column, and outputs the read data to the counter 54. When the XNOR is output from the memory 61, the data of the node yi of the output unit 57 and the complementary data thereof are input to the control line CTRL1 and the control line CTRL2 of the memory 61. The sense amplifier of the memory 61 reads data from the output line SAIN of each column, and outputs the read data to the accumulator 64.

As in the variation 4 of the embodiment 3, the XNOR circuit 79 may be provided in each of the cells 78 and 78'. In the variations 1 to 3 of the embodiment 3, the XNOR circuit 79 may be provided in each cell 78.

In the variation 4 of the embodiment 3, as in FIG. 56 and FIG. 57, the memories 51 and 61 include the XNOR circuits 79 (a first XNOR circuit and a second XNOR circuit) corresponding to the memory cells 10 and 10'. This allows the processing units 52 and 62 to include none of the XNOR circuits 53 and 63.

Variation 5 of the Embodiment 3

Figure 59A:
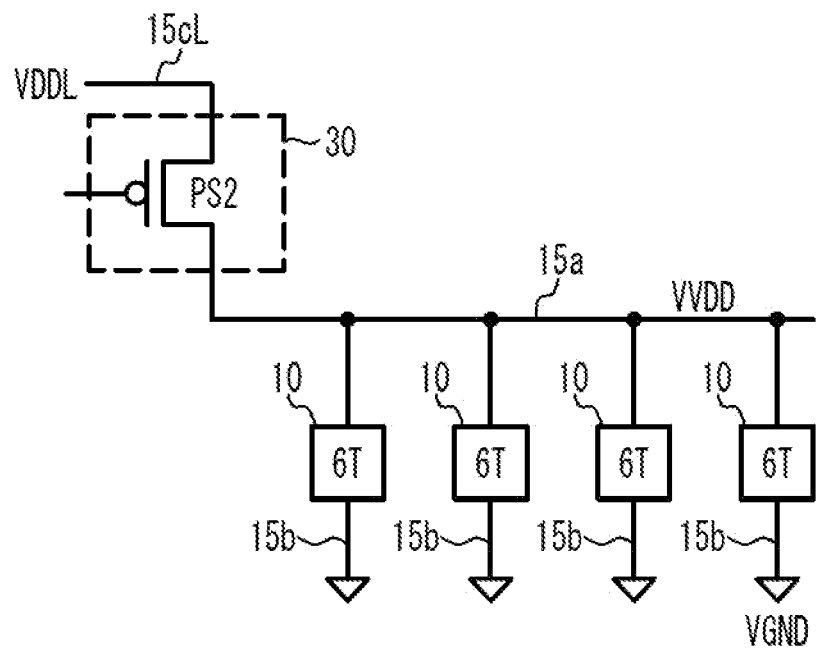
FIG. 59A and FIG. 59B are block diagrams of the vicinity of the power switch of a comparative example 4 and a variation 5 of the embodiment 3, respectively.
Figure 59B:
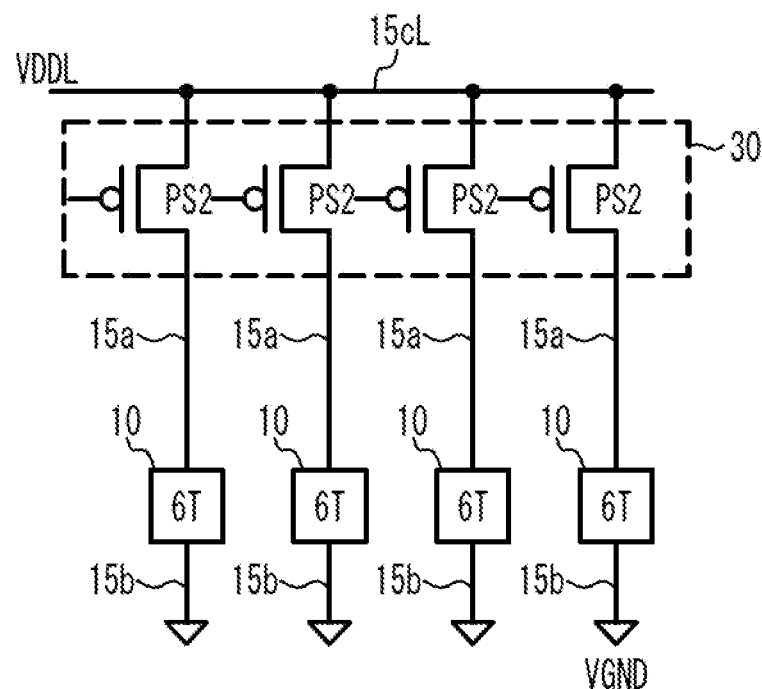

FIG. 59A and FIG. 59B are block diagrams of the vicinity of the power switch in a comparative example 4 and a variation 5 of the embodiment 3, respectively. As illustrated in FIG. 59A, in the comparative example 4, a plurality of 6T cells 10 are arranged in one row of the memory array. The number of the cells 10 in one row is, for example, 512. The memory cells 10 of one row are coupled to one power supply line 15a (the virtual power supply line). In the power switch 30, one FET PS2 is provided between the power supply 15cL with the voltage VDDL for the sleep state and the power supply line 15a. The illustration of the power supply 15cH with the voltage VDDH and the FET PS1 for the power switch is omitted. When the FET PS2 is turned on, the virtual power supply voltage VVDD of the power supply line 15a becomes the VDDL.

As illustrated in FIG. 59B, in the variation 5 of the embodiment 3, the power switch 30 includes FETs PS2 for respective memory cells 10, and each FET PS2 is connected between the power supply 15cL with the voltage VDDL for the sleep state and the power supply line 15a. The illustration of the power supply 15cH with the voltage VDDH and the FET PS1 for the power switch is omitted. When the FET PS2 is turned on, the virtual power supply voltage VVDD of the power supply line 15a becomes the VDDL.

Figure 60:
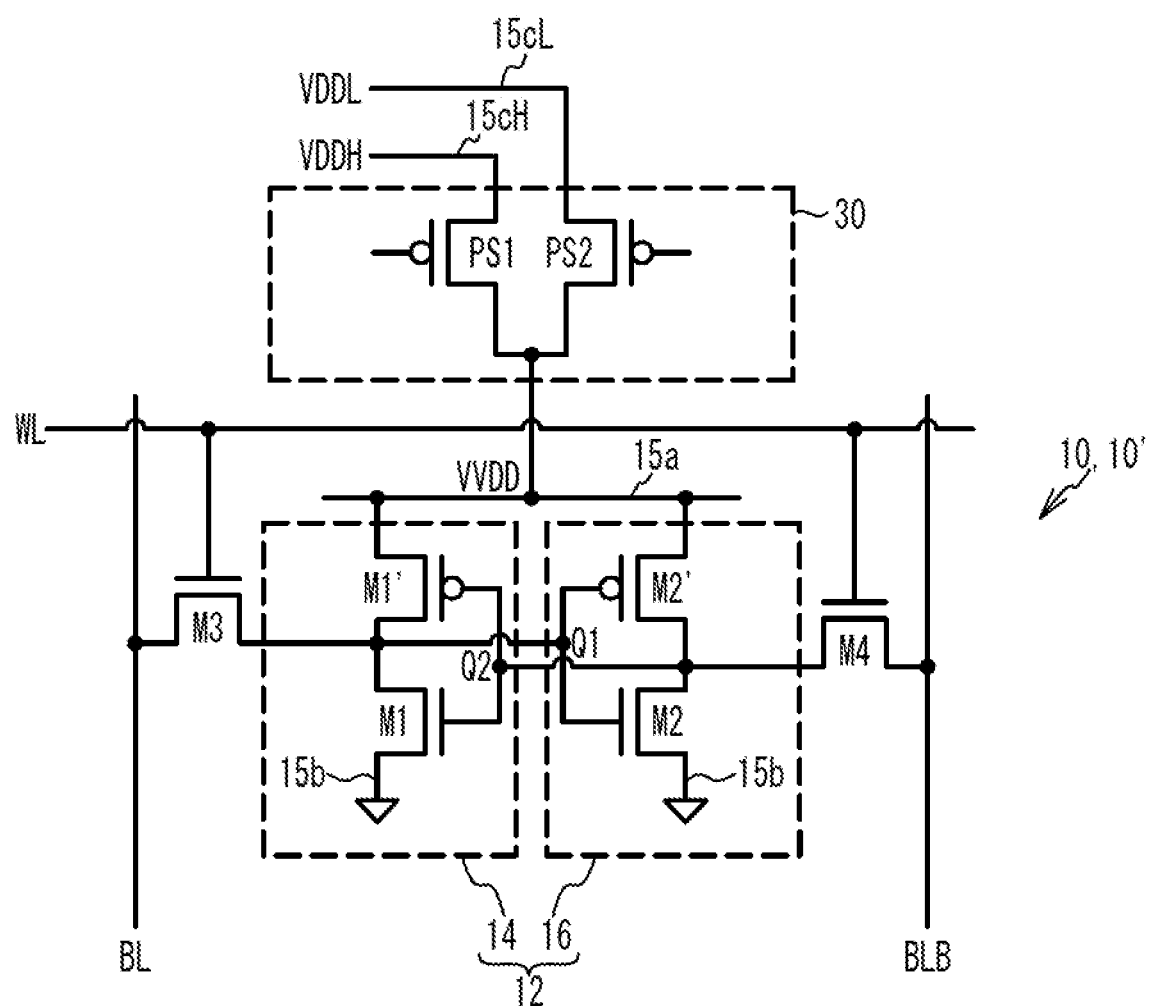
FIG. 60 is a circuit diagram of a 6T cell in the variation 5 of the embodiment 3.

FIG. 60 is a circuit diagram of the 6T cell in the variation 5 of the embodiment 3. As illustrated in FIG. 60, in the memory cells 10 and 10', the bistable circuit 12 includes the inverter circuit 14 having a PFET M1' and an NFET M1, and the inverter circuit 16 having a PFET M2' and an NFET M2. The inverter circuits 14 and 16 are connected in a loop shape. The NFETs M3 and M4 for pass transistors are provided. The power switch 30 includes the FET PS1 connecting the power supply 15cH, which supplies the voltage VDDH, and the power supply line 15a, and the FET PS2 connecting the power supply 15cL, which supplies the voltage VDDL, and the power supply line 15a. The voltage VDDH is the power supply voltage (a second power supply voltage) during the read and write operations, and is, for example, 1.2 V. The voltage VDDL is the power supply voltage (a first power supply voltage) during the sleep state in which the bistable circuit 12 retains the data but the write and read operations are not performed, and is, for example, ⅓ to ¼ of the VDDH. One FET PS1 (a second power switch) and one FET PS2 (a first power switch) are coupled to the virtual power supply lines 15a of one or some (e.g., 10 or less) memory cells 10. The FET PS1 may be coupled to the larger number of cells than the FET PS2. For example, one FET PS1 may be connected to 64, 128, or 256 memory cells 10.

Figure 61A:
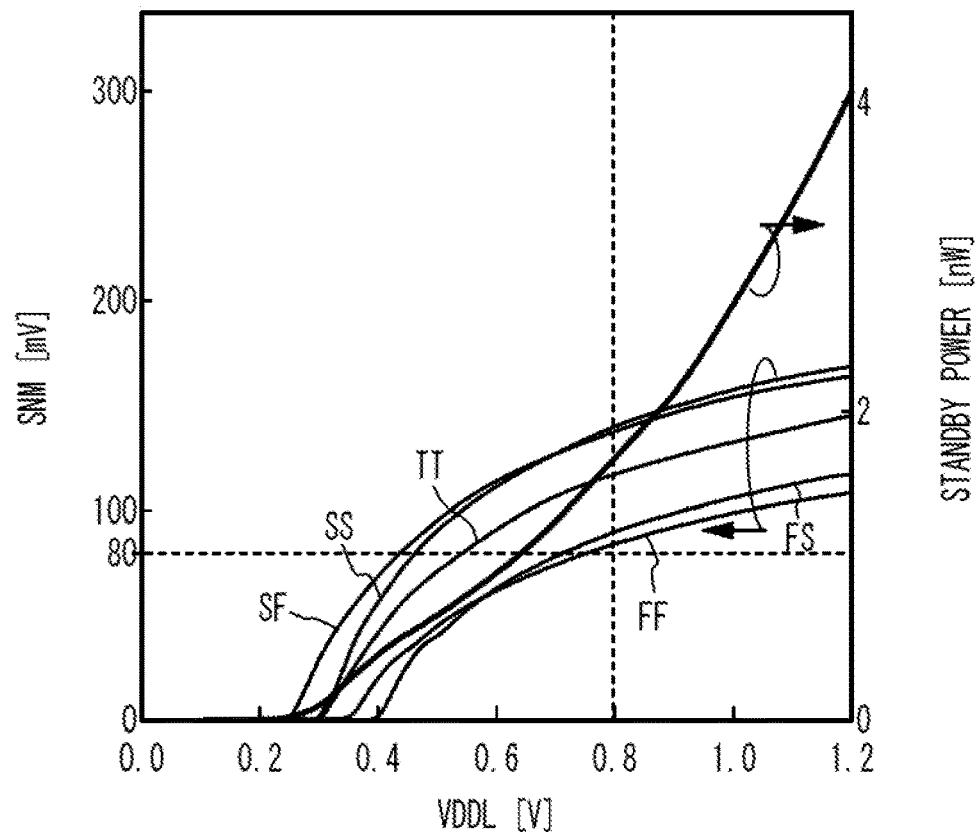
FIG. 61A and FIG. 61B present the SNM and the standby power with respect to VDDL in the comparative example 4 and the variation 5 of the embodiment 3, respectively.
Figure 61B:
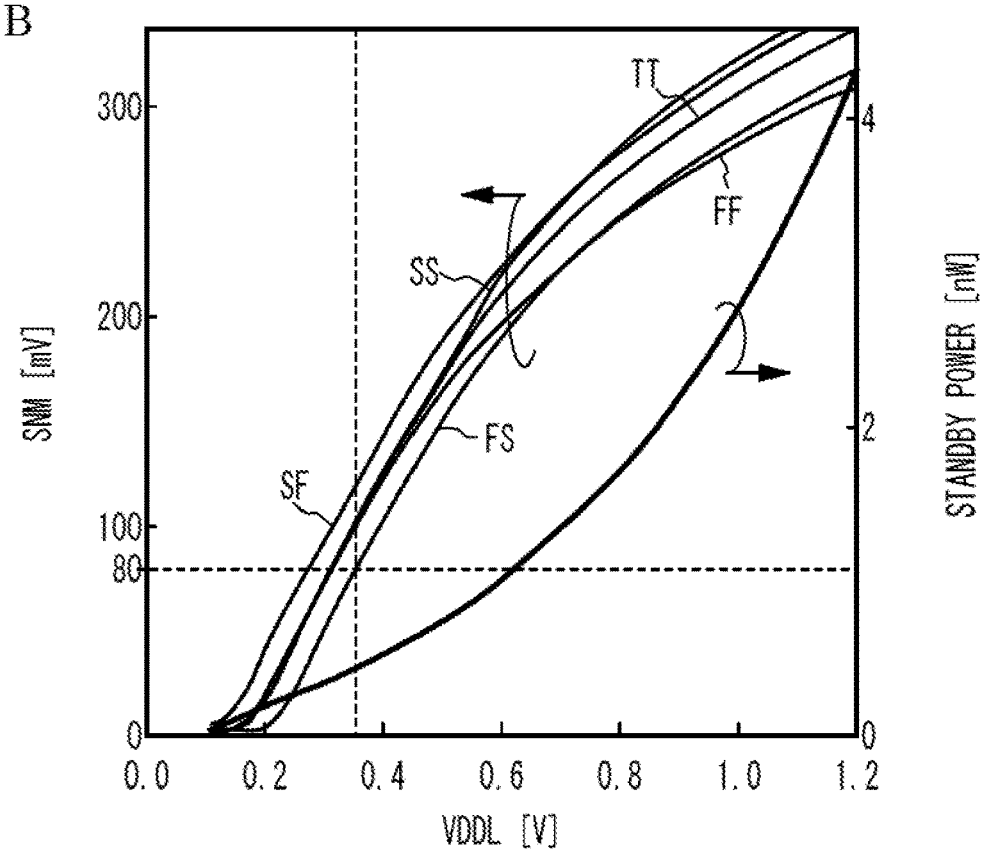

The SNM and the standby power were simulated for the case in which the FET PS2 is shared by 512 memory cells 10 as in the comparative example 4, and the case where the FET PS2 is provided so as to correspond to each memory cell 10 as in the variation 5 of the embodiment 3. FIG. 61A and FIG. 61B present the SNMs and the standby power of the comparative example 4 and the variation 5 of the embodiment 3 with respect to the VDDL, respectively.

As presented in FIG. 61A, in the comparative example 4, when the VDDL is 1.2 V, the SNM is 100 mV to 180 mV. As the VDDL is decreased, the SNM decreases. The minimum VDDL at which all SNMs are 80 mV or greater is 0.8 V. Thus, the VDDL in the sleep state is set to 0.8 V. The standby power when the VDDL is set to 0.8 V is approximately 1.6 nW.

As presented in FIG. 61B, in the variation 5 of the embodiment 3, when the VDDL is 1.2 V, the SNM is 300 mV or greater. As the VDDL is decreased, the SNM decreases. The minimum VDDL at which all SNMs are 80 mV greater is 0.35 V. Thus, the VDDL in the sleep state is set to 0.35 V. The standby power when the VDDL is set to 0.35 V is approximately 0.5 nW. As seen from the above, in the variation 5 of the embodiment 3 illustrated in FIG. 59B, the standby power can be reduced as compared with that in the comparative example 4 illustrated in FIG. 59A.

The reason why the SNM can be made to be large even when the VDDL is set low in the variation 5 of the embodiment 3 is because the virtual power supply voltage VVDD can be maintained at the VDDL when only one (or several) memory cell 10 is connected, while the SNM deteriorates because the virtual power supply voltage VVDD becomes lower than the VDDL when a plurality of the memory cells 10 are coupled to the FET PS2.

In the variation 5 of the embodiment 3, even when the 6T memory cells are used as the memory cells 10 and 10', the power supply voltage for the retention can be made to be low. Therefore, the area of the memory cell can be reduced, and the power consumption can be reduced. The virtual power supply system has been described as an example, but the virtual ground system may be used. The variation 5 of the embodiment 3 may be applied to the BNN devices of the embodiment 3 and the variations 1 to 4 of the embodiment. The embodiment 3 and the variations thereof are applicable to the neural network devices other than the BNN device.

The present specification discloses the following technical features 1 to 41 conceived by the inventor.

[Technical Feature 1]
A bistable circuit including:
a first inverter circuit and a second inverter circuit each including:
a first FET having a channel of a first conductivity type, wherein a source of the first FET is coupled to a power supply line, a drain of the first FET is coupled to an intermediate node, and a gate of the first FET is coupled to an input node,
a second FET having a channel of the first conductivity type, wherein a source of the second FET is coupled to the intermediate node, a drain of the second FET is coupled to an output node, and a gate of the second FET is coupled to the input node,
a third FET, wherein one of a source and a drain of the third FET is coupled to the intermediate node, and the other of the source and the drain of the third FET is coupled to a bias node, and
a fourth FET having a channel of a second conductivity type opposite to the first conductivity type, wherein one of a source and a drain of the fourth FET is coupled to the output node, and the other of the source and the drain of the fourth FET is coupled to a control line;
a first memory node to which an input node of the first inverter circuit and an output node of the second inverter circuit are coupled; and
a second memory node to which an output node of the first inverter circuit and an input node of the second inverter circuit are coupled,
wherein gates of the fourth FETs of the first inverter circuit and the second inverter circuit are coupled to a word line,
wherein a gate of the third FET of the first inverter circuit is coupled to one of the following nodes: the input node and the output node of the first inverter circuit and the input node and the output node of the second inverter circuit, and
wherein a gate of the third FET of the second inverter circuit is coupled to one of the following nodes: the input node and the output node of the second inverter circuit and the input node and the output node of the first inverter circuit.

[Technical Feature 2]
The bistable circuit according to technical feature 1,
wherein the third FET has a channel of the second conductivity type,
wherein the gate of the third FET of the first inverter circuit is coupled to the input node of the first inverter circuit or the output node of the second inverter circuit, and
wherein the gate of the third FET of the second inverter circuit is coupled to the input node of the second inverter circuit or the output node of the first inverter circuit.

[Technical Feature 3]
The bistable circuit according to technical feature 1,
wherein the third FET has a channel of the first conductivity type,
wherein the gate of the third FET of the first inverter circuit is coupled to the output node of the first inverter circuit or the input node of the second inverter circuit, and
wherein the gate of the third FET of the second inverter circuit is coupled to the output node of the second inverter circuit or the input node of the first inverter circuit.

[Technical Feature 4]
An electronic circuit including:
the bistable circuit according to any one of technical features 1 to 3; and a control circuit configured to, in a first state in which the bistable circuit retains data, set a first voltage between the power supply line and the control line lower than a second voltage between the first memory node and the second memory node in a second state in which data is read from the bistable circuit or data is written in the bistable circuit.

[Technical Feature 5]

The electronic circuit according to technical feature 4, wherein the control circuit sets the control line as a bit line for reading data from the bistable circuit or writing data in the bistable circuit, in the second state.

[Technical Feature 6]

The electronic circuit according to technical feature 4 or 5, wherein, in the second state, the control circuit sets a voltage of the word line higher than a voltage of the power supply line in the case that the first conductivity type is an N type, and sets the voltage of the word line lower than the voltage of the power supply line in the case that the first conductivity type is a P type.

[Technical Feature 7]

The electronic circuit according to any one of technical features 4 to 6, wherein, in the first state, the control circuit sets a voltage between the word line and the power supply line to the first voltage or lower than the first voltage.

[Technical Feature 8]

The electronic circuit according to any one of technical features 4 to 6, wherein, in a third state in which a voltage between the power supply line and the control line is set to the second voltage, the control circuit sets a voltage between the word line and the power supply line smaller than the second voltage.

[Technical Feature 9]

The electronic circuit according to any one of technical features 4 to 8, wherein a fixed bias is supplied to the bias node in both the first state and the second state.

[Technical Feature 10]

The electronic circuit according to technical feature 9, wherein the fixed bias is a voltage between a voltage of the first memory node and a voltage of the second memory node in the second state.

[Technical Feature 11]

The electronic circuit according to any one of technical features 4 to 10,
  wherein, in the second inverter circuit, the other of the source and the drain of the fourth FET is coupled to a first control line, and a gate of the fourth FET is coupled to a first word line,
  wherein, in the first inverter circuit, the other of the source and the drain of the fourth FET is coupled to a second control line, and a gate of the fourth FET is coupled to a second word line,
  wherein the first inverter circuit includes a fifth FET having a channel of the second conductivity type, one of the source and the drain of the fifth FET is coupled to the first memory node, the other of the source and the drain of the fifth FET is coupled to a third control line, and a gate of the fifth FET is coupled to a third word line, and
  wherein the control circuit uses the first word line to turn on the fourth FET of the second inverter circuit, uses the first control line to write data in the bistable circuit, uses the second word line to turn on the fourth FET of the first inverter circuit, uses the second control line to read data from the bistable circuit, uses the third word line to turn on the fifth FET of the first inverter circuit, and uses the third control line to read data from the bistable circuit.

[Technical Feature 12]

The electronic circuit according to technical feature 11,
  wherein in the case that the first conductivity type is an N type, the control circuit sets a voltage of the first word line when data is read from the bistable circuit higher than a voltage of the first word line when data is written in the bistable circuit, and lower than the higher of voltages of the second word line and the third word line when data is read from the bistable circuit, and
  wherein in the case that the first conductivity type is a P type, the control circuit sets a voltage of the first word line when data is read from the bistable circuit lower than a voltage of the first word line when data is written in the bistable circuit, and higher than the lower of voltages of the second word line and the third word line when data is read from the bistable circuit.

[Technical Feature 13]

The electronic circuit according to any one of technical features 4 to 10,
  wherein, in the first inverter circuit, the other of the source and the drain of the fourth FET is coupled to a first control line, and a gate of the fourth FET is coupled to the first word line,
  wherein, in the second inverter circuit, the other of the source and the drain of the fourth FET is coupled to a second control line, and a gate of the fourth FET is coupled to the first word line,
  wherein the first inverter circuit includes a fifth FET having a channel of the second conductivity type, one of a source and a drain of the fifth FET is coupled to the first memory node, the other of the source and the drain of the fifth FET is coupled to a third control line, and a gate of the fifth FET is coupled to a second word line,
  wherein the second inverter circuit includes a sixth FET having a channel of the second conductivity type, one of a source and a drain of the sixth FET is coupled to the second memory node, the other of the source and the drain of the sixth FET is coupled to a fourth control line, and a gate of the sixth FET is coupled to the second word line, and
  wherein the control circuit uses the first word line to turn on the fourth FETs of the first inverter circuit and the second inverter circuit, uses the first control line and the second control line to write data in the bistable circuit and read data from the bistable circuit, uses the second word line to turn on the fifth FET and the sixth FET, and uses the third control line and the fourth control line to write data in the bistable circuit and read data from the bistable circuit.

[Technical Feature 14]

A memory circuit including:
  a bistable circuit including:
    a first FET having a channel of a first conductivity type, wherein a source of the first FET is coupled to a power supply line, a drain of the first FET is coupled to a first memory node, and a gate of the first FET is coupled to a second memory node,
    a second FET having a channel of the first conductivity type, wherein a source of the second FET is coupled to the power supply line, a drain of the second FET is coupled to the second memory node, and a gate of the second FET is coupled to the first memory node,
    a third FET having a channel of a second conductivity type opposite to the first conductivity type, wherein one of a source and a drain of the third FET is coupled to the first memory node, the other of the source and the drain of the third FET is coupled to a first control line, and a gate of the third FET is coupled to a word line, and a fourth FET having a channel of the second conductivity type, wherein one of a source and a drain of the fourth FET is coupled to the second memory node, the other of the source and the drain of the fourth FET is coupled to a second control line, and a gate of the fourth FET is coupled to the word line;

a first switch, one end of the first switch being coupled to the first memory node;

a second switch, one end of the second switch being coupled to the second memory node;

a first non-volatile memory element, one end of the first non-volatile memory element being coupled to another end of the first switch, another end of the first non-volatile memory element being coupled to a third control line; and a second non-volatile memory element, one end of the second non-volatile memory element being coupled to another end of the second switch, and another end of the second non-volatile memory element being coupled to the third control line.

[Technical Feature 15]

The memory circuit according to technical feature 14, further including:

a control circuit that turns off the first switch and the second switch during a write operation in which data is written in the bistable circuit in a volatile manner and a read operation in which data is read from the bistable circuit, and turns on the first switch and the second switch during a store operation in which data is stored in the first non-volatile memory element and the second non-volatile memory element from the bistable circuit in a non-volatile manner and a restore operation in which data is restored in the bistable circuit from the first non-volatile memory element and the second non-volatile memory element.

[Technical Feature 16]

The memory circuit according to technical feature 15, wherein, when performing the store operation, the control circuit performs a first store operation in which the word line is set to a first voltage, the first control line and the second control line are set to a second voltage, and the third control line is set to a third voltage, and a second store operation in which the word line is set to a fourth voltage, the first control line and the second control line are set to a fifth voltage, and the third control line is set to a sixth voltage, wherein, in the case that the first conductivity type is an N type, the first voltage is lower than the fourth voltage, the second voltage and the fifth voltage are higher than a voltage of the power supply line, and the third voltage is lower than the sixth voltage, and wherein, in the case that the first conductivity type is a P type, the first voltage is higher than the fourth voltage, the second voltage and the fifth voltage are lower than the voltage of the power supply line, and the third voltage is higher than the sixth voltage.

[Technical Feature 17]

The memory circuit according to technical feature 16, wherein, in the case that the first conductivity type is an N type, the fourth voltage is lower than the fifth voltage, and wherein, in the case that the first conductivity type is a P type, the fourth voltage is higher than the fifth voltage.

[Technical Feature 18]

The memory circuit according to any one of technical features 15 to 17, wherein when performing the restore operation, the control circuit sets a voltage of the word line higher than the lower of voltages of the first memory node and the second memory node during the write operation and lower than the higher of voltages of the first memory node and the second memory node during the write operation.

[Technical Feature 19]

The memory circuit according to any one of technical features 15 to 18, wherein a gate of the third FET is coupled to a first word line, wherein a gate of the fourth FET is coupled to a second word line, wherein the memory circuit includes a fifth FET having a channel of the second conductivity type, one of a source and a drain of the fifth FET is coupled to the second memory node, the other of the source and the drain of the fifth FET is coupled to a fourth control line, and a gate of the fifth FET is coupled to a third word line, and wherein the control circuit uses the first word line to turn on the third FET, uses the first control line to write data in the bistable circuit, uses the second word line to turn on the fourth FET, uses the second control line to read data from the bistable circuit, uses the third word line to turn on the fifth FET, and uses the fourth control line to read data from the bistable circuit.

[Technical Feature 20]

The memory circuit according to technical feature 19, wherein, in the case that the first conductivity type is an N type, the control circuit sets a voltage of the first word line when data is read from the bistable circuit higher than a voltage of the first word line when data is written in the bistable circuit, and lower than the higher of voltages of the second word line and the third word line when data is read from the bistable circuit, and wherein, in the case that the first conductivity type is a P type, the control circuit sets a voltage of the first word line when data is read from the bistable circuit lower than a voltage of the first word line when data is written in the bistable circuit, and higher than the lower of voltages of the second word line and the third word line when data is read from the bistable circuit.

[Technical Feature 21]

The memory circuit according to any one of technical features 15 to 18, wherein a gate of the third FET is coupled to a first word line, wherein a gate of the fourth FET is coupled to the first word line, wherein the memory circuit includes a fifth FET having a channel of the second conductivity type and a sixth FET having a channel of the second conductivity type, one of a source and a drain of the fifth FET is coupled to the second memory node, the other of the source and the drain of the fifth FET is coupled to a fourth control line, a gate of the fifth FET is coupled to a second word line, one of a source and a drain of the sixth FET is coupled to the first memory node, the other of the source and the drain of the sixth FET is coupled to a fifth control line, and a gate of the sixth FET is coupled to the second word line, and wherein the control circuit uses the first word line to turn on the third FET and the fourth FET, uses the first control line and the second control line to write data in the bistable circuit and read data from the bistable circuit, and uses the second word line to turn on the fifth FET and the sixth FET, uses the fourth control line and the fifth control line to write data in the bistable circuit and read data from the bistable circuit.

[Technical Feature 22]

A processing device including:
- a first processing unit that performs a process of calculating one piece of second data of a plurality of pieces of second data corresponding to a plurality of second nodes of a second layer by weighting a plurality of pieces of first data corresponding to a plurality of first nodes of a first layer by a plurality of first weights, respectively, and adding up a plurality of pieces of weighted first data, for each of the plurality of pieces of second data to calculate the plurality of pieces of second data; and
- a second processing unit that performs a process of calculating parts, corresponding to one piece of second data, of a plurality of pieces of third data corresponding to a plurality of third nodes of a third layer by weighting the one piece of second data of the plurality of pieces of second data by a plurality of second weights, for each of the plurality of pieces of second data, and performs a process of calculating one piece of third data by adding up parts, corresponding to the plurality of pieces of second data, of the one piece of third data, for each of the plurality of pieces of third data,
- wherein while the second processing unit is performing a process for one piece of second data of the plurality of pieces of second data, the first processing unit performs a process for another piece of second data of the plurality of pieces of second data in parallel.

[Technical Feature 23]

The processing device according to technical feature 22, wherein the plurality of pieces of first data, the plurality of pieces of second data, the plurality of first weights, and the plurality of second weights are each 1 bit.

[Technical Feature 24]

The processing device according to technical feature 23, further including:
- a first memory including a plurality of first memory cells and a plurality of first bit lines, wherein the plurality of first memory cells store the plurality of first weights, respectively, store a plurality of first weights corresponding to one piece of second data in the same row, and store a plurality of first weights corresponding to another piece of second data in another row, and each of the plurality of first bit lines is coupled to a plurality of first memory cells in the same row, and extends in a column direction; and
- a second memory including a plurality of second memory cells and a plurality of second bit lines, wherein the plurality of second memory cells store the plurality of second weights, respectively, store a plurality of second weights corresponding one piece of second data in the same row, and store a plurality of second weights corresponding to another piece of second data in another row, and each of the plurality of second bit lines is coupled to a plurality of second memory cells in the same row, and extends in a column direction,
- wherein the first processing unit acquires the plurality of first weights from the first memory via the plurality of first bit lines when performing the process for the one piece of second data of the plurality of pieces of second data, and
- wherein the second processing unit acquires the plurality of second weights from the second memory via the plurality of second bit lines when performing the process for the one piece of second data of the plurality of pieces of second data.

[Technical Feature 25]

The processing device according to any one of technical features 22 to 24,
- wherein the first processing unit performs processes for at least two pieces of second data of the plurality of pieces of second data in parallel, and
- wherein the second processing unit performs processes for at least two pieces of second data of the plurality of pieces of second data in parallel.

[Technical Feature 26]

The processing device according to technical feature 25, further including:
- a first memory including a plurality of first memory cells that store the plurality of first weights, respectively, store a plurality of first weights corresponding to one piece of second data in the same row, and store a plurality of first weights corresponding to another piece of second data in another row,
- wherein each of the plurality of first memory cells includes a pair of memory nodes complementary to each other, at least one memory node of the pair of memory nodes is coupled to a first bit line and a second bit line that extend in a column direction in parallel, and
- wherein the first processing unit acquires the plurality of first weights from the first memory via the first bit line when performing one of the processes for the at least two pieces of second data, and acquires the plurality of first weights from the first memory via the second bit line when performing another one of the processes for the at least two pieces of second data.

[Technical Feature 27]

The processing device according to technical features 25 or 26, further comprising:
- a second memory including a plurality of second memory cells that store the plurality of second weights, respectively, store a plurality of second weights corresponding to one piece of second data in the same row, and store a plurality of second weights corresponding to another piece of second data in another row,
- wherein each of the plurality of second memory cells includes a pair of memory nodes complementary to each other, and at least one memory node of the pair of memory nodes is coupled to a third bit line and a fourth bit line that extend in a column direction in parallel, and
- wherein the second processing unit acquires the plurality of second weights from the second memory via the third bit line when performing one of the processes for the at least two pieces of second data, and acquires the plurality of second weights from the second memory via the fourth bit line when performing another one of the processes for the at least two pieces of second data.

[Technical Feature 28]

The processing device according to technical feature 25, further including:
- a first memory including a plurality of first memory cells that store the plurality of first weights, respectively, store a plurality of first weights corresponding to one piece of second data in the same row, and store a plurality of first weights corresponding to another piece of second data in another row, wherein each of the plurality of first memory cells includes a pair of memory nodes complementary to each other, wherein at least one memory node of the pair of memory nodes in one or some first memory cells of the plurality of first memory cells is coupled to a first bit line, and is not coupled to a second bit line, the first bit line and the second bit line extending in a column direction in parallel, wherein at least one memory node of the pair of memory nodes in one or some other first memory cells of the plurality of first memory cells is coupled to the second bit line, and is not coupled to the first bit line, and wherein the first processing unit acquires the plurality of first weights from the first memory via the first bit line when performing one of the processes for the at least two pieces of second data, and acquires the plurality of first weights from the first memory via the second bit line when performing another one of the processes for the at least two pieces of second data.

[Technical Feature 29]

The processing device according to technical feature 25 or 28, further comprising:

a second memory that includes a plurality of second memory cells that store the plurality of second weights, respectively, store a plurality of second weights corresponding to one piece of second data in the same row, and store a plurality of second weights corresponding to another piece of second data in another row, wherein each of the plurality of second memory cells includes a pair of memory nodes complementary to each other, wherein at least one memory node of the pair of memory nodes in one or some second memory cells of the plurality of second memory cells is coupled to a third bit line, and is not coupled to a fourth bit line, the third bit line and the fourth bit line extending in a column direction in parallel, wherein at least one memory node of the pair of memory nodes of one or some other second memory cells of the plurality of second memory cells is coupled to the fourth bit line, and is not connected to the third bit line, and wherein the second processing unit acquires the plurality of second weights from the second memory via the third bit line when performing one of the processes for the at least two pieces of second data, and acquires the plurality of second weights from the second memory via the fourth bit line when performing another one of the processes for the at least two pieces of second data.

[Technical Feature 30]

The processing device according to technical feature 23, wherein the first processing unit weights the plurality of pieces of first data by the plurality of first weights by performing XNORs between the plurality of pieces of first data and the plurality of first weights, and wherein the second processing unit weights the plurality of pieces of second data by the plurality of second weights by performing XNORs between the plurality of pieces of second data and the plurality of second weights.

[Technical Feature 31]

The processing device according to technical feature 23, further including:

a memory including:
a plurality of first memory cells that store the plurality of first weights, respectively,
a plurality of second memory cells that store the plurality of second weights, respectively,
a plurality of first XNOR circuits that perform XNORs between the plurality of pieces of first data and the plurality of first weights to weight the plurality of pieces of first data by the plurality of first weights, and are provided so as to correspond to the plurality of first memory cells, and
a plurality of second XNOR circuits that perform XNORs between the one piece of second data and the plurality of second weights to weight the one piece of second data by the plurality of second weights, and are provided so as to correspond to the plurality of second memory cells.

[Technical Feature 32]

The processing device according to any one of technical features 22 to 31, further including:

a memory including:
a plurality of memory cells that store the plurality of first weights and the plurality of second weights, respectively, wherein each of the plurality of memory cells includes a bistable circuit in which a CMOS inverter circuit is connected in a loop shape;
a first power switch that supplies a first power supply voltage to virtual power supply lines, one first power switch being coupled to virtual power supply lines of 10 or less memory cells, and
a second power switch that supplies a second power supply voltage higher than the first power supply voltage to the virtual power supply lines.

[Technical Feature 33]

The processing device according to any one of technical features 22 to 32, further comprising:

a memory including a plurality of memory cells that store the plurality of first weights and the plurality of second weights, respectively, wherein each of the plurality of memory cells includes the bistable circuit according to any one of technical features 1 to 3 or the memory circuit according to any one of technical features 14 to 21.

[Technical Feature 34]

A processing device comprising:

a processing unit that performs at least one of an n-to-1 connection process or a 1-to-n connection process, the n-to-1 connection process and the 1-to-n connection process being neural network processes;

a memory that stores data used in a process performed by the processing unit, and has a plurality of rows; and a power supply circuit that supplies a first power supply voltage, which enables reading of data, to a row in which data to be processed by the processing unit is stored, and supplies a second power supply voltage, which is lower than the first power supply voltage and enables retaining of data, to a row other than the row or shuts down a power supply voltage of the row other than the row.

[Technical Feature 35]

The processing device according to technical feature 34, wherein the processing unit performs, as the n-to-1 connection process, a process of calculating one piece of second data of a plurality of pieces of second data corresponding to a plurality of second nodes of a second layer by weighting a plurality of pieces of first data corresponding to a plurality of first nodes by a plurality of weights, respectively, and adding up a plurality of pieces of weighted first data, for each of the plurality of pieces of second data, to calculate the plurality of pieces of second data, wherein the memory stores the plurality of weights, respectively, stores a plurality of weights corresponding to one piece of second data in the same row, and stores a plurality of weights corresponding to another piece of second data in another row, and wherein the power supply circuit supplies the first power supply voltage to the same row when performing a process of calculating the one piece of second data, and supplies the second power supply voltage to at least one row other than the same row or shuts down the power supply voltage of the at least one row other than the same row.

[Technical Feature 36]

The processing device according to technical feature 34 or 35, wherein the processing unit performs, as the 1-to-n connection process, a process of calculating respective parts of a plurality of pieces of third data corresponding to a plurality of third nodes of a third layer by weighting one piece of second data of a plurality of pieces of second data corresponding to a plurality of second nodes of a second layer by a plurality of weights, for each of the plurality of pieces of second data, and calculates each of the plurality of pieces of third data by adding up corresponding parts of the third data originating from the plurality of pieces of second data, wherein a plurality of memories store the plurality of weights, respectively, store a plurality of weights corresponding to the one piece of second data in the same row, and store a plurality of weights corresponding to another piece of second data in another row, and wherein, when the process of calculating the one piece of second data is performed, the power supply circuit supplies the first power supply voltage to the same row, and supplies the second power supply voltage to a memory cell of at least one row other than the same row or shuts down the power supply voltage of the at least one row other than the same row.

[Technical Feature 37]

A processing device including:

a processing unit that performs at least one process of an n-to-1 connection process or a 1-to-n connection process, the n-to-1 connection process and the 1-to-n connection process being neural network processes;

a memory that stores data used in a process performed by the processing unit, and has a plurality of rows;

a power supply circuit that supplies a first power supply voltage, which enables reading of data, to a first row in which data to be processed by the processing unit is stored, and supplies a second power supply voltage, which is lower than the first power supply voltage and enables retaining of data, to a second row other than the first row or shuts down a power supply voltage of the second row; and a control unit that controls the processing unit and the power supply circuit so that data is read from the first row and the at least one process is performed using the read data in a state in which the first power supply voltage is being supplied to the first row and the second power supply voltage is being supplied to the second row or the power supply voltage of the second row is being shut down, the control unit controlling the processing unit and the power supply circuit while sequentially changing the first row.

[Technical Feature 38]

The processing device according to technical feature 37, wherein the processing unit performs, as the n-to-1 connection process, a process of calculating one piece of second data of a plurality of pieces of second data corresponding to a plurality of second nodes of a second layer by weighting a plurality of pieces of first data corresponding to a plurality of first nodes by a plurality of weights, respectively, and adding up a plurality of pieces of weighted first data, for each of the plurality of pieces of second data, to calculate the plurality of pieces of second data, wherein the memory stores the plurality of weights, stores a plurality of weights corresponding to one piece of second data in the same row, and stores a plurality of weights corresponding to another piece of second data in another row, wherein the power supply circuit supplies the first power supply voltage to the same row when performing a process of calculating the one piece of second data, and supplies the second power supply voltage to at least one row other than the same row or shuts down the power supply voltage of the at least one row other than the same row, and wherein the control unit controls the processing unit and the power supply circuit so that the process of calculating the one piece of second data is performed in a state in which the first power supply voltage is being supplied to the same row and the second power supply voltage being supplied to the at least one row other than the same row or the power supply voltage of the at least one row other than the same row is being shut down.

[Technical Feature 39]

The processing device according to technical feature 37 or 38, wherein the processing unit performs, as the 1-to-n connection process, a process of calculating parts, corresponding to one piece of second data, of a plurality of pieces of third data corresponding, respectively, to a plurality of third nodes of a third layer by weighting the one piece of second data of a plurality of pieces of second data corresponding to a plurality of second nodes of a second layer by a plurality of weights, for each of the plurality of pieces of second data, and performs a process of calculating one piece of third data by adding up parts, corresponding to the plurality of pieces of second data, of the one piece of third data, for each of the plurality of pieces of third data, wherein the memory stores the plurality of weights, stores a plurality of weights corresponding to the one piece of second data in the same row, and stores a plurality of weights corresponding to another piece of second data in another row, wherein, when the process of calculating the one piece of second data is performed, the power supply circuit supplies the first power supply voltage to the same row, and supplies the second power supply voltage to a memory cell of at least one row other than the same row or shuts down the power supply voltage of the at least one row other than the same row, and wherein the control unit controls the processing unit and the power supply circuit so that the process of calculating the one piece of second data is performed in a state in which the first power supply voltage is being supplied to the same row and the second power supply voltage is being supplied to the at least one row other than the same row or the power supply voltage of the at least one row other than the same row is being shut down.

[Technical Feature 40]

A processing device including:

a processing unit that performs a process of calculating one piece of second data of a plurality of pieces of second data corresponding to a plurality of second nodes of a second layer by weighting a plurality of pieces of first data corresponding to a plurality of first nodes of a first layer by a plurality of weights, respectively, and adding up a plurality of pieces of weighted first data, for each of the plurality of pieces of second data to calculate the plurality of pieces of second data, and performs processes for at least two pieces of second data of the plurality of pieces of second data in parallel; and a memory including, in a plurality of rows, a plurality of memory cells that store the plurality of weights, respectively, the memory storing at least two weights corresponding to one piece of second data in at least two memory cells in the same row, the memory storing at least two weights corresponding to another piece of second data in at least two memory cells in another row, at least two memory cells in a first row of the plurality of rows being coupled to a first bit line extending in a column direction, the at least two memory cells in the first row being not coupled to a second bit line extending in the column direction, at least two memory cells in a second row of the plurality of rows being coupled to the second bit line, and the at least two memory cells in the second row being not coupled to the first bit line, wherein the processing unit acquires the at least two weights stored in the at least two memory cells of the first row from the memory via the first bit line in order to perform one of the processes for the at least two pieces of second data, and acquires the at least two weights stored in the at least two memory cells of the second row from the memory via the second bit line in order to perform another one of the processes for the at least two pieces of second data.

[Technical Feature 41]

A processing device including:

a processing unit that performs a process of calculating parts, corresponding to one piece of first data of a plurality of pieces of first data, of a plurality of pieces of second data by weighting the one piece of first data by a plurality of weights, for each of the plurality of pieces of first data, performs a process of calculating one piece of second data of the plurality of pieces of second data by adding up parts, corresponding to the plurality of pieces of first data, for the one piece of second data, the plurality of pieces of first data corresponding to a plurality of first nodes of a first layer, the plurality of pieces of second data corresponding to a plurality of second nodes of a second layer, and performs processes for at least two pieces of first data of the plurality of pieces of first data in parallel; and a memory that includes, in a plurality of rows, a plurality of memory cells that store the plurality of weights, respectively, the memory storing at least two weights corresponding to one piece of first data in at least two memory cells in the same row, the memory storing at least two weights corresponding to another piece of first data in at least two memory cells in another row, at least two memory cells in a first row of the plurality of rows being coupled to a first bit line extending in a column direction, the at least two memory cells in the first row being not coupled to a second bit line extending in the column direction, at least two memory cells in a second row of the plurality of rows being coupled to the second bit line, the at least two memory cells in the second row being not coupled to the first bit line, wherein the processing unit acquires the at least two weights stored in the at least two memory cells of the first row from the memory via the first bit line in order to perform one of the processes for the at least two pieces of first data, and acquires the at least two weights stored in the at least two memory cells of the second row from the memory via the second bit line in order to perform another one of the processes for the at least two pieces of second data.

Although preferred embodiments of the present invention have been described so far, the present invention is not limited to those particular embodiments, and various changes and modifications may be made to them within the scope of the invention claimed herein.

What is claimed is:

1. A bistable circuit comprising:

a first inverter circuit and a second inverter circuit each including:
  an input node;
  an output node;
  an intermediate node;
  a first FET having a channel of a first conductivity type, wherein a source of the first FET is coupled to a power supply line, a drain of the first FET is coupled to the intermediate node, and a gate of the first FET is coupled to the input node,
  a second FET having a channel of the first conductivity type, wherein a source of the second FET is coupled to the intermediate node, a drain of the second FET is coupled to the output node, and a gate of the second FET is coupled to the input node,
  a third FET, wherein one of a source and a drain of the third FET is coupled to the intermediate node, and the other of the source and the drain of the third FET is coupled to a bias node, and
  a fourth FET having a channel of a second conductivity type opposite to the first conductivity type, wherein one of a source and a drain of the fourth FET is coupled to the output node, and the other of the source and the drain of the fourth FET is coupled to a control line;

a first memory node to which the input node of the first inverter circuit and the output node of the second inverter circuit are coupled; and a second memory node to which an output node of the first inverter circuit and an input node of the second inverter circuit are coupled, wherein gates of the fourth FETs of the first inverter circuit and the second inverter circuit are coupled to a word line, wherein a gate of the third FET of the first inverter circuit is coupled to one of the following nodes: the input node and the output node of the first inverter circuit and the input node and the output node of the second inverter circuit, and wherein a gate of the third FET of the second inverter circuit is coupled to one of the following nodes: the input node and the output node of the second inverter circuit and the input node and the output node of the first inverter circuit.

2. The bistable circuit according to claim 1,
wherein the third FET has a channel of the second conductivity type,
wherein the gate of the third FET of the first inverter circuit is coupled to the input node of the first inverter circuit or the output node of the second inverter circuit, and
wherein the gate of the third FET of the second inverter circuit is coupled to the input node of the second inverter circuit or the output node of the first inverter circuit.

3. The bistable circuit according to claim 1,
wherein the third FET has a channel of the first conductivity type,
wherein the gate of the third FET of the first inverter circuit is coupled to the output node of the first inverter circuit or the input node of the second inverter circuit, and
wherein the gate of the third FET of the second inverter circuit is coupled to the output node of the second inverter circuit or the input node of the first inverter circuit.

4. An electronic circuit comprising:
the bistable circuit according to claim 1; and
a control circuit configured to, in a first state in which the bistable circuit retains data, set a first voltage between the power supply line and the control line lower than a second voltage between the first memory node and the second memory node in a second state in which data is read from the bistable circuit or data is written in the bistable circuit.

5. The electronic circuit according to claim 4, wherein the control circuit sets the control line as a bit line for reading data from the bistable circuit or writing data in the bistable circuit, in the second state.

6. The electronic circuit according to claim 4, wherein, in the second state, the control circuit sets a voltage of the word line higher than a voltage of the power supply line in the case that the first conductivity type is an N type, and sets the voltage of the word line lower than the voltage of the power supply line in the case that the first conductivity type is a P type.

7. The electronic circuit according to claim 4, wherein, in the first state, the control circuit sets a voltage between the word line and the power supply line to the first voltage or lower than the first voltage.

8. The electronic circuit according to claim 4, wherein, in a third state in which a voltage between the power supply line and the control line is set to the second voltage, the control circuit sets a voltage between the word line and the power supply line smaller than the second voltage.

9. The electronic circuit according to claim 4, wherein a fixed bias is supplied to the bias node in both the first state and the second state.

10. The electronic circuit according to claim 9, wherein the fixed bias is a voltage between a voltage of the first memory node and a voltage of the second memory node in the second state.

11. The electronic circuit according to claim 4,
wherein, in the second inverter circuit, the other of the source and the drain of the fourth FET is coupled to a first control line, and a gate of the fourth FET is coupled to a first word line, wherein, in the first inverter circuit, the other of the source and the drain of the fourth FET is coupled to a second control line, and a gate of the fourth FET is coupled to a second word line,
wherein the first inverter circuit includes a fifth FET having a channel of the second conductivity type, one of the source and the drain of the fifth FET is coupled to the first memory node, the other of the source and the drain of the fifth FET is coupled to a third control line, and a gate of the fifth FET is coupled to a third word line, and
wherein the control circuit uses the first word line to turn on the fourth FET of the second inverter circuit, uses the first control line to write data in the bistable circuit, uses the second word line to turn on the fourth FET of the first inverter circuit, uses the second control line to read data from the bistable circuit, uses the third word line to turn on the fifth FET of the first inverter circuit, and uses the third control line to read data from the bistable circuit.

12. The electronic circuit according to claim 11,
wherein in the case that the first conductivity type is an N type, the control circuit sets a voltage of the first word line when data is read from the bistable circuit higher than a voltage of the first word line when data is written in the bistable circuit, and lower than the higher of voltages of the second word line and the third word line when data is read from the bistable circuit, and
wherein in the case that the first conductivity type is a P type, the control circuit sets a voltage of the first word line when data is read from the bistable circuit lower than a voltage of the first word line when data is written in the bistable circuit, and higher than the lower of voltages of the second word line and the third word line when data is read from the bistable circuit.

13. The electronic circuit according to claim 4,
wherein, in the first inverter circuit, the other of the source and the drain of the fourth FET is coupled to a first control line, and a gate of the fourth FET is coupled to the first word line,
wherein, in the second inverter circuit, the other of the source and the drain of the fourth FET is coupled to a second control line, and a gate of the fourth FET is coupled to the first word line,
wherein the first inverter circuit includes a fifth FET having a channel of the second conductivity type, one of a source and a drain of the fifth FET is coupled to the first memory node, the other of the source and the drain of the fifth FET is coupled to a third control line, and a gate of the fifth FET is coupled to a second word line,
wherein the second inverter circuit includes a sixth FET having a channel of the second conductivity type, one of a source and a drain of the sixth FET is coupled to the second memory node, the other of the source and the drain of the sixth FET is coupled to a fourth control line, and a gate of the sixth FET is coupled to the second word line, and
wherein the control circuit uses the first word line to turn on the fourth FETs of the first inverter circuit and the second inverter circuit, uses the first control line and the second control line to write data in the bistable circuit and read data from the bistable circuit, uses the second word line to turn on the fifth FET and the sixth FET, and uses the third control line and the fourth control line to write data in the bistable circuit and read data from the bistable circuit.

* * * * *